United States Patent [19]

Ema et al.

[11] Patent Number: 5,036,519
[45] Date of Patent: Jul. 30, 1991

[54] SEMICONDUCTOR LASER CONTROLLER

[75] Inventors: Hidetoshi Ema, Yokohama; Hiroshi Takahashi, Kawasaka, both of Japan

[73] Assignee: Ricoh Company, Ltd., Tokyo, Japan

[21] Appl. No.: 446,583

[22] Filed: Dec. 5, 1989

[30] Foreign Application Priority Data

| Dec. 5, 1988 | [JP] | Japan | 63-307543 |
| Feb. 3, 1989 | [JP] | Japan | 1-24923 |
| Feb. 3, 1989 | [JP] | Japan | 1-24924 |
| Feb. 3, 1989 | [JP] | Japan | 1-24925 |
| Feb. 3, 1989 | [JP] | Japan | 1-24926 |
| Feb. 3, 1989 | [JP] | Japan | 1-24927 |
| Feb. 3, 1989 | [JP] | Japan | 1-24928 |
| Feb. 3, 1989 | [JP] | Japan | 1-24929 |
| Feb. 3, 1989 | [JP] | Japan | 1-24930 |
| Feb. 3, 1989 | [JP] | Japan | 1-24931 |
| Feb. 3, 1989 | [JP] | Japan | 1-24932 |

[51] Int. Cl.$^5$ .............................. H01S 3/00
[52] U.S. Cl. ......................... 372/38; 372/33; 372/29; 369/122
[58] Field of Search ............ 372/29, 31, 38, 33; 369/122

[56] References Cited

U.S. PATENT DOCUMENTS

| 3,898,583 | 8/1975 | Shuey | 372/38 |
| 4,771,431 | 9/1988 | Nakazawa et al. | 372/38 |
| 4,819,241 | 4/1989 | Nagano | 372/29 |
| 4,845,720 | 7/1989 | Koishi et al. | 372/31 |

FOREIGN PATENT DOCUMENTS

| 0112670 | 6/1984 | Japan | 372/31 |
| 0098284 | 4/1989 | Japan | 372/29 |

Primary Examiner—Frank Gonzalez
Assistant Examiner—Susan S. Morse
Attorney, Agent, or Firm—Cooper & Dunham

[57] ABSTRACT

A semiconductor laser controller converts the light output of the driven laser to a photovoltaic current proportional to that light output and separates the current into high and low frequency components. A negative feedback loop controls the forward current of the laser such that the sum of these high and low frequency components of the photovoltaic current equal a reference signal current defining the light output of the laser. A control unit controls the reference current such that a voltage proportional to the low frequency component of the photovoltaic current equals a reference voltage corresponding to the reference current.

64 Claims, 54 Drawing Sheets

LUMINOUS LEVEL
COMMAND SIGNAL

LUMINOUS LEVEL
COMMAND SIGNAL

LUMINOUS LEVEL
COMMAND SIGNAL

Fig. 61
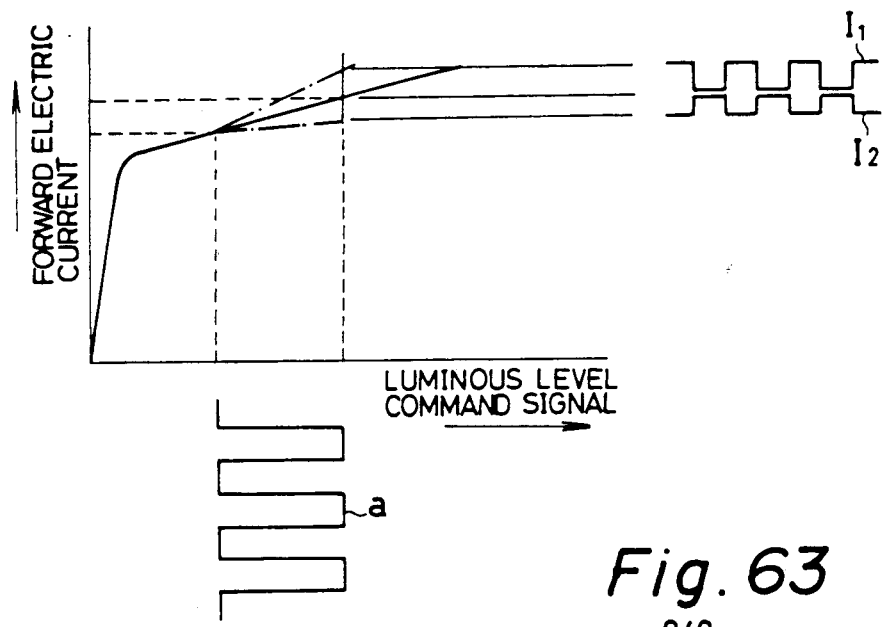
Fig. 63
Fig. 62
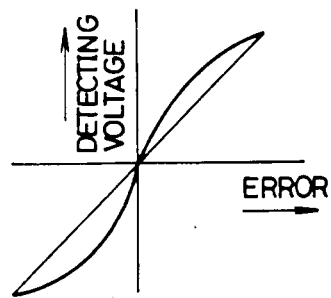
Fig. 64
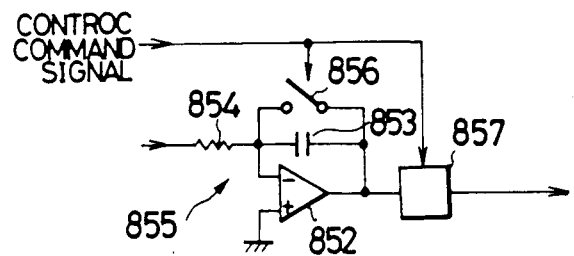

SEMICONDUCTOR LASER CONTROLLER

BACKGROUND OF THE INVENTION

The present invention relates to a semiconductor laser controller for controlling a light output of a semiconductor laser used as a light source in a laser printer, an optical disk apparatus, an optical communication device, etc.

Recently, an optical disk apparatus of a write-recordable postscript type (WO type) has been used to perform reproduction of information and further writing and recording operations thereof. Further, there is a disk apparatus of a magnetic optical type (MO type) which has an erasing function as well as the writing function and can perform a rewriting operation. In such optical apparatuses, with respect to the light intensity of a laser beam emitted from a semiconductor laser, two kinds of light intensities for reproduction and record are set in the case of the optical disk apparatus of the WO type. In the case of the optical disk apparatus of the MO type, the light intensity for erasion is further added to the above two light intensities so that three kinds of light intensities are set. In any case, the stabilization of the light intensities of the laser beam is indispensable to the stable reproducing, recording and erasing operations.

In a system for controlling the light intensity for reproduction of the laser beam of the semiconductor laser, a normal operational amplifier is used as an amplifier and a comparator. Since such an operational amplifier is used, when power for reproduction is varied, this variation cannot be restrained for a time about a minimum pulse width of reproduced data. As a result, there are cases in which focusing and tracking servo controls are not suitably performed and an error in reproduced data is caused. This is because a return light with respect to the semiconductor laser exerts a bad influence on the power control of this semiconductor laser and this influence increases as the laser power is low as that for reproduction. At the reproducing time, the reflected light is varied by a reflected light from a really data-existing portion and a reflected light from a data non-existing portion so that the degrees of the above influence are different from each other.

As a system for reducing the influence of such a return light, there is a system using a ¼ waveform plate. Namely, in the optical disk apparatus of the WO type, when a linearly polarized light with respect to the optical disk from a beam splitter is converted to a circularly polarized light by the ¼ waveform plate, the disk reflected light is returned as the circularly polarized light to the ¼ waveform plate. When this reflected light passes through the ¼ waveform plate, the reflected light becomes a linearly polarized light having a phase different by 90° from that of an incident light. This reflected light is then incident to the beam splitter again so that the reflected light is not returned onto the side of the semiconductor laser, but is directed to only a detecting system. However, in the optical disk apparatus of the MO type, the ¼ waveform plate cannot be inserted into the apparatus. This is because it is necessary that the spot light beam irradiated onto an optically magnetic disk face is a linearly polarized light to reproduce a signal by the direction of the polarized light in the optical disk apparatus of the MO type. Accordingly, when the optical disk apparatus is constructed to be of both the WO and MO types, it is necessary to set the ¼ waveform plate to be inserted at the using time of the apparatus of the WO type, and detach the ¼ waveform plate at the using time of the apparatus of the MO type. Therefore, as the disk apparatus, it is necessary to dispose parts for moving and operating the ¼ waveform plate, a drive circuit therefor, etc. Such a construction is disadvantageous with respect to reliability, cost, outer size, weight, etc. Such a situation is similarly caused in a reproduction power control in a system for controlling the respective light intensities for reproduction, record and erasion.

In this control system, to control the operation of the semiconductor laser and stabilize its light output, it is necessary to dispose two independent control circuits composed of a semiconductor laser drive control system for only reproduction and a semiconductor laser drive control system for only record and erasion, thereby increasing the number of circuits and parts. Further, at the really recording time, the control of a constant electric current is performed and is different from that at the control time of the recording power. Therefore, the restriction of the variation of the recording power at the really recording time becomes insufficient.

Further, conventionally, a laser diode drive unit cannot be stably operated at a high speed with respect to a low frequency caused by the change in temperature, etc.

The semiconductor laser is very compact and can be directly modulated by a drive electric current at a high speed. Therefore, recently, the semiconductor laser has been widely used as a light source in the optical disk apparatus, a laser printer, etc.

However, the drive electric current and light output characteristics of the semiconductor laser are greatly changed by temperature. This change causes a problem when the light intensity of the semiconductor laser is set to a desired value. Various kinds of APC (Automatic Power Control) circuits have been proposed to solve this problem and use the advantages of the semiconductor laser.

These APC circuits are generally divided into the following three systems.

(1) In a first system, the light output of the semiconductor laser is monitored by a light-receiving element. A photoelectric negative feedback loop for controlling a forward electric current of the semiconductor laser at any time is disposed such that a signal proportional to a light-receiving electric current (proportional to the light output of the semiconductor laser) generated in this light-receiving element is equal to a command signal indicative of a luminous level. In this system, the light output of the semiconductor laser is controlled to be a desired value by this photoelectric negative feedback loop.

(2) In a second system, the light output of the semiconductor laser is monitored by the light-receiving element in a power setting period. The forward electric current of the semiconductor laser is controlled such that the signal proportional to the light-receiving electric current (proportional to the light output of the semiconductor laser) generated in this light-receiving element is equal to the luminous level command signal. In a period except for the power setting period, the forward electric current value of the semiconductor laser set in the power setting period is held to control the light output of the semiconductor laser to be a desired value. In the period except for the power setting period, the forward electric current of the semiconductor laser is modulated by information with the forward electric current value of the semiconductor laser set in the power setting period as a reference, thereby superimposing the information on the light output of the semiconductor laser.

(3) In a third system, the temperature of the semiconductor laser is measured. The light output of the semiconductor laser is controlled to be a desired value by controlling the forward electric current of the semiconductor laser by the measured temperature, or controlling the temperature of the semiconductor laser to be constant.

The system (1) is desirable to set the light output of the semiconductor laser to be the desired value. However, a limit is caused with respect to control speed by limits of the operating speed of the light-receiving element, an operating speed, etc., of an amplifying element constituting the photoelectric negative feedback loop. For example, in consideration of a cross frequency in an open loop of the photoelectric negative feedback loop as a reference of this control speed, the step responsive characteristics of the light output of the semiconductor laser can be approximately provided as follows when this cross frequency is set to $f_0$.

$$P_{out} = P_0 \{1 - \exp(-2\pi f_0 t)\}$$

where $P_{out}$ is the light output of the semiconductor laser, $P_0$ is the light intensity set in the semiconductor laser, and t is time.

In many cases in which the semiconductor laser is used, it is necessary to set to a predetermined value the entire light amount (an integral value $\int P_{out}$ of the light output) from a time immediately after the light output of the semiconductor laser is changed until a set time $\tau_0$ has passed. This integral value is provided as follows.

$$\int P_{out} = P_0 \cdot t_0 \left\{ 1 - \frac{1}{2\pi f_0 \tau_0} [1 - \exp(-2\pi f_0 \tau_0)] \right\}$$

If the time $\tau_0 = 50$ ns and an allowable range of the error is set to 0.4%, the cross frequency $f_0 > 800$ MHZ must be set. It is very difficult to set the cross frequency to such a value.

In the system (2), the above problems with respect to the system (1) are not caused and it is possible to modulate the semiconductor laser at a high speed. Accordingly, the system (2) is used in many cases. However, in this system (2), the light output of the semiconductor laser is not controlled at any time so that the light amount of the semiconductor laser is easily varied by a disturbance, etc. As the disturbance, DO loop characteristics of the semiconductor laser for example are considered. An error about several % is easily caused by the DO loop characteristics with respect to the light amount of the semiconductor laser. A compensating method by combining a thermal time constant of the semiconductor laser and the frequency characteristics of the semiconductor laser drive electric current is proposed as a trial for restricting the DO loop characteristics of the semiconductor laser. However, in such a method, there is dispersion every semiconductor laser with respect to the thermal time constant of the semiconductor laser. Further, this thermal time constant is different by the environment of the semiconductor laser.

Further, the light amount of the semiconductor laser is varied by the influence of the return light in the optical disk apparatus, etc.

SUMMARY OF THE INVENTION

It is therefore a first object of the present invention to provide a semiconductor laser controller which can be stably operated at a high speed with respect to a low frequency caused by the change in temperature, etc.

A second object of the present invention is to provide a semiconductor laser controller which is operated at a high speed with a high accuracy and has a high resolution.

A third object of the present invention is to provide an optical disk apparatus in which can be constructed to be of both WO and MO types without using the ¼ wavelength plate and therefore the parts relating to the ¼ wavelength plate are omitted.

The first and second objects of the present invention can be achieved by a semiconductor laser controller comprising photoelectric converting means for converting a light output of a driven semiconductor laser to a photovoltaic current proportional to the light output of the driven semiconductor laser by separating the photovoltaic current into high and low frequency components; a photoelectric negative feedback loop for controlling a forward electric current of the semiconductor laser such that a sum of the high and low frequency components of the photovoltaic current converted by the photoelectric converting means is equal to a reference signal electric current defining the light output of the semiconductor laser; and control means for controlling the reference signal electric current such that a voltage proportional to the low frequency component of the photovoltaic current converted by the photoelectric converting means is equal to a reference signal voltage corresponding to the reference signal electric current.

The photoelectric negative feedback loop detects the light output of the driven semiconductor laser by a light-receiving portion and controls the forward electric current of the semiconductor laser such that a light-receiving signal as the photovoltaic current proportional to the light output of the semiconductor laser provided from the light-receiving portion is equal to a command signal indicative of a luminous level as the reference signal electric current, and the controller further comprises converting means for converting the luminous level command signal to the forward electric current of the semiconductor laser such that the light-receiving signal is equal to the luminous level command signal on the basis of light output and forward electric current characteristics of the semiconductor laser, a coupling coefficient between the light-receiving portion and the semiconductor laser, and light input and light-receiving signal characteristics of the light-receiving portion, and comprises means for controlling an operation of the semiconductor laser by a sum or difference in electric current with respect to a control electric current of the photoelectric negative feedback loop and an electric current produced by the converting means.

The controller further comprises a circuit for turning on and off an offset electric current by a switching signal, and the operation of the semiconductor laser is controlled by an electric current provided by adding the offset electric current to the sum or difference in electric current.

The controller further comprises detecting means for detecting an error in conversion of the converting means by detecting the control electric current of the photoelectric negative feedback loop.

The controller further comprises a circuit for turning on and off an offset electric current by a switching signal, and the operation of the semiconductor laser is controlled by an electric current provided by adding the offset electric current to the sum or difference in electric current.

The photoelectric negative feedback loop is constructed by a first photoelectric negative feedback loop for detecting the light output of the semiconductor laser by the light-receiving portion and controlling the forward electric current of the semiconductor laser such that a light-receiving electric current proportional to the light output of the semiconductor laser obtained from the light-receiving portion is equal to a first luminous level command signal in which the luminous level command signal is converted to an electric current, and a second photoelectric negative feedback loop for controlling the first luminous level command signal such that a voltage proportional to the light-receiving electric current is equal to that of the luminous level command signal.

The converting means converts the luminous level command signal as an analog signal voltage to an electric current proportional to the luminous level command signal such that the light output in the light output and forward electric current characteristics of the semiconductor laser to those represented by a straight line.

The converting means converts the luminous level command signal as an analog signal voltage to an electric current corresponding to the luminous level command signal such that the light output in the light output and forward electric current characteristics of the semiconductor laser is represented by a polygonal line.

The luminous level command signal is set to a digital signal and the converting means has a conversion table for converting the luminous level command signal to a signal for correcting the light output and forward electric current characteristics of the semiconductor laser, and a digital/analog converter for converting the signal converted by the conversion table to the forward electric current of the semiconductor laser.

The controller further comprises correcting means for correcting the change in light output and forward electric current characteristics of the semiconductor laser by controlling the conversion rule such that the control electric current of the photoelectric negative feedback loop is not changed even when the luminous level command signal is changed by a detecting signal from the detecting means.

The converting means converts the luminous level command signal as an analog signal voltage to an electric current corresponding to the luminous level command signal by approximating the light output and forward electric current characteristics of the semiconductor laser to a straight line, and the detecting means detects the phase and amplitude with respect to the luminous level command signal of the control electric current of the photoelectric negative feedback loop by the luminous level command signal modulated at a constant amplitude level in a constant period, and the correcting means controls the inclination in conversion characteristics of the converting means so as to minimize an absolute value of the control electric current of the photoelectric negative feedback loop in the constant period by the detecting signal from the detecting means and holds the inclination in conversion characteristics of the converting means in the other period.

The converting means converts the luminous level command signal as an analog signal voltage to an electric current determined by the luminous level command signal by approximating the light output and forward electric current characteristics of the semiconductor laser to a polygonal line constructed by n straight lines where n designates a natural number, and the detecting means detects the phase and amplitude with respect to the luminous level command signal of the control electric current of the photoelectric negative feedback loop by the luminous level command signal modulated at more than $(2n-1)$ different amplitudes and an offset value signal in a constant period, and the correcting means controls the inclination and a polygonal point of each straight line constructing the polygonal line of the converting means so as to minimize an absolute value of the control electric current of the photoelectric negative feedback loop in the constant period by the detecting signal from the detecting means, and holds the inclination and the polygonal point of each straight line constructing the polygonal line of the converting means in the other period.

The converting means has a conversion table for converting the luminous level command signal as a digital signal to a signal corrected on the basis of the light output and forward electric current characteristics of the semiconductor laser and has digital/analog converting means for converting the signal converted by the conversion table to the forward electric current of the semiconductor laser, and the detecting means detects the phase and amplitude with respect to the luminous level command signal of the control electric current of the photoelectric negative feedback loop by the luminous level command signal modulated at a plurality of amplitude values according to a dynamic range in a constant period, and the correcting means controls a value of the conversion table so as to minimize an absolute value of the control electric current of the photoelectric negative feedback loop in the constant period by the detecting signal from the detecting means, and holds the value of the conversion table in the other period.

The converting means converts the luminous level command signal as an analog signal voltage to an electric current corresponding to the luminous level command signal such that the light put in the light output and forward electric current characteristics of the semiconductor laser is represented by a straight line, and the detecting means detects the control electric current of the photoelectric negative feedback loop by emitting the light from the semiconductor laser in a constant period in which the luminous level command signal is set at least two different levels, and the correcting means controls the inclination in conversion characteristics of the converting means so as to correct the change in differential quantum efficiency of the semiconductor laser in the constant period by the detecting signal from the detecting means and holds the inclination in conversion characteristics of the converting means in the other period.

The converting means has means for converting the luminous level command signal as an analog signal voltage to an electric current corresponding to the luminous level command signal such that the light output in the light output and forward electric current characteristics of the semiconductor laser is represented by a straight line, and has switching means for turning on and off the forward electric current of the semiconductor laser by a set electric current value by a switching signal, and the detecting means detects the control electric current of the photoelectric negative feedback loop by emitting the light from the semiconductor laser in a constant period in which the luminous level command signal is set at least two different levels, and the correcting means controls the inclination in conversion characteristics of the converting means so as to correct the change in differential quantum efficiency of the semiconductor laser in the constant period by the detecting signal from the detecting means, and holds the inclination in conversion characteristics of the converting means in the other period.

The converting means has means for converting the luminous level command signal as an analog signal voltage to an electric current corresponding to the luminous level command signal such that the light output in the light output and forward electric current characteristics of the semiconductor laser is represented by a straight line, and has switching means for turning on and off the forward electric current of the semiconductor laser by a set electric current value by a switching signal, and the detecting means detects the phase and amplitude with respect to the luminous level command signal of the control electric current of the photoelectric negative feedback loop in a constant period in which the luminous level command signal is set at a constant amplitude level, and the correcting means controls the inclination in conversion characteristics of the converting means so as to minimize an absolute value of the control electric current of the photoelectric negative feedback loop in the constant period by the detecting signal from the detecting means, and holds the inclination in conversion characteristics of the converting means in the other period.

The converting means has means for converting the luminous level command signal as an analog signal voltage to an electric current corresponding to the luminous level command signal such that the light output in the light output and forward electric current characteristics of the semiconductor laser is represented by a straight line, and has switching means for turning on and off the forward electric current of the semiconductor laser by a set electric current value by a switching signal, and the detecting means and the correcting means sample a control electric current of the photoelectric negative feedback loop at timings of a peak and a bottom of the luminous level command signal in a constant period in which the luminous level command signal is pulse-modulated at a constant amplitude level having a constant offset level, and control a conversion coefficient of the converting means so as to minimize an absolute value of a differential voltage of sampling values corresponding to these peak and bottom, and control a set electric current value of the switching means so as to minimize the absolute value of the differential voltage between the sampling value corresponding to the timing of the bottom and a voltage corresponding to a bottom value of the luminous level command signal, and hold the inclination in conversion characteristics of the converting means and the set electric current value of the switching means in the other period.

The converting means converts the luminous level command signal as an analog signal voltage to an electric current corresponding to the luminous level command signal such that the light output in the light output and forward electric current characteristics of the semiconductor laser is represented by a polygonal line constructed by n straight lines where n designates a natural number, and the detecting means detects the control electric current of the photoelectric negative feedback loop by emitting the light from the semiconductor laser in a constant period in which the luminous level command signal is set at least 2n different levels, and the correcting means controls the inclination in conversion characteristics of the converting means approximated by the straight line so as to correct the change in differential quantum efficiency of the semiconductor laser in the constant period by the detecting signal from the detecting means, and holds the inclination in conversion characteristics of the converting means in the other period.

The converting means has means for converting the luminous level command signal as an analog signal voltage to an electric current corresponding to the luminous level command signal by approximating the light output and forward electric current characteristics of the semiconductor laser to a polygonal line constructed by n straight lines where n designates a natural number, and has switching means for turning on and off the forward electric current of the semiconductor laser by a set electric current value by a switching signal, and the detecting means detects the control electric current of the photoelectric negative feedback loop by emitting the light from the semiconductor laser in a constant period in which the luminous level command signal is set at least 2n different levels, and the correcting means controls the inclination in conversion characteristics of the converting means approximated by the straight line so as to correct the change in differential quantum efficiency of the semiconductor laser in the constant period by the detecting signal from the detecting means, and holds the inclination in conversion characteristics of the converting means in the other period.

The converting means has means for converting the luminous level command signal as an analog signal voltage to an electric current corresponding to the luminous level command signal such that the light output in the light output and forward electric current characteristics of the semiconductor laser is represented by a polygonal line constructed by n straight lines where n designates a natural number, and the detecting means and the correcting means sample the control electric current of the photoelectric negative feedback loop at timings of a peak and a bottom of the luminous level command signal in a constant period in which the luminous level command signal is pulse-modulated at least $(2n-1)$ different constant amplitude levels having a constant offset level, and control the inclination and a polygonal point of each polygonal line of the converting means approximated by the polygonal line so as to minimize an absolute value of a differential voltage of sampling values corresponding to these peak and bottom, and holds the inclination and the polygonal point of each polygonal line of the converting means in the other period.

The converting means has means for converting the luminous level command signal as an analog signal voltage to an electric current corresponding to the luminous level command signal such that the light output in the light output and forward electric current characteristics of the semiconductor laser is represented by a polygonal line constructed by n straight lines where n designates a natural number, and has switching means for turning on and off the forward electric current of the semiconductor laser by a set electric current value by a switching signal, and the detecting means and the correcting means sample the control electric current of the photoelectric negative feedback loop at timings of a peak and a bottom of the luminous level command signal in a constant period in which the luminous level command signal is pulse-modulated at least 2n different constant amplitude levels having a constant offset level, and control the inclination and a polygonal point of each polygonal line of the converting means approximated by the polygonal line and the set electric current value switched by the switching means so as to minimize an absolute value of a differential voltage of sampling values corresponding to these peak and bottom, and holds the inclination and the polygonal point of each polygonal line of the converting means and the set electric current value in the other period.

The converting means, the detecting means and the correcting means have means for converting the luminous level command signal as a digital signal by a conversion table so as to correct the light output and forward electric current characteristics of the semiconductor laser and further converting the converted signal to an electric current corresponding to the luminous level command signal by a digital/analog converter, and have means for linearly setting the conversion characteristics of the conversion table in a constant period in which the luminous level command signal is increased from a minimum setting level to a maximum setting level, is decreased from the maximum setting level to the minimum setting level, or is arbitrarily changed in accordance with a dynamic range, and the linearly setting means sets a value of the conversion table such that a sum of the control electric current of the photoelectric negative feedback loop and a conversion electric current of the conversion table becomes the conversion electric current of the conversion table.

The controller further comprises switching means for turning on and off the forward electric current of the semiconductor laser by a set electric current value by a switching signal, and the operation of the semiconductor laser is controlled by an electric current provided by adding an electric current produced by the switching means to the control electric current of the semiconductor laser, and an electric current provided by subtracting the electric current produced by the switching means from each setting value of the conversion table is set to the value of the conversion table, and the value of the electric current produced by the switching means is set to the forward electric current of the semiconductor laser corresponding to the minimum setting value of the luminous level command signal.

The semiconductor laser controller may comprise photoelectric converting means for detecting a photovoltaic current proportional to a light output of a driven laser diode and separating the photovoltaic current into high and low frequency components; a photoelectric negative feedback loop for controlling a forward electric current of the laser diode such that a sum of the high and low frequency components of the photovoltaic current generated by the photoelectric converting means is equal to a reference signal electric current; and phase compensating means for compensating a phase of the forward electric current of the laser diode.

The third object of the present invention can be achieved by an optical disk apparatus for irradiating a laser beam from a semiconductor laser to an optical disk to record, reproduce or erase information, the apparatus comprising a light-receiving element for receiving a portion of the laser beam from the semiconductor laser; a wide band electric current amplifier connected to the semiconductor laser and inputting a command signal indicative of a luminous level; a wide band photoelectric negative feedback loop composed of an impedance converter and a first voltage-current converter connected in parallel to each other between the wide band electric current amplifier and the light-receiving element, the wide band photoelectric negative feedback loop feeding a detecting signal provided by the light-receiving element at a reproducing or erasing time back to the wide band electric current amplifier; and a low region photoelectric negative feedback loop composed of a differential amplifier and a second voltage-current converter connected between the light-receiving element and the wide band electric current amplifier, the low region photoelectric negative feedback loop comparing the detecting signal provided by the light-receiving element at the reproducing or erasing time with a reference value by the differential amplifier, and converting the compared signal to an electric signal by the second voltage-current converter, and feeding the converted signal back to the wide band electric current amplifier.

In the above optical disk apparatus, a luminous command signal in accordance with a series of data pulses at the recording time and the light intensity of the laser beam for record is inputted as the luminous level command signal to the photoelectric negative feedback loop through a circuit for correcting high frequency region characteristics.

Further objects and advantages of the present invention will be apparent from the following description of the preferred embodiments of the present invention as illustrated in the accompanying drawings.

BRIEF DESCRIPTION OF THE DRAWINGS

FIGS. 61 and 62 are characteristic graphs for explaining the semiconductor laser controller of the present invention;

FIG. 63 is a block diagram showing the construction of a multiplier in another embodiment of the present invention;

FIG. 64 is a block diagram showing a portion of the semiconductor laser controller in another embodiment of the present invention;

DESCRIPTION OF THE PREFERRED EMBODIMENTS

The preferred embodiments of a semiconductor laser controller in the present invention will now be described in detail with reference to the accompanying drawing.

Figure 1:
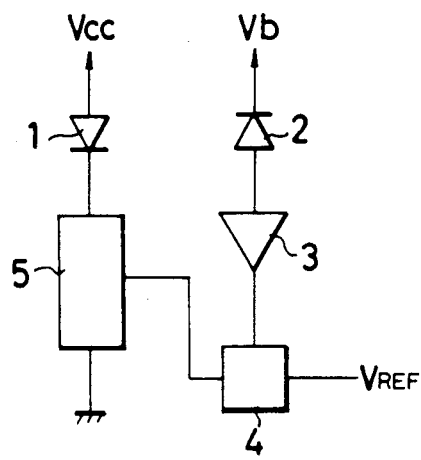
FIG. 1 is a block diagram showing one example of a general optical disk apparatus.

A system for controlling light intensity for reproduction of a laser beam of a semiconductor laser is shown in FIG. 1 for example. In this control system, a portion of the laser beam emitted from a semiconductor laser 1 connected to a power source having a voltage $V_{cc}$ is received by a light-receiving element such as a photodiode 2 for example. Reference numeral Vb designates a reverse bias voltage. An electric current detected by this photodiode 2 is amplified by an amplifier 3. A detected value amplified by the amplifier 3 is compared with a reference voltage $V_{REF}$ for reproduction by a comparator 4. The operation of an electric current source 5 for reproduction is controlled in accordance with a comparing output of the comparator 4 so that the light intensity of the laser beam of the semiconductor laser 1 is maintained such that this light intensity has a power for reproduction.

Figure 2:
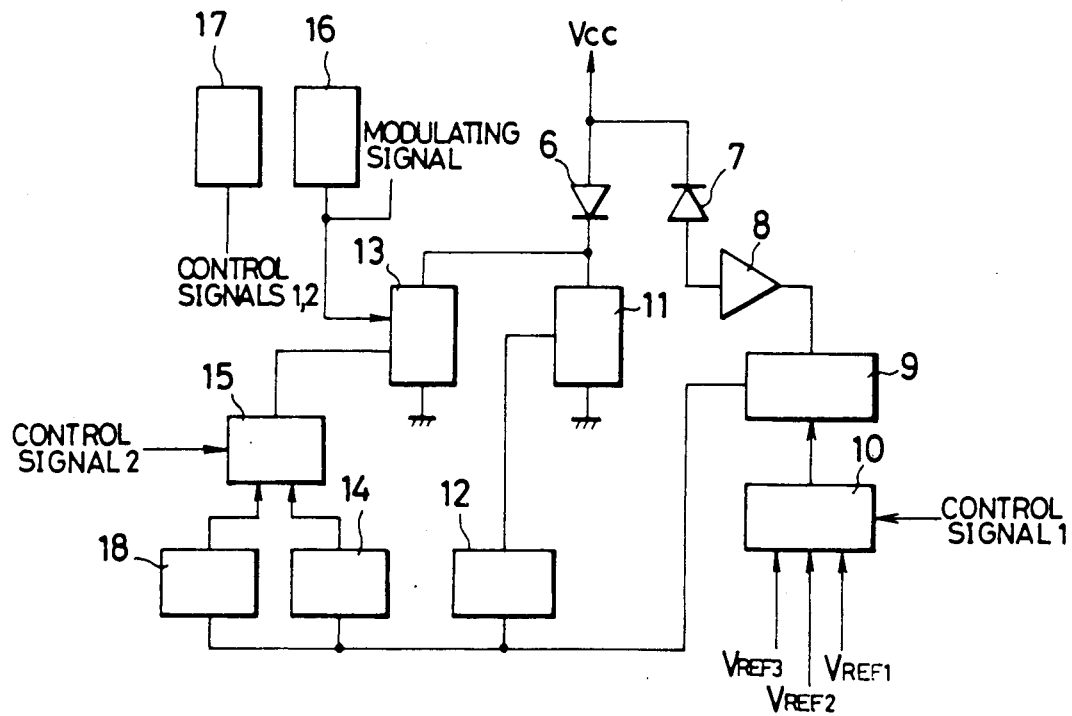
FIG. 2 is a block diagram showing another example of the general optical disk apparatus.
Figure 3:
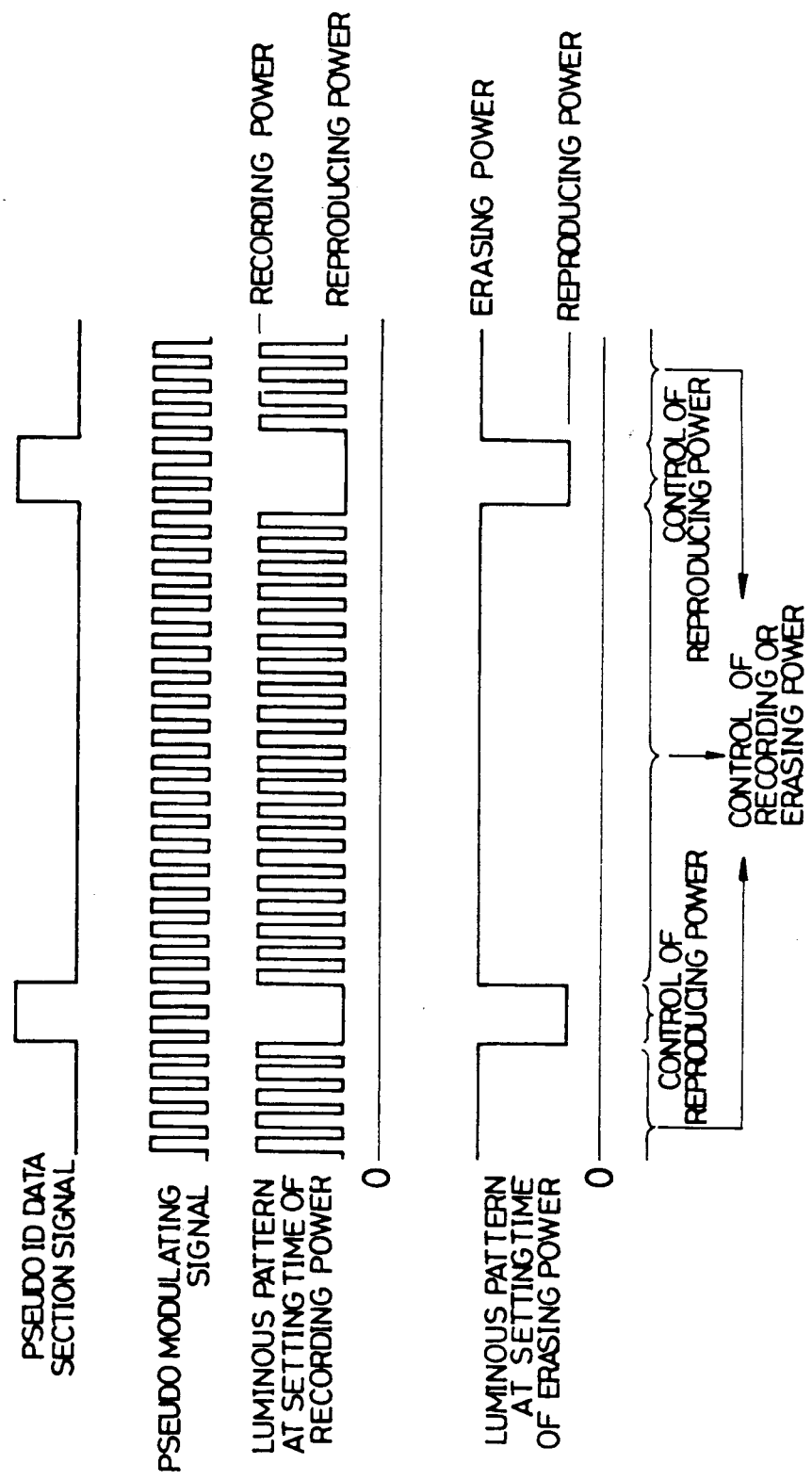
FIG. 3 is a timing chart of the general optical disk apparatus.

A system for controlling the respective light intensities for reproduction, record and erasion as shown in FIGS. 2 and 3 is proposed. Similar to FIG. 1, with respect to the control of the light intensity at a reproducing time by the well-known control system, a portion of the laser beam emitted from a semiconductor laser 6 is received by a light-receiving element such as a photodiode 7 for example. An electric current detected by this photodiode 7 is amplified by an amplifier 8 and is compared with the reference voltage $V_{REF}$ by a comparator 9. A reference voltage $V_{REF1}$ for reproduction is selected as the reference voltage $V_{REF}$ from a switching element 10 based on a control signal 1. The operatio.` of a constant electric current source 11 for reproduction is controlled in accordance with the comparing output of the comparator 9. Thus, the light intensity of the laser beam of the semiconductor laser 1 is maintained to have a power for reproduction. At this time, a holding circuit 12 disposed between the comparator 9 and the constant electric current source 11 for reproduction is not set to a holding mode, but is set to a sampling mode.

The control of the light intensity at a recording time will next be described. At this time, the holding circuit 12 is set to the holding mode and the power for reproduction is maintained by the electric current source 11 for reproduction to emit the light from the semiconductor laser 6. A detected electric current provided through the light-receiving element 7 and the amplifier 8 at this time is compared with a voltage $V_{REF2}$ for record by the comparator 9. The operation of an electric current source 13 for record and erasion in parallel to the electric current source 11 for reproduction is controlled in accordance with the comparing output to superimpose the electric current corresponding to the recording power on the semiconductor laser 6. Thus, the light intensity of the laser beam of the semiconductor laser 6 is maintained to have a power for record. At this time, a holding circuit 14 disposed between the comparator 9 and the electric current source 13 for record and erasion is set to the sampling mode. Further, a switching element 15 is in a state in which this switching element selects the side of this holding circuit 14 by a control signal 2. The semiconductor laser 6 is not turned on by a direct current when the recording power is controlled as mentioned above, which is the features of this structure. Namely, the electric current source 13 for record and erasion is modulated in accordance with a modulating signal at the recording time. However, at the time of the power control, the power control for record is also performed while the above modulation is performed by a pseudo modulating signal generated from a pseudo modulating signal generating circuit 16 oscillating at a frequency close to that in real write data. It is assumed that the power control continues for a time longer than a time interval for really passing through one sector composed of an ID section and a data section. A pseudo signal indicative of the ID section and the data section is generated from a pseudo ID/data section signal generating circuit 17 to control the operations of the switching elements 10 and 15. In a period in which the ID section is indicated, a power control mode for reproduction is set and a holding value of the holding circuit 12 is newly reset. The holding circuit 14 is set to a holding mode.

The control of the light intensity at an erasing time is approximately similar to that at the recording time. However, in this case, a reference voltage $V_{REF3}$ for erasion is selected as the reference voltage for the comparator 9. further, the operation of the electric current source 13 forr record and erasion is controlled through a holding circuit 18 and the switching element 15. At this time, no modulating operation by the pseudo modulating signal generating circuit 16 is performed, but the control by the pseudo ID/data section signal generating circuit 17 is performed.

FIG. 3 illustrates a timing chart showing such a control.

When the really recording or erasing operation is performed after such a control, the power for record or erasion to be superimposed on the power for reproduction is determined by a signal held by the holding circuit 14 or 18. Then, the laser beam is emitted from the semiconductor laser to perform the recording or erasing operation.

Figure 4:
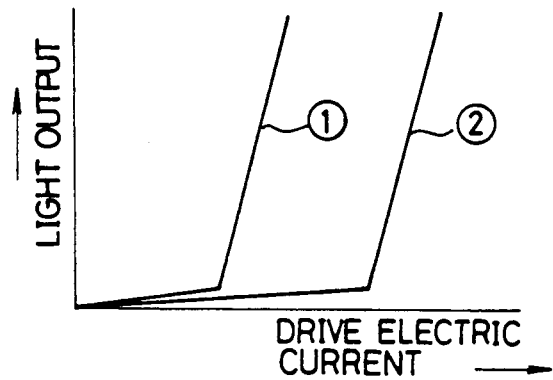
FIG. 4 is a characteristic graph showing the electric current and light output characteristics of a laser diode.
Figure 5:
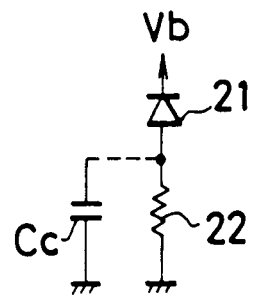
FIGS. 5 and 6 are circuit diagrams respectively showing examples of a photoelectric converter in a general laser diode drive unit.
Figure 6:
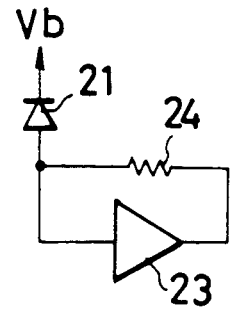
Figure 7:
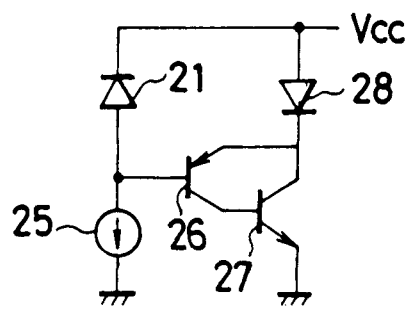
FIG. 7 is a circuit diagram showing an example of the general laser diode drive unit.

In a laser diode, as shown in FIG. 4, the electric current and light output characteristics are changed by the change in temperature as shown by marks ① and ② so that an electric current for starting the laser oscillation is greatly changed. Therefore, in a unit for driving the laser diode, a forward electric current of the laser diode is controlled such that a portion of the light output of the laser diode is monitored by a photodiode and a photovoltaic current generated by this photodiode is equal to a reference electric current. Otherwise, the forward electric current of the laser diode is controlled such that a voltage proportional to the above photovoltaic current is equal to a reference voltage. In this laser diode drive unit, a typical example of a circuit for detecting the photovoltaic current generated by the photodiode is shown in FIG. 5 in which a photodiode 21 and a resistor 22 are connected in series to each other. This typical example is also shown in FIG. 6 in which an inverted amplifier 23 and a resistor 24 constitute the above detecting circuit. An operational amplifier or a high speed amplifier is used as the inverted amplifier 23. In these figures, reference numeral Cc designates a junction capacitance of the photodiode 21 and reference numeral Vb designates a bias voltage. As shown in FIG. 7 for example, in the laser diode drive unit, the forward electric current of the laser diode 28 is controlled by a compound transistor composed of transistors 26 and 27 such that the photovoltaic current generated in the photodiode 21 is equal to a reference electric current of a reference electric current source 25. In this figure, reference numeral Vcc designates a voltage of a power source. Japanese Patent Application Laying Open (KOKAI) Nos. 63-78585, 63-78586 and 63-84181 disclose a structure in which the forward electric current of the laser diode is controlled by using the compound transistor such that the photovoltaic current generated in the photodiode is equal to the reference electric current, thereby constantly controlling the light output of the laser diode. Japanese Patent Application Laying Open (KOKAI) No. 60-229542 discloses a structure in which a temperature detecting circuit detects the temperature of the laser diode to control the electric current for starting the oscillation of the laser diode corresponding to the detected temperature and is added to a laser diode drive section.

The laser diode is often used as a light source for a laser printer, an optical disk apparatus, an optical communication device, etc. The laser diode drive unit for driving this laser diode is required to be operated at a high speed and be stably operated irrespective of the change in temperature, etc. However, in the laser diode drive apparatus using the circuit shown in FIG. 5, a high frequency component of the photovoltaic current of the photodiode 21 does not flow through the resistor 22 by the junction capacitor Cc of the photodiode 21. Therefore, in a high frequency region, the phase of the voltage between both terminals of the resistor 22 is delayed with respect to that of the photovoltaic current of the photodiode 21 so that the drive unit cannot be operated at a high speed. In the laser diode drive unit using the circuit shown in FIG. 6, when the operational amplifier is used as the inverted amplifier 23, the drive unit is not operated at a high speed. Further, when the high speed amplifier is used as the inverted amplifier 23, the drive unit is not stably operated at a low frequency such as that of a direct current. In the laser diode drive units shown in FIG. 7 and Japanese Patent Application Laying Open (KOKAI) Nos. 63-78585, 63-78586 and 63-84181, the photodiode is connected to a base of a transistor so that a phase delay of the electric current is caused by the capacitance of the photodiode and a base input resistance of the transistor. The electric current having the delayed phase becomes a base drive electric current of the transistor and is amplified by a compound transistor and then flows to the laser diode as it is. Accordingly, the operating speed of the circuit must be reduced to prevent the oscillation of the laser diode. Further, since the compound transistor is used, for example, when a radiation sensitivity of the photodiode is set to 0.02 mA/mW, a differential quantum efficiency of the laser diode is set to 0.6 mW/mA, an electric current gain of the compound transistor is set to 10,000, and the light output of the laser diode is set to 0.2 mW, the reference electric current is provided as follows.

$$0.2 \text{ mW} \times 0.02 \text{ mA/mW} = 4 \text{ } \mu A.$$

Accordingly, when the electric current and light output characteristics of the laser diode are changed by the change in temperature as shown in FIG. 4 and thereby the electric current for starting the oscillation of the laser diode is changed by 10 mA, the difference in electric current $$10 \text{ mA}/10,000 = 1 \text{ } \mu A$$

is needed between the reference electric current and the photovoltaic current since the electric current gain of the compound transistor is 10,000. Accordingly, when the light output 0.2 mW is generated, an error $1 \text{ } \mu A/4 \text{ } \mu A = 0.25 = 25\%$ is caused. Therefore, the light output of the laser diode cannot be constantly held by the change in temperature.

In the laser diode drive unit shown in Japanese Patent Application Laying Open (KOKAI) No. 60-229542, it is necessary to dispose the temperature detecting circuit and the drive unit cannot correspond to the change in temperature characteristics by deterioration of the laser diode, etc.

An optical disk apparatus in one embodiment of the present invention will next be described with reference to FIGS. 8 to 11. In the optical disk apparatus of both the WO and MO types, a semiconductor laser 121 is used as a light source of an optical pickup and is connected to an electric power having a voltage Vcc. A photodiode 122 functions as a light-receiving element for receiving a portion of a laser beam emitted from this semiconductor laser 121 and monitoring an intensity of the received light. The photodiode 122 is connected to a circuit portion of a reverse bias voltage Vb. The semiconductor laser 121 is connected to a wide band electric current amplifier 123 which also includes a direct current for flowing a drive electric current If through the semiconductor laser. A detecting resistor R is connected between the photodiode 122 and the ground. A shunting electric current $I_1$ of a photovoltaic electric current Is proportional to the light intensity of the semiconductor laser 121 detected by this photodiode 122 flows through an impedance converter 124. This impedance converter 124 is connected to the photodiode 122 through a capacitor C. This impedance converter 124 is set to have a low input impedance and a high output impedance. A first voltage-current converter 125 inputs thereto a voltage $V_1$ corresponding to an electric current $I_2$ flowing through the detecting resistor R and provided by subtracting the shunting electric current $I_1$ from the photovoltaic electric current Is. This first voltage-current converter 125 is connected to the photodiode 122 in parallel to the impedance converter 124. An output electric current $I_3$ of the impedance converter 124 and an output electric current $I_4$ of the voltage-current converter 125 are inputted to an electric current adder 126. An added electric current $I_5$ of this electric current adder 126 is inputted to an electric current adder 127 together with a reference electric current $I_R$. An added electric current $I_6$ of this electric current adder 127 becomes a command signal indicative of a luminous level with respect to the semiconductor laser 121 and is inputted to the wide band electric current amplifier 123. Namely, the impedance converter 124 and the first voltage-current converter 125 are feedback-connected between the photodiode 122 and the wide band electric current amplifier 123 connected to the semiconductor laser 121 by utilizing the electric current adders 126 and 127, thereby forming a wide band photoelectric negative feedback loop 128.

A differential amplifier 129 inputs a reference voltage $V_R$ and the voltage $V_1$ corresponding to the electric current $I_2$ flowing through the detecting resistor R. An output voltage $V_2$ of this differential amplifier 129 is inputted to a second voltage-current converter 130. This second voltage-current converter 130 outputs the reference electric current $I_R$ for the electric current adder 127. Namely, the differential amplifier 129 and the second voltage-current converter 130 are feedback-connected between the photodiode 122 and the wide band electric current amplifier 123 connected to the semiconductor laser 121 by utilizing the electric current adder 127, thereby forming a low region photoelectric negative feedback loop 131.

The wide band photoelectric negative feedback loop 128 and the low region photoelectric negative feedback loop 131 form a circuit 132 for driving the semiconductor laser at a high speed.

In such a construction, an input electric current $I_6$ with respect to the wide band electric current amplifier 123 for flowing the drive electric current If through the semiconductor laser 121 is represented as $I_6 = I_R - I_5$ by the reference electric current $I_R$ proportional to the input voltage $V_2$ of the second voltage-current converter 130 and the electric current $I_5$ added by the electric current adder 126. The electric current $I_3$ constituting one component of the electric current $I_5$ is set to be equal to the electric current $I_1$ by the impedance converter 124. The electric current $I_4$ constituting another component of the electric current $I_5$ is set to be equal to the electric current $I_2$ flowing through the detecting resistor R by the voltage-current converter 125. Accordingly, the electric current $I_5$ inputted to the electric current adder 127 becomes a sum of the electric currents $I_1$ and $I_2$, i.e., the photovoltaic electric current Is monitored by the light-receiving element 122. Namely, at the reproducing time, the light intensity of the semiconductor laser 121 is detected by the light-receiving element 122. The photovoltaic electric current Is indicative of a signal corresponding to the detected light intensity is fed back to the wide band electric current amplifier 123 in relation to the luminous level command signal $I_6$ for the electric current adder 127 by the wide band photoelectric negative feedback loop 128 provided with the impedance converter 124 and the voltage-current converter 125 at a speed higher than that provided by a minimum pulse width of reproduced data. Thus, the light intensity of the laser beam from the semiconductor laser 121 is controlled to be stable as that for reproduction. A lower frequency component is fed back to the wide band electric current amplifier 123 in relation to the luminous level command signal $I_6$ for the electric current adder 127 by the lower region photoelectric negative feedback loop 132 provided with the differential amplifier 129 and the second voltage-current converter 130 at the speed higher than that provided by the minimum pulse width of the reproduced data. Thus, the light intensity of the laser beam from the semiconductor laser 121 is controlled to be stable as that for reproduction. Accordingly, the feedback and stabilizing controls are performed by the wide band and low region photoelectric negative feedback loops 128 and 131 at the speed higher than that provided by the minimum pulse width of the reproduced data. Therefore, the stabilizing control can be performed without using a ¼ wavelength plate before the semiconductor laser 121 has an influence on the change in return light, especially, reflected light by the existence and non-existence of the data on an optical disk. Accordingly, the optical disk apparatus can be constructed as that of both the WO and MO types without using the ¼ wavelength plate so that the parts relating to the ¼ wavelength plate can be omitted.

The above description is made at the reproducing time, but is similarly made at the erasing time.

Figure 8:
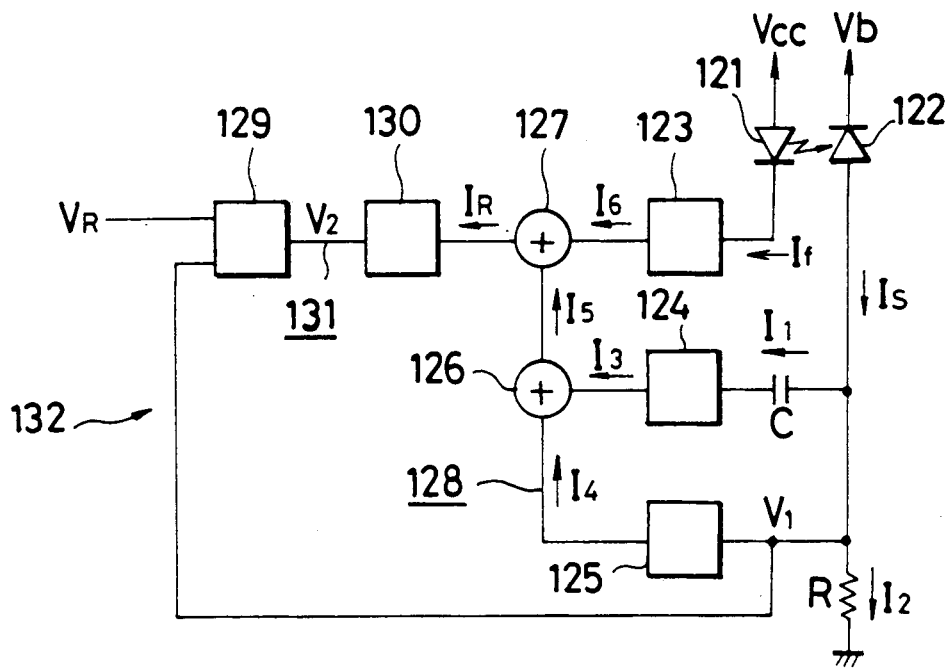
FIG. 8 is a block diagram showing an optical disk apparatus in one embodiment of the present invention.
Figure 9:
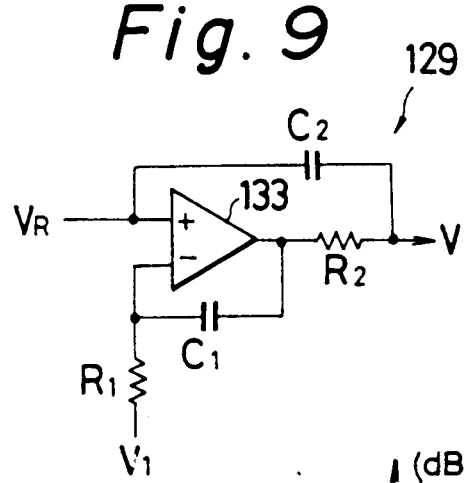
FIG. 9 is a circuit diagram of a differential amplifier.
Figure 10:
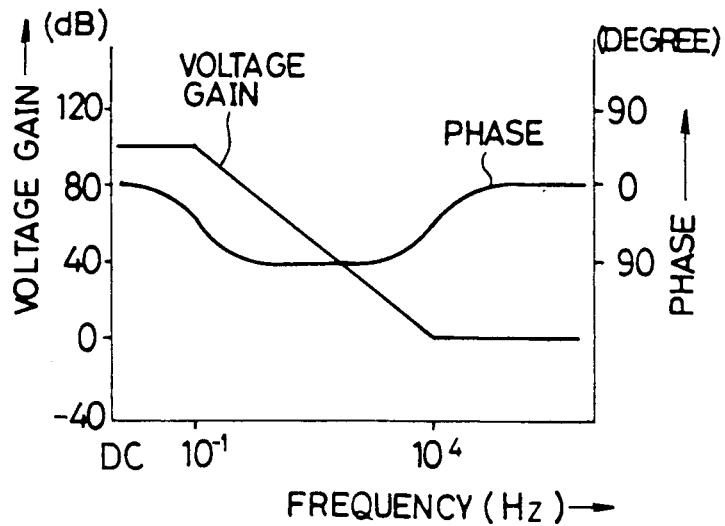
FIG. 10 is a graph showing the frequency characteristics with respect to a voltage gain and a phase.

The differential amplifier 129 shown in FIG. 8 is composed of an operational amplifier 133 as shown in FIG. 9 for example. This operational amplifier 133 has a + input terminal for inputting the reference voltage $V_R$ and a − input terminal for inputting the input voltage $V_1$ through a resistor $R_1$. A capacitor $C_1$, a resistor $R_2$ and a capacitor $C_2$ are connected between the input and output terminals of this operational amplifier 133. FIG. 10 shows the frequency characteristics (voltage gain and phase) of the differential amplifier 129 in the low region photoelectric negative feedback loop 131.

Figure 11:
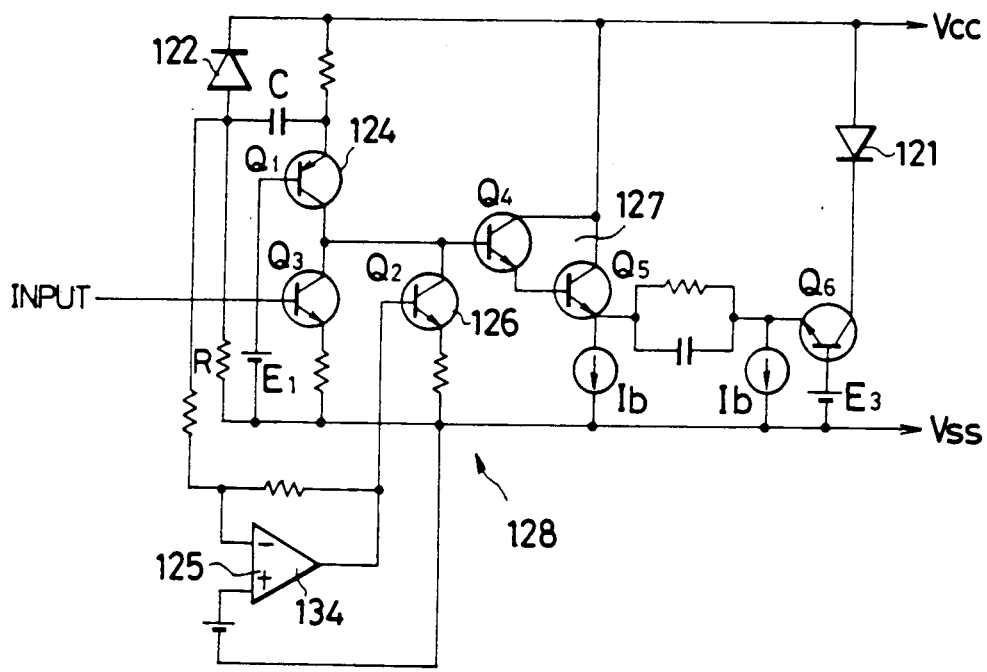
FIG. 11 is a circuit diagram of a wide band photoelectric negative feedback loop.

The wide band photoelectric negative feedback loop 128 shown in FIG. 8 is constructed as shown in FIG. 11 for example. First, the impedance converter 124 is composed of a transistor $Q_1$ having a base connected to a bias power source $E_1$ and an emitter connected to the photodiode 122 through a capacitor C. The first voltage-current converter 125 is composed of an operational amplifier 134 having a − input terminal for inputting the input voltage $V_1$ corresponding to the electric current flowing through the detecting resistor R and a + input terminal for inputting a bias voltage $E_3$. A collector of the transistor $Q_1$ and an output terminal of this operational amplifier 134 are respectively connected to a collector and a base of a transistor $Q_2$ as the electric current adder 126. The collector of the transistor $Q_1$ is connected to a transistor $Q_3$ having a base for inputting an input signal INPUT=$I_R$. The collectors of these transistors $Q_3$ and $Q_2$ are connected to transistors $Q_4$ and $Q_5$ Darlington-connected to each other as the electric current adder 127. This transistor $Q_5$ is connected to the wide band electric current amplifier 123 composed of a bias electric current source Ib, a transistor $Q_6$, a bias power source $E_3$, etc.

Figure 12:
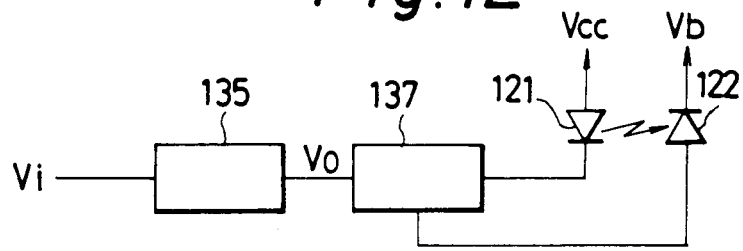
FIG. 12 is a block diagram showing the optical disk apparatus in one embodiment of the present invention.
Figure 13:
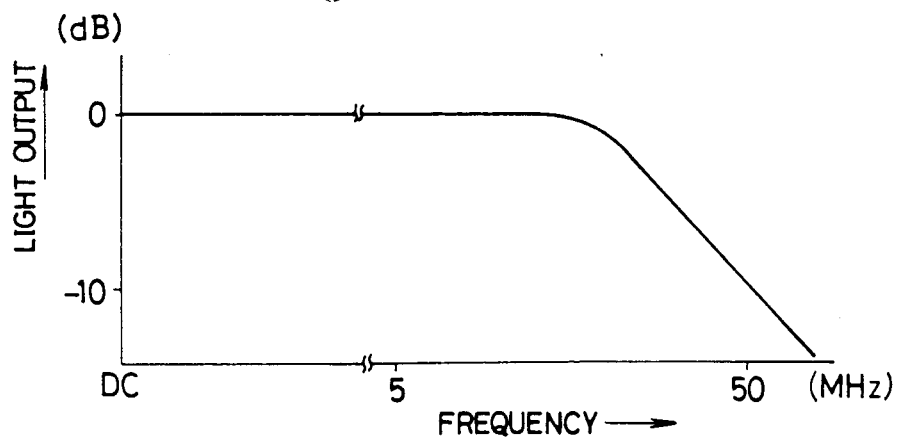
FIG. 13 is a graph showing the frequency characteristics of a light output.

The embodiment of the present invention will be further described in detail with reference to FIGS. 12 to 14 in consideration of the recording time. A luminous level command signal Vi corresponding to each of the recording, erasing and reproducing times is inputted to the photoelectric negative feedback loop composed of the above-mentioned semiconductor laser 121, the photodiode 122 and the semiconductor laser high speed drive circuit 132 as a signal Vo through a circuit 135 for correcting high frequency region characteristics. The high frequency region characteristics in the photoelectric negative feedback loop are compensated by passing this signal through the high frequency region characteristics correcting circuit 135. Namely, as mentioned above, the photoelectric negative feedback loop formed for reproduction or erasion has characteristics in which the light output level is lowered as the frequency is increased as shown by the frequency characteristics in FIG. 13. Accordingly, this loop cannot be used as it is at the recording time when high frequency modulation is performed in accordance with the recorded data.

Therefore, in this embodiment, the high frequency region characteristics correcting circuit 135 is disposed to adjust the waveform of an optical signal according to a series of pulses of the recorded data at the recording time and the light intensity for record such that the high frequency region characteristics are compensated. Thereafter, the adjusted signal is provided as an input for the semiconductor laser high speed drive circuit 132 in the photoelectric negative feedback loop and becomes the real luminous level command signal at the recording time. Thus, the same semiconductor laser high speed drive circuit 132 can be commonly used to adjust and stabilize the light intensity in each of the reproducing, erasing and recording operations.

Figure 14:
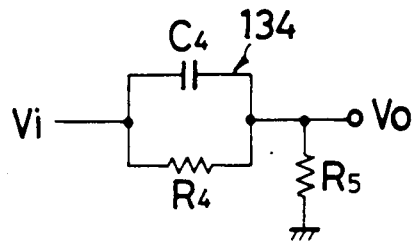
FIG. 14 is a circuit diagram of a circuit for correcting the high frequency region characteristics.

In the high frequency region characteristics correcting circuit 134, a resistor $R_5$ and a parallel circuit composed of a capacitor $C_4$ and a resistor $R_4$ are connected to each other like a filter as shown in FIG. 14 for example.

As mentiooned above, in accordance with the present invention, the light intensity of the laser beam from the semiconductor laser is detected by the light-receiving element at the reproducing or erasing time of data. A signal corresponding to this detected light intensity is fed back at a high speed as a luminous level command signal for the wide band electric current amplifier by the wide band photoelectric negative feedback loop composed of the impedance converter and the first voltage-current converter on one hand, and by the low region photoelectric negative feedback loop composed of the differential amplifier and the second voltage-current converter on the other hand. Accordingly, the stabilizing operation can be performed to provide the light intensity for reproduction or erasion at a speed higher than that provided by the minimum pulse width of the reproduced data. Thus, the stabilizing control can be performed without using a ¼ wavelength plate before the semiconductor laser has an influence on the change in return light, especially, the change in reflected light by the existence and non-existence of the data on the optical disk. Therefore, the optical disk apparatus can be constructed as that of both the WO and MO types without using the ¼ wavelength plate so that the parts relating to the ¼ wavelength plate can be omitted.

The photoelectric negative feedback loop formed for reproduction or erasion in accordance with the present invention has the characteristics in which the light output level is lowered as the frequency is increased. Accordingly, this loop cannot be used as it is at the recording time when the high frequency modulation is performed in accordance with the recorded data. However, in accordance with the present invention, the high frequency region characteristics correcting circuit is disposed to adjust the waveform of an optical signal according to a series of pulses of the recorded data at the recording time and the light intensity for record such that the high frequency region characteristics are compensated. Thereafter, the adjusted signal can be inputted as a luminous level command signal to the photoelectric negative feedback loop. Thus, the same circuit construction of the photoelectric negative feedback loop for reproduction and erasion can be commonly used. Further, the light intensity can be controlled to be suitable when the loop is operated at the really recording time, etc.

Figure 16:
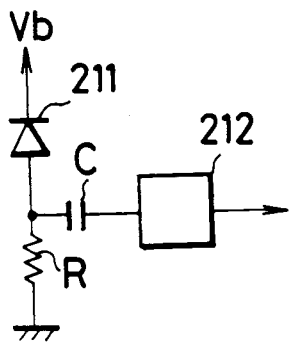
FIG. 16 is a circuit diagram showing a photoelectric converter in the embodiment in FIG. 15.

FIG. 16 shows the construction of a photoelectric converter in a laser diode drive unit in one embodiment of the present invention.

This photoelectric converter is constructed by a photodiode 211, a resistor R, a capacitor C and an impedance converter 212. The photodiode 211 monitors a portion of a light output of a driven laser diode. A photovoltaic current Is generated by this photodiode 211 is proportional to the light output of the driven laser diode and flows through the resistor R and the capacitor C. An electric current Ic flowing through the capacitor C is outputted through the impedance converter 212. When an input impedance of the impedance converter 212 is Ri, an output impedance of the impedance converter 212 is Ro, and the electric current flowing through the resistor R is Ir, the following formulas are formed.

$$Is = Ir + Ic$$

$$R \times Ir = Ri \times Ic + Ic/jwC$$

Therefore, $$Ic = Is/(1 + Ri/R + Ic/jwCR)$$

When a transistor having a base connected to the ground for example is used as the impedance converter 212, an inequality $Ri < 20 \, \Omega$ is formed so that a relation $R >> Ri$ can be easily realized. Accordingly, $$Ic = \frac{jwCR}{1 + jwCR} \cdot Is$$

$$Ir = Is/(1 + jwCR)$$

Therefore, the impedance converter 212 becomes an electric current source for supplying a high frequency component of the photovoltaic current Is and the voltage between both terminals of the resistor R becomes a voltage proportional to the photovoltaic current Is. Since the impedance converter 212 does not amplify the electric current, no phase delay of the electric current by the impedance converter 212 is caused. Further, since the junction capacitance of the photodiode 211 is approximately less than 20 pF, it is possible to set the capacitance of the capacitor C to a large value sufficiently greater than 20 pF such as C=1000 pF for example so that there is no phase delay of the electric current by the junction capacitance of the photodiode 211. An operational amplifier having a sufficient direct current stability can be used with respect to a low frequency component of the photovoltaic current Is so that it is possible to perform various processings having a stability with respect to the low frequency. In this embodiment using such a photoelectric converter, there is no influence on the phase delay of the electric current by the junction capacitance of the photodiode 211 and the stability with respect to the low frequency is improved so that the laser diode drive unit can be operated at a high speed.

Figure 15:
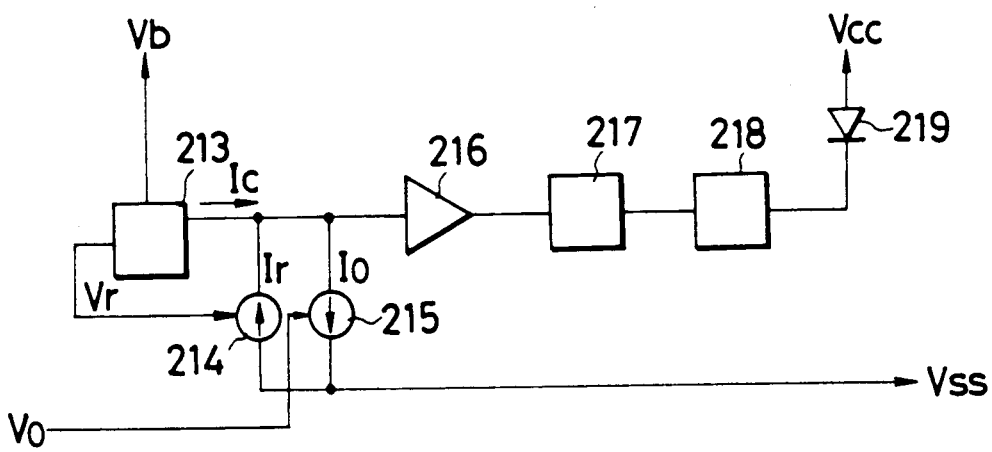
FIG. 15 is a block diagram showing another embodiment of the present invention.

FIG. 15 shows the entire construction of the laser diode drive unit in the above embodiment of the present invention.

A photoelectric converter 213 is constructed by the photoelectric converter in FIG. 16 and outputs the high frequency component Ic of the photovoltaic current Is from the impedance converter 212. The photoelectric converter 213 converts the low frequency component Ir of the photovoltaic current Is to a voltage Vr by the resistor R and outputs this converted voltage. This output voltage Vr of the photoelectric converter 213 is again converted to the electric current Ir by a voltage-current converter 214 and is added to the output electric current Ic of the photoelectric converter 213. On the other hand, a reference signal voltage Vo is converted to an electric current Io by a voltage-current converter 215 and an electric current Io−(Ir+Ic) is inputted to an electric current amplifier 216. This electric current amplifier 216 is constructed by a compound transistor, etc. for example and has an output impedance less than several $\Omega$ and amplifies and outputs the input electric current Io−(Ir+Ic). The output electric current of this electric current amplifier 216 leads by a phase lead circuit 217 with respect to phase and is inputted to an impedance converter 218. The impedance converter 218 has a small input impedance and a large output impedance. A forward electric current of a driven laser diode 219 is controlled by an output electric current of the impedance converter 218 and a portion of a light output of the laser diode 219 is monitored by the photoelectric converter 213. Accordingly, these constructional portions 213 to 219 construct a photoelectric negative feedback loop and control the light output of the laser diode 219 to be proportional to the reference signal voltage Vo.

In this embodiment, the electric current amplifier 215 is generally constructed by electric current amplifying elements at plural stages and the phase delay amount is increased as the number of stages of the electric current amplifying elements is increased with respect to the high frequency component. Normally, the electric current amplifying elements of the electric current amplifier 215 are set at about two stages with a view to the increase in phase delay amount by the increase in stage number and the increase in open loop gain of the photoelectric negative feedback loop. However, in this case, there is also a problem with respect to the phase delay amount by the increase in stage number of the electric current amplifying elements in the electric current amplifier 215 to operate the laser diode drive unit at a high speed. In this embodiment, this phase delay amount can be reduced by using the phase lead circuit 217 so that it is possible to operate the photoelectric negative feedback loop at a high speed.

As mentioned above, in accordance with the embodiment of the present invention shown in FIGS. 15 and 16, a laser diode drive unit comprises photoelectric converting means for detecting a photovoltaic current proportional to a light output of a driven laser diode by separating this photovoltaic current into high and low frequency components; a photoelectric negative feedback loop for controlling a forward electric current of the laser diode such that a sum of the high and low frequency components of the photovoltaic current generated by the photoelectric converting means is equal to a reference signal electric current; and phase compensating means for compensating a phase of the forward electric current of the laser diode. Therefore, the laser diode drive unit can be operated at a high speed by the photoelectric converting means and the phase compensating means.

Further, in accordance with the embodiment of the present invention, a laser diode drive unit comprises photoelectric converting means for detecting a photovoltaic current proportional to a light output of a driven laser diode by separating this photovoltaic current into high and low frequency components; a photoelectric negative feedback loop for controlling a forward electric current of the laser diode such that a sum of the high and low frequency components of the photovoltaic current generated by the photoelectric converting means is equal to a reference signal electric current; and control means for controlling the reference signal electric current such that a voltage proportional to the low frequency component of the photovoltaic current generated by the photoelectric converting means is equal to a reference signal voltage. Therefore, the laser diode drive unit is stably operated with respect to a low frequency caused by the change in temperature, etc. and it is possible to operate the laser diode drive unit at a high speed.

Figure 17:
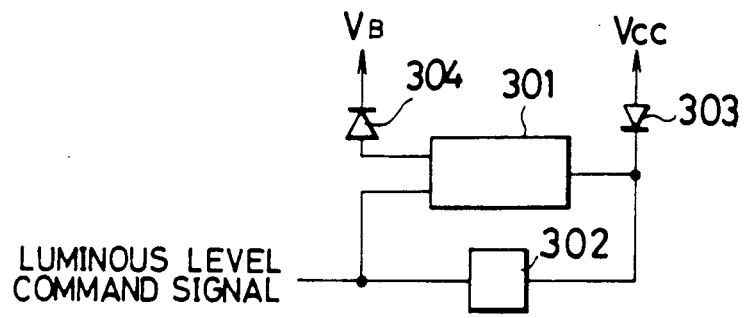
FIG. 17 is a block diagram showing a semiconductor laser controller in one embodiment of the present invention.

FIG. 17 shows a semiconductor laser controller in one embodiment of the present invention.

A command signal indicative of a luminous level is inputted to a comparing amplifier 301 and an electric current converter 302 and a portion of a light output of a driven semiconductor laser 303 is monitored by a light-receiving element 304. The comparing amplifier 301, the semiconductor laser 303 and the light-receiving element 304 form a photoelectric negative feedback loop. The comparing amplifier 301 compares the luminous level command signal and a light-receiving signal proportional to a photovoltaic current (proportional to the light output of the semiconductor laser 303) induced in the light-receiving element 304. The comparing amplifier 301 then controls a forward electric current of the semiconductor laser 303 by this compared result such that the light-receiving signal is equal to the luminous level command signal. The electric current converter 302 outputs an electric current preset in accordance with the luminous level command signal such that the light-receiving signal is equal to the luminous level command signal. This preset electric current is an electric current preset on the basis of light output and forward electric current characteristics of the semiconductor laser 303, a coupling coefficient between the light-receiving element 304 and the semiconductor laser 303, and light input and light-receiving signal characteristics of the light-receiving element 304. A sum of an output electric current of this electric current converter 302 and a control electric current outputted from the comparing amplifier 301 becomes the forward electric current of the semiconductor laser 303.

When a cross frequency in an open loop of the above photoelectric negative feedback loop is $f_0$ and a DC gain is 10,000, step responsive characteristics of the light output $P_{out}$ of the semiconductor laser 303 can be approximately provided by the following formula.

$$P_{out} = PL + (PS - PL) \exp(-2\pi f_0 t)$$

where PL designates the light output at $t = \infty$ and PS designates a light amount set by the electric current converter 302.

Since the DC gain in the open loop of the photoelectric negative feedback loop is set to 10,000, the PL is considered to be equal to the set light amount when an allowable range of a set error is less than 0.1%.

Accordingly, if the light amount PS set by the electric current converter 302 is equal to the PL, the light output of the semiconductor laser 303 is instantly equal to the PL. Even when the PS is varied by 5% by a disturbance, etc., the error with respect to a set value of the light output of the semiconductor laser 303 becomes less than 0.4% after 10 ns if the $f_0$ is about 40 MHZ.

To set to a value less than 0.4% the error in entire light amount (an integral value $\int P_{out}$ of the light output) from a time immediately after the light output of the semiconductor laser 303 is changed until a set time $\tau_0$ has passed, it is sufficient that the cross frequency of the photoelectric negative feedback loop is greater than 40 MHZ when the set time $\tau_0 = 50$ ns. Such a cross frequency value can be easily realized.

Further, in this embodiment, the output electric current of the electric current converter 302 is added to the control electric current of the photoelectric negative feedback loop. When the electric current converter 302 is connected in parallel to the semiconductor laser 303, the operation of the semiconductor laser 303 can be controlled by the difference in electric current between the output electric current of the electric current converter 302 and the control electric current of the photoelectric negative feedback loop.

As mentioned above, in accordance with this embodiment, a semiconductor laser controller accurately operated at a high speed and having a high resolution can be provided.

Figure 20:
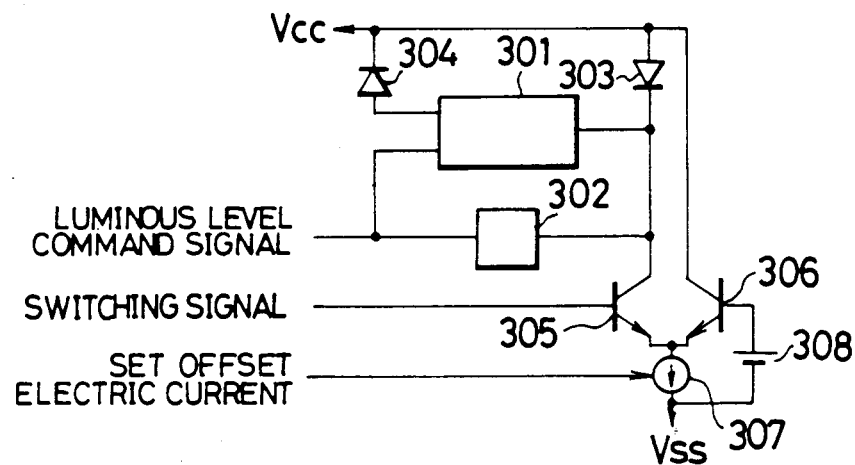
FIG. 20 is a block diagram showing the semiconductor laser controller in another embodiment of the present invention.

FIG. 20 shows the semiconductor laser controller in another embodiment of the present invention.

A luminous level command signal is inputted to a comparing amplifier 301 and an electric current converter 302 and a portion of a light output of a driven semiconductor laser 303 is monitored by a light-receiving element 304. The comparing amplifier 301, the semiconductor laser 303 and the light-receiving element 304 form a photoelectric negative feedback loop. The comparing amplifier 301 compares the luminous level command signal and a light-receiving signal proportional to a photovoltaic current (proportional to the light output of the semiconductor laser 303) induced in the light-receiving element 304. The comparing amplifier 301 then controls a forward electric current of the semiconductor laser 303 by this compared result such that the light-receiving signal is equal to the luminous level command signal. The electric current converter 302 outputs an electric current preset in accordance with the luminous level command signal such that the light-receiving signal is equal to the luminous level command signal. This preset electric current is an electric current preset on the basis of light output and forward electric current characteristics of the semiconductor laser 303, a coupling coefficient between the light-receiving element 304 and the semiconductor laser 303, and light input and light-receiving signal characteristics of the light-receiving element 304. Transistors 305, 306, an electric current source 307 and a bias power source 308 constitute a switching circuit. A switching signal is inputted to a base of the transistor 305 at a timing for emitting a light from the semiconductor laser 303. When this switching signal is not inputted, the transistor 306 is turned on and the transistor 305 is turned off by a bias voltage of the bias power source 308. Accordingly, no electric current (offset electric current) is supplied from the electric current source 307 to the semiconductor laser 303 so that no light is emitted from the semiconductor laser 303. When the switching signal is inputted to the base of the transistor 305, the transistor 305 is turned on and the transistor 306 is turned off. The electric current is not supplied from the electric current source 307 to the semiconductor laser 303 and the light is emitted from the semiconductor laser 303. In this case, the semiconductor laser 303 is controlled by a sum of a drive electric current provided by the switching circuit, an output electric current of the electric current converter 302 and a control electric current of the photoelectric negative feedback loop.

When a cross frequency in an open loop of the above photoelectric negative feedback loop is $f_0$ and a DC gain is 10,000, step responsive characteristics of the light output $P_{out}$ of the semiconductor laser 303 can be approximately provided by the following formula.

$$P_{out} = PL + (PS - PL) \exp(-2\pi f_0 t)$$

where PL designates the light output at $t = \infty$ and PS designates a light amount set by a sum of the output electric current of the electric current converter 302 and the drive electric current of the switching circuit.

Since the DC gain in the open loop of the photoelectric negative feedback loop is set to 10,000, the PL is considered to be equal to the set light amount when an allowable range of a set error is less than 0.1%.

Figure 22:
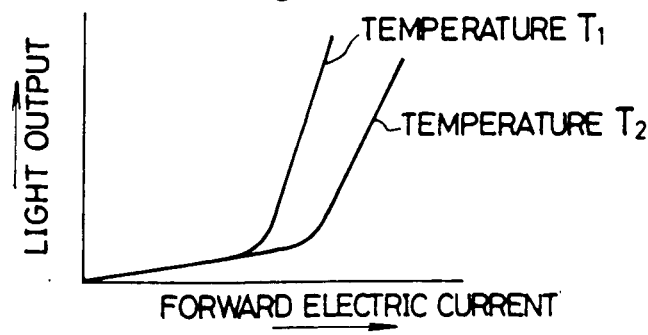
FIG. 22 is a characteristic graph showing the light output and electric current characteristics of a semiconductor laser.

Accordingly, if the light amount PS set by the electric current converter 302 is equal to the PL, the light output of the semiconductor laser 303 is instantly equal to the PL. The switching circuit is operated at a high speed until the drive electric current value provided by the switching circuit. Accordingly, the switching circuit rises at a high speed irrespective of a rising speed of the electric current converter 302. Further, in general, in the light output and electric current characteristics of the semiconductor laser, as shown in FIG. 22, the semiconductor laser does not oscillate until a threshold electric current so that there is almost no deterioration of a quenching ratio by the offset electric current. Even when the PS is varied by 5% by a disturbance, etc., the error with respect to a set value of the light output of the semiconductor laser 303 becomes less than 0.4% after 10 ns if the $f_0$ is about 40 MHZ.

To set to a value less than 0.4% the error in entire light amount (an integral value $\int P_{out}$ of the light output) from a time immediately after the light output of the semiconductor laser 303 is changed until a set time $\tau_0$ has passed, it is sufficient that the cross frequency of the photoelectric negative feedback loop is greater than 40 MHZ when the set time $\tau_0 = 50$ ns. Such a cross frequency value can be easily realized.

Figure 18:
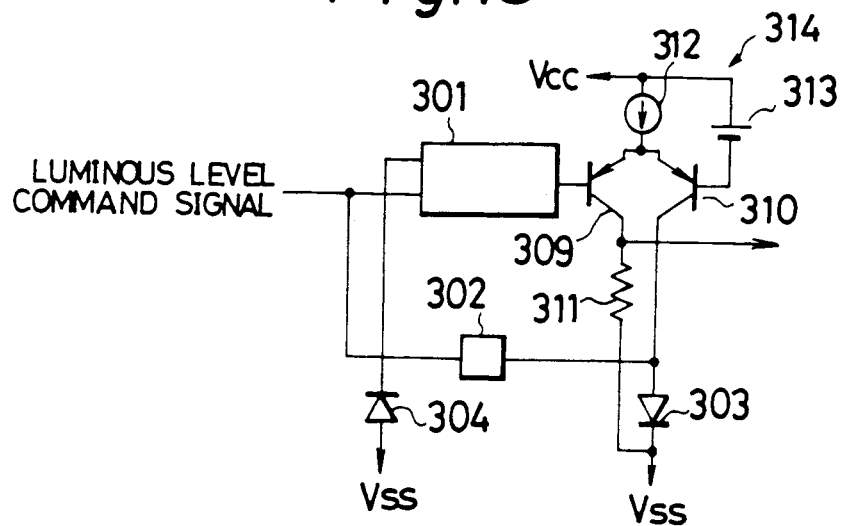
FIGS. 18 and 19 are block diagrams showing the semiconductor laser controller in another embodiments of the present invention.

FIG. 18 shows the semiconductor laser controller in another embodiment of the present invention.

A command signal indicative of a luminous level is inputted to a comparing amplifier 301 and an electric current converter 302 and a portion of a light output of a driven semiconductor laser 303 is monitored by a light-receiving element 304. The comparing amplifier 301, the semiconductor laser 303 and the light-receiving element 304 form a photoelectric negative feedback loop. Transistors 309, 310, an electric current source 312 and a bias power source 313 constitute a differential amplifier 314. The comparing amplifier 301 compares the luminous level command signal and a light-receiving signal proportional to a photovoltaic current (proportional to the light output of the semiconductor laser 303) induced in the light-receiving element 304. The comparing amplifier 301 then controls a forward electric current of the semiconductor laser 303 through the differential amplifier 314 by this compared result such that the light-receiving signal is equal to the luminous level command signal. The electric current converter 302 outputs an electric current preset in accordance with the luminous level command signal such that the light-receiving signal is equal to the luminous level command signal. This preset electric current is an electric current preset on the basis of light output and forward electric current characteristics of the semiconductor laser 303, a coupling coefficient between the light-receiving element 304 and the semiconductor laser 303, and light input and light-receiving signal characteristics of the light-receiving element 304. A sum of an output electric current of this electric current converter 302 and a control electric current outputted from the differential amplifier 314 becomes the forward electric current of the semiconductor laser 303.

When a cross frequency in an open loop of the above photoelectric negative feedback loop is $f_0$ and a DC gain is 10,000, step responsive characteristics of the light output $P_{out}$ of the semiconductor laser 303 can be approximately provided by the following formula.

$$P_{out} = PL + (PS - PL) \exp(-2\pi f_0 t)$$

where PL designates the light output at $t = \infty$ and PS designates a light amount set by the electric current converter 302.

Since the DC gain in the open loop of the photoelectric negative feedback loop is set to 10,000, the PL is considered to be equal to the set light amount when an allowable range of a set error is less than 0.1%.

Accordingly, if the light amount PS set by the electric current converter 302 is equal to the PL, the light output of the semiconductor laser 303 is instantly equal to the PL. In this case, since $P_{out} = PL$, the output of the comparing amplifier 301 is not changed. Namely, the electric current value of a resistor 311 is not changed so that the voltage between both terminals of the resistor 311 is not changed. However, when the PS is varied by a disturbance, etc., an insufficient electric current by the electric current converter 302 is supplied by the comparing amplifier 301 in the forward direction of the semiconductor laser 303. This electric current value becomes a value provided by subtracting the electric current flowing through the resistor 311 from an electric current set by the electric current source 312. Accordingly, the resistor 311 detects the control electric current of the semiconductor laser 303. Therefore, the electric current value corresponding to an error in conversion of the electric current converter 302 can be detected by measuring the voltage between both terminals of the resistor 311.

Figure 19:
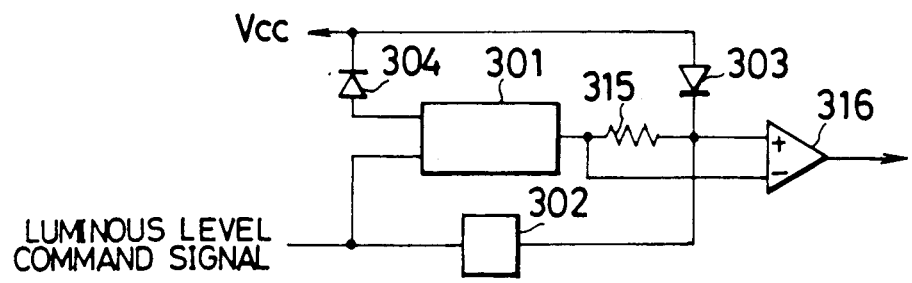

FIG. 19 shows the semiconductor laser controller in another embodiment of the present invention.

In this embodiment, an output electric current of the comparing amplifier 301 in the embodiment of FIG. 18 is supplied to the semiconductor laser 303 through a resistor 315 for detecting the electric current. Thus, the voltage between both terminals of the resistor 315 for detecting the electric current is taken out by a differential amplifier 316. Accordingly, the control electric current of the photoelectric negative feedback loop is detected by the resistor 315 for detecting the electric current and is taken out through the differential amplifier 316.

Figure 21:
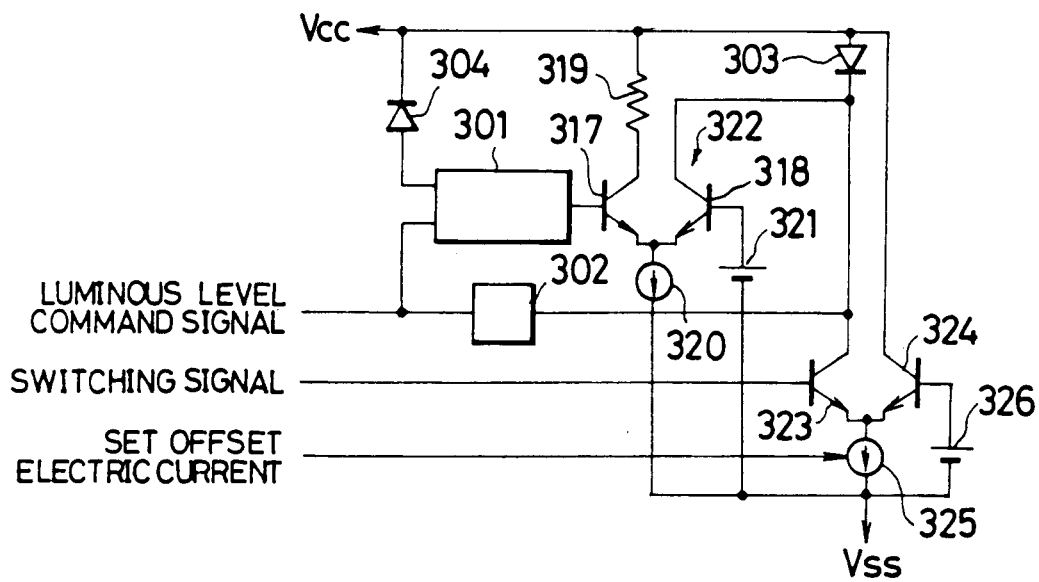
FIG. 21 is a block diagram showing the semiconductor laser controller in another embodiment of the present invention.

FIG. 21 shows the semiconductor laser controller in another embodiment of the present invention.

A command signal indicative of a luminous level is inputted to a comparing amplifier 301 and an electric current converter 302 and a portion of a light output of a driven semiconductor laser 303 is monitored by a light-receiving element 304. The comparing amplifier 301, the semiconductor laser 303 and the light-receiving element 304 form a photoelectric negative feedback loop. Transistors 317, 318, an electric current source 320 and a bias power source 321 constitute a differential amplifier 322. The comparing amplifier 301 compares the luminous level command signal and a light-receiving signal proportional to a photovoltaic current (proportional to the light output of the semiconductor laser 303) induced in the light-receiving element 304. The comparing amplifier 301 then controls a forward electric current of the semiconductor laser 303 through the differential amplifier 322 by this compared result such that the light-receiving signal is equal to the luminous level command signal. Transistors 323, 324, an electric current source 325 and a bias power source 326 constitute a switching circuit.

The electric current converter 302 outputs an electric current less by an electric current value (offset electric current value) set by the electric current source 325 than an electric current preset in accordance with the luminous level command signal such that the light-receiving signal is equal to the luminous level command signal. This preset electric current is an electric current preset on the basis of light output and forward electric current characteristics of the semiconductor laser 303, a coupling coefficient between the light-receiving element 304 and the semiconductor laser 303, and light input and light-receiving signal characteristics of the light-receiving element 304.

A switching signal is inputted to a base of a transistor 323 at a timing for emitting a light from the semiconductor laser 303. When this switching signal is not inputted, the transistor 324 is turned on and the transistor 323 is turned off by a bias voltage of the bias power source 326. Accordingly, no electric current is supplied from the electric current source 325 to the semiconductor laser 303 so that no light is emitted from the semiconductor laser 303. When the switching signal is inputted to the base of the transistor 323, the transistor 323 is turned on and the transistor 324 is turned off. The electric current is not supplied from the electric current source 325 to the semiconductor laser 303 and the light is emitted from the semiconductor laser 303. In this case, the operation of the semiconductor laser 303 is controlled by a sum of a drive electric current provided by the switching circuit, an output electric current of the electric current converter 302 and a control electric current of the photoelectric negative feedback loop.

When a cross frequency in an open loop of the above photoelectric negative feedback loop is $f_0$ and a DC gain is 10,000, step responsive characteristics of the light output $P_{out}$ of the semiconductor laser 303 can be approximately provided by the following formula.

$$P_{out} = PL + (PS - PL) \exp(-2\pi f_0 t)$$

where PL designates the light output at $t = \infty$ and PS designates a light amount set by a sum of the output electric current of the electric current converter 302 and the drive electric current of the switching circuit.

Since the DC gain in the open loop of the photoelectric negative feedback loop is set to 10,000, the PL is considered to be equal to the set light amount when an allowable range of a set error is less than 0.1%.

Accordingly, if the light amount PS set by the electric current converter 302 is equal to the PL, the light output of the semiconductor laser 303 is instantly equal to the PL. In this case, since $P_{out} = PL$, the output of the comparing amplifier 301 is not changed. Namely, the electric current value of a resistor 319 is not changed so that the voltage between both terminals of the resistor 319 is not changed. However, when the PS is varied by a disturbance, etc., an insufficient electric current by the electric current converter 302 is supplied by the comparing amplifier 301 in the forward direction of the semiconductor laser 303. This electric current value becomes a value provided by subtracting the electric current flowing through the resistor 319 from an electric current set by the electric current source 320. Accordingly, the resistor 319 detects the control electric current of the semiconductor laser 303. Therefore, the electric current value corresponding to an error in conversion of the electric current converter 302 can be detected by measuring the voltage between both terminals of the resistor 319. The switching circuit is operated at a high speed until the drive electric current value provided by the switching circuit. Accordingly, the switching circuit rises at a high speed irrespective of a rising speed of the electric current converter 302. Further, in general, in the light output and electric current characteristics of the semiconductor laser, as shown in FIG. 22, the semiconductor laser does not oscillate until a threshold electric current so that there is almost no deterioration of a quenching ratio by the offset electric current.

As mentioned above, in accordance with the present invention shown in FIGS. 17 to 21, a semiconductor laser controller comprises a photoelectric negative feedback loop for detecting a light output of a driven semiconductor laser by a light-receiving portion and controlling a forward electric current of the semiconductor laser such that a light-receiving signal proportional to the light output of the semiconductor laser provided from the light-receiving portion is equal to a command signal indicative of a luminous level; converting means for converting the luminous level command signal to the forward electric current of the semiconductor laser such that the light-receiving signal is equal to the luminous level command signal on the basis of light output and forward electric current characteristics of the semiconductor laser, a coupling coefficient between the light-receiving portion and the semiconductor laser, and light input and light-receiving signal characteristics of the light-receiving portion; and means for controlling the operation of the semiconductor laser by a sum or difference in electric current with respect to a control electric current of the photoelectric negative feedback loop and an electric current produced by the converting means. Accordingly, the semiconductor laser controller accurately operated at a high speed and having a high resolution can be realized.

Further, in the above semiconductor laser controller of the present invention, the controller further comprises a circuit for turning on and off an offset electric current by a switching signal, and the operation of the semiconductor laser is controlled by an electric current provided by adding the offset electric current to the sum or difference in electric current. Accordingly, the light output of the semiconductor laser can be set to a predetermined light amount at a high speed even when the light is emitted from the semiconductor laser from a state in which no light is emitted.

Further, in the above semiconductor laser controller of the present invention, the controller further comprises means for detecting an error in conversion of the converting means by detecting the control electric current of the photoelectric negative feedback loop. Accordingly, it can be checked whether the converting means is optimal or not. Therefore, it is possible to set the converting means to be optimal.

Further, in the above semiconductor laser controller of the present invention, the controller further comprises a circuit for turning on and off an offset electric current by a switching signal, and the operation of the semiconductor laser is controlled by an electric current provided by adding the offset electric current to the sum or difference in electric current. Accordingly, it can be checked whether the converting means is optimal or not. Therefore, it is possible to set the converting means to be optimal and the light output of the semiconductor laser can be turned on and off at a high speed.

Figure 23:
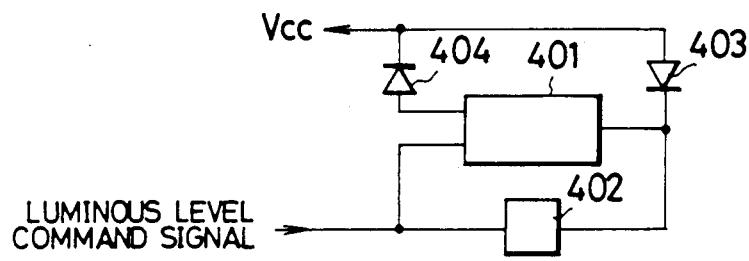
FIGS. 23 to 28 are circuit diagrams showing the semiconductor laser controller in another embodiments of the present invention.

FIG. 23 shows the semiconductor laser controller in another embodiment of the present invention. In this embodiment, a comparing amplifier 401, an electric current converter 402, a driven semiconductor laser 403 and a light-receiving element 404 and their operations are similar to those shown in the embodiment of FIG. 17. Effects obtained in the embodiment of FIG. 23 are similar to those obtained in the embodiment of FIG. 17.

Figure 24:
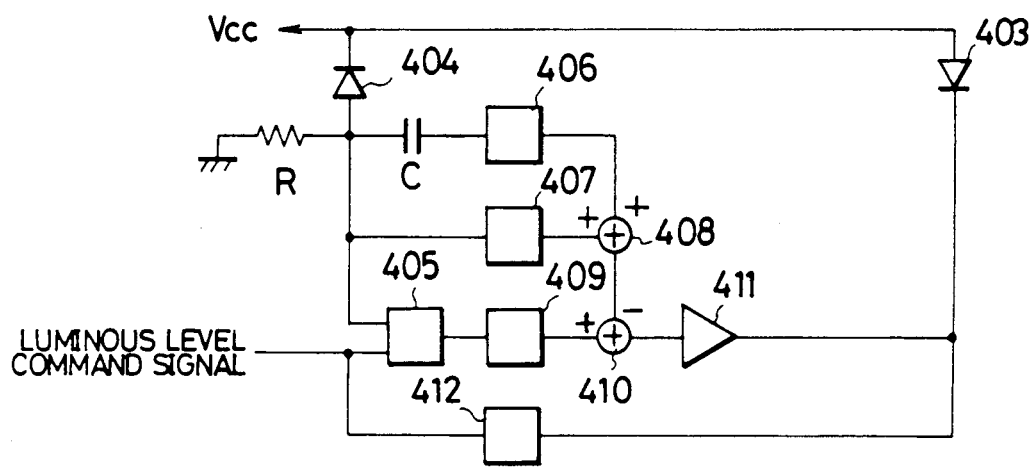

FIG. 24 shows the semiconductor laser controller in accordance with another embodiment of the present invention.

A luminous level command signal is inputted to a comparing amplifier 405 and an electric current converter 402. A portion of a light output of a driven semiconductor laser 403 is monitored by a light-receiving element 404. A high frequency component of a photovoltaic current (proportional to the light output of the semiconductor laser 403) Is caused in the light-receiving element 404 is inputted to an impedance converter 406 through a capacitor C. A lower frequency component of the photovoltaic current Is is converted to a voltage through a resistor R. The voltage generated in this resistor R is inputted to the comparing amplifier 405 and a voltage-current converter 407. The voltage-current converter 407 converts the voltage generated in the resistor R to an electric current. The output electric current of this voltage-current converter 407 is added to an output electric current of the impedance converter 406 by an adder 408 and the added electric current becomes an electric current $I_0$ equal to the photovoltaic current Is generated in the light-receiving element 404. On the other hand, the comparing amplifier 405 compares the voltage generated in the resistor R and the luminous level command signal and amplifies the difference in voltage therebetween. An output voltage of this comparing amplifier 405 is converted to an electric current by a voltage-current converter 409 and is changed to a first luminous level command signal electric current IL. A subtracter 410 subtracts the electric current $I_0$ from the adder 408 from the first luminous level command signal electric current IL from the voltage-current converter 409, and outputs a differential electric current therebetween. This differential electric current is amplified by an electric current amplifier 411 and is outputted as a control electric current of the semiconductor laser 403. Accordingly, the light-receiving element 404, the capacitor C, the resistor R, the impedance converter 406, the voltage-current converter 407, the adder 408, the subtracter 410 and the electric current amplifier 411 constitute a first photoelectric negative feedback loop for controlling a forward electric current of the semiconductor laser 403 such that the photovoltaic current Is of the light-receiving element 404 proportional to the light output of the semiconductor laser 403 is equal to the first luminous level command signal electric current IL from the voltage-current converter 409. The comparing amplifier 405 and the voltage-current converter 409 constitute a second photoelectric negative feedback loop for controlling the first luminous level command signal electric current IL such that a voltage proportional to the photovoltaic current Is of the light-receiving element 404 is equal to that of a second luminous level command signal from the exterior of the controller.

With respect to the high frequency component of the second luminous level command signal, the electric current converter 402 outputs an electric current preset in accordance with the second luminous level command signal such that the electric current $I_0$ from the adder 408 is equal to the first luminous level command signal electric current IL. This preset electric current is an electric current preset on the basis of light output and forward electric current characteristics of the semiconductor laser 403, a coupling coefficient between the light-receiving element 404 and the semiconductor laser 403, and light input and light-receiving signal characteristics of the light-receiving element 404. With respect to the low frequency component of the second luminous level command signal, the electric current converter 402 outputs an electric current preset in accordance with the second luminous level command signal such that the voltage between both terminals of the resistor R is equal to that of the first luminous level command signal. This preset electric current is an electric current preset on the basis of the light output and forward electric current characteristics of the semiconductor laser 403, the coupling coefficient between the light-receiving element 404 and the semiconductor laser 403, and the light input and light-receiving signal characteristics of the light-receiving element 404. A sum of the output electric current of this electric current converter 402 and the output electric current of the electric current amplifier 411 becomes the forward electric current of the semiconductor laser 403.

When a cross frequency in an open loop of the above first photoelectric negative feedback loop is $f_0$ and a DC gain therein is 30 and a DC gain in the above second photoelectric negative feedback loop is 10,000, step responsive characteristics of the light output $P_{out}$ of the semiconductor laser 403 can be approximately provided by the following formula.

$$P_{out} = PL + (PS - PL) \exp(-2\pi f_0 t)$$

where PL designates the light output at $t = \infty$ and PS designates a light amount set by the electric current converter 402.

Since the DC gain of the second photoelectric negative feedback loop is set to 10,000, the PL is considered to be equal to the set light amount when an allowable range of a set error is less than 0.1%. Further, since the DC gain of the first photoelectric negative feedback loop is set to 30, a stationary error in the first photoelectric negative feedback loop becomes about $(PS-PL)/30$. Accordingly, if the light amount PS set by the electric current converter 402 is equal to the PL, the light output of the semiconductor laser 403 is instantly equal to the PL. Even when the PS is varied by 5% by a disturbance, etc., the stationary error in the first photoelectric negative feedback loop becomes about 0.2% so that the error with respect to a set value of the light output of the semiconductor laser 403 becomes less than 0.4% after 10 ns if the $f_0$ is about 40

MHZ and the DC gain of the first photoelectric negative feedback loop is about 30.

To set to a value less than 0.4% the error in entire light amount (an integral value ∫P$_{out}$ of the light output) from a time immediately after the light output of the semiconductor laser 403 is changed until a set time $\tau_0$ has passed, it is sufficient that the cross frequency of the photoelectric negative feedback loop is greater than 40 MHZ and the DC gain is about 30 times when the set time $\tau_0$=50 ns. Such cross frequency and DC gain values can be easily realized.

Further, in this embodiment, the output electric current of the electric current converter 412 is added to the control electric current of the photoelectric negative feedback loop. When the electric current converter 412 is connected in parallel to the semiconductor laser 403, the operation of the semiconductor laser 403 can be controlled by the difference in electric current between the output electric current of the electric current converter 412 and the control electric current of the photoelectric negative feedback loop.

Figure 25:
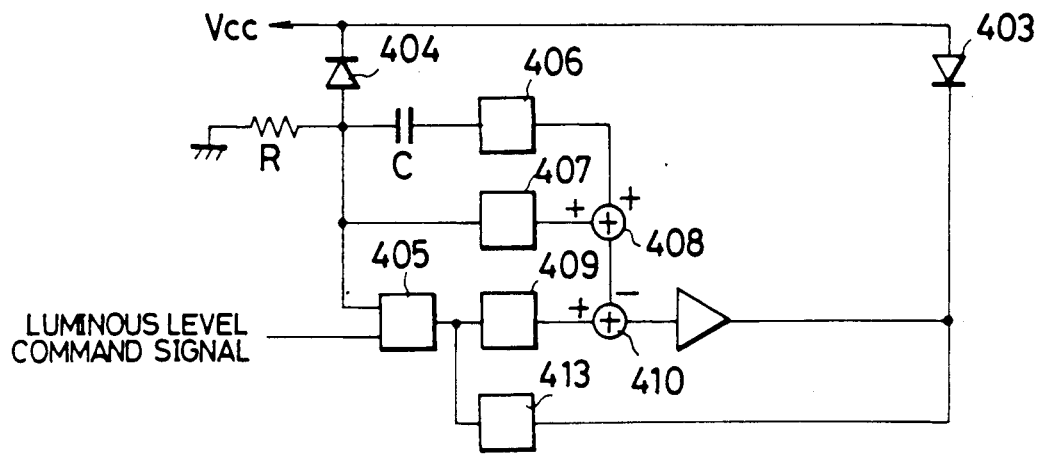

FIG. 25 shows the semiconductor laser controller in another embodiment of the present invention.

In this embodiment, instead of the second luminous level command signal in the embodiment of FIG. 24, an output voltage of a comparing amplifier 405 is inputted to an electric current converter 413. With respect to a high frequency component of a second luminous level command signal, the electric current converter 413 outputs an electric current preset in accordance with an output voltage of the comparing amplifier 405 such that an electric current $I_0$ from the adder 408 is equal to a first luminous level command signal electric current IL. This preset electric current is an electric current preset on the basis of light output and forward electric current characteristics of the semiconductor laser 403, a coupling coefficient between the light-receiving element 404 and the semiconductor laser 403, and light input and light-receiving signal characteristics of the light-receiving element 404. With respect to a low frequency component of the second luminous level command signal, the electric current converter 413 outputs an electric current preset in accordance with the output voltage of the comparing amplifier 405 such that the voltage between both terminals of a resistor R is equal to that of the first luminous level command signal. This preset electric current is an electric current preset on the basis of the light output and forward electric current characteristics of the semiconductor laser 403, the coupling coefficient between the light-receiving element 404 and the semiconductor laser 403, and the light input and light-receiving signal characteristics of the light-receiving element 404.

Figure 28:
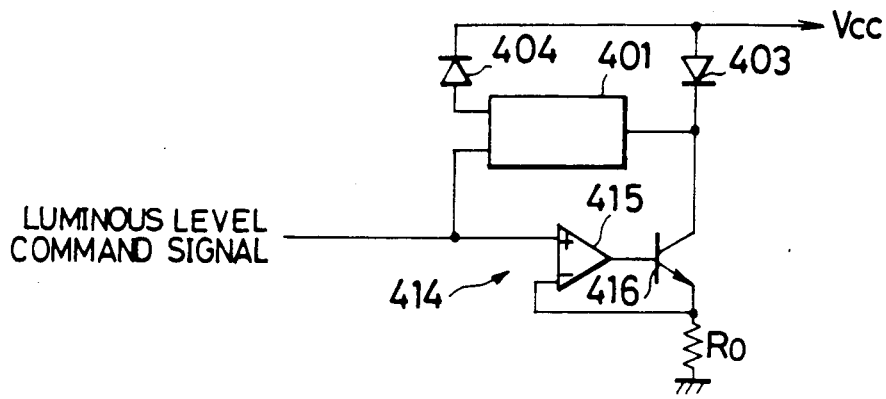

FIG. 28 shows the semiconductor laser controller in another embodiment of the present invention.

A luminous level command signal is inputted to a comparing amplifier 401 and an electric current converter 414 and a portion of a light output of a driven semiconductor laser 403 is monitored by a light-receiving element 404. The comparing amplifier 401, the semiconductor laser 403 and the light-receiving element 404 form a photoelectric negative feedback loop. The comparing amplifier 401 compares the luminous level command signal and a light-receiving signal proportional to a photovoltaic current (proportional to the light output of the semiconductor laser 403) induced in the light-receiving element 404. The comparing amplifier 401 then controls a forward electric current of the semiconductor laser 403 by this compared result such that the light-receiving signal is equal to the luminous level command signal.

The electric current converter 414 is constructed by a differential amplifier 415, a transistor 416 and a resistor $R_0$. The electric current converter 414 outputs an electric current preset in accordance with the luminous level command signal such that the light-receiving signal is equal to the luminous level command signal. This preset electric current is an electric current preset on the basis of light output and forward electric current characteristics of the semiconductor laser 403, a coupling coefficient between the light-receiving element 404 and the semiconductor laser 403, and light input and light-receiving signal characteristics of the light-receiving element 404. Namely, the luminous level command signal Vs is inputted to the differential amplifier 415 and is converted to an electric current $Vs/R_0$ by the transistor 416 and the resistor $R_0$. A sum $Vs/R_0 + A\Delta V$ of this electric current $Vs/R_0$ and an output electric current $A\Delta V$ of the comparing amplifier 401 becomes the forward electric current of the semiconductor laser 403. The semiconductor laser 403 outputs the light output $P_0$ determined by the forward electric current $Vs/R_0 + A\Delta V$.

In general, with respect to the forward electric current greater than a threshold electric current $I_{th}$ in the semiconductor laser, the relation between the light output and the forward electric current can be approximately represented by a straight line of a differential quantum efficiency $\eta$. In this case, the light output $P_0$ can be represented as follows.

$$P_0 = \frac{\eta}{(1 + \alpha S\eta A)} \left( \frac{1}{R1} + A\frac{1}{R_0} \right) Vs - \frac{\eta}{1 + \alpha S\eta A} I_{th}$$

where $\alpha$ designates the coupling coefficient between the light-receiving element 403 and the semiconductor laser 404, S a radiation sensitivity of the light-receiving element 403, and A designates an amplification factor of the comparing amplifier 401, and $\Delta V = Vs/R1 - \alpha SP_0$.

Similar to the embodiment of FIG. 24, the responsive characteristics can be approximately represented as follows when the Vs is changed from a $V_0$ (the light output of the semiconductor laser 403 corresponding to the $V_0$ shows a light intensity when the electric current of the semiconductor laser is greater than the threshold electric current) to a Vi.

$$P_0 = \frac{Vi}{\alpha SR_0} + \frac{Vi}{\alpha SR_0} \left( \frac{\alpha S\eta R_0}{R} - 1 \right) \cdot \exp(-2\pi f_0 t)$$

Accordingly, if the light output is set such that $R = \alpha S\eta R_0$, effects similar to those in the embodiment of FIG. 24 can be obtained by a simple construction.

The electric current converter 414 in this embodiment may be constructed by that shown in FIGS. 29 to 32.

Figure 29:
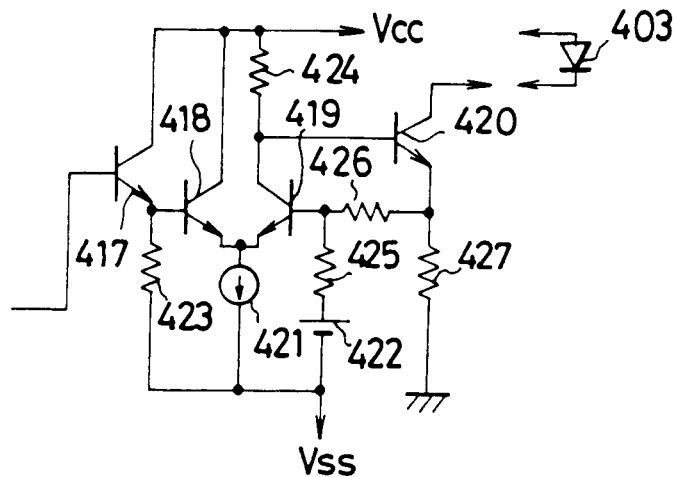
FIGS. 29 to 35 are circuit diagrams showing electric current converters in another embodiments of the present invention.
Figure 30:
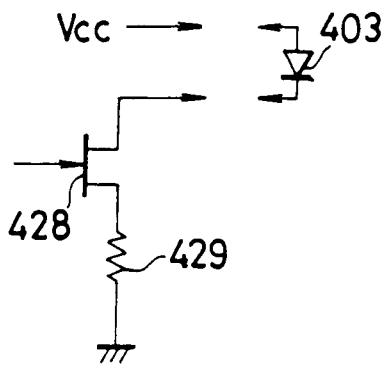
Figure 31:
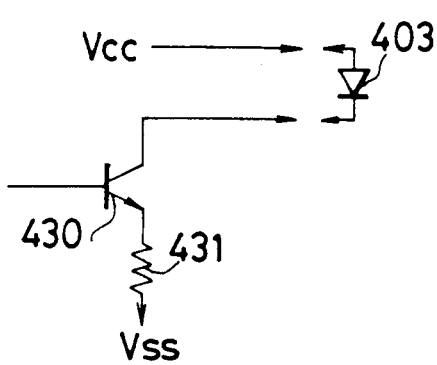
Figure 32:
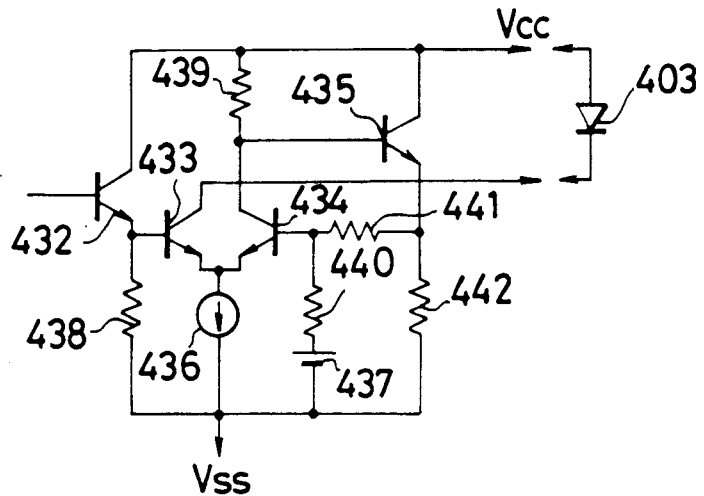

The electric current converter shown in FIG. 29 is constructed by transistors 417 to 420, an electric current source 421, a voltage source 422 and resistors 423 to 427. The electric current converter shown in FIG. 30 is constructed by a field effect transistor 428 and a resistor 429. The electric current converter shown in FIG. 31 is constructed by a transistor 430 and a resistor 431. The electric current converter shown in FIG. 32 is constructed by transistors 432 to 435, an electric current source 436, a voltage source 437 and resistors 438 to 442. Similar to the above-mentioned electric current converter 414, these electric current converters output an electric current preset in accordance with the luminous level command signal such that the light-receiving signal is equal to the luminous level command signal. This preset electric current is an electric current preset on the basis of the light output and forward electric current characteristics of the semiconductor laser 403, the coupling coefficient between the light-receiving element 404 and the semiconductor laser 403, and the light input and light-receiving signal characteristics of the light-receiving element 404. Namely, the luminous level command signal is converted to an electric current proportional to the luminous level command signal by approximating the light output and forward electric current characteristics of the semiconductor laser 403 to those represented by a straight line.

Figure 26:
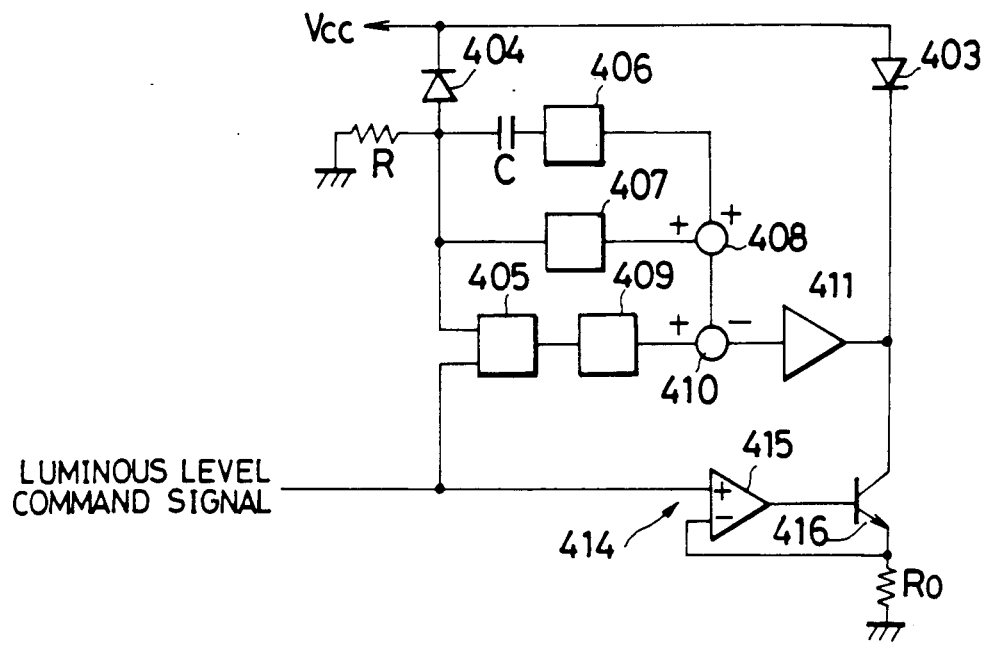

FIG. 26 shows the semiconductor laser controller in another embodiment of the present invention.

A luminous level command signal is inputted to a comparing amplifier 405 and an electric current converter 414. A portion of a light output of a driven semiconductor laser 403 is monitored by a light-receiving element 404. A high frequency component of a photovoltaic current (proportional to the light output of the semiconductor laser 403) Is induced in the light-receiving element 404 is inputted to an impedance converter 406 through a capacitor C. A lower frequency component of the photovoltaic current Is is converted to a voltage through a resistor R. The voltage generated in this resistor R is inputted to the comparing amplifier 405 and a voltage-current converter 407. The voltage-current converter 407 converts the voltage generated in the resistor R to an electric current. The output electric current of this voltage-current converter 407 is added to an output electric current of the impedance converter 406 by an adder 408 and the added electric current becomes an electric current $I_0$ equal to the photovoltaic current Is generated in the light-receiving element 404. On the other hand, the comparing amplifier 405 compares the voltage generated in the resistor R and the luminous level command signal and amplifies the difference in voltage therebetween. An output voltage of this comparing amplifier 405 is converted to an electric current by a voltage-current converter 409 and becomes a first luminous level command signal electric current IL. A subtracter 410 subtracts the electric current $I_0$ from the adder 408 from the first luminous level command signal electric current IL from the voltage-current converter 409, and outputs a differential electric current therebetween. This differential electric current is amplified by an electric current amplifier 411 and is outputted as a control electric current of the semiconductor laser 403. Accordingly, the light-receiving element 404, the capacitor C, the resistor R, the impedance converter 406, the voltage-current converter 407, the adder 408, the subtracter 410 and the electric current amplifier 411 constitute a first photoelectric negative feedback loop for controlling a forward electric current of the semiconductor laser 403 such that the photovoltaic current Is of the light-receiving element 404 proportional to the light output of the semiconductor laser 403 is equal to the first luminous level command signal electric current IL from the voltage-current converter 409. The comparing amplifier 405 and the voltage-current converter 409 constitute a second photoelectric negative feedback loop for controlling the first luminous level command signal electric current IL such that a voltage proportional to the photovoltaic current Is of the light-receiving element 404 is equal to that of a second luminous level command signal from the exterior of the controller.

The electric current converter 414 is constructed by a differential amplifier 415, a transistor 416 and a resistor $R_0$. The electric current converter 414 outputs an electric current preset in accordance with the luminous level command signal such that the light-receiving signal is equal to the luminous level command signal. This preset electric current is an electric current preset on the basis of light output and forward electric current characteristics of the semiconductor laser 403, a coupling coefficient between the light-receiving element 404 and the semiconductor laser 403, and light input and light-receiving signal characteristics of the light-receiving element 404. Namely, the luminous level command signal Vs is inputted to the differential amplifier 415 and is converted to an electric current $Vs/R_0$ by the transistor 416 and the resistor $R_0$. A sum $Vs/R_0 + A\Delta V$ of this electric current $Vs/R_0$ and an output electric current $A\Delta V$ of the comparing amplifier 401 becomes the forward electric current of the semiconductor laser 403. The semiconductor laser 403 outputs the light output $P_0$ determined by the forward electric current $Vs/R_0 + A\Delta V$.

In general, with respect to the forward electric current greater than a threshold electric current $I_{th}$ in the semiconductor laser, the relation between the light output and the forward electric current can be approximately represented by a straight line of a differential quantum efficiency $\eta$. In this case, the light output $P_0$ can be represented as follows.

$$P_0 = \frac{\eta}{(1 + \alpha S\eta A)}\left(\frac{1}{R1} + A\frac{1}{R_0}\right)Vs - \frac{\eta}{1 + \alpha S\eta A}I_{th}$$

where $\alpha$ designates the coupling coefficient between the light-receiving element 403 and the semiconductor laser 404, S a radiation sensitivity of the light-receiving element 403, R1 a conversion coefficient of the voltage-current converter 409, and A designates an amplification factor of the comparing amplifier 401, and IL $= \alpha SP_0$.

Similar to the embodiment of FIG. 24, the responsive characteristics can be approximately represented as follows when the Vs is changed from a $V_0$ (the light output of the semiconductor laser 403 corresponding to the $V_0$ shows a light intensity when the electric current of the semiconductor laser is greater than the threshold electric current) to a Vi.

$$P_0 = \frac{Vi}{\alpha S R_0} + \frac{Vi}{\alpha S R_0}\left(\frac{\alpha S\eta R_0}{R} - 1\right)\exp(-2\pi f_0 t)$$

Accordingly, if the light output is set such that $R = \alpha S\eta R_0$, effect similar to those in the embodiment of FIG. 24 can be obtained by a simple construction.

Figure 27:
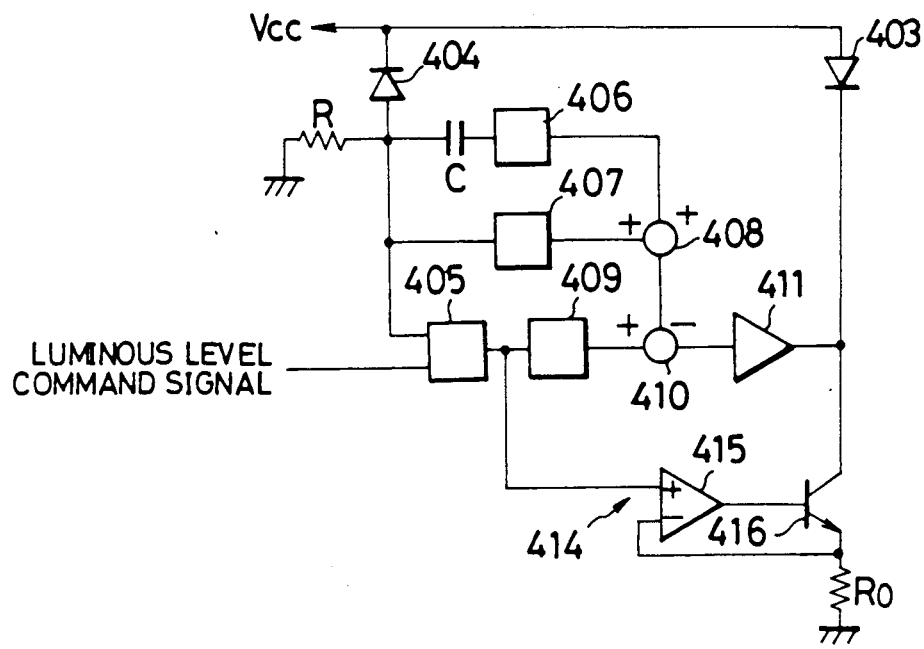

FIG. 27 shows the semiconductor laser controller in another embodiment of the present invention.

In this embodiment, instead of the second luminous level command signal in the embodiment of FIG. 26, an output voltage of the comparing amplifier 405 is inputted to an electric current converter 414. The electric current converter 414 is constructed by a differential amplifier 415, a transistor 416 and a resistor $R_0$. The electric current converter 414 outputs an electric current preset in accordance with the output voltage of the comparing amplifier 405 such that the light-receiving signal is equal to the luminous level command signal. This preset electric current is an electric current preset on the basis of light output and forward electric current characteristics of the semiconductor laser 403, a coupling coefficient between the light-receiving element 404 and the semiconductor laser 403, and light input and light-receiving signal characteristics of the light-receiving element 404. Namely, the output voltage of the comparing amplifier 405 is inputted to the differential amplifier 415 and is converted to an electric current $V_s/R_0$ by the transistor 416 and the resistor $R_0$.

Figure 33:
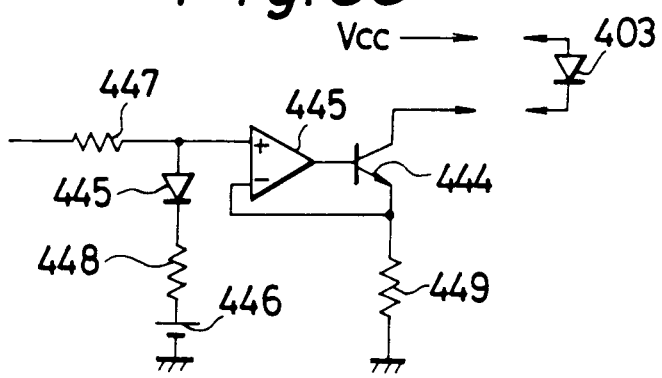
Figure 34:
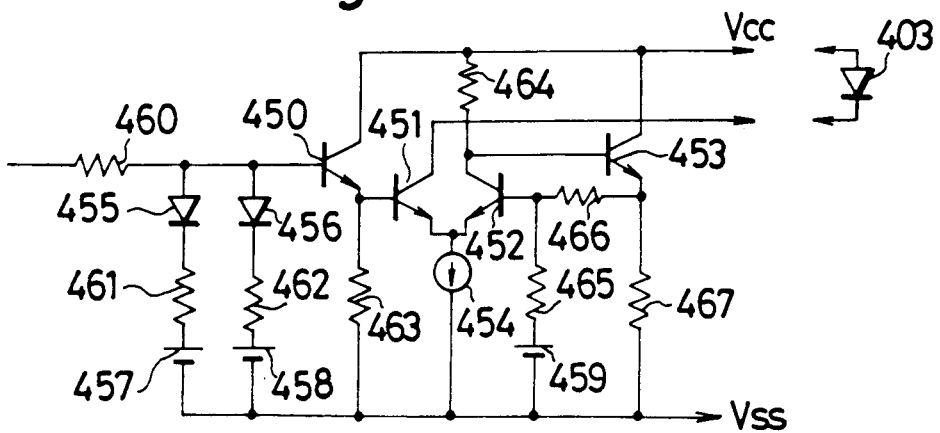
Figure 35:
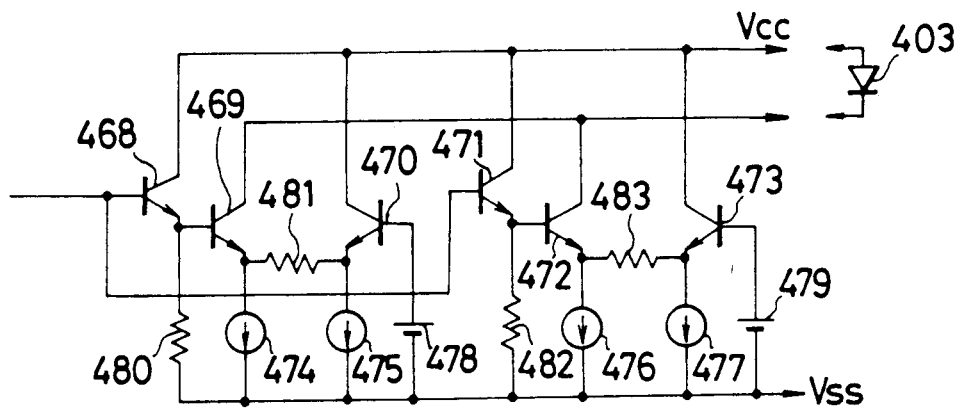

In the above-mentioned embodiments, the electric current converter is constructed by using the general one and the characteristics approximated by a straight line, but can be constructed by the characteristics approximated by a polygonal line. FIGS. 33 to 35 show examples of the electric current converter having the characteristics approximated by a polygonal line and used in the above-mentioned embodiments.

The electric current converter shown in FIG. 33 is constructed by a differential amplifier 443, a transistor 444, a diode 445, a voltage source 446 and resistors 447 to 449. A polygonal point is determined by a voltage of the voltage source 446. The electric current converter shown in FIG. 34 is constructed by transistors 450 to 453, an electric current source 454, diodes 455, 456, voltage sources 457 to 459 and resistors 460 to 467. The polygonal point is determined by voltages of the voltage sources 457 and 458. The electric current converter shown in FIG. 35 is constructed by transistors 468 to 473, electric current sources 474 to 477, voltage sources 478, 479 and resistors 480 to 483. The polygonal point is determined by voltages of the voltage sources 478 and 479.

Figure 36:
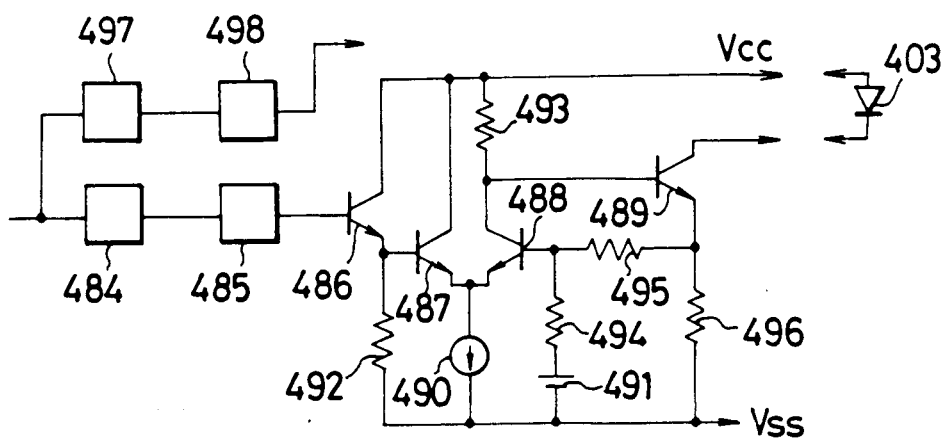
FIG. 36 is a circuit diagram showing a portion of the semiconductor laser controller in another embodiment of the present invention.

To optimize the above-mentioned electric current converter, it is effective to correct the light output and forward electric current characteristics of the semiconductor laser by a conversion table with the luminous level command signal as a digital signal. FIG. 36 shows a portion of the semiconductor laser controller in this case.

In this embodiment, the luminous level command signal composed of the digital signal in the above embodiment is data-converted to correct the light output and forward electric current characteristics of the semiconductor laser by the conversion table 848, and is further D/A-converted by a digital/analog (D/A) converter 485. The D/A-converted signal is then converted to an electric current by an electric current converting section composed of transistors 486 to 489, an electric current source 490, a voltage source 491 and resistors 492 to 496 and is further supplied to the semiconductor laser 403. The luminous level command signal is delayed by a predetermined time by a data delay circuit 497 and is D/A-converted by a D/A converter 498 and is then inputted to the above comparing amplifier 405.

As mentioned above, in the present invention shown in FIGS. 23 to 36, a semiconductor laser controller comprises a photoelectric negative feedback loop for detecting a light output of a driven semiconductor laser by a light-receiving portion and controlling a forward electric current of the semiconductor laser such that a light-receiving signal proportional to the light output of the semiconductor laser provided from the light-receiving portion is equal to a command signal indicative of a luminous level; converting means for converting the luminous level command signal to a photoelectric current of the semiconductor laser such that the light-receiving signal is equal to the luminous level command signal on the basis of light output and forward electric current characteristics of the semiconductor laser, a coupling coefficient between the light-receiving portion and the semiconductor laser, and light input and light-receiving signal characteristics of the light-receiving portion; and means for controlling the operation of the semiconductor laser by a sum or difference in electric current with respect to a control electric current of the photoelectric negative feedback loop and an electric current produced by the converting means. Accordingly, the semiconductor laser controller accurately operated at a high speed and having a high resolution and strongly bearing against a disturbance, etc. can be realized.

Further, in the above semiconductor laser controller of the present invention, the photoelectric negative feedback loop is constructed by a first photoelectric negative feedback loop for detecting the light output of the semiconductor laser by the light-receiving portion and controlling the forward electric current of the semiconductor laser such that a light-receiving electric current proportional to the light output of the semiconductor laser obtained from the light-receiving portion is equal to the luminous level command signal in which a first luminous level command signal is converted to an electric current, and a second photoelectric negative feedback loop for controlling the first luminous level command signal such that a voltage proportional to the light-receiving electric current is equal to that of the luminous level command signal. Accordingly, effects similar to those obtained in the above-mentioned semiconductor laser controller can be obtained without setting an open loop gain of the photoelectric negative feedback loop in a high frequency region to a very large value.

Further, in the above semiconductor laser controller of the present invention, the converting means converts the luminous level command signal as an analog signal voltage to an electric current proportional to the luminous level command signal by approximating the light output and forward electric current characteristics of the semiconductor laser to those represented by a straight line. Accordingly, effects similar to those obtained in the above-mentioned semiconductor laser controller can be obtained by a simple circuit construction.

Further, in the above semiconductor laser controller of the present invention, the converting means converts the luminous level command signal as an analog signal voltage to an electric current corresponding to the luminous level command signal by approximating the light output and forward electric current characteristics of the semiconductor laser to those represented by a polygonal line. Accordingly, effects similar to those obtained in the above-mentioned semiconductor laser controller can be obtained by a simple circuit construction and the accuracy in operation of the controller is improved in comparison with that using the characteristics approximated by the straight line.

Further, in the above semiconductor laser controller of the present invention, the luminous level command signal is set to a digital signal and the converting means has a conversion table for converting the luminous level command signal to a signal for correcting the light output and forward electric current characteristics of the semiconductor laser, and a digital/analog converter for converting the signal converted by the conversion table to the forward electric current of the semiconductor laser. Accordingly, the accuracy in operation of the semiconductor laser controller is improved since the nonlinearity is secured by the conversion table with respect to the above electric current converting means, and effects similar to those obtained in the above-mentioned semiconductor laser controller can be obtained.

Figure 37:
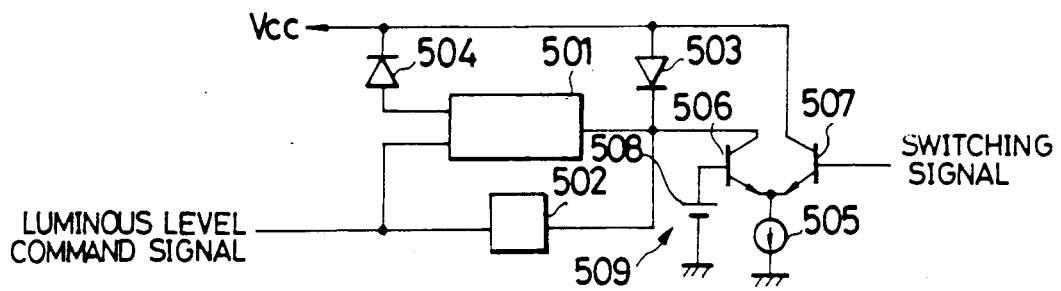
FIGS. 37 to 42 are circuit diagrams showing the semiconductor laser controller in another embodiments of the present invention.

FIG. 37 shows the semiconductor laser controller in another embodiment of the present invention.

A command signal indicative of a luminous level is inputted to a comparing amplifier 501 and an electric current converter 502 and a portion of a light output of a driven semiconductor laser 503 is monitored by a light-receiving element 504. The comparing amplifier 501, the semiconductor laser 503 and the light-receiving element 504 form a photoelectric negative feedback loop. The comparing amplifier 501 compares the luminous level command signal and a light-receiving signal proportional to a photovoltaic current (proportional to the light output of the semiconductor laser 503) induced in the light-receiving element 504. The comparing amplifier 501 then controls a forward electric current of the semiconductor laser 503 by this compared result such that the light-receiving signal is equal to the luminous level command signal. The electric current converter 502 outputs an electric current less by an electric current value set by the electric current source 505 than an electric current preset in accordance with the luminous level command signal such that the light-receiving signal is equal to the luminous level command signal. This preset electric current is an electric current preset on the basis of light output and forward electric current characteristics of the semiconductor laser 503, a coupling coefficient between the light-receiving element 504 and the semiconductor laser 503, and light input and light-receiving signal characteristics of the light-receiving element 504.

The electric current source 505, transistors 506, 507 and a voltage source 508 constitute a switching circuit 509. Normally, the transistor 507 is turned on and the transistor 506 is turned off and no electric current is supplied from the electric current source 505 to the semiconductor laser 503 so that no light is emitted from the semiconductor laser 503. A switching signal is inputted to a base of the transistor 507 at a timing for emitting the light from the semiconductor laser 503 so that the transistor 507 is turned off and the transistor 506 is turned on. Thus, a set electric current from the electric current source 505 is supplied to the semiconductor laser 503 so that the light is emitted from the semiconductor laser 503. The operation of the semiconductor laser 503 is controlled by a sum of an output electric current of this switching circuit 509, an output electric current of the electric current converter 502 and a control electric current outputted from the comparing amplifier 501.

When a cross frequency in an open loop of the above photoelectric negative feedback loop is $f_0$ and a DC gain is 10,000, step responsive characteristics of the light output $P_{out}$ of the semiconductor laser 503 can be approximately provided by the following formula.

$$P_{out} = PL + (PS - PL) \exp(-2\pi f_0 t)$$

where PL designates the light output at $t = \infty$ and PS designates a light amount set by a sum of the output electric current of the electric current converter 502 and the output electric current of the switching circuit 509.

Since the DC gain in the open loop of the photoelectric negative feedback loop is set to 10,000, the PL is considered to be equal to the set light amount when an allowable range of a set error is less than 0.1%.

Accordingly, if the light amount PS set by the electric current converter 502 is equal to the PL, the light output of the semiconductor laser 503 is instantly equal to the PL. The switching circuit 509 is operated at a high speed until a drive electric current of the switching circuit 509. Accordingly, the switching circuit rises at a high speed irrespective of a rising speed of the electric current converter 502. Further, in general, as can seen from the light output and electric current characteristics of the semiconductor laser shown in FIG. 43, the semiconductor laser does not oscillate until a threshold electric current so that there is no deterioration of a quenching ratio by an offset electric current. Even when the PS is varied by 5% by a disturbance, etc., the error with respect to a set value of the light output of the semiconductor laser 503 becomes less than 0.4% after 10 ns if the $f_0$ is about 40 MHZ.

To set to a value less than 0.4% the error in entire light amount (an integral value $\int P_{out}$ of the light output) from a time immediately after the light output of the semiconductor laser 503 is changed until a set time $\tau_0$ has passed, it is sufficient that the cross frequency of the photoelectric negative feedback loop is greater than 40 MHZ when the set time $\tau_0 = 50$ ns. Such a cross frequency value can be easily realized.

Further, in this embodiment, the output electric current of the electric current converter 502 is added to the control electric current of the photoelectric negative feedback loop. When the electric current converter 502 is connected in parallel to the semiconductor laser 503, the operation of the semiconductor laser 503 can be controlled by the difference in electric current between the output electric current of the electric current converter 502 and the control electric current of the photoelectric negative feedback loop.

As mentioned above, in accordance with this embodiment, the semiconductor laser accurately operated at a high speed and having a high resolution can be realized.

Figure 38:
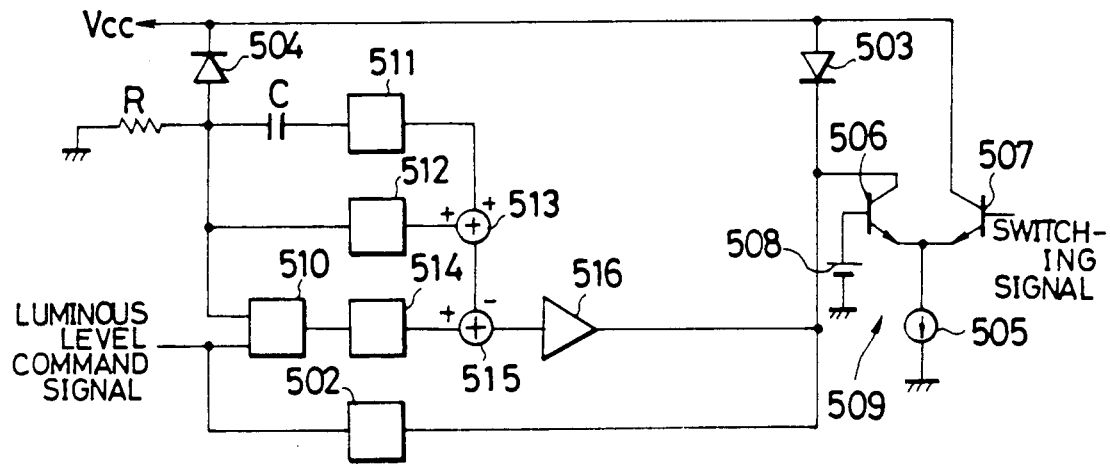

FIG. 38 shows the semiconductor laser controller in another embodiment of the present invention.

A luminous level command signal is inputted to a comparing amplifier 510 and an electric current converter 502. A portion of a light output of a driven semiconductor laser 503 is monitored by a light-receiving element 504. A high frequency component of a photovoltaic current (proportional to the light output of the semiconductor laser 503) Is induced in the light-receiving element 504 is inputted to an impedance converter 511 through a capacitor C. A lower frequency component of the photovoltaic current Is is converted to a voltage through a resistor R. The voltage generated in this resistor R is inputted to the comparing amplifier 510 and a voltage-current converter 512. The voltage-current converter 512 converts the voltage generated in the resistor R to an electric current. The output electric current of this voltage-current converter 512 is added to an output electric current of the impedance converter 511 by an adder 513 and the added electric current becomes an electric current $I_0$ equal to the photovoltaic current Is generated in the light-receiving element 504. On the other hand, the comparing amplifier 510 compares the voltage generated in the resistor R and the luminous level command signal and amplifies the difference in voltage therebetween. An output voltage of this comparing amplifier 510 is converted to an electric current by a voltage-current converter 514 and is changed to a first luminous level command signal electric current IL. A subtracter 515 subtracts the electric current $I_0$ from the adder 513 from the first luminous level command signal electric current IL from the voltage-current converter 514, and outputs a differential electric current therebetween. This differential electric current is amplified by an electric current amplifier 516 and is outputted as a control electric current of the semiconductor laser 503. Accordingly, the light-receiving element 504, the capacitor C, the resistor R, the impedance converter 511, the voltage-current converter 512, the adder 513, the subtracter 515 and the electric current amplifier 516 constitute a first photoelectric negative feedback loop for controlling a forward electric current of the semiconductor laser 503 such that the photovoltaic current Is of the light-receiving element 504 proportional to the light output of the semiconductor laser 503 is equal to the first luminous level command signal electric current IL from the voltage-current converter 514. The comparing amplifier 510 and the voltage-current converter 514 constitute a second photoelectric negative feedback loop for controlling the first luminous level command signal electric current IL such that a voltage proportional to the photovoltaic current Is of the light-receiving element 504 is equal to that of a second luminous level command signal from the exterior of the controller.

The operations of the electric current converter 502 and a switching circuit 509 are similar to those in the above-mentioned embodiments. The operation of the semiconductor laser 503 is controlled by a sum of an output electric current of the switching circuit 509, an output electric current of the electric current converter 502 and a control electric current outputted from the comparing amplifier 501.

When a cross frequency in an open loop of the above first photoelectric negative feedback loop is $f_0$ and a DC gain therein is 30 and a DC gain in the second photoelectric negative feedback loop is 10,000, step responsive characteristics of the light output $P_{out}$ of the semiconductor laser 503 can be approximately provided by the following formula.

$$P_{out} = PL + (PS - PL) \exp(-2\pi f_0 t).$$

Since the DC gain of the second photoelectric negative feedback loop is set to 10,000, the PL is considered to be equal to the set light amount when an allowable range of a set error is less than 0.1%. Further, since the DC gain of the first photoelectric negative feedback loop is set to 30, a stationary error in the first photoelectric negative feedback loop becomes about $(PS-PL)/30$. Accordingly, if the light amount PS set by the electric current converter 502 is equal to the PL, the light output of the semiconductor laser 503 is instantly equal to the PL. The switching circuit 509 is operated at a high speed until a drive electric current value provided by the switching circuit 509. Accordingly, the switching circuit rises at a high speed irrespective of a rising speed of the electric current converter 502. Further, in general, as can be seen from the light output and electric current characteristics of the semiconductor laser shown in FIG. 43, the semiconductor laser does not oscillate until a threshold electric current so that there is no deterioration of a quenching ratio by an offset electric current. Even when the PS is varied by 5% by a disturbance, etc., a stationary error of the first photoelectric negative feedback loop becomes about 0.2% so that the error with respect to a set value of the light output of the semiconductor laser 503 becomes less than 0.4% after 10 ns if the $f_0$ is about 40 MHZ and the DC gain of the first photoelectric negative feedback loop is about 30.

To set to a value less than 0.4% the error in entire light amount (an integral value $\int P_{out}$ of the light output) from a time immediately after the light output of the semiconductor laser 503 is changed until a set time $\tau_0$ has passed, it is sufficient that the cross frequency of the photoelectric negative feedback loop is greater than 40 MHZ when the set time $\tau_0=50$ ns and the DC gain is about 30 times. Such cross frequency and DC gain values can be easily realized.

Figure 39:
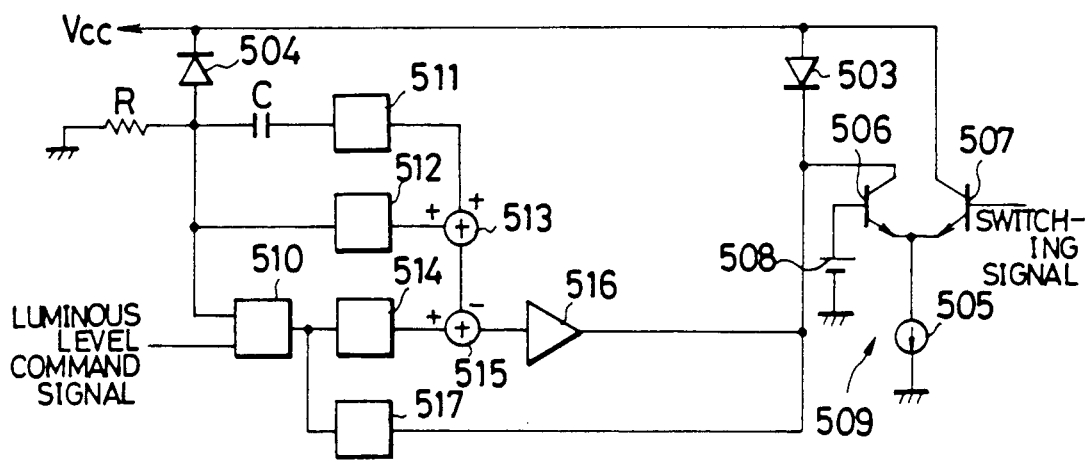

FIG. 39 shows the semiconductor laser controller in another embodiment of the present invention.

In this embodiment, instead of the second luminous level command signal in the embodiment of FIG. 38, an output voltage of the comparing amplifier 510 is inputted to an electric current converter 517. With respect to a high frequency component of a second luminous level command signal, the electric current converter 517 outputs an electric current preset in accordance with an output voltage of the comparing amplifier 510 such that an electric current $I_0$ from an adder 513 is equal to a first luminous level command signal electric current IL. This preset electric current is an electric current preset on the basis of light output and forward electric current characteristics of the semiconductor laser 503, a coupling coefficient between the light-receiving element 504 and the semiconductor laser 503, and light input and light-receiving signal characteristics of the light-receiving element 504. With respect to a low frequency component of the second luminous level command signal, the electric current converter 517 outputs an electric current preset in accordance with the output voltage of the comparing amplifier 510 such that the voltage between both terminals of a resistor R is equal to that of the first luminous level command signal. This preset electric current is an electric current preset on the basis of the light output and forward electric current characteristics of the semiconductor laser 503, the coupling coefficient between the light-receiving element 504 and the semiconductor laser 503, and the light input and light-receiving signal characteristics of the light-receiving element 504.

Figure 42:
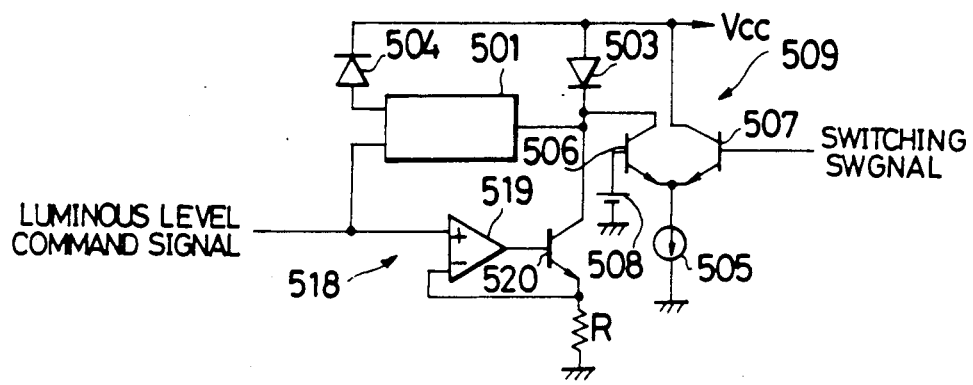

FIG. 42 shows the semiconductor laser controller in another embodiment of the present invention.

In this embodiment, an electric current amplifier 518 is constructed by a differential amplifier 519, a transistor 520 and a resistor $R_0$ as the electric current converter in the embodiment of FIG. 37. The electric current amplifier 518 outputs an electric current preset in accordance with a luminous level command signal Vs such that the light-receiving signal is equal to the luminous level command signal. This preset electric current is an electric current preset on the basis of light output and forward electric current characteristics of the semiconductor laser 503, a coupling coefficient between the light-receiving element 504 and the semiconductor laser 503, and light input and light-receiving signal characteristics of the light-receiving element 504. Namely, the luminous level command signal Vs is inputted to the differential amplifier 519 and is converted to an electric current $Vs/R_0$ by the transistor 520 and the resistor $R_0$. A sum $Vs/R_0 + A\Delta V$ of this electric current $Vs/R_0$ and an output electric current $A\Delta V$ of the comparing amplifier 501 becomes the forward electric current of the semiconductor laser 503. The semiconductor laser 503 outputs the light output $P_0$ determined by the forward electric current $Vs/R_0 + A\Delta V$. The operation of the semiconductor laser 503 is controlled by a sum of an output electric current of the switching circuit 509, an output electric current of the electric current converter 502 and a control electric current outputted from the comparing amplifier 501.

In general, with respect to the forward electric current greater than a threshold electric current $I_{th}$ in the semiconductor laser, the relation between the light output and the forward electric current can be approximately represented by a straight line of a differential quantum efficiency $\eta$. In this case, the light output $P_0$ can be represented as follows.

$$P_0 = \frac{\eta}{(1 + \alpha S \eta A)} \left( \frac{1}{R1} + A \frac{1}{R_0} \right) Vs - \frac{\eta}{1 + \alpha S \eta A} I_{th}$$

where A designates an amplification factor of the comparing amplifier 501 and $\Delta V = Vs/R1 - \alpha SP_0$.

Similar to the embodiment of FIG. 38, the responsive characteristics can be approximately represented as follows when the Vs is changed from a $V_0$ (the light output of the semiconductor laser 503 corresponding to the $V_0$ shows a light intensity when the electric current of the semiconductor laser is greater than the threshold electric current) to a Vi.

$$P_0 = \frac{Vi}{\alpha SR_0} + \frac{Vi}{\alpha SR_0} \left( \frac{\alpha S \eta R_0}{R} - 1 \right) \cdot \exp(-2\pi f_0 t)$$

Accordingly, if the light output is set such that $R = \alpha S \eta R_0$, effects similar to those in the embodiment of FIG. 38 can be obtained by a simple construction.

The electric current converter 518 in this embodiment may be constructed by that shown in FIGS. 29 to 32.

Figure 40:
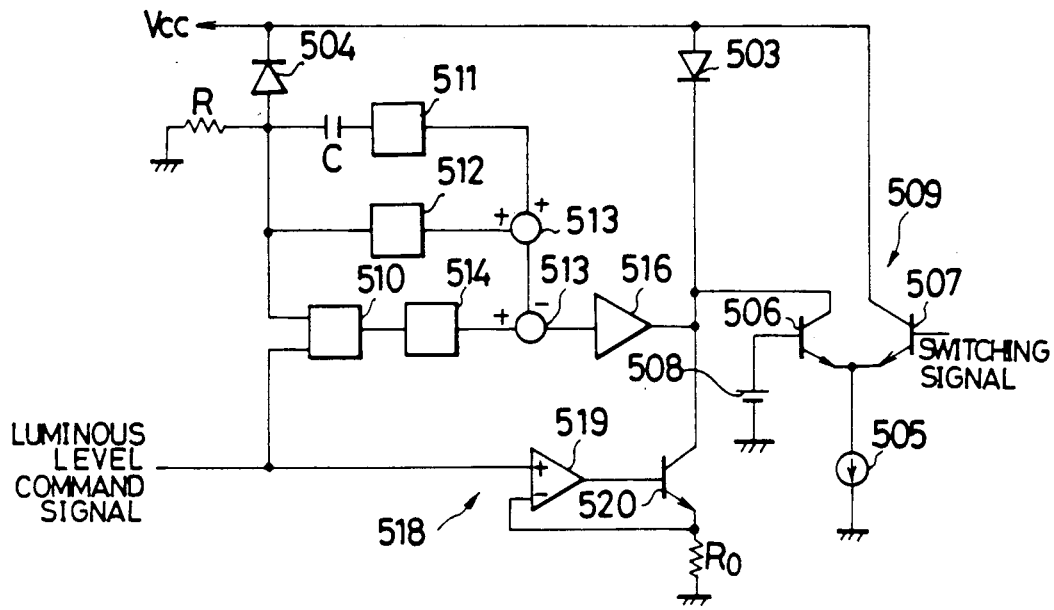

FIG. 40 shows the semiconductor laser controller in another embodiment of the present invention.

In this embodiment, an electric current amplifier 518 is constructed by a differential amplifier 519, a transistor 520 and a resistor $R_0$ as the electric current converter in the embodiment of FIG. 38. The electric current amplifier 518 outputs an electric current preset in accordance with a luminous level command signal such that the light-receiving signal is equal to the luminous level command signal. This preset electric current is an electric current preset on the basis of light output and forward electric current characteristics of the semiconductor laser 503, a coupling coefficient between the light-receiving element 504 and the semiconductor laser 503, and light input and light-receiving signal characteristics of the light-receiving element 504. Namely, the luminous level command signal Vs is inputted to the differential amplifier 519 and is converted to an electric current $Vs/R_0$ by the transistor 520 and the resistor $R_0$. A sum $Vs/R_0 + (A(IL - Io)) + Iof$ of this electric current $Vs/R_0$ and an output electric current Iof of a switching circuit 509 and an output electric current $A(IL - Io)$ of an electric current amplifier 516 becomes the forward electric current of the semiconductor laser 503. The semiconductor laser 503 outputs the light output $P_0$ determined by the forward electric current $Vs/R_0 + A(IL - Io) + Iof$. In general, with respect to the forward electric current greater than a threshold electric current $I_{th}$ in the semiconductor laser, the relation between the light output and the forward electric current can be approximately represented by a straight line of a differential quantum efficiency $\eta$. In this case, the light output $P_0$ can be represented as follows.

$$P_0 = \frac{\eta}{(1 + \alpha S \eta A)} \left( \frac{1}{R1} + A \frac{1}{R_0} \right) Vs - \frac{\eta}{1 + \alpha S \eta A} I_{th}$$

where R1 designates a conversion coefficient of the voltage-current converter 514, A designates an amplification factor of the electric current amplifier 516 and $IL = \alpha SP_0$.

Similar to the embodiment of FIG. 38, the responsive characteristics can be approximately represented as follows when the Vs is changed from a $V_0$ (the light output of the semiconductor laser 503 corresponding to the $V_0$ shows a light intensity when the electric current of the semiconductor laser is greater than the threshold electric current) to a Vi.

$$P_0 = \frac{Vi}{\alpha SR_0} + \frac{Vi}{\alpha SR_0} \left( \frac{\alpha S \eta R_0}{R} - 1 \right) \cdot \exp(-2\pi f_0 t)$$

Accordingly, if the light output is set such that $R = \alpha S \eta R_0$, effects similar to those in the embodiment of FIG. 38 can be obtained by a simple construction.

Figure 41:
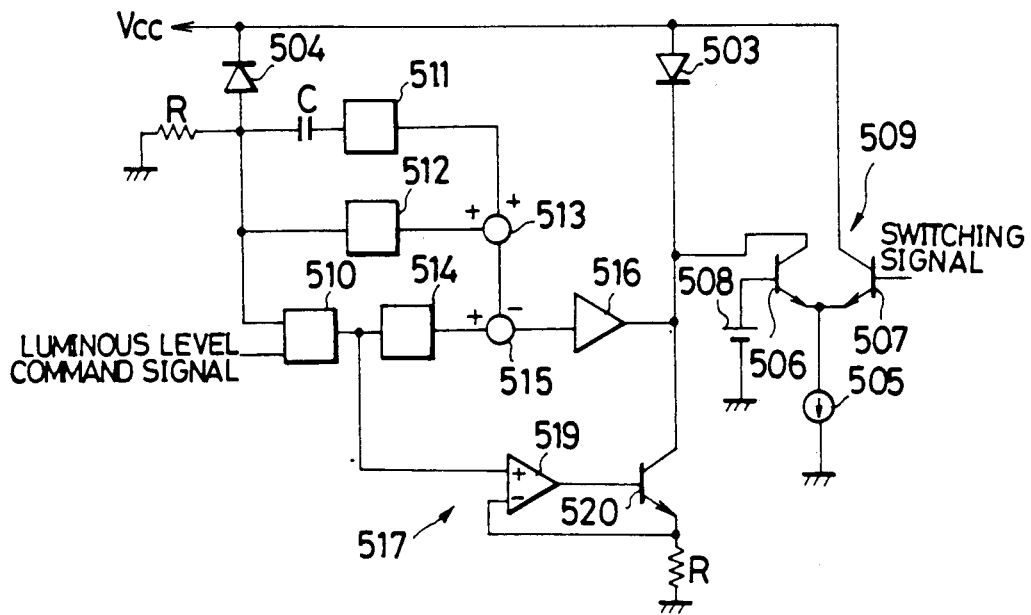

FIG. 41 shows the semiconductor laser controller in another embodiment of the present invention.

In this embodiment, instead of the second luminous level command signal in the embodiment of FIG. 40, an output voltage of the comparing amplifier 510 is inputted to an electric current converter 517 and the electric current converter 517 is operated as above.

In the above-mentioned embodiments, the electric current converter is constructed by using the general one and the characteristics approximated by a straight line, but can be constructed by the characteristics approximated by a polygonal line. FIGS. 33 to 35 show examples of the electric current converter having the characteristics approximated by the polygonal line and used in the above-mentioned embodiments.

To optimize the above-mentioned electric current converter, it is effective to correct the light output and forward electric current characteristics of the semiconductor laser by a conversion table with the luminous level command signal as a digital signal. FIG. 36 shows a portion of the semiconductor laser controller in this case.

As mentioned above, in accordance with the embodiments of the present invention shown in FIGS. 37 to 42, a semiconductor laser controller comprises a photoelectric negative feedback loop for detecting a light output of a driven semiconductor laser by a light-receiving portion and controlling a forward electric current of the semiconductor laser such that a light-receiving signal proportional to the light output of the semiconductor laser provided from the light-receiving portion is equal to a command signal indicative of a luminous level; switching means for switching a constant electric current value of the forward electric current of the semiconductor laser by a switching signal; converting means for converting the luminous level command signal to the forward electric current of the semiconductor laser in accordance with a conversion rule preset such that the light-receiving signal is equal to the luminous level command signal on the basis of light output and forward electric current characteristics of the semiconductor laser, a coupling coefficient between the light-receiving portion and the semiconductor laser, and light input and light-receiving signal characteristics of the light-receiving portion; and means for controlling the operation of the semiconductor laser by a sum or difference in electric current with respect to a control electric current of the photoelectric negative feedback loop, an output electric current of the switching means and an electric current produced by the converting means. Accordingly, the semiconductor laser controller accurately operated at a high speed and having a high resolution and strongly bearing against a disturbance, etc. can be realized.

Further, in the above semiconductor laser controller of the present invention, the photoelectric negative feedback loop is constructed by a first photoelectric negative feedback loop for detecting the light output of the semiconductor laser by the light-receiving portion and controlling the forward electric current of the semiconductor laser such that a light-receiving electric current proportional to the light output of the semiconductor laser obtained from the light-receiving portion is equal to the luminous level command signal in which a first luminous level command signal is converted to an electric current, and a second photoelectric negative feedback loop for controlling the first luminous level command signal such that a voltage proportional to the light-receiving electric current is equal to that of the luminous level command signal. Accordingly, effects similar to those obtained in the above-mentioned semiconductor laser controller can be obtained without setting an open loop gain of the photoelectric negative feedback loop in a high frequency region to a very large value.

Further, in the above semiconductor laser controller of the present invention, the converting means converts the luminous level command signal as an analog signal voltage to an electric current proportional to the luminous level command signal by approximating the light output and forward electric current characteristics of the semiconductor laser to those represented by a straight line. Accordingly, effects similar to those obtained in the above-mentioned semiconductor laser controller can be obtained by a simple circuit construction.

Further, in the above semiconductor laser controller of the present invention, the converting means converts the luminous level command signal as an analog signal voltage to an electric current corresponding to the luminous level command signal by approximating the light output and forward electric current characteristics of the semiconductor laser to those represented by a polygonal line. Accordingly, effects similar to those obtained in the above-mentioned semiconductor laser controller can be obtained by a simple circuit construction and the accuracy in operation of the controller is improved in comparison with that using the characteristics approximated by the straight line.

Further, in the above semiconductor laser controller of the present invention, the luminous level command signal is set to a digital signal and the converting means has a conversion table for converting the luminous level command signal to a correcting signal corrected on the basis of the light output and forward electric current characteristics of the semiconductor laser, and a digital-/analog converter for converting the signal converted by the conversion table to the forward electric current of the semiconductor laser. Accordingly, the accuracy in operation of the semiconductor laser controller is improved since the non-linearity is secured by the conversion table with respect to the above electric current converting means, and effects similar to those obtained in the above-mentioned controller can be obtained.

Figure 44:
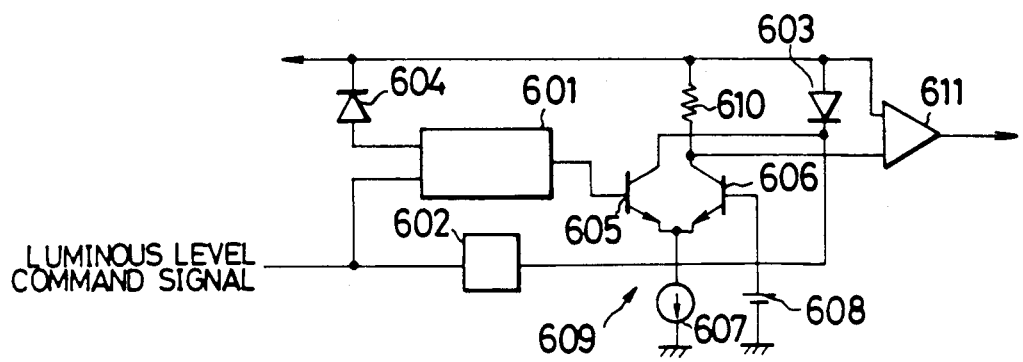
FIGS. 44 to 49 are circuit diagrams showing the semiconductor laser controller in another embodiments of the present invention.

FIG. 44 shows the semiconductor laser controller in another embodiment of the present invention.

In this embodiment, the power sources Vcc and Vss in the above-mentioned embodiment of FIG. 18 are opposite to each other and transistors 605, 606 are of an NPN type. The voltage between both terminals of a resistor 610 is taken out through a differential amplifier 611.

Figure 45:
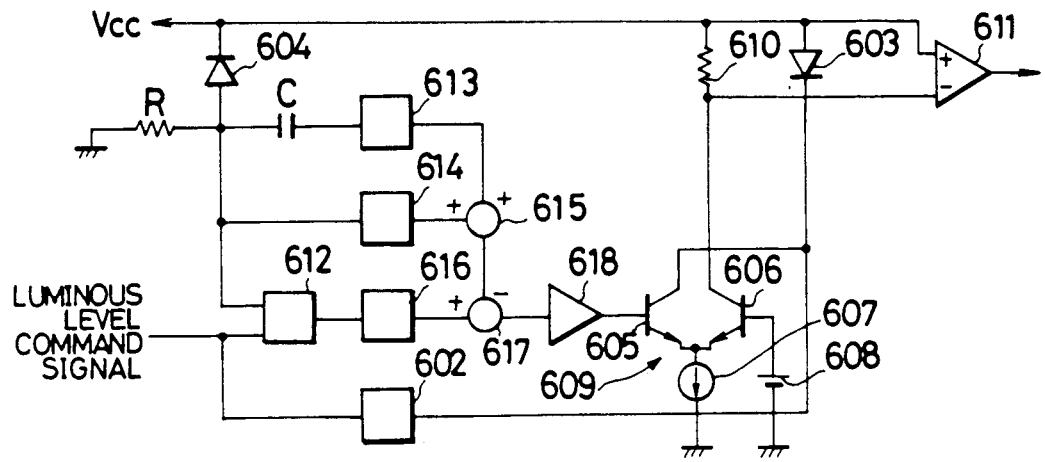

FIG. 45 shows the semiconductor laser controller in accordance with another embodiment of the present invention.

A luminous level command signal is inputted to a comparing amplifier 612 and an electric current converter 602. A portion of a light output of a driven semiconductor laser 603 is monitored by a light-receiving element 604. A high frequency component of a photovoltaic current (proportional to the light output of the semiconductor laser 603) Is induced in the light-receiving element 604 is inputted to an impedance converter 613 through a capacitor C. A lower frequency component of the photovoltaic current Is is converted to a voltage through a resistor R. The voltage generated in this resistor R is inputted to the comparing amplifier 612 and a voltage-current converter 614. The voltage-current converter 614 converts the voltage generated in the resistor R to an electric current. The output electric current of this voltage-current converter 614 is added to an output electric current of the impedance converter 613 by an adder 615 and the added electric current becomes an electric current $I_0$ equal to the photovoltaic current Is generated in the light-receiving element 604. On the other hand, the comparing amplifier 612 compares the voltage generated in the resistor R and the luminous level command signal and amplifies the difference in voltage therebetween. An output voltage of this comparing amplifier 612 is converted to an electric current by a voltage-current converter 616 and becomes a first luminous level command signal electric current IL. A subtracter 617 subtracts the electric current $I_0$ from the adder 615 from the first luminous level command signal electric current IL from the voltage-current converter 616, and outputs a differential electric current therebetween. This differential electric current is amplified by an electric current amplifier 618 and is outputted as a control electric current of the semiconductor laser 603 through a differential amplifier 609. Accordingly, the light-receiving element 604, the capacitor C, the resistor R, the impedance converter 613, the voltage-current converter 614, the adder 615, the subtracter 617, the electric current amplifier 618 and the differential amplifier 609 constitute a first photoelectric negative feedback loop for controlling a forward electric current of the semiconductor laser 603 such that the photovoltaic current Is of the light-receiving element 604 proportional to the light output of the semiconductor laser 603 is equal to the first luminous level command signal electric current IL from the voltage-current converter 616. The comparing amplifier 612 and the voltage-current converter 616 constitute a second photoelectric negative feedback loop for controlling the first luminous level command signal electric current IL such that a voltage proportional to the photovoltaic current Is of the light-receiving element 604 is equal to that of a second luminous level command signal from the exterior of the controller.

The operations of the electric current converter 602, the differential amplifier 609, the resistor 610 and the differential amplifier 611 are similar to those in the above-mentioned embodiments. A sum of an output electric current of the electric current converter 602 and a control electric current outputted from the differential amplifier 609 becomes the forward electric current of the semiconductor laser 603.

When a cross frequency in an open loop of the above first photoelectric negative feedback loop is $f_0$ and a DC gain therein is 30 and a DC gain in the second photoelectric negative feedback loop is 10,000, step responsive characteristics of the light output $P_{out}$ of the semiconductor laser 603 can be approximately provided by the following formula.

$$P_{out} = PL + (PS - PL) \exp(-2\pi f_0 t).$$

Since the DC gain of the second photoelectric negative feedback loop is set to 10,000, the PL is considered to be equal to the set light amount when an allowable range of a set error is less than 0.1%. Further, since the DC gain of the first photoelectric negative feedback loop is set to 30, a stationary error in the first photoelectric negative feedback loop becomes about $(PS-PL)/30$. Accordingly, if the light amount PS set by the electric current converter 602 is equal to the PL, the light output of the semiconductor laser 603 is instantly equal to the PL. In this case, since $P_{out}=PL$, the output of the comparing amplifier 612 is not changed. Namely, the electric current value of the resistor 610 is not changed so that the voltage between both terminals of the resistor 610 is not changed. However, when the PS is varied by a disturbance, etc., an insufficient electric current by the electric current converter 602 is supplied by the comparing amplifier 612 in the forward direction of the semiconductor laser 603. This electric current value becomes a value provided by subtracting the electric current flowing through the resistor 610 from an electric current set by the electric current source 607. Accordingly, the electric current value corresponding to an error in conversion of the electric current converter 602 can be detected by measuring the voltage between both terminals of the resistor 610.

Even when the PS is varied by 5% by a disturbance, etc., the stationary error in the first photoelectric negative feedback loop becomes about 0.2% so that the error with respect to a set value of the light output of the semiconductor laser 603 becomes less than 0.4% after 10 ns if the $f_0$ is about 40 MHZ and the DC gain of the first photoelectric negative feedback loop is about 30.

To set to a value less than 0.4% the error in entire light amount (an integral value $\int P_{out}$ of the light output) from a time immediately after the light output of the semiconductor laser 603 is changed until a set time $\tau_0$ has passed, it is sufficient that the cross frequency of the photoelectric negative feedback loop is greater than 40 MHZ and the DC gain of the photoelectric negative feedback loop is about 30 times when the set time $\tau_0 = 50$ ns. Such cross frequency and DC gain values can be easily realized.

Figure 46:
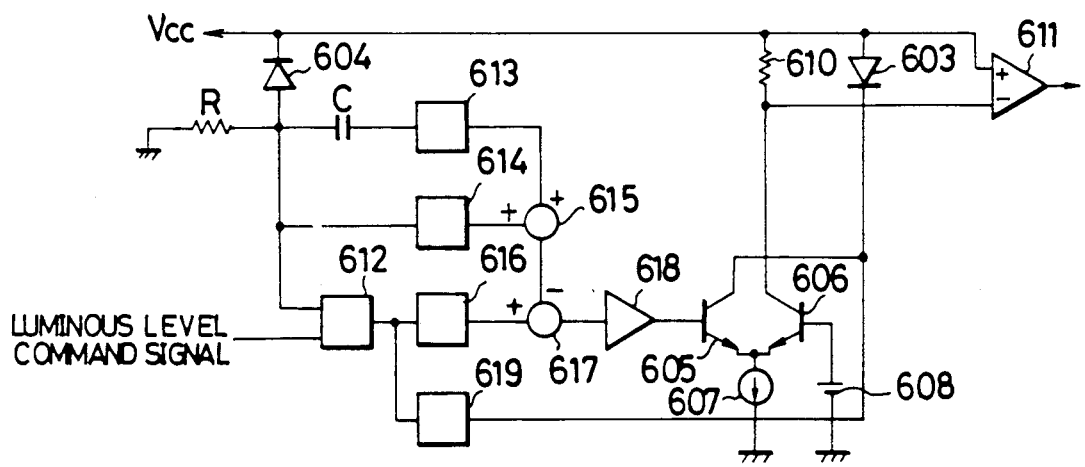

FIG. 46 shows the semiconductor laser controller in another embodiment of the present invention.

In this embodiment, instead of the second luminous level command signal in the embodiment of FIG. 45, an output voltage of the comparing amplifier 612 is inputted to an electric current converter 619. The electric current converter 619 outputs an electric current preset in accordance with the output voltage of the comparing amplifier 612 such that the light-receiving signal is equal to the luminous level command signal. This preset electric current is an electric current preset on the basis of light output and forward electric current characteristics of the semiconductor laser 603, a coupling coefficient between the light-receiving element 604 and the semiconductor laser 603, and light input and light-receiving signal characteristics of the light-receiving element 604. Namely, with respect to a high frequency component of the luminous level command signal, the electric current converter 619 outputs an electric current preset in accordance with the output voltage of the comparing amplifier 612 such that an electric current $I_0$ from an adder 615 is equal to a first luminous level command signal electric current IL. This preset electric current is an electric current preset on the basis of the light output and forward electric current characteristics of the semiconductor laser 603, the coupling coefficient between the light-receiving element 604 and the semiconductor laser 603, and the light input and light-receiving signal characteristics of the light-receiving element 604. With respect to a low frequency component of the second luminous level command signal, the electric current converter 619 outputs an electric current preset in accordance with the output voltage of the comparing amplifier 612 such that the voltage between both terminals of the resistor R is equal to that of the first luminous level command signal. This preset electric current is an electric current preset on the basis of the light output and forward electric current characteristics of the semiconductor laser 603, the coupling coefficient between the light-receiving element 604 and the semiconductor laser 603, and the light input and light-receiving signal characteristics of the light-receiving element 604.

Figure 47:
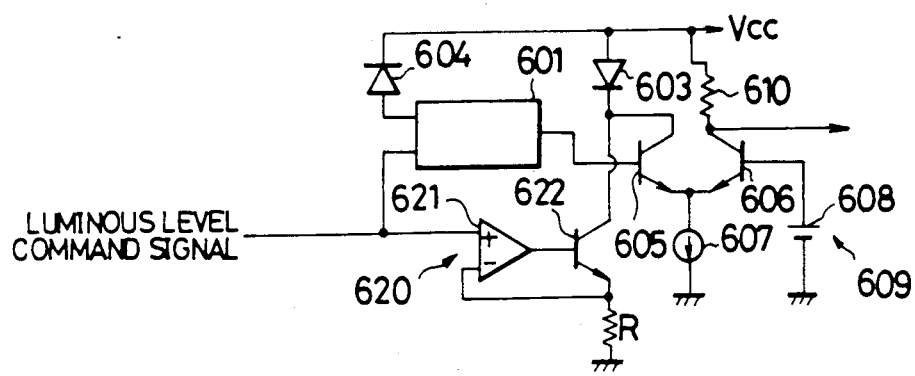

FIG. 47 shows the semiconductor laser controller in another embodiment of the present invention.

In this embodiment, an electric current amplifier 620 is constructed by a differential amplifier 621, a transistor 622 and a resistor $R_0$ as the electric current converter in the embodiment of FIG. 44. Further, in this embodiment, the differential amplifier 611 is omitted. The electric current amplifier 620 outputs an electric current preset in accordance with a luminous level command signal Vs such that the light-receiving signal is equal to the luminous level command signal. This preset electric current is an electric current preset on the basis of light output and forward electric current characteristics of the semiconductor laser 603, a coupling coefficient between the light-receiving element 604 and the semiconductor laser 603, and light input and light-receiving signal characteristics of the light-receiving element 604. Namely, the luminous level command signal Vs is inputted to the differential amplifier 621 and is converted to an electric current Vs/R$_0$ by the transistor 622 and the resistor R$_0$. A sum Vs/R$_0$+A$\Delta$V of this electric current Vs/R$_0$ and an output electric current A$\Delta$V of the differential amplifier 609 becomes the forward electric current of the semiconductor laser 603. The semiconductor laser 603 outputs the light output P$_0$ determined by the forward electric current Vs/R$_0$+A$\Delta$V. As mentioned above, the resistor 610 converts the control electric current of the photoelectric negative feedback loop to a voltage and detects this voltage, and this detected voltage is outputted.

In general, with respect to the forward electric current greater than a threshold electric current I$_{th}$ in the semiconductor laser, the relation between the light output and the forward electric current can be approximately represented by a straight line of a differential quantum efficiency $\eta$. In this case, the light output P$_0$ can be represented as follows.

$$P_0 = \frac{\eta}{(1 + \alpha S\eta A)} \left( \frac{1}{R1} + A \frac{1}{R_0} \right) V_s - \frac{\eta}{1 + \alpha S\eta A} I_{th}$$

$$\Delta V = V_s/R1 - \alpha S P_0$$

Similar to the embodiment of FIG. 45, the responsive characteristics can be approximately represented as follows when the Vs is changed from a V$_0$ (the light output of the semiconductor laser 603 corresponding to the V$_0$ shows a light intensity when the electric current of the semiconductor laser is greater than the threshold electric current) to a Vi.

$$P_0 = \frac{V_i}{\alpha S R_0} + \frac{V_i}{\alpha S R_0} \left( \frac{\alpha S \eta R_0}{R} - 1 \right) \cdot \exp(-2\pi f_0 t)$$

Accordingly, if the light output is set such that R=$\alpha S\eta R_0$, effects similar to those in the embodiment of FIG. 45 can be obtained by a simple construction.

The electric current converter 620 in this embodiment may be constructed by that shown in FIGS. 29 and 32.

Figure 48:
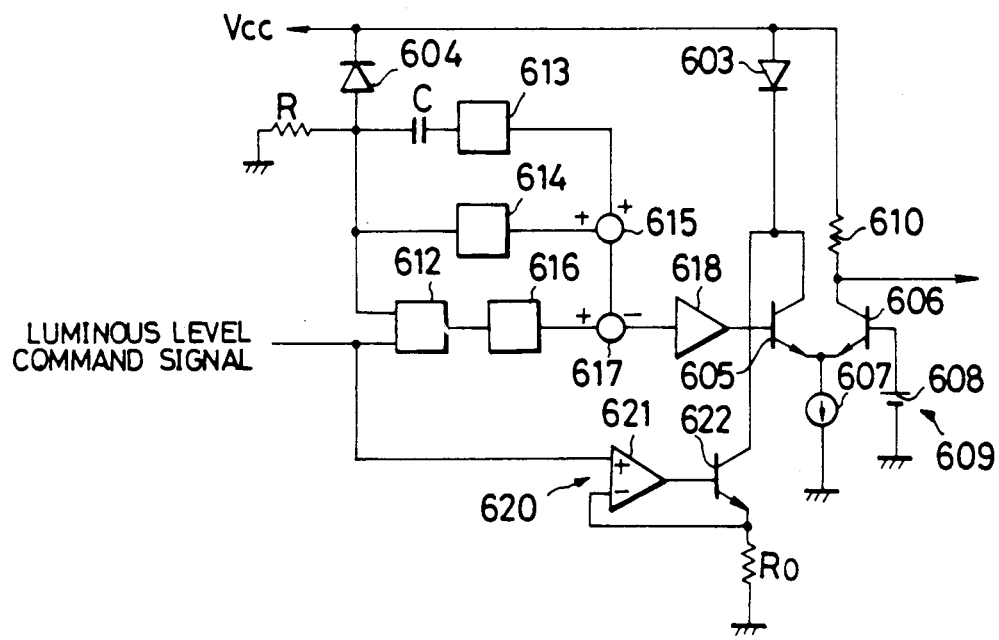

FIG. 48 shows the semiconductor laser controller in another embodiment of the present invention.

In this embodiment, the above-mentioned electric current converter 620 is used as that in the embodiment of FIG. 45 and the differential amplifier 611 is omitted.

In general, with respect to the forward electric current greater than a threshold electric current I$_{th}$ in the semiconductor laser, the relation between the light output and the forward electric current can be approximately represented by a straight line of a differential quantum efficiency $\eta$. In this case, the light output P$_0$ of the semiconductor laser 603 can be represented as follows.

$$P_0 = \frac{\eta}{(1 + \alpha S\eta A)} \left( \frac{1}{R1} + A \frac{1}{R_0} \right) V_s - \frac{\eta}{1 + \alpha S\eta A} I_{th}$$

Similar to the embodiment of FIG. 45, the responsive characteristics can be approximately represented as follows when the Vs is changed from a V$_0$ (the light output of the semiconductor laser 603 corresponding to the V$_0$ shows a light intensity when the electric current of the semiconductor laser is greater than the threshold electric current) to a Vi.

$$P_0 = \frac{V_i}{\alpha S R_0} + \frac{V_i}{\alpha S R_0} \left( \frac{\alpha S \eta R_0}{R} - 1 \right) \cdot \exp(-2\pi f_0 t)$$

Accordingly, if the light output is set such that R=$\alpha S\eta R_0$, effects similar to those in the embodiment of FIG. 45 can be obtained by a simple construction.

Figure 49:
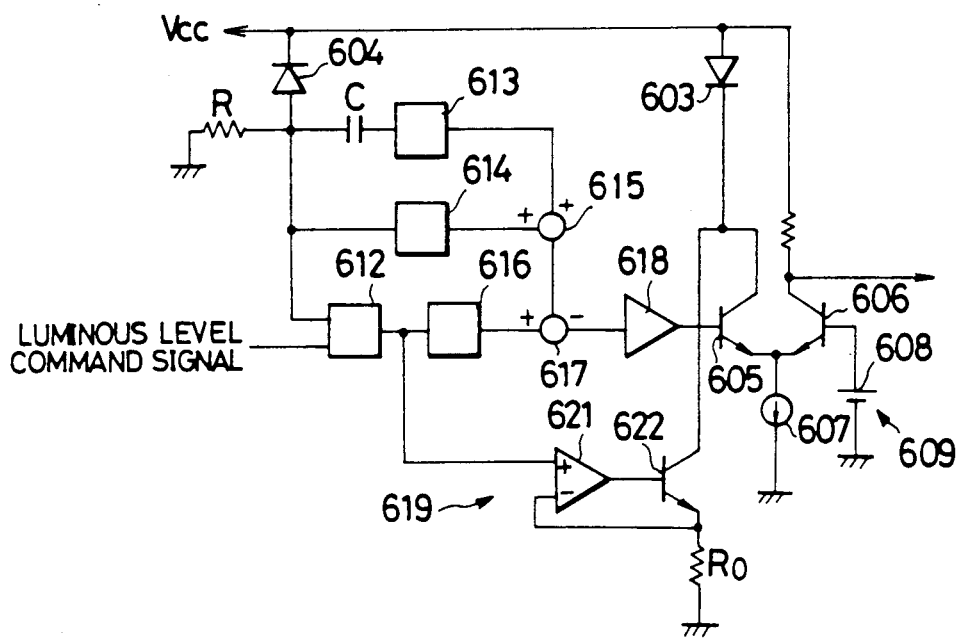

FIG. 49 shows the semiconductor laser controller in another embodiment of the present invention.

In this embodiment, instead of the second luminous level command signal in the embodiment of FIG. 48, an output voltage of the comparing amplifier 612 is inputted to an electric current converter 619.

In the above-mentioned embodiments, the electric current converter is constructed by using the general one and the characteristics approximated by a straight line, but can be constructed by the characteristics approximated by a polygonal line. FIGS. 33 to 35 show examples of the electric current converter having the characteristics approximated by the polygonal line and used in the above-mentioned embodiments.

To optimize the above-mentioned electric current converter, it is effective to correct the light output and forward electric current characteristics of the semiconductor laser by a conversion table with the luminous level command signal as a digital signal. FIG. 36 shows a portion of the semiconductor laser controller in this case.

As mentioned above, in the embodiments of the present invention shown in FIGS. 44 to 49, a semiconductor laser controller comprises a photoelectric negative feedback loop for detecting a light output of a driven semiconductor laser by a light-receiving portion and controlling a forward electric current of the semiconductor laser such that a light-receiving signal proportional to the light output of the semiconductor laser provided from the light-receiving portion is equal to a command signal indicative of a luminous level; detecting means for detecting a control electric current of the photoelectric negative feedback loop; converting means for converting the luminous level command signal to the forward electric current of the semiconductor laser in accordance with a conversion rule preset such that the light-receiving signal is equal to the luminous level command signal on the basis of light output and forward electric current characteristics of the semiconductor laser, a coupling coefficient between the light-receiving portion and the semiconductor laser, and light input and light-receiving signal characteristics of the light-receiving portion; and means for controlling the operation of the semiconductor laser by a sum or difference in electric current with respect to the control electric current of the photoelectric negative feedback loop and an electric current produced by the converting means. Accordingly, the semiconductor laser controller accurately operated at a high speed and having a high resolution and strongly bearing against a disturbance, etc. can be realized.

Further, in the above semiconductor laser controller of the present invention, the photoelectric negative feedback loop is constructed by a first photoelectric negative feedback loop for detecting the light output of the semiconductor laser by the light-receiving portion and controlling the forward electric current of the semiconductor laser such that a light-receiving electric current proportional to the light output of the semiconductor laser obtained from the light-receiving portion is equal to the luminous level command signal in which a first luminous level command signal is converted to an electric current, and a second photoelectric negative feedback loop for controlling the first luminous level command signal such that a voltage proportional to the light-receiving electric current is equal to that of the luminous level command signal Accordingly, effects similar to those obtained in the above-mentioned semiconductor laser controller can be obtained without setting an open loop gain of the photoelectric negative feedback loop in a high frequency region to a very large value.

Further, in above the semiconductor laser controller of the present invention, the converting means converts the luminous level command signal as an analog signal voltage to an electric current proportional to the luminous level command signal by approximating the light output and forward electric current characteristics of the semiconductor laser to those represented by a straight line. Accordingly, effects similar to those obtained in the above-mentioned semiconductor laser controller can be obtained by a simple circuit construction.

Further, in the above semiconductor laser controller of the present invention, the converting means converts the luminous level command signal as an analog signal voltage to an electric current corresponding to the luminous level command signal by approximating the light output and forward electric current characteristics of the semiconductor laser to those represented by a polygonal line. Accordingly, effects similar to those obtained in the above-mentioned semiconductor laser controller can be obtained by a simple circuit construction and the accuracy in operation of the controller is improved in comparison with that using the characteristics approximated by the straight line.

Further, in the above semiconductor laser controller of the present invention, the luminous level command signal is set to a digital signal and the converting means has a conversion table for converting the luminous level command signal to a correcting signal corrected on the basis of the light output and forward electric current characteristics of the semiconductor laser, and digital-/analog converting means for converting the signal converted by the conversion table to the forward electric current of the semiconductor laser. Accordingly, the accuracy in operation of the semiconductor laser controller is improved since the non-linearity is secured by the conversion table with respect to the above electric current converting means and effects similar to those obtained in the above-mentioned controller can be obtained.

Figure 50:
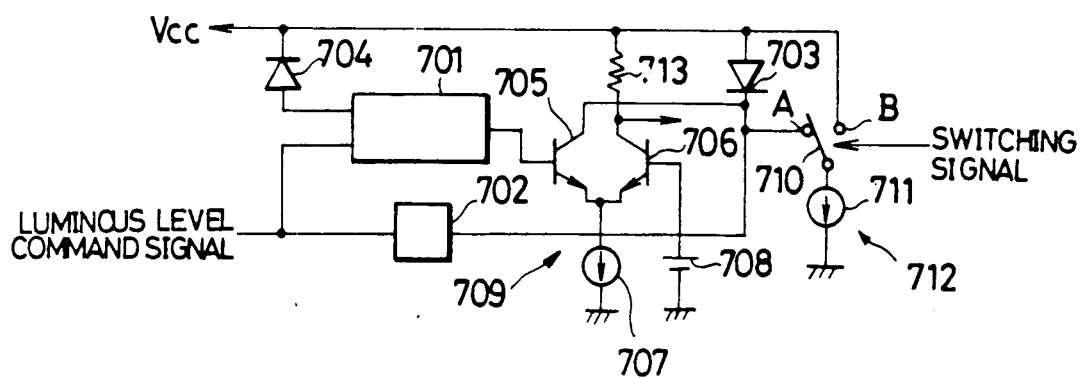
FIGS. 50 to 55 are circuit diagrams showing the semiconductor laser controller in another embodiments of the present invention.

FIG. 50 shows the semiconductor laser controller in another embodiment of the present invention.

A command signal indicative of a luminous level is inputted to a comparing amplifier 701 and an electric current converter 702 and a portion of a light output of a driven semiconductor laser 703 is monitored by a light-receiving element 704. The comparing amplifier 701, the semiconductor laser 703, the light-receiving element 704 and a differential amplifier 709 form a photoelectric negative feedback loop. The comparing amplifier 701 compares the luminous level command signal and a light-receiving signal proportional to a photovoltaic current (proportional to the light output of the semiconductor laser 703) induced in the light-receiving element 704. The differential amplifier 709 is composed of transistors 705, 706, an electric current source 707 and a voltage source 708. The comparing amplifier 701 then controls a forward electric current of the semiconductor laser 703 by the above compared result through the differential amplifier 709 such that the light-receiving signal is equal to the luminous level command signal. The electric current converter 702 outputs an electric current preset in accordance with the luminous level command signal such that the light-receiving signal is equal to the luminous level command signal. This preset electric current is an electric current preset on the basis of light output and forward electric current characteristics of the semiconductor laser 703, a coupling coefficient between the light-receiving element 704 and the semiconductor laser 703, and light input and light-receiving signal characteristics of the light-receiving element 704. A switching circuit 712 is composed of a switch 710 and an electric current source 711 and the switch 710 is turned on and off by a switching signal. Normally, the switch 710 is switched onto the side of a fixed contact B and no electric current is supplied to the semiconductor laser 703 from the electric current source 711 so that no light is emitted from the semiconductor laser 703. When the switching signal is inputted at a timing for emitting the light from the semiconductor laser 703, the switch 710 is switched onto the side of a fixed contact A and the electric current is supplied from the electric current source 711 to the semiconductor laser 703 so that the light is emitted from the semiconductor laser 703. A sum of a drive electric current of this switching circuit 712, an output electric current of the electric current converter 702 and a control electric current outputted from the comparing amplifier 701 through the differential amplifier 709 becomes the forward electric current of the semiconductor laser 703.

When a cross frequency in an open loop of the above photoelectric negative feedback loop is $f_0$ and a DC gain is 10,000, step responsive characteristics of the light output $P_{out}$ of the semiconductor laser 703 can be approximately provided by the following formula.

$$P_{out} = PL + (PS - PL) \exp(-2\pi f_0 t)$$

where PL designates the light output at $t = \infty$ and PS designates a light amount set by the electric current converter 702.

Since the DC gain in the open loop of the photoelectric negative feedback loop is set to 10,000, the PL is considered to be equal to the set light amount when an allowable range of a set error is less than 0.1%.

Accordingly, if the light amount PS set by the electric current converter 702 is equal to the PL, the light output of the semiconductor laser 703 is instantly equal to the PL. In this case, since $P_{out} = PL$, the output of the comparing amplifier 701 is not changed. Namely, the electric current flowing through a resistor 713 is not changed so that the voltage between both terminals of the resistor 713 is not changed. However, when the PS is varied by a disturbance, etc., an insufficient electric current by the electric current converter 702 is supplied by the comparing amplifier 701 in the forward direction of the semiconductor laser 703. This electric current value becomes a value provided by subtracting the electric current flowing through the resistor 713 from an electric current set by the electric current source 707. Accordingly, the electric current value corresponding to an error in conversion of the electric current converter 702 can be detected by measuring the voltage between both terminals of the resistor 713. The switching circuit 712 is operated at a high speed until a drive electric current value provided by the switching circuit 712. Accordingly, the switching circuit rises at a high speed irrespective of a rising speed of the electric current converter 702. Further, in general, as can be seen from the electric current and light output characteristics of the semiconductor laser 703 shown in FIG. 43, the semiconductor laser does not oscillate until a threshold electric current so that there is almost no deterioration of a quenching ratio by an offset electric current.

Further, in this embodiment, the output electric current of the electric current converter 702 is added to the control electric current of the photoelectric negative feedback loop. When the electric current converter 702 is connected in parallel to the semiconductor laser 703, the operation of the semiconductor laser 703 can be controlled by the difference in electric current between the output electric current of the electric current converter 702 and the control electric current of the photoelectric negative feedback loop.

As mentioned above, in accordance with this embodiment, the semiconductor laser controller accurately operated at a high speed and having a high resolution can be realized.

Figure 51:
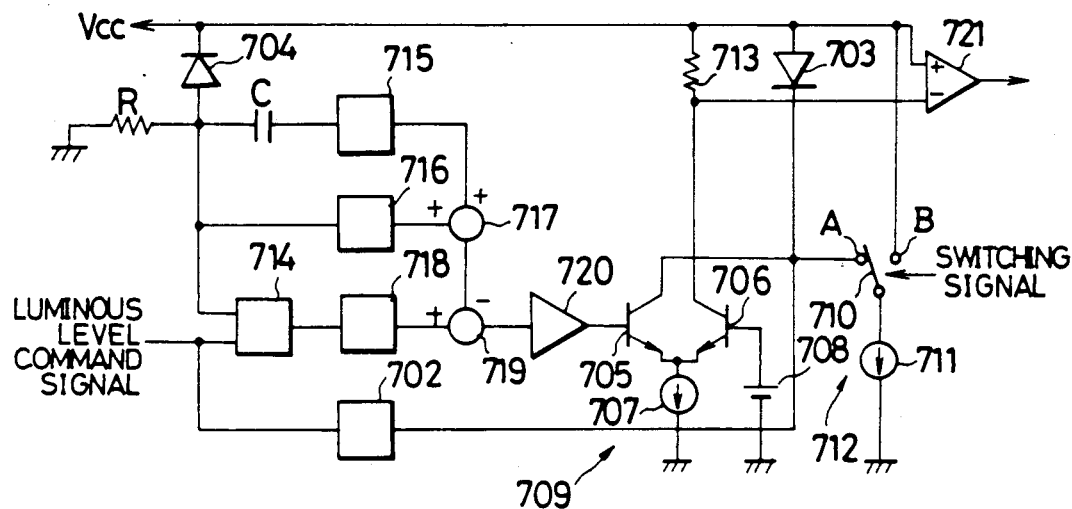

FIG. 51 shows the semiconductor laser controller in another embodiment of the present invention.

A luminous level command signal is inputted to a comparing amplifier 714 and an electric current converter 702. A portion of a light output of a driven semiconductor laser 703 is monitored by a light-receiving element 704. A high frequency component of a photovoltaic current (proportional to the light output of the semiconductor laser 703) Is induced in the light-receiving element 704 is inputted to an impedance converter 715 through a capacitor C. A lower frequency component of the photovoltaic current Is is converted to a voltage through a resistor R. The voltage generated in this resistor R is inputted to the comparing amplifier 714 and a voltage-current converter 716. The voltage-current converter 716 converts the voltage generated in the resistor R to an electric current. The output electric current of this voltage-current converter 716 is added to an output electric current of the impedance converter 715 by an adder 717 and the added electric current becomes an electric current $I_0$ equal to the photovoltaic current Is generated in the light-receiving element 704. On the other hand, the comparing amplifier 714 compares the voltage generated in the resistor R and the luminous level command signal and amplifies the difference in voltage therebetween. An output voltage of this comparing amplifier 714 is converted to an electric current by a voltage-current converter 718 and becomes a first luminous level command signal electric current IL. A subtracter 719 subtracts the electric current $I_0$ from the adder 717 from the first luminous level command signal electric current IL from the voltage-current converter 718, and outputs a differential electric current therebetween. This differential electric current is amplified by an electric current amplifier 720 and is outputted as a control electric current of the semiconductor laser 703 through the differential amplifier 709.

Accordingly, the light-receiving element 704, the capacitor C, the resistor R, the impedance converter 715, the voltage-current converter 716, the adder 717, the subtracter 719, the electric current amplifier 720 and the differential amplifier 709 constitute a first photoelectric negative feedback loop for controlling a forward electric current of the semiconductor laser 703 such that the photovoltaic current Is of the light-receiving element 704 proportional to the light output of the semiconductor laser 703 is equal to the first luminous level command signal electric current IL from the voltage-current converter 718. The comparing amplifier 714 and the voltage-current converter 718 constitute a second photoelectric negative feedback loop for controlling the first luminous level command signal electric current IL such that a voltage proportional to the photovoltaic current Is of the light-receiving element 704 is equal to that of a second luminous level command signal from the exterior of the controller.

The operations of the electric current converter 702, the differential amplifier 709, a resistor 713 and a switching circuit 712 are similar to those in the above-mentioned embodiments. A sum of an output electric current of an electric current converter 702, an output electric current of the switching circuit 712 and the control electric current outputted from the differential amplifier 709 becomes the forward electric current of the semiconductor laser 703. The voltage between both terminals of the resistor 713 is taken out by the differential amplifier 721.

When a cross frequency in an open loop of the above first photoelectric negative feedback loop is $f_0$ and a DC gain therein is 30 and a DC gain in the second photoelectric negative feedback loop is 10,000, step responsive characteristics of the light output $P_{out}$ of the semiconductor laser 703 can be approximately provided by the following formula.

$$P_{out} = PL + (PS - PL) \exp(-2\pi f_0 t).$$

Since the DC gain of the second photoelectric negative feedback loop is set to 10,000, the PL is considered to be equal to the set light amount when an allowable range of a set error is less than 0.1%. Further, since the DC gain of the first photoelectric negative feedback loop is set to 30, a stationary error in the first photoelectric negative feedback loop becomes about $(PS-PL)/30$. Accordingly, if the light amount PS set by the electric current converter 702 is equal to the PL, the light output of the semiconductor laser 703 is instantly equal to the PL. In this case, since $P_{out}=PL$, the output of the comparing amplifier 714 is not changed. Namely, the electric current value of the resistor 713 is not changed so that the voltage between both terminals of the resistor 713 is not changed. However, when the PS is varied by a disturbance, etc., an insufficient electric current by the electric current converter 702 is supplied by the comparing amplifier 714 in the forward direction of the semiconductor laser 703. This electric current value becomes a value provided by subtracting the electric current flowing through the resistor 713 from an electric current set by an electric current source 707. Accordingly, the electric current value corresponding to an error in conversion of the electric current converter 702 can be detected by measuring the voltage between both terminals of the resistor 713. The switching circuit 712 is operated at a high speed until a drive electric current value provided by the switching circuit 712. Accordingly, the switching circuit rises at a high speed irrespective of a rising speed of the electric current converter 702. Further, in general, as can be seen from the electric current and light output characteristics of the semiconductor laser 703 shown in FIG. 43, the semiconductor laser does not oscillate until a threshold electric current value so that there is almost no deterioration of a quenching ratio by an offset electric current. Even when the PS is varied by 5% by a disturbance, etc., the stationary error of the first photoelectric negative feedback loop becomes about 0.2% so that the error with respect to a set value of the light output of the semiconductor laser 703 becomes less than 0.4% after 10 ns if the $f_0$ is about 40 MHZ and the DC gain of the first photoelectric negative feedback loop is about 30.

To set to a value less than 0.4% the error in entire light amount (an integral value $\int P_{out}$ of the light output) from a time immediately after the light output of the semiconductor laser 703 is changed until a set time $\tau_0$ has passed, it is sufficient that the cross frequency of the photoelectric negative feedback loop is greater than 40 MHZ when the set time $\tau_0 = 50$ ns and the DC gain of the photoelectric negative feedback loop is about 30 times. Such cross frequency and DC gain values can be easily realized.

Figure 52:
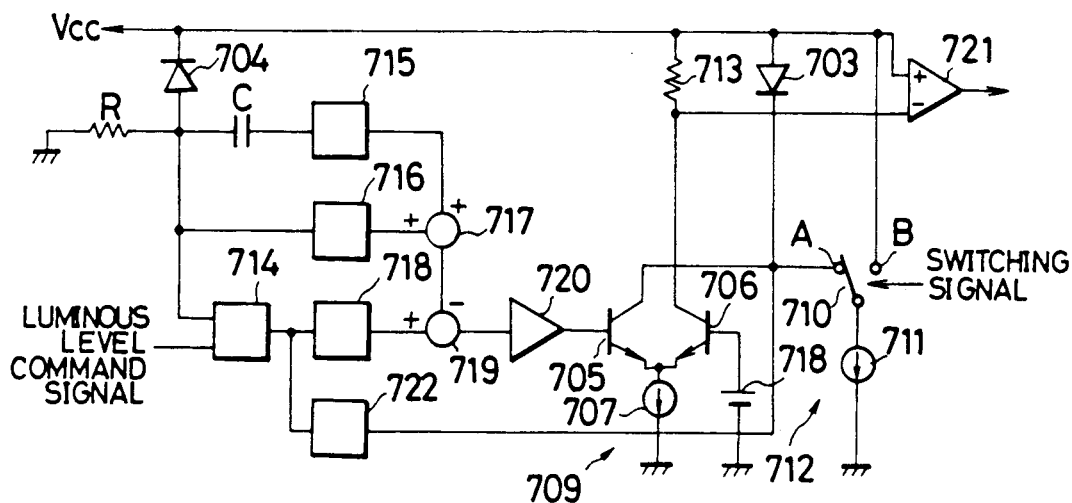

FIG. 52 shows the semiconductor laser controller in another embodiment of the present invention.

In this embodiment, instead of the second luminous level command signal in the embodiment of FIG. 51, an output voltage of the comparing amplifier 714 is inputted to an electric current converter 722. The electric current converter 722 outputs an electric current preset in accordance with the output voltage of the comparing amplifier 714 such that the light-receiving signal is equal to the luminous level command signal. This preset electric current is an electric current preset on the basis of light output and forward electric current characteristics of the semiconductor laser 703, a coupling coefficient between the light-receiving element 704 and the semiconductor laser 703, and light input and light-receiving signal characteristics of the light-receiving element 704. Namely, with respect to a high frequency component of the luminous level command signal, the electric current converter 722 outputs an electric current preset in accordance with the output voltage of the comparing amplifier 714 such that the electric current $I_0$ from the adder 717 is equal to the first luminous level command signal electric current IL. This preset electric current is an electric current preset on the basis of the light output and forward electric current characteristics of the semiconductor laser 703, the coupling coefficient between the light-receiving element 704 and the semiconductor laser 703, and the light input and light-receiving signal characteristics of the light-receiving element 704. With respect to a low frequency component of the second luminous level command signal, the electric current converter 713 outputs an electric current preset in accordance with the output voltage of the comparing amplifier 714 such that the voltage between both terminals of the resistor R is equal to that of the first luminous level command signal. This preset electric current is an electric current preset on the basis of the light output and forward electric current characteristics of the semiconductor laser 703, the coupling coefficient between the light-receiving element 704 and the semiconductor laser 703 and the light input and light-receiving signal characteristics of the light-receiving element 704.

Figure 53:
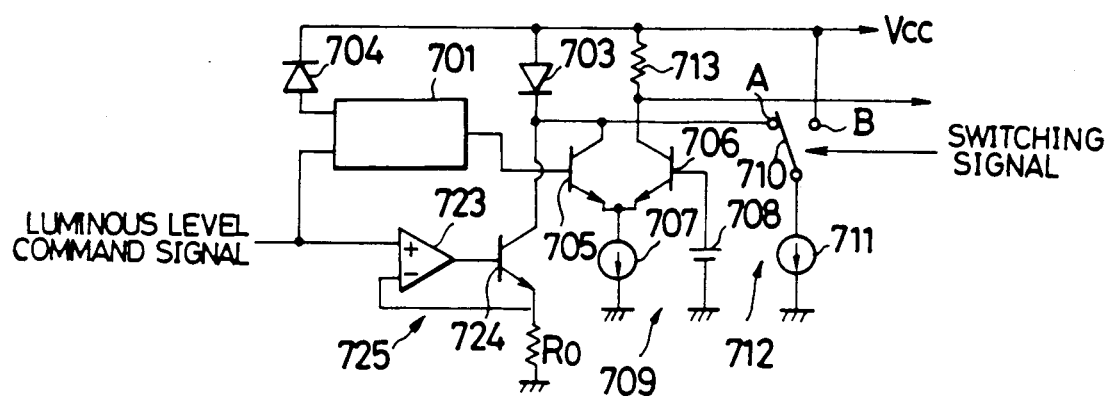

FIG. 53 shows the semiconductor laser controller in another embodiment of the present invention.

In this embodiment, an electric current amplifier 725 is constructed by a differential amplifier 723, a transistor 724 and a resistor $R_0$ as the electric current converter 702 in the embodiment of FIG. 50. The electric current amplifier 725 outputs an electric current preset in accordance with a luminous level command signal Vs such that the light-receiving signal is equal to the luminous level command signal. This preset electric current is an electric current preset on the basis of light output and forward electric current characteristics of the semiconductor laser 703, a coupling coefficient between the light-receiving element 704 and the semiconductor laser 703, and light input and light-receiving signal characteristics of the light-receiving element 704. Namely, the luminous level command signal Vs is inputted to the differential amplifier 723 and is converted to an electric current $Vs/R_0$ by the transistor 724 and the resistor $R_0$. A sum of this output electric current $Vs/R_0$ of the electric current converter 725, an output electric current of the switching circuit 712 and a control electric current $A\Delta V$ outputted from the differential amplifier 709 becomes the forward electric current of the semiconductor laser 703.

Figure 43:
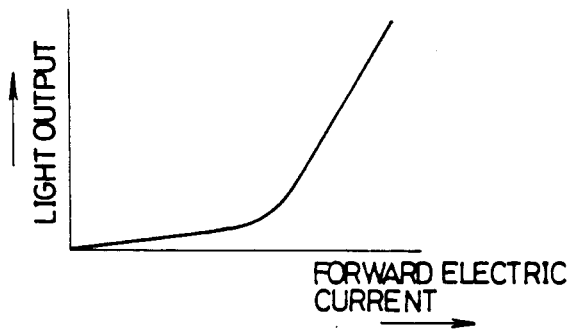
FIG. 43 is a characteristic graph showing the forward electric current and light output characteristics of the semiconductor laser.

In general, as shown in FIG. 43, with respect to the forward electric current greater than a threshold electric current $I_{th}$ in the semiconductor laser, the relation between the light output and the forward electric current can be approximately represented by a straight line of a differential quantum efficiency $\eta$. In this case, the light output $P_0$ can be represented as follows.

$$P_0 = \frac{\eta}{(1 + \alpha S\eta A)} \left( \frac{1}{R1} + A\frac{1}{R_0} \right) Vs - \frac{\eta}{1 + \alpha S\eta A} Ith$$

$$\Delta V = Vs/R1 - \alpha S P_0$$

Similar to the embodiment of FIG. 51, the responsive characteristics can be approximately represented as follows when the Vs is changed from a $V_0$ (the light output of the semiconductor laser 703 corresponding to the $V_0$ shows a light intensity when the electric current of the semiconductor laser is greater than the threshold electric current) to a Vi.

$$P_0 = \frac{Vi}{\alpha S R_0} + \frac{Vi}{\alpha S R_0} \left( \frac{\alpha S\eta R_0}{R} - 1 \right) \cdot \exp(-2\pi f_0 t)$$

Accordingly, if the light output is set such that $R = \alpha S\eta R_0$, effects similar to those in the embodiment of FIG. 51 can be obtained by a simple construction.

The electric current converter in the above embodiment may be constructed by that shown in FIGS. 29 to 32.

Figure 54:
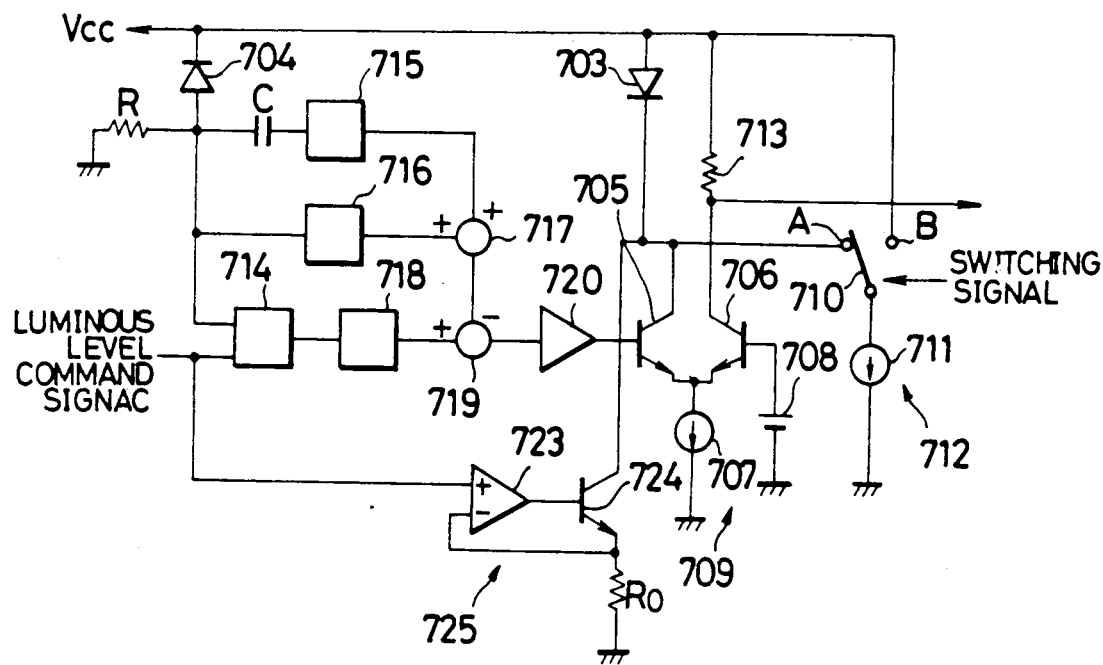

FIG. 54 shows the semiconductor laser controller in another embodiment of the present invention.

In this embodiment, the above electric current converter 725 is used as that in the embodiment of FIG. 51 and the differential amplifier 721 is omitted.

In general, as shown in FIG. 43, with respect to the forward electric current greater than a threshold electric current $I_{th}$ in the semiconductor laser, the relation between the light output and the forward electric current can be approximately represented by a straight line of a differential quantum efficiency $\eta$. In this case, the light output $P_0$ of the semiconductor laser 703 can be represented as follows.

$$P_0 = \frac{\eta}{(1 + \alpha S \eta A)} \left( \frac{1}{R1} + A \frac{1}{R_0} \right) V_s - \frac{\eta}{1 + \alpha S \eta A} I_{th}$$

Similar to the embodiment of FIG. 51, the responsive characteristics can be approximately represented as follows when the Vs is changed from a $V_0$ (the light output of the semiconductor laser 703 corresponding to the $V_0$ shows a light intensity when the electric current of the semiconductor laser is greater than the threshold electric current) to a Vi.

$$P_0 = \frac{V_i}{\alpha S R_0} + \frac{V_i}{\alpha S R_0} \left( \frac{\alpha S \eta R_0}{R} - 1 \right) \cdot \exp(-2\pi f_0 t)$$

Accordingly, if the light output is set such that $R = \alpha S \eta R_0$, effects similar to those in the embodiment of FIG. 51 can be obtained by a simple construction.

Figure 55:
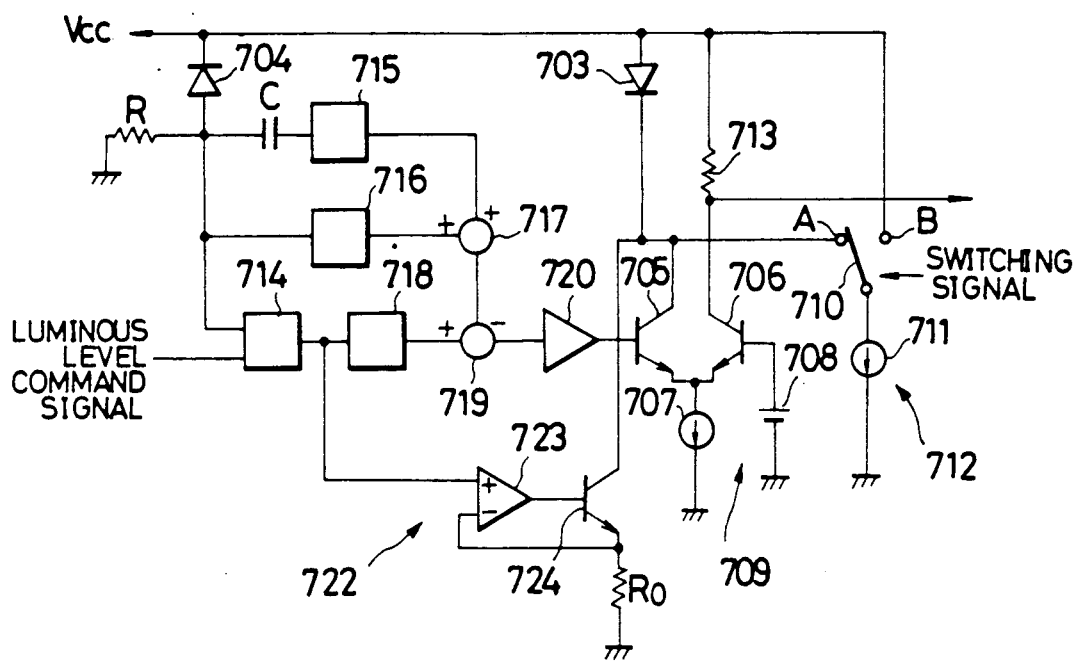

FIG. 55 shows the semiconductor laser controller in another embodiment of the present invention.

In this embodiment, instead of the second luminous level command signal in the embodiment of FIG. 54, an output voltage of the comparing amplifier 714 is inputted to an electric current converter 722 composed of a differential amplifier 723, a transistor 724 and a resistor $R_0$. This electric current converter 722 is operated as mentioned above.

In the above-mentioned embodiments, the electric current converter is constructed by using the general one and the characteristics approximated by a straight line, but can be constructed by the characteristics approximated by a polygonal line. As mentioned above, FIGS. 33 to 35 show examples of the electric current converter having the characteristics approximated by a polygonal line and used in the above-mentioned embodiments.

Figure 56:
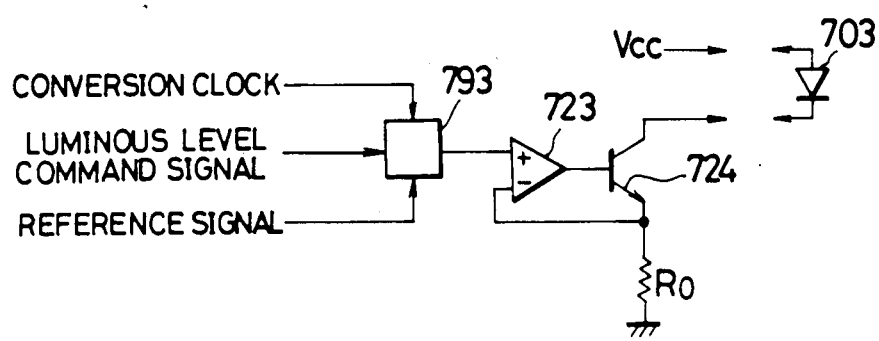
FIG. 56 is a circuit diagram showing a portion of the semiconductor laser controller in another embodiment of the present invention.

In the above-mentioned embodiments, as shown in FIG. 56, a digital/analog converter 793 ma be disposed on an input side of the above electric current converter 725. In this case, the luminous level command signal is digital/analog-converted by a digital/analog converter 793 as a digital signal. Thereafter, the D/A-converted signal is then converted to an electric current by the differential amplifier 723, the transistor 724 and the resistor $R_0$. A reference signal of the digital/analog converter 793 is changed to correct the electric current and light output characteristics of the semiconductor laser 703.

To optimize the above-mentioned electric current converter, it is effective to correct the light output and forward electric current characteristics of the semiconductor laser by a conversion table with the luminous level command signal as a digital signal. As mentioned above, FIG. 36 shows a portion of the semiconductor laser controller in this case.

As mentioned above, in the embodiments of the present invention shown in FIGS. 50 to 56, a semiconductor laser controller comprises a photoelectric negative feedback loop for detecting a light output of a driven semiconductor laser by a light-receiving portion and controlling a forward electric current of the semiconductor laser such that a light-receiving signal proportional to the light output of the semiconductor laser provided from the light-receiving portion is equal to a command signal indicative of a luminous level; detecting means for detecting a control electric current of the photoelectric negative feedback loop; switching means for switching a constant electric current value of the forward electric current of the semiconductor laser by a switching signal; converting means for converting the luminous level command signal to the forward electric current of the semiconductor laser in accordance with a conversion rule preset such that the light-receiving signal is equal to the luminous level command signal on the basis of light output and forward electric current characteristics of the semiconductor laser, a coupling coefficient between the light-receiving portion and the semiconductor laser, and light input and light-receiving signal characteristics of the light-receiving portion; and means for controlling the operation of the semiconductor laser by a sum or difference in electric current with respect to the control electric current of the photoelectric negative feedback loop, an output electric current of the switching means and an electric current produced by the converting means. Accordingly, the semiconductor laser controller accurately operated at a high speed and having a high resolution and strongly bearing against a disturbance, etc. can be realized. Further, conversion rule of the converting means can be set to be optimal by providing the detecting means for detecting the control electric current of the photoelectric negative feedback loop.

Further, in the above semiconductor laser controller of the present invention, the photoelectric negative feedback loop is constructed by a first photoelectric negative feedback loop for detecting the light output of the semiconductor laser by the light-receiving portion and controlling the forward electric current of the semiconductor laser such that a light-receiving electric current proportional to the light output of the semiconductor laser obtained from the light-receiving portion is equal to the luminous level command signal in which a first luminous level command signal is converted to an electric current, and a second photoelectric negative feedback loop for controlling the first luminous level command signal such that a voltage proportional to the light-receiving electric current is equal to that of the luminous level command signal. Accordingly, effects similar to those obtained in the above-mentioned semiconductor laser controller can be obtained without setting an open loop gain of the photoelectric negative feedback loop in a high frequency region to a very large value.

Further, in the above semiconductor laser controller of the present invention, the converting means converts the luminous level command signal as an analog signal voltage to an electric current corresponding to the luminous level command signal by approximating the light output and forward electric current characteristics of the semiconductor laser to those represented by a straight line. Accordingly, effects similar to those obtained in the above-mentioned semiconductor laser controller can be obtained by a simple circuit construction.

Further, in the above semiconductor laser controller of the present invention, the converting means converts the luminous level command signal as an analog signal voltage to an electric current corresponding to the luminous level command signal by approximating the light output and forward electric current characteristics of the semiconductor laser to those represented by a polygonal line. Accordingly, effects similar to those obtained in the above-mentioned semiconductor laser controller can be obtained by a simple circuit construction and the accuracy in operation of the controller is improved in comparison with that using the characteristics approximated by the straight line.

Further, in the above semiconductor laser controller of the present invention, the luminous level comman signal is set to a digital signal and the converting means has a conversion table for converting the luminous level command signal to a correcting signal corrected on the basis of the light output and forward electric current characteristics of the semiconductor laser, and digital-/analog converting means for converting the signal converted by the conversion table to the forward electric current of the semiconductor laser. Accordingly, the accuracy in operation of the semiconductor laser controller is improved since the non-linearity is compensated by the conversion table with respect to the above electric current converting means, and effects similar to those obtained in the above-mentioned controller can be obtained.

Figure 57:
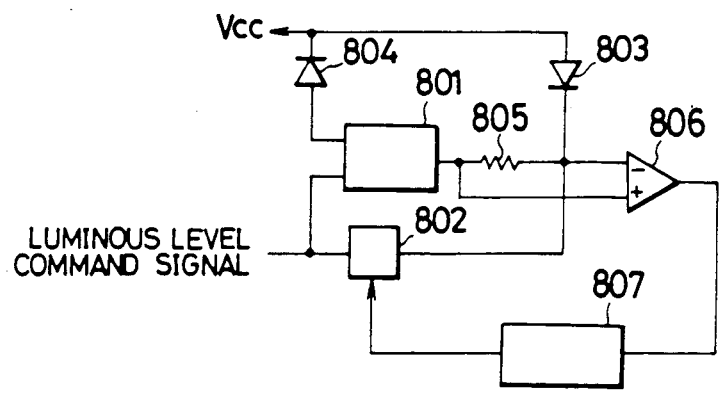
FIGS. 57 to 60 are block diagrams showing the semiconductor laser controller in another embodiments of the present invention.

FIG. 57 shows the semiconductor laser controller in another embodiment of the present invention.

A command signal indicative of a luminous level is inputted to a comparing amplifier 801 and an electric current converter 802 and a portion of a light output of a driven semiconductor laser 803 is monitored by a light-receiving element 804. The comparing amplifier 801, the semiconductor laser 803 and the light-receiving element 804 form a photoelectric negative feedback loop. The comparing amplifier 801 compares the luminous level command signal and a light-receiving signal proportional to a photovoltaic current (proportional to the light output of the semiconductor laser 803) induced in the light-receiving element 804. The comparing amplifier 801 then controls a forward electric current of the semiconductor laser 803 by the above compared result through a resistor 805 such that the light-receiving signal is equal to the luminous level command signal. The electric current converter 802 outputs an electric current preset in accordance with the luminous level command signal such that the light-receiving signal is equal to the luminous level command signal. This preset electric current is an electric current preset on the basis of light output and forward electric current characteristics of the semiconductor laser 803, a coupling coefficient between the light-receiving element 804 and the semiconductor laser 803, and light input and light-receiving signal characteristics of the light-receiving element 804. A sum of the output electric current of this electric current converter 802 and a control electric current outputted from the comparing amplifier 801 becomes the forward electric current of the semiconductor laser 803.

When a cross frequency in an open loop of the above photoelectric negative feedback loop is $f_0$ and a DC gain is 10,000, step responsive characteristics of the light output $P_{out}$ of the semiconductor laser 803 can be approximately provided by the following formula.

$$P_{out} = PL + (PS - PL) \exp(-2\pi f_0 t)$$

where PL designates the light output at $t = \infty$ and PS designates a light amount set by the electric current converter 802.

Since the DC gain in the open loop of the photoelectric negative feedback loop is set to 10,000, the PL is considered to be equal to the set light amount when an allowable range of a set error is less than 0.1%.

Accordingly, if the light amount PS set by the electric current converter 802 is equal to the PL, the light output of the semiconductor laser 803 is instantly equal to the PL. In this case, since $P_{out} = PL$, the output of the comparing amplifier 801 is not changed. Namely, the electric current value of the resistor 805 is not changed so that the voltage between both terminals of the resistor 805 is not changed. However, when the PS is varied by the change in temperature, a disturbance, etc., an insufficient electric current by the electric current converter 802 is supplied by the comparing amplifier 801 in the forward direction of the semiconductor laser 803. Accordingly, the electric current value corresponding to an error in conversion of the electric current converter 802 can be detected by measuring the voltage between both terminals of the resistor 805 when the luminous level command signal is changed for a constant period. The voltage between both terminals of this resistor 805 is detected by a differential amplifier 806 and an output voltage of this differential amplifier 806 is inputted to a circuit 807 for correcting the light output characteristics. This correcting circuit 807 controls a conversion rule of the electric current converter 802 such that the voltage between both terminals of the resistor 805 is minimized in the above constant period, and holds this conversion rule in the other period. As a result, the electric current converter 802 can be held such that the PS is approximately equal to the PL at any time irrespective of the change in light output and forward electric current characteristics of the semiconductor laser 803.

Even when the PS is varied by 5% by DO loop characteristics of the semiconductor laser 803, etc., the error with respect to a set value of the light output of the semiconductor laser 803 becomes less than 0.4% after 10 ns if the $f_0$ is about 40 MHZ.

To set to a value less than 0.4% the error in entire light amount (an integral value $\int P_{out}$ of the light output) from a time immediately after the light output of the semiconductor laser 803 is changed until a set time $\tau$ has passed, it is sufficient that the cross frequency of the photoelectric negative feedback loop is greater than 40 MHZ when the set time $\tau = 50$ ns. Such a cross frequency value can be easily realized.

Further, in this embodiment, the output electric current of the electric current converter 802 is added to the control electric current of the photoelectric negative feedback loop. When the electric current converter 802 is connected in parallel to the semiconductor laser 803, the operation of the semiconductor laser 803 can be controlled by the difference in electric current between the output electric current of the electric current converter 802 and the control electric current of the photoelectric negative feedback loop.

As mentioned above, in accordance with this embodiment, the semiconductor laser controller accurately operated at a high speed and having a high resolution can be realized.

Figure 71:
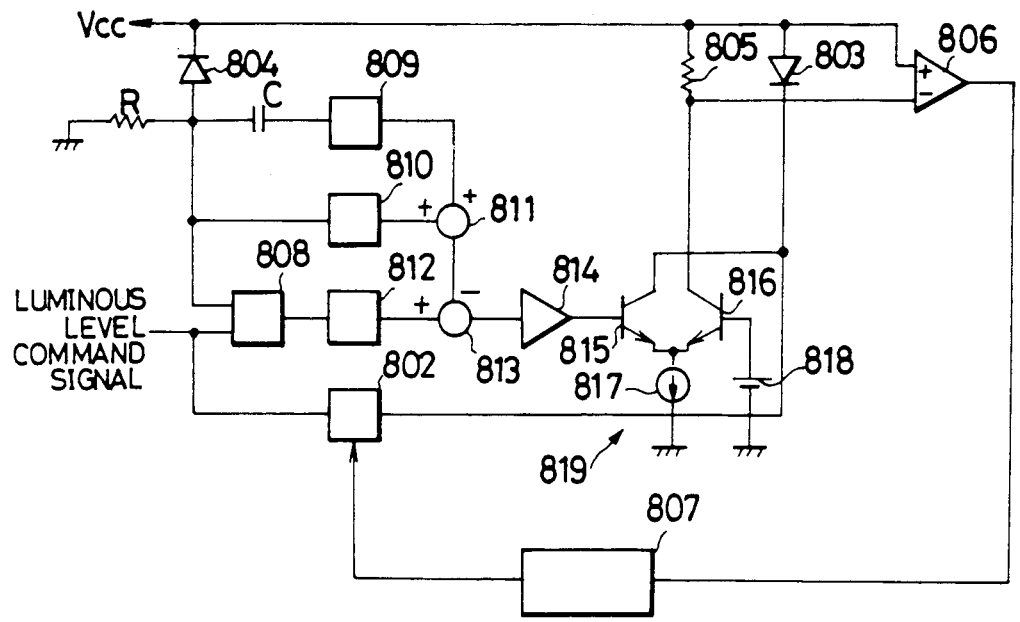
FIGS. 71 and 72 are block diagrams showing the semiconductor laser controller in another embodiments of the present invention.

FIG. 71 shows the semiconductor laser controller in another embodiment of the present invention.

A luminous level command signal is inputted to a comparing amplifier 808 and an electric current converter 802. A portion of a light output of a driven semiconductor laser 803 is monitored by a light-receiving element 804. A high frequency component of a photovoltaic current (proportional to the light output of the semiconductor laser 803) Is induced in the light-receiving element 804 is inputted to an impedance converter 809 through a capacitor C. A lower frequency component of the photovoltaic current Is is converted to a voltage through a resistor R. The voltage generated in this resistor R is inputted to the comparing amplifier 808 and a voltage-current converter 810. The voltage-current converter 810 converts the voltage generated in the resistor R to an electric current. The output electric current of this voltage-current converter 810 is added to an output electric current of the impedance converter 809 by an adder 811 and the added electric current becomes an electric current $I_0$ equal to the photovoltaic current Is generated in the light-receiving element 804. On the other hand, the comparing amplifier 808 compares the voltage generated in the resistor R and the luminous level command signal and amplifies the difference in voltage therebetween. An output voltage of this comparing amplifier 808 is converted to an electric current by a voltage-current converter 812 and becomes a first luminous level command signal electric current IL. A subtracter 813 subtracts the electric current $I_0$ from the adder 811 from the first luminous level command signal electric current IL from the voltage-current converter 812, and outputs a differential electric current therebetween. This differential electric current is amplified by an electric current amplifier 814 and is outputted as a control electric current of the semiconductor laser 803 through a differential amplifier 819 composed of transistors 815, 816, an electric current source 817 and a bias voltage source 818. Accordingly, the light-receiving element 804, the capacitor C, the resistor R, the impedance converter 809, the voltage-current converter 810, the adder 811, the subtracter 813, the electric current amplifier 814 and the differential amplifier 819 constitute a photoelectric negative feedback loop for controlling a forward electric current of the semiconductor laser 803 such that the photovoltaic current Is of the light-receiving element 804 proportional to the light output of the semiconductor laser 803 is equal to the first luminous level command signal electric current IL from the voltage-current converter 812. The comparing amplifier 808 and the voltage-current converter 812 constitute a second photoelectric negative feedback loop for controlling the first luminous level command signal electric current IL such that a voltage proportional to the photovoltaic current Is is equal to that of the luminous level command signal.

With respect to the high frequency component of the luminous level command signal, the electric current converter 802 outputs an electric current preset in accordance with the luminous level command signal such that the output electric current $I_0$ of the adder 811 is equal to the first luminous level command signal electric current IL from the voltage-current converter 812. This preset electric current is an electric current preset on the basis of light output and forward electric current characteristics of the semiconductor laser 803, a coupling coefficient between the light-receiving element 804 and the semiconductor laser 803, and light input and light-receiving signal characteristics of the light-receiving element 804. With respect to the low frequency component of the luminous level command signal, the electric current converter 802 outputs an electric current preset in accordance with the luminous level command signal such that the voltage between both terminals of the resistor 805 is equal to that of the luminous level command signal. This preset electric current is an electric current preset on the basis of the light output and forward electric current characteristics of the semiconductor laser 803, the coupling coefficient between the light-receiving element 804 and the semiconductor laser 803, and the light input and light-receiving signal characteristics of the light-receiving element 804. A sum of the output electric current of this electric current converter 802 and the control electric current outputted from the differential amplifier 819 becomes the forward electric current of the semiconductor laser 803.

When a cross frequency in an open loop of the above first photoelectric negative feedback loop is $f_0$ and a DC gain therein is 30 and a DC gain in the second photoelectric negative feedback loop is 10,000, step responsive characteristics of the light output $P_{out}$ of the semiconductor laser 803 can be approximately provided by the following formula.

$$P_{out} = PL + (PS - PL) \exp(-2\pi f_0 t).$$

Since the DC gain of the second photoelectric negative feedback loop is set to 10,000, the PL is considered to be equal to the set light amount when an allowable range of a set error is less than 0.1%. Further, since the DC gain of the first photoelectric negative feedback loop is set to 30, a stationary error in the first photoelectric negative feedback loop becomes about $(PS-PL)/30$. Accordingly, if the light amount PS set by the electric current converter 802 is equal to the PL, the light output of the semiconductor laser 803 is instantly equal to the PL. In this case, since $P_{out} = PL$, the output of the comparing amplifier 814 is not changed. Namely, the electric current value of the resistor 805 is not changed so that the voltage between both terminals of the resistor 805 is not changed. However, when the light output and forward electric current characteristics of the semiconductor laser 803 are changed and the PS is thus varied by the change in temperature, a disturbance, etc., an insufficient electric current by the electric current converter 802 is supplied by the comparing amplifier 808 in the forward direction of the semiconductor laser 803. Accordingly, the electric current value corresponding to an error in conversion of the electric current converter 802 can be detected by measuring the voltage between both terminals of the resistor 805 when the luminous level command signal is changed for a constant period. The voltage detected by a differential amplifier 806 is inputted to a circuit 807 for correcting the light output characteristics. This correcting circuit 807 controls a conversion rule of the electric current converter 802 such that the voltage between both terminals of the resistor 805 is minimized in the above constant period, and holds this conversion rule in the other period. As a result, the electric current converter 802 can be held such that the PS is approximately equal to the PL at any time irrespective of the change in light output and forward electric current characteristics of the semiconductor laser 803. Even when the PS is varied by 5% by a disturbance, etc., the stationary error in the first photoelectric negative feedback loop becomes about 0.2% so that the error with respect to a set value of the light output of the semiconductor laser 803 becomes less than 0.4% after 10 ns if the $f_0$ is about 40 MHZ and the DC gain of the first photoelectric negative feedback loop is about 30.

To set to a value less than 0.4% the error in entire light amount (an integral value $\int P_{out}$ of the light output) from a time immediately after the light output of the semiconductor laser 803 is changed until a set time $\tau_0$ has passed, it is sufficient that the cross frequency of the photoelectric negative feedback loop is greater than 40 MHZ and the DC gain of the photoelectric negative feedback loop is about 30 times when the set time $\tau_0=50$ ns. Such cross frequency and DC gain values can be easily realized.

Further, in this embodiment, the output electric current of the electric current converter 802 is added to the control electric current of the photoelectric negative feedback loop. When the electric current converter 802 is connected in parallel to the semiconductor laser 803, the operation of the semiconductor laser 803 can be controlled by the difference in electric current between the output electric current of the electric current converter 802 and the control electric current of the photoelectric negative feedback loop.

Figure 72:
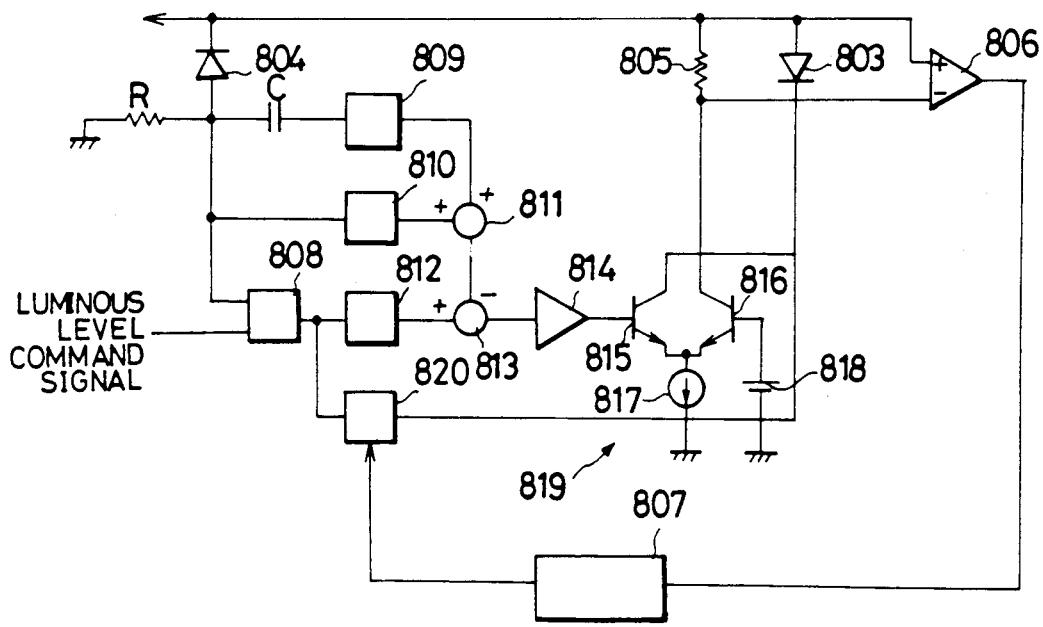

FIG. 72 shows the semiconductor laser controller in another embodiment of the present invention.

In this embodiment, instead of the second luminous level command signal in the embodiment of FIG. 71, an output voltage of the comparing amplifier 808 is inputted to an electric current converter 820. The electric current converter 820 outputs an electric current preset in accordance an output voltage of the comparing amplifier 808 such that the light-receiving signal is equal to the luminous level command signal. This preset electric current is an electric current preset on the basis of light output and forward electric current characteristics of the semiconductor laser 803, a coupling coefficient between the light-receiving element 804 and the semiconductor laser 803, and light input and light-receiving signal characteristics of the light-receiving element 804. Namely, with respect to a high frequency component of the luminous level command signal, the electric current converter 820 outputs an electric current preset in accordance with the output voltage of the comparing amplifier 808 such that the electric current $I_0$ from the adder 811 is equal to the first luminous level command signal electric current IL. This preset electric current is an electric current preset on the basis of the light output and forward electric current characteristics of the semiconductor laser 803, the coupling coefficient between the light-receiving element 804 and the semiconductor laser 803, and the light input and light-receiving signal characteristics of othe light-receiving element 804. With respect to a low frequency component of the second luminous level command signal, the electric current converter 819 outputs an electric current preset in accordance with the output voltage of the comparing amplifier 808 such that the voltage between both terminals of the resistor R is equal to that of the first luminous level command signal. This preset electric current is an electric current preset on the basis of the light output and forward electric current characteristics of the semiconductor laser 803, the coupling coefficient between the light-receiving element 804 and the semiconductor laser 803, and the light input and light-receiving signal characteristics of the light-receiving element 804.

Figure 58:
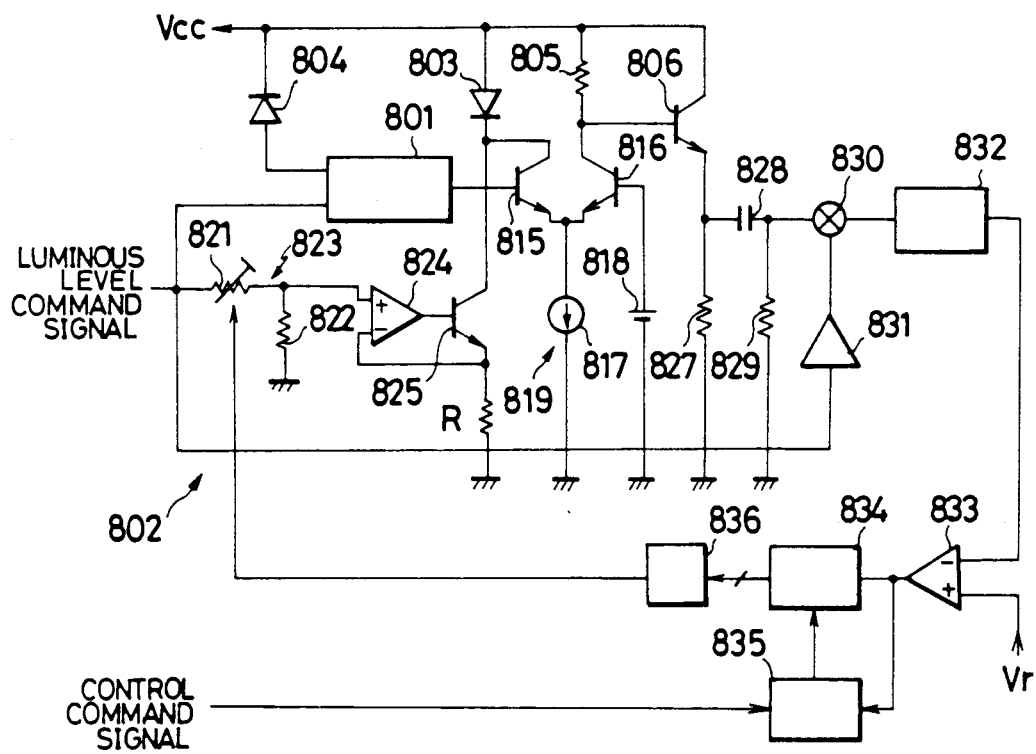

FIG. 58 shows the semiconductor laser controller in another embodiment of the present invention.

A command signal indicative of a luminous level is inputted to a comparing amplifier 801 and an electric current converter 802 and a portion of a light output of a driven semiconductor laser 803 is monitored by a light-receiving element 804. A differential amplifier 819 is composed of transistors 815, 816, an electric current source 817 and a bias voltage source 818. The differential amplifier 819, the comparing amplifier 801, the semiconductor laser 803 and the light-receiving element 804 form a photoelectric negative feedback loop. The comparing amplifier 801 compares the luminous level command signal and a light-receiving signal proportional to a photovoltaic current (proportional to the light output of the semiconductor laser 803) induced in the light-receiving element 804. The comparing amplifier 801 then controls a forward electric current of the semiconductor laser 803 by this compared result through the differential amplifier 819 such that the light-receiving signal is equal to the luminous level command signal.

The electric current converter 802 is constructed by an attenuator 823 composed of a variable resistor 821 and a resistor 822, a differential amplifier 824, a transistor 825 and a resistor $R_0$. The electric current converter 802 outputs an electric current preset in accordance with the luminous level command signal. This preset electric current is an electric current preset on the basis of light output and forward electric current characteristics of the semiconductor laser 803, a coupling coefficient between the light-receiving element 804 and the semiconductor laser 803, and light input and light-receiving signal characteristics of the light-receiving element 804. Namely, the luminous level command signal Vs is attenuated by the attenuator 823 to kVs and is inputted to the differential amplifier 824 and is then converted to an electric current $kVs/R_0$ by the transistor 825 and the resistor $R_0$. A sum $kVs/R_0 + A\Delta V$ of this electric current $kVs/R_0$ and an output electric current $A\Delta V$ of the differential amplifier 819 becomes the forward electric current of the semiconductor laser 803.

In general, with respect to the forward electric current greater than a threshold electric current $I_{th}$ in the semiconductor laser, the relation between the light output and the forward electric current can be approximately represented by a straight line of a differential quantum efficiency $\eta$. In this case, the light output $P_0$ of the semiconductor laser can be represented as follows.

$$P_0 = \frac{\eta}{(1 + \alpha S\eta A)}\left(\frac{1}{R1} + A\frac{k}{R_0}\right)V_s - \frac{\eta}{1 + \alpha S\eta A} I_{th}$$

$$\Delta V = V_s/R1 - \alpha S P_0$$

Similar to the above embodiment, the responsive characteristics can be approximately represented as follows when the Vs is changed from a $V_0$ (the light output of the semiconductor laser 803 corresponding to the $V_0$ shows a light intensity when the electric current of the semiconductor laser is greater than the threshold electric current) to a Vi.

$$P_0 = \frac{kVi}{\alpha S R_0} + \frac{kVi}{\alpha S R_0}\left(\frac{\alpha S\eta R_0}{kR} - 1\right)\cdot \exp(-2\pi f_0 t)$$

Accordingly, if $k=\alpha S\eta R_0$, the light output $P_0$ is instantly equal to $\eta Vi/R$ so that the output of the comparing amplifier 801 is not changed. Namely, the electric current value of the resistor 805 is not changed so that the voltage between both terminals of the resistor 805 is not changed. However, when the differential quantum efficiency $\eta$ is varied by the change in temperature, a disturbance, etc., an insufficient electric current by the electric current converter 802 is supplied by the comparing amplifier 808 in the forward direction of the semiconductor laser 803. Accordingly, the electric current value corresponding to an error in conversion of the electric current converter 802 can be detected by measuring the voltage between both terminals of the resistor 805 when the luminous level command signal is changed for a constant period.

A direct current component of the voltage Vd between both terminals of the resistor 805 is removed therefrom by a circuit composed of a capacitor 808 and a resistor 829 through an emitter follower composed of a transistor 826 and a resistor 827. Then, this voltage is inputted to a multiplier 830. The amplitude of the luminous level command signal is made constant by a limiter amplifier 831 and this signal is inputted to the multiplier 830. FIG. 61 shows two input signals of this multiplier 830. In a constant period for detecting the forward electric current of the semiconductor laser 803, a signal a modulated at a constant amplitude level as shown in FIG. 61 is inputted as the luminous level command signal and an electric current $I_2$ (or $I_1$) as shown in FIG. 61 is observed by the resistor 805. In a period except for this constant period, the luminous level command signal is set as a luminous level command value of the semiconductor laser 803 and the forward electric current of the semiconductor laser 803 is set to a value according to this luminous level command value. The multiplier 830 multiplies the two input signals and the multiplied result is outputted by a filter 832 as a voltage showing the relation between the error in operation of electric current converter 802 and a detected voltage as shown in FIG. 62. The detected voltage from this filter 832 is inputted to one terminal of a comparator 833 and is compared with a reference voltage Vr. The output voltage of this comparator 833 is inputted to an updown terminal of an updown counter 834 to control a counting-up mode and a counting-down mode of the updown counter 834. The counting operation of the updown counter 834 is controlled by clock and control signals from a timing generator 835 and the updown counter 834 holds a counted value. The timing generator 835 switches the operation of the updown counter 834 from the counted value holding operation to the counting operation by inputting a control command signal in the above constant period (the period for detecting the forward electric current of the semiconductor laser 803). The timing generator 835 also switches the operation of the updown counter 834 from the counting operation to the counted value holding operation at a timing for changing the output voltage of the comparator 833 from a high level to a low level, or a timing for changing this output voltage from the low level to the high level. The counted value of the updown counter 834 is digital/analog-converted by a digital/analog converter 836. The operation of the above variable resistor 821 is controlled by an output signal of this digital/analog converter 836 and an attenuating amount of the attenuator 823 is determined so that the above coefficient k of the electric current converter 802 is controlled.

Figure 68:
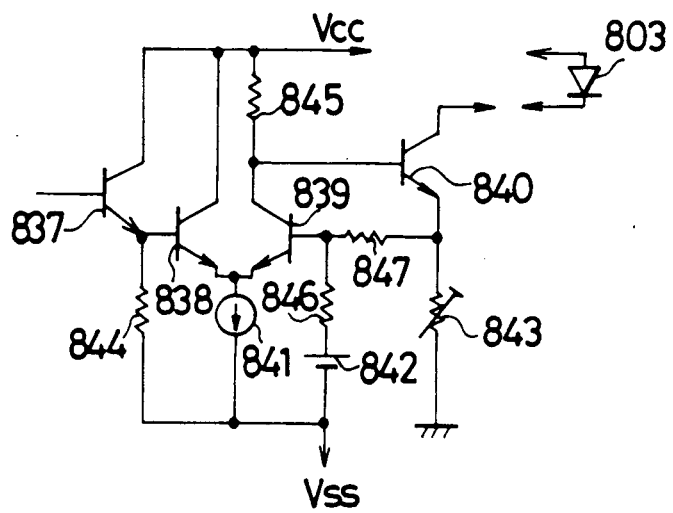
FIGS. 68 to 70 are block diagrams showing the construction of the electric current converter in the respective embodiments of the present invention.

As shown in FIG. 68, the above electric current converter may be composed of transistors 837 to 840, an electric current source 841, a voltage source 842, a variable resistor 843 and resistors 844 to 847. Further, the operation of the variable resistor 843 may be controlled by the output signal of the digital/analog converter 836. Further, as shown in FIG. 63, the multiplier 832 may be constituted by a non-inverting circuit 848, an inverting circuit 849, a switch 850 and a buffer 851.

In this case, an output signal of a circuit composed of the capacitor 828 and the resistor 829 is inputted to the non-inverting circuit 848 and the inverting circuit 849, and either one of output signals of the non-inverting circuit 848 and the inverting circuit 849 is selected by the switch 850. An output signal of the limit amplifier 831 switches the switch 850 through the buffer 851.

After the counted value of the updown counter 834 is initialized at a timing for starting the control by its control command signal, its counting operation may be switched to the counted value holding operation at a timing for changing the polarity of the output voltage of the comparator 833 by limiting the counting operation of the updown counter 834 to the counting up or down operation.

As shown in FIG. 64, a constructional section composed of the comparator 833, the updown counter 834 and the digital/analog converter 836 may be constructed by an integrator 855 composed of an operational amplifier 852, a capacitor 853 and a resistor 854, a reset switch 856 and a hold circuit 857. In this case, the switch 856 is turned off by the turning-on operation of the control command signal and an output voltage of the filter 832 is integrated by the integrator 855. By the turning-off operation of the control command signal, the hold circuit 857 holds an output signal of the integrator 855 and the switch 856 is turned on, thereby resetting the integrator 855.

In the above embodiment, the value k is adjusted by the variable attenuator 823, but may be adjusted by a device except for the variable attenuator 823 such as a voltage control amplifier (VCA) for example.

Figure 59:
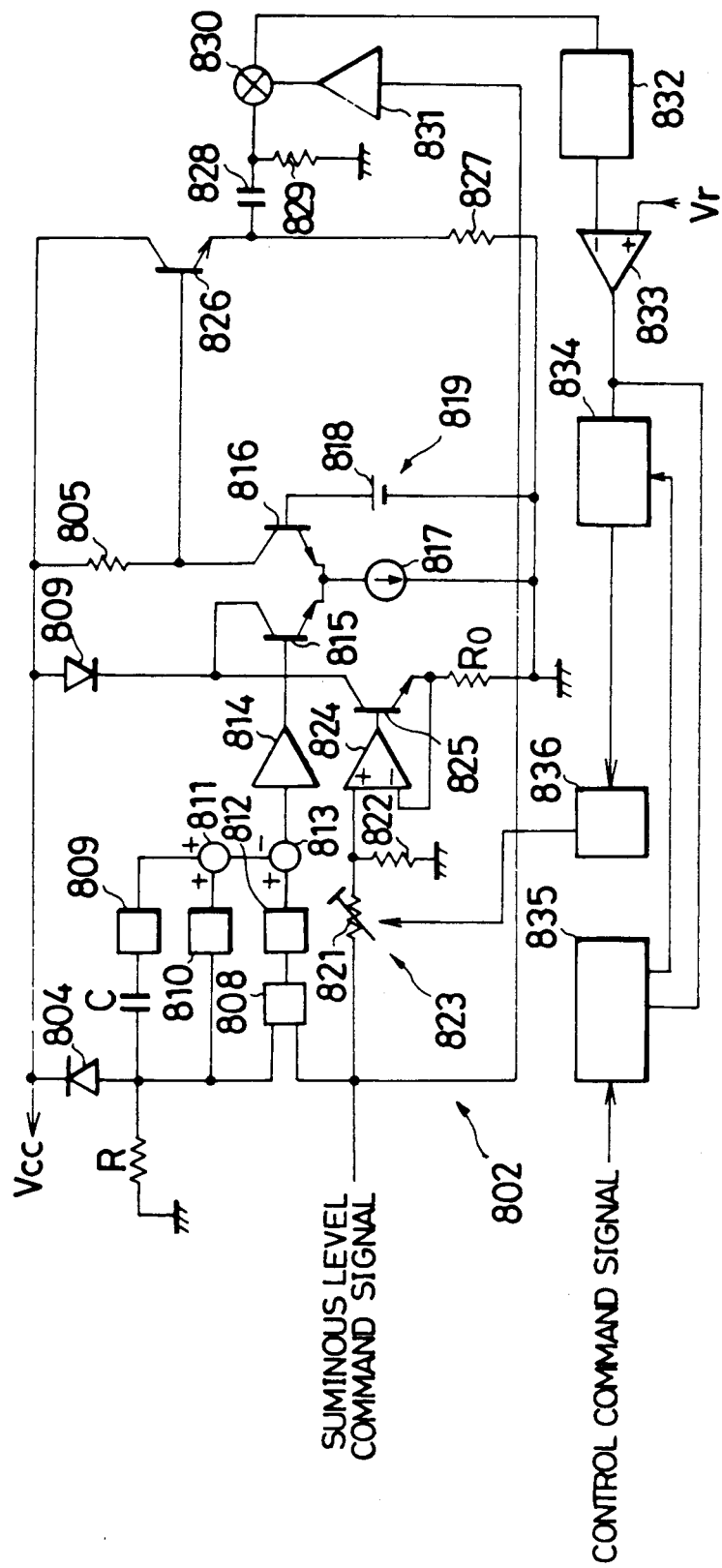

FIG. 59 shows the semiconductor laser controller in another embodiment of the present invention.

In this embodiment, instead of the comparing amplifier 801 in the embodiment of FIG. 58, the controller uses a circuit composed of the capacitor C, the resistor R, the impedance converter 809, the voltage-current converters 810, 812, the comparing amplifier 808, the adder 811, the subtracter 813 and the electric current amplifier 814 in the embodiment of FIG. 71. This circuit is operated as mentioned before. In this embodiment, similar to the above-mentioned embodiments, the electric current converter as shown in FIG. 68 may be also used and the circuit as shown in FIG. 63 may be used instead of the multiplier 830. Further, the circuit as shown in FIG. 64 may be used instead of the constructional section composed of the comparator 833, the updown counter 834 and the digital/analog converter 836. Further, the VCA, etc. may be used instead of the variable attenuator 823. After the counted value of the updown counter 834 is initialized at a timing for starting the control by its control command signal, its counting operation may be switched to the counted value holding operation at a timing for changing the polarity of the output voltage of the comparator 833 by limiting the counting operation of the updown counter 834 to the counting up or down operation.

Figure 60:
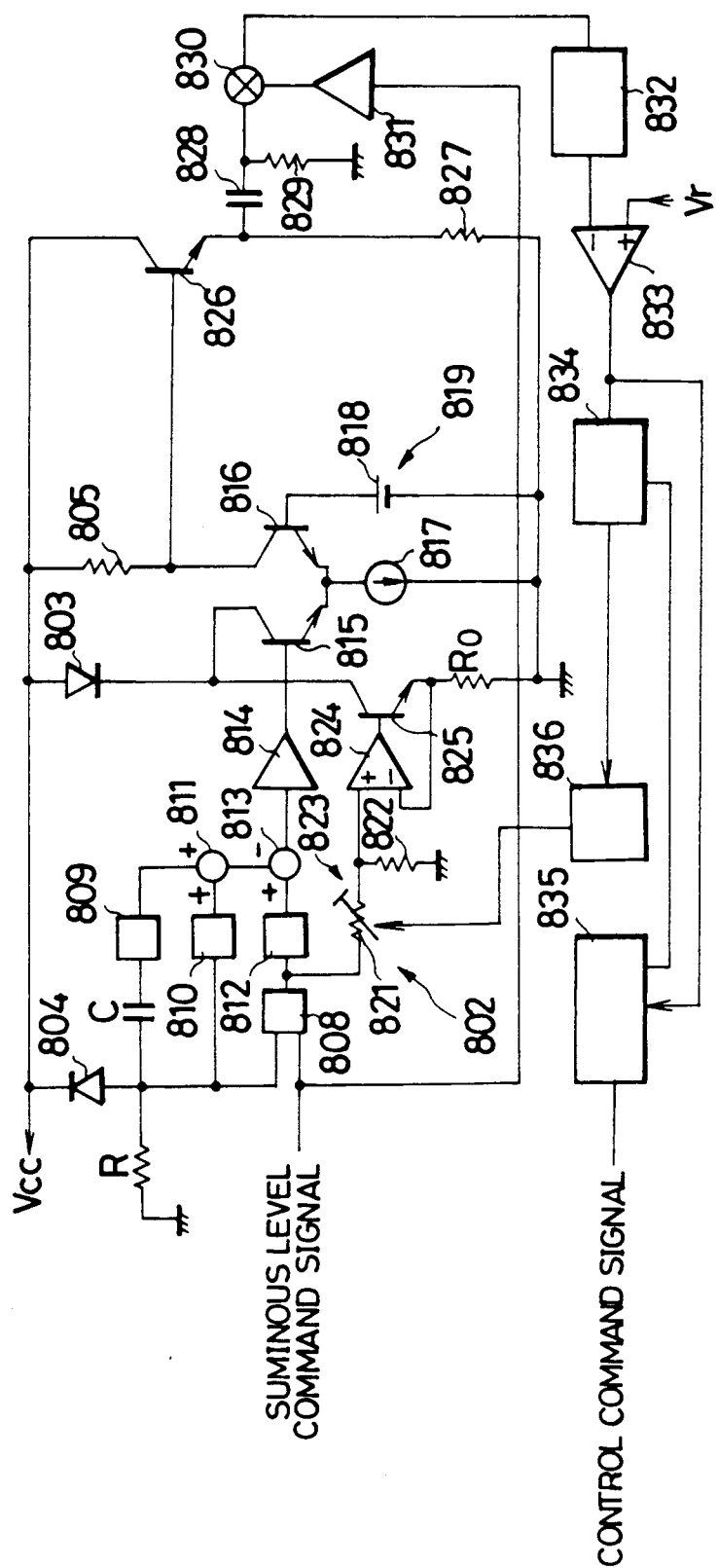

FIG. 60 shows the semiconductor laser controller in another embodiment of the present invention. In this embodiment, instead of the luminous level command signal in the embodiment of FIG. 59, an output voltage of the comparing amplifier 808 is inputted to the electric current converter 802.

Figure 65:
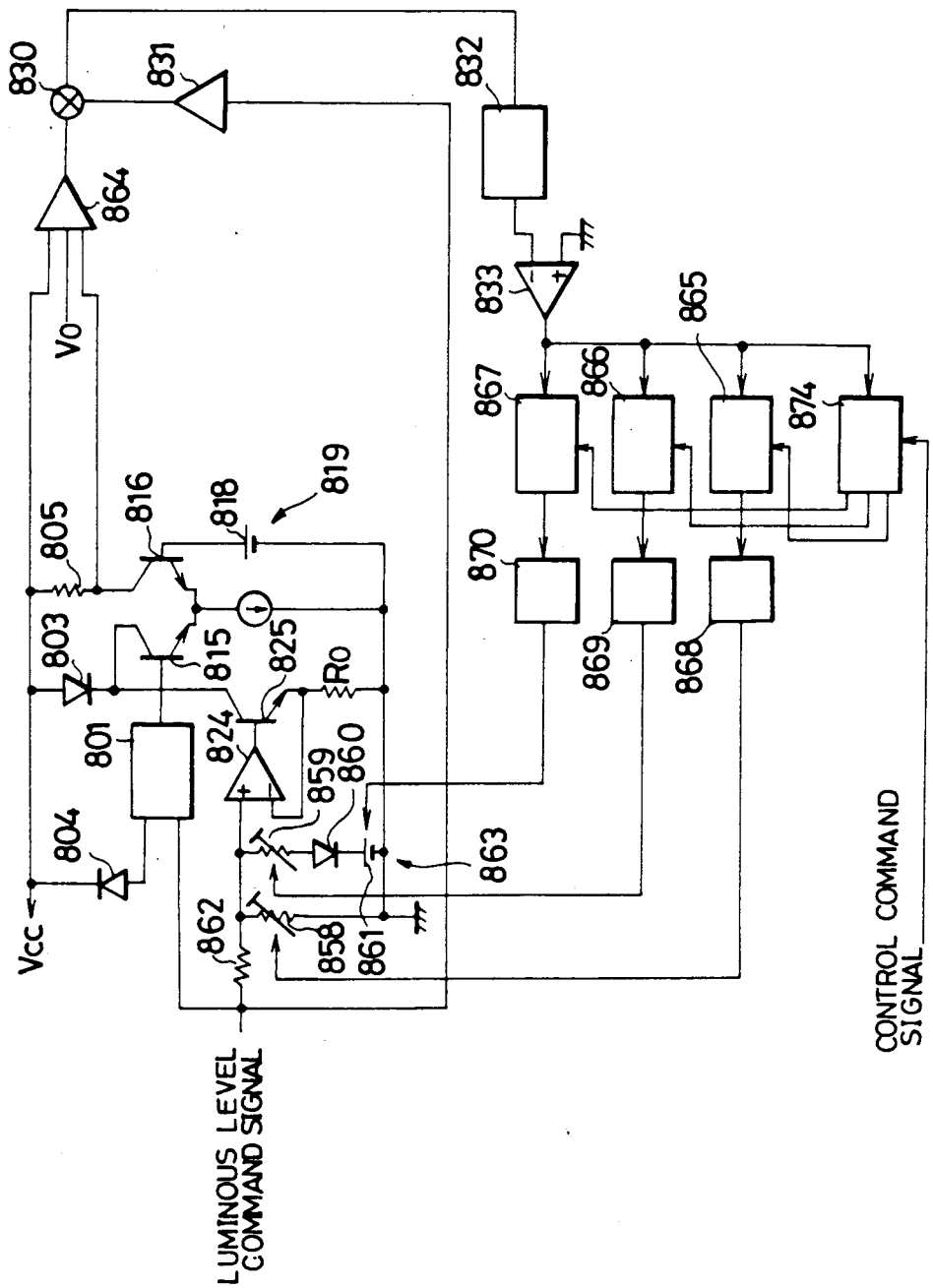
FIG. 65 is a block diagram showing the semiconductor laser controller in another embodiment of the present invention.
Figure 66:
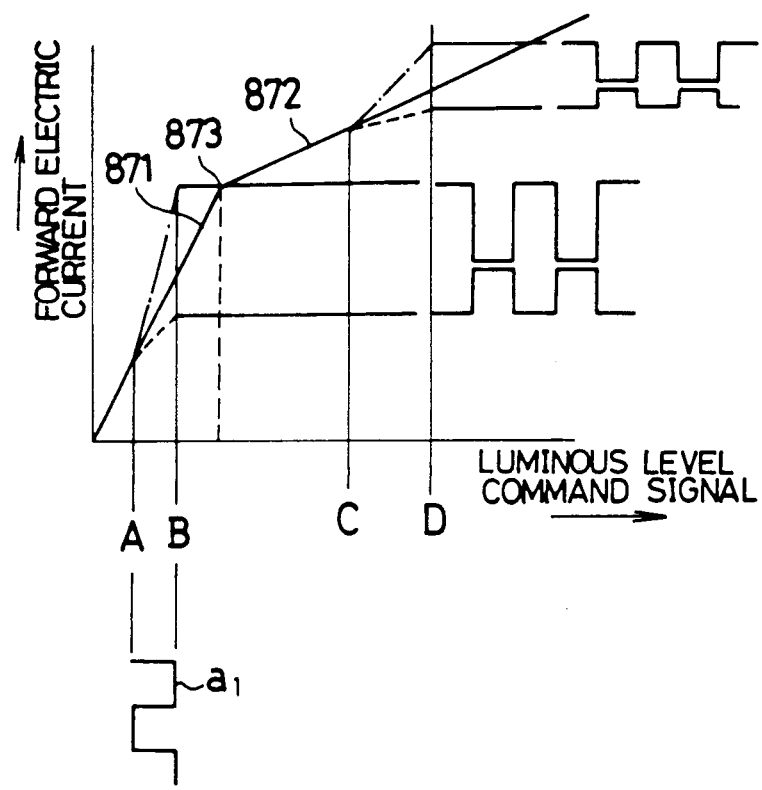
FIGS. 66 and 67 are characteristic graphs for explaining the semiconductor laser controller of the present invention.
Figure 67:
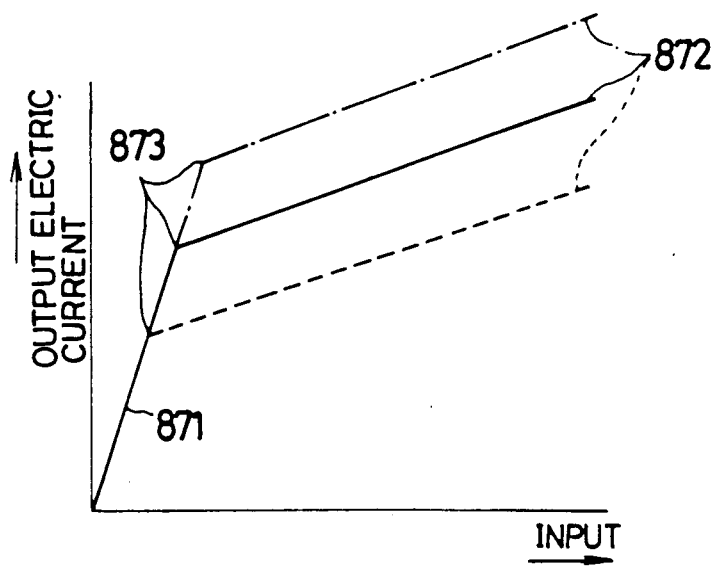

In the above embodiment, the electric current converter is constructed by approximating the light output and forward electric current characteristics of the semiconductor laser 803 by a straight line and converting the luminous level command signal to an electric current. However, as shown in FIG. 65, the light output and forward electric current characteristics of the semiconductor laser 803 can be more accurately approximated by approximating these characteristics by a polygonal line and converting the luminous level command signal to the electric current. In this embodiment of FIG. 65, a variable attenuator 863 composed of variable resistors 858, 859, a diode 860, a voltage source 861 and a resistor 862 is used in the embodiment of FIG. 58. An adder-subtracter 864 subtracts a predetermined voltage $V_0$ corresponding to the electric current of the electric current source 817 from the voltage between both terminals of the resistor 805. This subtracted value is detected and outputted to a multiplier 830. A comparator 833 compares the output voltage of a filter 832 with 0 V and provides the compared result as a binary signal. The output voltage of this comparator is inputted to updown terminals of updown counters 865, 866 and 867. The counted values of these updown counters 865, 866 and 867 are respectively digital/analog-converted by digital/analog converters 868, 869 and 870. The operations of the variable resistors 858, 859 and the voltage source 861 are controlled by output signals of the digital/analog converters 868, 869 and 870. Thus, as shown in FIG. 66, the inclinations of respective straight lines 871, 872 and their polygonal point 873 with respect to the conversion characteristics of the electric current converter 802 (a polygonal line approximating the light output and forward electric current characteristics of the semiconductor laser 803) are respectively controlled. In this case, the timing generator 874 switches the operations of the digital/analog converters 865, 866 and 867 from the counted value holding operation to the counting operation at different timings by inputting a control command signal to count the number of clock signals. Further, the operations of the digital/analog converters 865, 866 and 867 are switched from the counting operation to the counted value holding operation at a leading or trailing edge of the output signal of the comparator 833. The luminous level command signal becomes a signal $a_1$, etc. modulated at a constant amplitude level between A and B and between C and D as shown in FIG. 66 corresponding to the counting operation of the updown counters 865 and 866 by the timing generator 874 in a constant control period. The luminous level command signal also becomes a signal at a constant level corresponding to the counting operation of the updown counter 867 by the timing generator 874. The straight lines 871 and 872 are controlled by controlling the polygonal point 873 as shown in FIG. 67.

Figure 69:
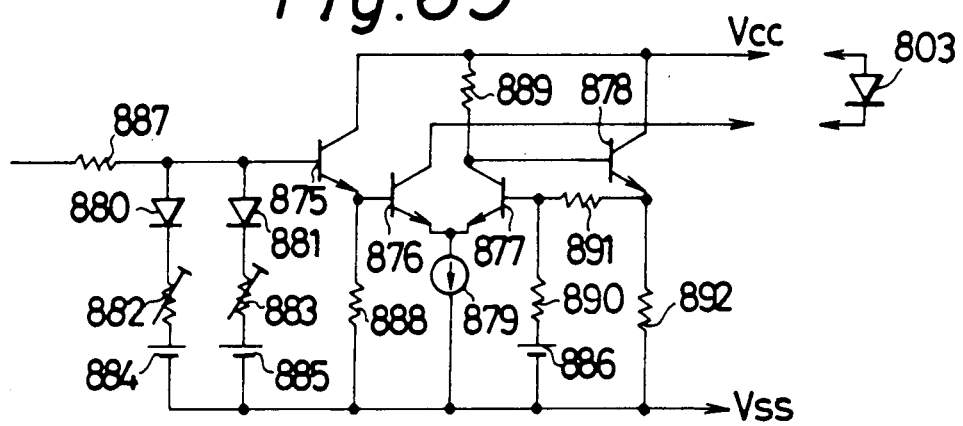
Figure 70:
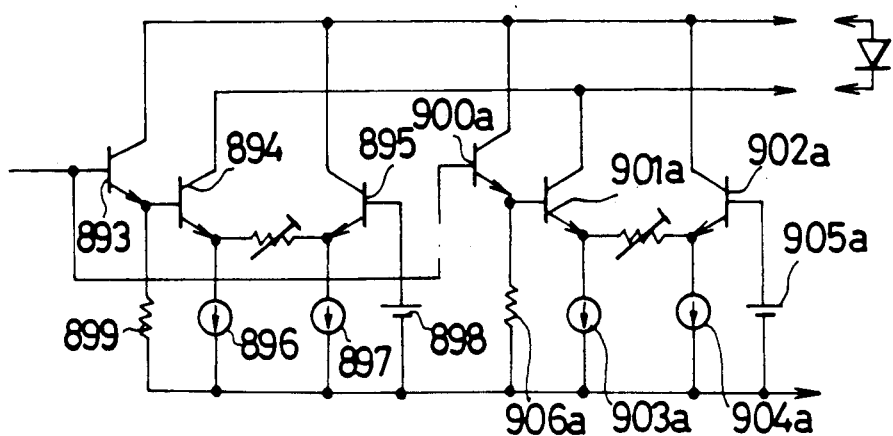

In the above embodiment, the conversion characteristics of the electric current converter 802 (the polygonal line approximating the light output and forward electric current characteristics of the semiconductor laser 803) is constructed by the two straight lines 871 and 872, but may be constructed by more than three straight lines. For example, as shown in FIG. 69, when the electric current converter 802 is constructed by transistors 875 to 878, an electric current source 879, diodes 880, 881, variable resistors 882, 833, voltage sources 884 to 886 and resistors 887 to 892, there are three straight lines constituting the polygonal line and two polygonal points. Further, as shown in FIG. 70, when the electric current converter 802 is constructed by an amplifier composed of transistors 893 to 895, electric current sources 896, 897, a voltage source 898 and a resistor 899, and an amplifier different in gain from the former amplifier and composed of transistors 900a to 902a, electric current sources 903a, 904a, a voltage source 905a and a resistor 906a, there are also three straight lines constituting the polygonal line and two polygonal points. Similar to the above embodiment, these straight lines and polygonal points are respectively controlled by the updown counters and the digital/analog converters.

As shown in FIGS. 51 and 36, the electric current converter 802 may be constructed by using digital/analog converters with the luminous level command signal as a digital signal. In this case, a conversion rule of the electric current converter 802 is controlled by determining a reference voltage, etc. of the digital/analog converter 793 by an output signal of the digital/analog converter 836. However, as in the embodiment of FIG. 65, etc., the plural straight lines and polygonal points constituting the conversion characteristics of the electric current converter 802 (the polygonal line approximating the light output and forward electric current characteristics of the semiconductor laser 803) may be controlled by modulating the luminous level command signal and controlling the value of the conversion table 484 in FIG. 36 by the output signals, etc., of the above digital/analog converters 865, 866 and 867.

As mentioned above, in the embodiments of the present invention shown in FIGS. 57 to 72, a semiconductor laser controller comprises a photoelectric negative feedback loop for detecting a light output of a driven semiconductor laser by a light-receiving portion and controlling a forward electric current of the semiconductor laser such that a light-receiving signal proportional to the light output of the semiconductor laser provided from the light-receiving portion is equal to a command signal indicative of a luminous level; converting means for converting the luminous level command signal to the forward electric current of the semiconductor laser in accordance with a conversion rule preset such that the light-receiving signal is equal to the luminous level command signal on the basis of light output and forward electric current characteristics of the semiconductor laser, a coupling coefficient between the light-receiving portion and the semiconductor laser, and light input and light-receiving signal characteristics of the light-receiving portion; detecting means for detecting a control electric current of the photoelectric negative feedback loop; correcting means for correcting the change in light output and forward electric current characteristics of the semiconductor laser by controlling the conversion rule such that the control electric current of the photoelectric negative feedback loop is not changed even when the luminous level command signal is changed by a detecting signal from the detecting means; and means for controlling the operation of the semiconductor laser by a sum or difference in electric current with respect to the control electric current of the photoelectric negative feedback loop and an electric current produced by the converting means. Accordingly, the electric current converter can be set to be optimal even when a disturbance such as the change in temperature is caused. The semiconductor laser controller accurately operated at a high speed and having a high resolution and strongly bearing against the disturbance, etc. can be realized.

Further, in the semiconductor laser controller of the present invention, the photoelectric negative feedback loop is constructed by a first photoelectric negative feedback loop for detecting the light output of the semiconductor laser by the light-receiving portion and controlling the forward electric current of the semiconductor laser such that a light-receiving electric current proportional to the light output of the semiconductor laser obtained from the light-receiving portion is equal to the luminous level command signal in which a first luminous level command signal is converted to an electric current, and a second photoelectric negative feedback loop for controlling the first luminous level command signal such that a voltage proportional to the light-receiving electric current is equal to that of the luminous level command signal. Accordingly, effects similar to those obtained in the above-mentioned semiconductor laser controller can be obtained without setting an open loop gain of the photoelectric negative feedback loop in a high frequency region to a very large value.

Further, in the semiconductor laser controller of the present invention, the converting means converts the luminous level command signal as an analog signal voltage to an electric current corresponding to the luminous level command signal by approximating the light output and forward electric current characteristics of the semiconductor laser to a straight line, and the detecting means detects the phase and amplitude with respect to the luminous level command signal of the control electric current of the photoelectric negative feedback loop by the luminous level command signal modulated at a constant amplitude level in a constant period, and the correcting means controls the inclination in conversion characteristics of the converting means so as to minimize an absolute value of the control electric current of the photoelectric negative feedback loop in the constant period by the detecting signal from the detecting means and holds the inclination in conversion characteristics of the converting means in the other period. Accordingly, effects similar to those obtained in the above-mentioned semiconductor laser controller can be obtained by a simple circuit construction.

Further, in the semiconductor laser controller of the present invention, the converting means converts the luminous level command signal as an analog signal voltage to an electric current corresponding to the luminous level command signal by approximating the light output and forward electric current characteristics of the semiconductor laser to a straight line, and the detecting means detects the phase and amplitude with respect to the luminous level command signal of the control electric current of othe first photoelectric negative feedback loop by the luminous level command signal modulated at a constant amplitude level in a constant period, and the correcting means controls the inclination in conversion characteristics of the converting means so as to minimize an absolute value of the control electric current of the first photoelectric negative feedback loop in the constant period by the detecting signal from the detecting means and holds the inclination in conversion characteristics of the converting means in the other period. Accordingly, effects similar to those obtained in the above-mentioned semiconductor laser controller can be obtained by a simple circuit construction.

Further, in the semiconductor laser controller of the present invention, the converting means converts the luminous level command signal as an analog signal voltage to an electric current determined by the luminous level command signal by approximating the light output and forward electric current characteristics of the semiconductor laser to a polygonal line constructed by n straight lines where n designates a natural number, and the detecting means detects the phase and amplitude with respect to the luminous level command signal of the control electric current of the photoelectric negative feedback loop by the luminous level command signal modulated at more than (2n−1) different amplitudes and an offset value signal in a constant period, and the correcting means controls the inclination and a polygonal point of each straight line constructing the polygonal line of the converting means so as to minimize an absolute value of the control electric current of the photoelectric negative feedback loop in the constant period by the detecting signal from the detecting means, and holds the inclination and the polygonal point of each straight line constructing the polygonal line of the converting means in the other period. Accordingly, the semiconductor laser controller accurately operated at a high speed and having a high resolution and strongly bearing against a disturbance, etc. can be realized.

Further, in the semiconductor laser controller of the present invention, the converting means converts the luminous level command signal as an analog signal voltage to an electric current determined by the luminous level command signal by approximating the light output and forward electric current characteristics of the semiconductor laser to a polygonal line constructed by n straight lines where n designates a natural number, and the detecting means detects the phase and amplitude with respect to the luminous level command signal of the control electric current of the first photoelectric negative feedback loop by the luminous level command signal modulated at more than (2n−1) different amplitudes and an offset value signal in a constant period, and the correcting means controls the inclination and a polygonal point of each straight line constructing the polygonal line of the converting means so as to minimize an absolute value of the control electric current of the first photoelectric negative feedback loop in the constant period by the detecting signal from the detecting means and holds the inclination and the polygonal point of each straight line constructing the polygonal line of the converting means in the other period. Accordingly, the semiconductor laser controller having a relatively simple construction and accurately operated at a high speed and having a high resolution and strongly bearing against a disturbance, etc. can be realized.

Further, in the semiconductor laser controller of the present invention, the converting means has a conversion table for converting the luminous level command signal as a digital signal to a signal corrected on the basis of the light output and forward electric current characteristics of the semiconductor laser and has digital-/analog converting means for converting the signal converted by the conversion table to the forward electric current of the semiconductor laser, and the detecting means detects the phase and amplitude with respect to the luminous level command signal of the control electric current of the photoelectric negative feedback loop by the luminous level command signal modulated at a plurality of amplitude values according to a dynamic range in a constant period, and the correcting means controls a value of the conversion table so as to minimize an absolute value of the control electric current of the photoelectric negative feedback loop in the constant period by the detecting signal from the detecting means, and holds the value of the conversion table in the other period. Accordingly, the semiconductor laser controller having a very high accuracy can be realized.

Further, in the semiconductor laser controller of the present invention, the converting means has a conversion table for converting the luminous level command signal as a digital signal to a signal corrected on the basis of the light output and forward electric current characteristics of the semiconductor laser and has digital-/analog converting means for converting the signal converted by the conversion table to the forward electric current of the semiconductor laser, and the detecting means detects the phase and amplitude with respect to the luminous level command signal of the control electric current of the first photoelectric negative feedback loop by the luminous level command signal modulated at a plurality of amplitude values according to a dynamic range in a constant period, and the correcting means controls a value of the conversion table so as to minimize an absolute value of the control electric current of the first photoelectric negative feedback loop in the constant period by the detecting signal from the detecting means, and holds the value of the conversion table in the other period. Accordingly, the semiconductor laser controller having a very high accuracy can be realized.

Figure 73:
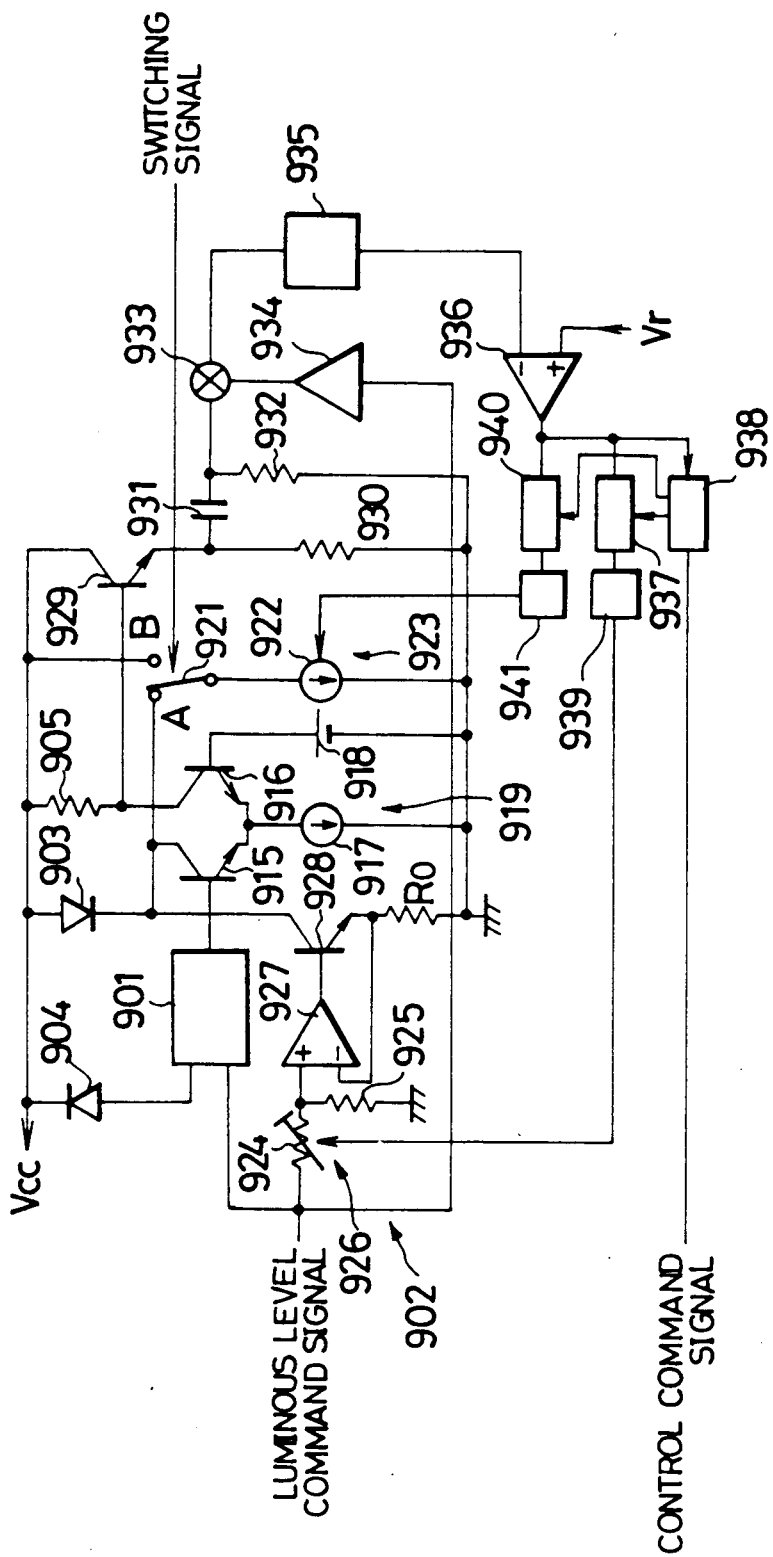
FIGS. 73 to 83 are block diagrams showing the semiconductor laser controller in another embodiments of the present invention.

FIG. 73 shows the semiconductor laser controller in another embodiment of the present invention.

A command signal indicative of a luminous level is inputted to a comparing amplifier 901 and an electric current converter 902 and a portion of a light output of a driven semiconductor laser 903 is monitored by a light-receiving element 904. A differential amplifier 919 is composed of transistors 915, 916, an electric current source 917 and a bias voltage source 918. The differential amplifier 919, the comparing amplifier 901, the semiconductor laser 903 and the light-receiving element 904 form a photoelectric negative feedback loop. The comparing amplifier 901 compares the luminous level command signal and a light-receiving signal proportional to a photovoltaic current (proportional to the light output of the semiconductor laser 903) induced in the light-receiving element 904. The comparing amplifier 901 then controls a forward electric current of the semiconductor laser 903 by this compared result through the differential amplifier 919 such that the light-receiving signal is equal to the luminous level command signal.

A switch 921 and an electric current source 922 constructs a switching circuit 923. Normally, the switch 921 is switched onto the side of a fixed terminal B and no set electric current I$_0$ by the electric current source 922 is supplied to the semiconductor laser 903 so that no light is emitted from the semiconductor laser 903. When a switching signal is inputted at a timing for emitting the light from the semiconductor laser 903, the switch 921 is switched onto the side of a fixed terminal A and the set electric current I$_0$ by the electric current source 922 is supplied to the semiconductor laser 903 so that the light is emitted from the semiconductor laser 903.

The electric current converter 902 is constructed by an attenuator 926 composed of a variable resistor 924 and a resistor 925, a differential amplifier 927, a transistor 928 and a resistor R$_0$. The electric current converter 902 outputs an electric current preset in accordance with the luminous level command signal. This preset electric current is an electric current preset on the basis of light output and forward electric current characteristics of the semiconductor laser 903, a coupling coefficient between the light-receiving element 904 and the semiconductor laser 903, and light input and light-receiving signal characteristics of the light-receiving element 904. Namely, the luminous level command signal Vs is attenuated by the attenuator 926 to kVs and is inputted to the differential amplifier 924 and is then converted to an electric current kVs/R$_0$ by the transistor 928 and the resistor R$_0$. A sum kVs/R$_0$+AΔV+I$_0$ of this electric current kVs/R$_0$, an output electric current AΔV of the differential amplifier 919 and the output electric current I$_0$ of the switching circuit 923 becomes the forward electric current of the semiconductor laser 903. The semiconductor laser 903 outputs a light output P$_0$ determined by this forward electric current kVs/R$_0$+AΔV+I$_0$.

In general, with respect to the forward electric current greater than a threshold electric current I$_{th}$ in the semiconductor laser, the relation between the light output and the forward electric current can be approximately represented by a straight line of a differential quantum efficiency η. In this case, the light output P$_0$ of the semiconductor laser can be represented as follows.

$$P_0 = \frac{\eta}{(1 + \alpha S\eta A)} \left( \frac{1}{R1} + A\frac{k}{R_0} \right) V_s - \frac{\eta}{1 + \alpha S\eta A} I_{th}$$

$$\Delta V = V_s/R1 - \alpha S P_0$$

The responsive characteristics can be approximately represented as follows when the Vs is changed from a V$_0$ (the light output of the semiconductor laser 903 corresponding to the V$_0$ shows a light intensity when the electric current of the semiconductor laser is greater than the threshold electric current) to a Vi.

$$P_0 = \frac{kVi}{\alpha S R_0} + \frac{kVi}{\alpha S R_0} \left( \frac{\alpha S \eta R_0}{kR} - 1 \right) \cdot \exp(-2\pi f_0 t)$$

The switching circuit 923 is operated at a high speed until a drive electric current value provided by the switching circuit 923. Accordingly, this switching circuit rises at a high speed irrespective of a rising speed of the electric current converter 902. Further, in general, the semiconductor laser 903 has the light output and electric current characteristics in which there is no laser oscillation until the threshold electric current. Accordingly, no quenching ratio by an offset electric current is almost deteriorated.

If k=αSηR$_0$, the light output P$_0$ is instantly equal to ηVi/R so that the output of the comparing amplifier 901 is not changed. Namely, the electric current value of the resistor 905 is not changed so that the voltage between both terminals of the resistor 905 is not changed. However, when the differential quantum efficiency η is varied by the change in temperature, a disturbance, etc., an insufficient electric current by the electric current converter 902 is supplied by the comparing amplifier 901 in the forward direction of the semiconductor laser 903. Accordingly, the electric current value corresponding to an error in conversion of the electric current converter 902 can be detected by measuring the voltage between both terminals of the resistor 905 when the luminous level command signal is changed for a constant period.

Figure 84:
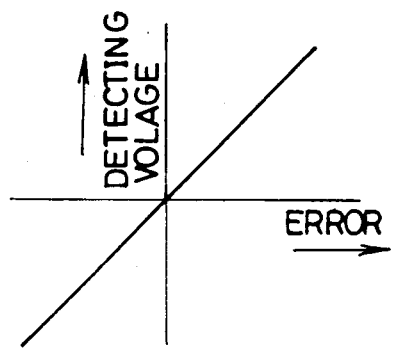
FIGS. 84 and 85 are characteristic graphs for explaining the semiconductor laser controller of the present invention.

The luminous level command signal is modulated by a modulating circuit at a constant amplitude level in a constant control period. At this time, a direct current component of the voltage Vd between both terminals of the rsistor 905 is removed therefrom by a circuit composed of a capacitor 931 and a resistor 932 through an emitter follower composed of a transistor 929 and a resistor 930. Then, this voltage is inputted to a multiplier 933. The amplitude of the luminous level command signal is made constant by a limiter amplifier 934 and this signal is inputted to the multiplier 933. FIG. 61 shows two input signals of this multiplier 933. In the control period, a signal a modulated at a constant amplitude level as shown in FIG. 61 is inputted as the luminous level command signal and an electric current $I_2$ (or $I_1$) as shown in FIG. 61 is observed by the resistor 905. In a period except for this constrol period, the luminous level command signal is set as a luminous level command value of the semiconductor laser 903 and the forward electric current of the semiconductor laser 903 is set to a value according to this luminous level command value. The multiplier 933 multiplies the two input signals and the multiplied result is outputted by a filter 935 as a voltage showing the relation between the error in operation of the electric current converter 902 and a detected voltage as shown in FIG. 84. The detected voltage from this filter 935 is inputted to one terminal of a comparator 936 and is compared with a reference voltage Vr. The output voltage of this comparator 936 is inputted to an updown terminal of an updown counter 937 to control an counting-up mode and a counting-down mode of the updown counter 937. The counting operation of the updown counter 937 is controlled by clock and control signals from a timing generator 938 and the updown counter 937 holds a counted value. The timing generator 938 switches the operation of the updown counter 937 from the counted value holding operation to the counting operation by inputting a control command signal in the above control period. The timing generator 938 also switches the operation of the updown counter 937 from the counting operation to the counted value holding operation at a timing for changing the output voltage of the comparator 936 from a high level to a low level, or a timing for changing this output voltage from the low level to the high level. The counted value of the updown counter 937 is digital/analog-converted by a digital/analog converter 939. The operation of the above variable resistor 924 is controlled by an output signal of this digital/analog converter 939 and an attenuating amount of the attenuator 926 is determined so that the above coefficient k of the electric current converter 902 is controlled.

Figure 85:
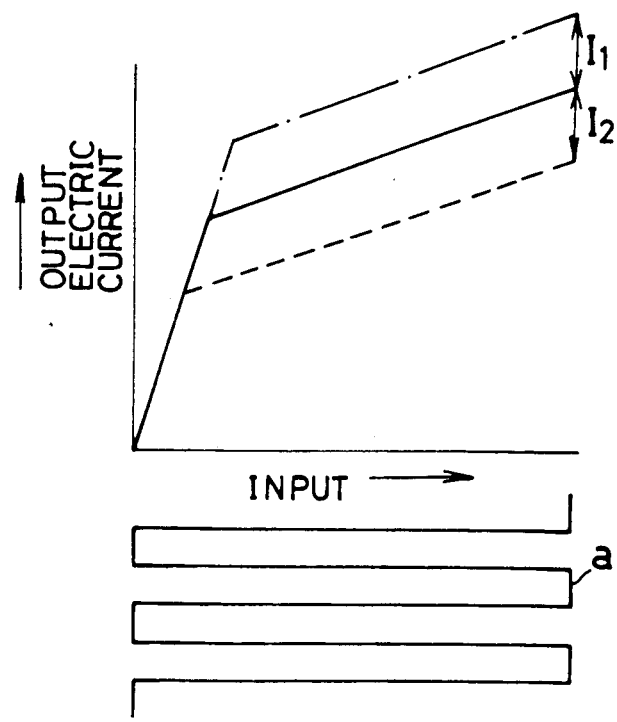

Next, the luminous level command signal is modulated by the modulating circuit as shown in FIG. 85, and a portion shown by broken line in this figure corresponds to a voltage observed by the resistor 905. An output of the multiplier 933 is outputted by the filter 935 as a voltage showing the relation between the error in operation of the electric current converter 902 and the detected voltage as shown in FIG. 84. The detected voltage from this filter 935 is inputted to one terminal of the comparator 936 and is compared with the reference voltage Vr. The output voltage of this comparator 936 is inputted to an updown terminal of an updown counter 940 to control a counting-up mode and a counting-down mode of the updown counter 940. The counting operation of the updown counter 940 is controlled by the clock and control signals from the timing generator 938 and the updown counter 940 holds a counted value. At this time, the timing generator 938 switches the operation of the updown counter 940 from the counted value holding operation to the counting operation. The timing generator 938 also switches the operation of the updown counter 940 from the counting operation to the counted value holding operation at the timing for changing the output voltage of the comparator 936 from the high level to the low level, or the timing for changing this output voltage from the low level to the high level. The counted value of the updown counter 940 is digital/analog-converted by a digital/analog converter 941. The set electric current value of the electric current source 922 is controlled by an output signal of this digital/analog converter 941.

In a period except for the control period, the resistance value of the variable resistor 924 and the set electric current value of the electric current source 922 are held by the counted value holding operation of the updown counters 937 and 940.

The above multiplier 933 may be constructed by the non-inverting circuit 848, the inverting circuit 849, the switch 950 and the buffer 851 as shown in FIG. 63.

After the counted values of the updown counters 937, 940 are initialized at a timing for starting the control thereof in operation, its counting operation may be switched to the counted value holding operation at a timing for changing the polarity of the output voltage of the comparator 936 by limiting the counting operation of the updown counters 937, 940 to the counting up or down operation.

A constructional section composed of the comparator 936, the updown counter 937 and the digital/analog converter 939 may be constructed by the integrator 855 composed of the operational amplifier 852, the capacitor 853 and the resistor 854, the reset switch 856 and the hold circuit 857 as shown in FIG. 64. A constructional section composed of the comparator 936, the updown counter 940 and the digital/analog converter 941 can be also constructed by the circuit as shown in FIG. 64.

In the above embodiment, the above value k is adjusted by the variable attenuator 926, but may be adjusted by a device except for the variable attenuator 926 such as a voltage control amplifier (VCA) for example.

Figure 74:
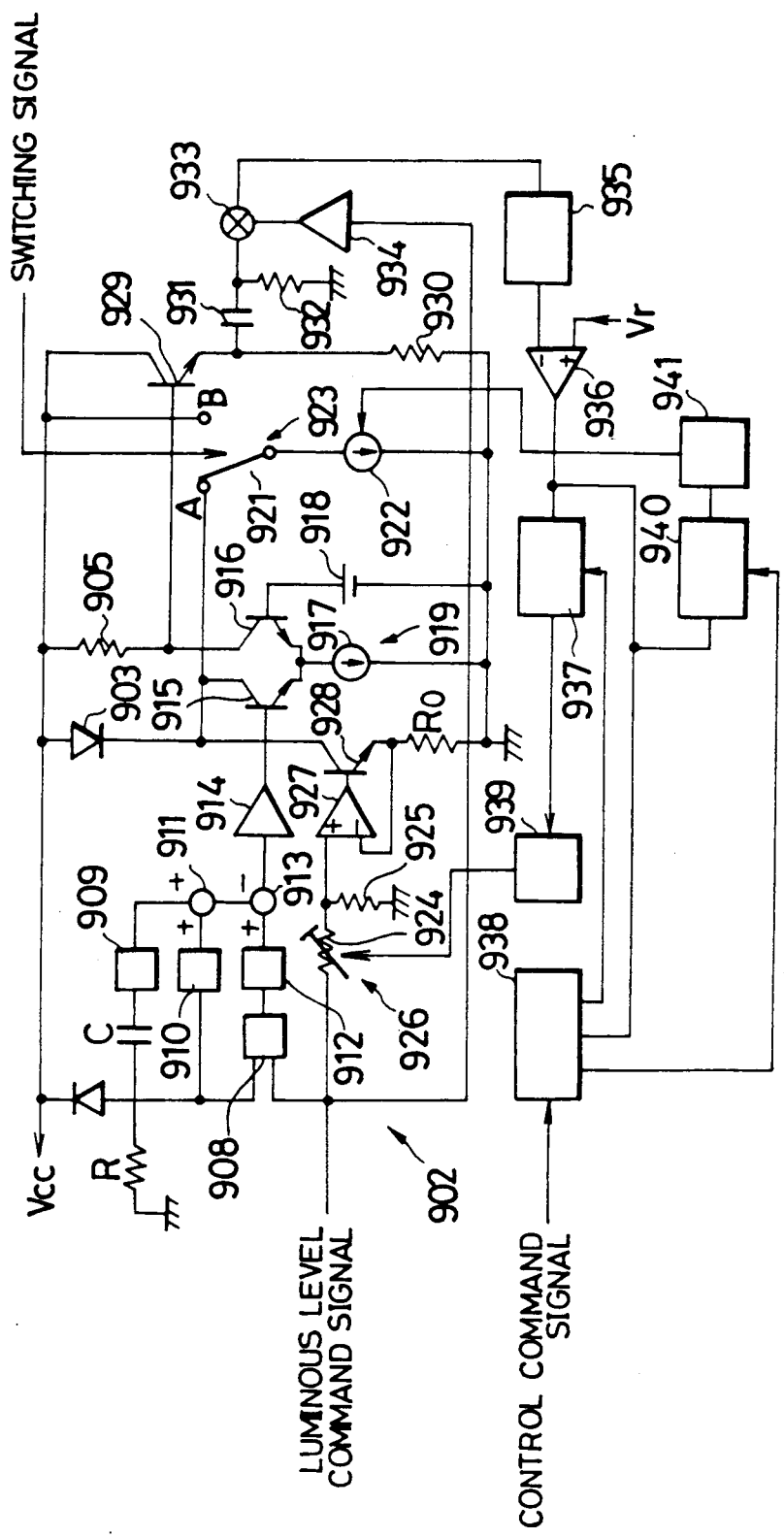

FIG. 74 shows the semiconductor laser controller in another embodiment of the present invention.

In this embodiment, instead of the comparing amplifier 901 in the embodiment of FIG. 73, the controller uses a circuit composed of a capacitor C, a resistor R, an impedance converter 909, voltage-current converters 910, 912, a comparing amplifier 908, an adder 911, a subtracter 913 and an electric current amplifier 914 as in the embodiment of FIG. 71. This circuit is operated as mentioned before. In this embodiment, as mentioned above, the circuit as shown in FIG. 63 may be used instead of the multiplier 933. Further, the circuit as shown in FIG. 64 may be used instead of the constructional section composed of the comparator 936, the updown counter 937 and the digital/analog converter 939 and the constructional section composed of the comparator 936, the updown counter 940 and the digital/analog converter 941. Further, the VCA, etc. may be used instead of the variable attenuator 926. After the counted values of the updown counters 937, 940 are initialized at a timing for starting the control thereof in operation, its counting operation may be switched to the counted value holding operation at a timing for changing the polarity of the output voltage of the comparator 936 by limiting the counting operation of the updown counters 937, 940 to the counting up or down operation.

Figure 75:
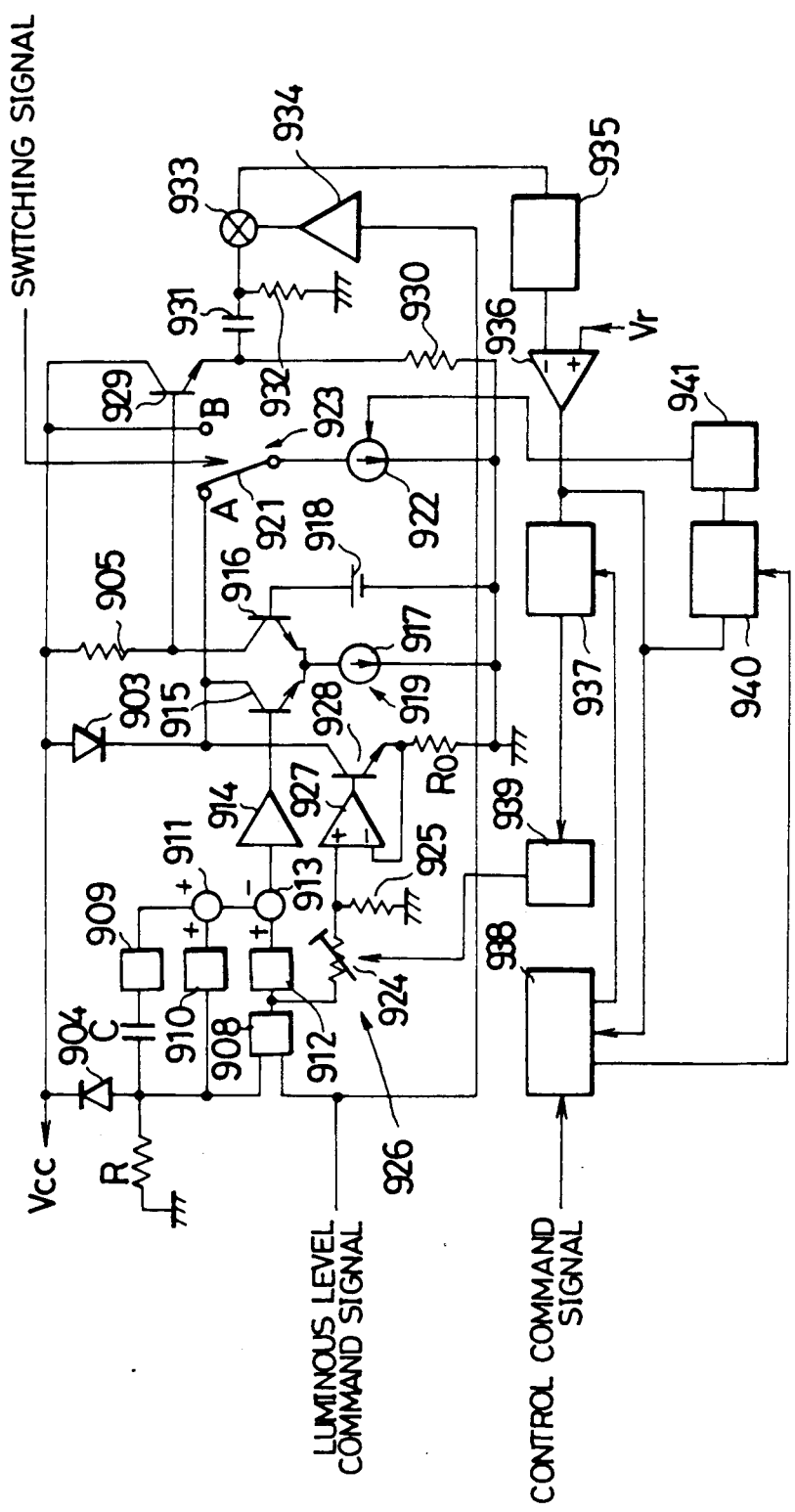

FIG. 75 shows the semiconductor laser controller in another embodiment of the present invention.

In this embodiment, instead of the luminous level command signal in the embodiment of FIG. 74, an output voltage of the comparing amplifier 908 is inputted to the electric current converter 902.

Figure 76:
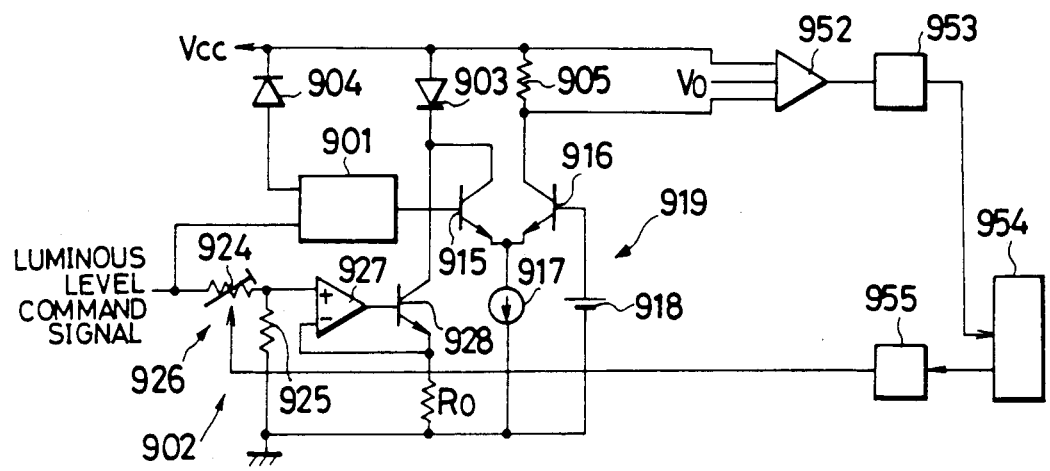

FIG. 76 shows the semiconductor laser controller in another embodiment of the present invention.

In this embodiment, a light-receiving element 904, a semiconductor laser 903, a comparing amplifier 901, an electric current converter 902 and a differential amplifier 919 are similar to those in the embodiment of FIG. 73. A sum $kV_s/R_0 + A\Delta V$ of an output electric current $A\Delta V$ of the differential amplifier 919 and an output electric current $kV_s/R_0$ of the electric current converter 902 becomes the forward electric current of the semiconductor laser 903. The semiconductor laser 903 outputs a light output $P_0$ determined by this forward electric current $kV_s/R_0 + A\Delta V + I_0$.

In general, with respect to the forward electric current greater than a threshold electric current $I_{th}$ in the semiconductor laser, the relation between the light output and the forward electric current can be approximately represented by a straight line of a differential quantum efficiency $\eta$. In this case, the light output $P_0$ of the semiconductor laser can be represented as follows.

$$P_0 = \frac{\eta}{(1 + \alpha S\eta A)}\left(\frac{1}{R1} + A\frac{k}{R_0}\right)V_s - \frac{\eta}{1 + \alpha S\eta A}I_{th}$$

The responsive characteristics can be approximately represented as follows when the $V_s$ is changed from a $V_0$ to a $V_i$.

$$P_0 = \frac{kV_i}{\alpha SR_0} + \frac{kV_i}{\alpha SR_0}\left(\frac{\alpha S\eta R_0}{kR} - 1\right) \cdot \exp(-2\pi f_0 t)$$

If $k = \alpha S\eta R_0$, the light output $P_0$ is instantly equal to $\eta V_i/R$ so that the output of the comparing amplifier 901 is not changed. Namely, the electric current value of the resistor 905 is not changed so that the voltage between both terminals of the resistor 905 is not changed. However, when the differential quantum efficiency $\eta$ is varied by the change in temperature, a disturbance, etc., an insufficient electric current by the electric current converter 902 is supplied by the comparing amplifier 901 in the forward direction of the semiconductor laser 903. Accordingly, the electric current value corresponding to an error in conversion of the electric current converter 902 can be detected by measuring the voltage between both terminals of the resistor 905 when the luminous level command signal is changed for a constant period.

In a constant control period, the luminous level command signal is modulated by signals set to at least two different values by a modulating circuit. At this time, an adder-subtracter 952 detects a voltage provided by subtracting the voltage $V_0$ from the voltage between both terminals of the resistor 905 so that the control electric current of the photoelectric negative feedback loop is detected as a voltage. The voltage $V_0$ is a voltage for removing an offset as an electric current value of an electric current source 917 from the control electric current of the photoelectric negative feedback loop. An output voltage of the adder-subtracter 952 is analog/digital-converted by an analog/digital converter 953 and is inputted to a calculating circuit 954. The calculating circuit 954 calculates the value $\eta$ from a set of the values P and $I_0$ composed of more than two measured values in which the light output and forward electric current characteristics of the semiconductor laser 903 are approximated by $P = \eta(I_0 - I_{th})$. This calculated value $\eta$ is digital/analog-converted by a digital/analog converter 955. The operation of the above variable resistor 924 is controlled by an output signal of this digital/analog converter 955. Thus, the attenuating amount of an attenuator 926 is determined and the above coefficient k of the electric current converter 902 is controlled.

The above-mentioned calculating circuit 954 will next be described in detail.

The luminous light amounts P1, P2 of the semiconductor laser 903, the corresponding control electric currents I11, I21 of the photoelectric negative feedback loop and the electric currents I12, I22 produced by the electric current converter 902 are represented as follows.

$P1 = \eta(I11 + I12 - I_{th})$ $P2 = \eta(I21 + I22 - I_{th})$

Accordingly, the differential quantum efficiency $\eta$ is provided as follows.

$\eta = (P1 - P2)/(I11 - I21 + I12 - I22)$

When the variable resistor 924 has a suitable resistance value, the electric currents I11 and I12 for controlling the luminous light amount of the semiconductor laser 903 are equal with respect to the luminous level command signal Vi. When the conversion coefficient of the electric current converter 902 is a suitable value, the proportional coefficient k is provided as follows.

$k = (P1 - P2)/[\eta(Vi1 - Vi2)]$

Accordingly, $k = (I11 - I21 + I12 - I22)/(Vi1 - Vi2)$

Further, when the coefficient k is an arbitrary value k', $k = [k'(Vi1 - Vi2) + I11 - I21]/(Vi1 - Vi2)$ Accordingly, an optimal conversion coefficient k can be provided if the conversion coefficient k' of the electric current converter 902 is suitably set when the Vi1 and Vi2 are the luminous level command signals. The calculating circuit 954 calculates a control value of the variable resistor 924 such that the conversion coefficient of the electric current converter 902 becomes the optimal conversion coefficient k from the output signal of the analog/digital converter 953 with respect to the luminous level command signals having two different values. The operation of the above variable resistor 924 is controlled by this calculated control value through the digital/analog converter 955.

In this embodiment, the control value of the variable resistor 924 is calculated by the calculating circuit 954 from the output signal of the analog/digital converter 953 with respect to the two different values of the luminous level command signal. However, the control value of the variable resistor 924 may be calculated by performing a statistical processing of an average value, etc. by the calculating circuit from the output signal of the analog/digital converter 953 with respect to more than three different values of the luminous level command signal. Further, in this embodiment, a VCA, etc. may be used instead of the variable attenuator 926.

Figure 77:
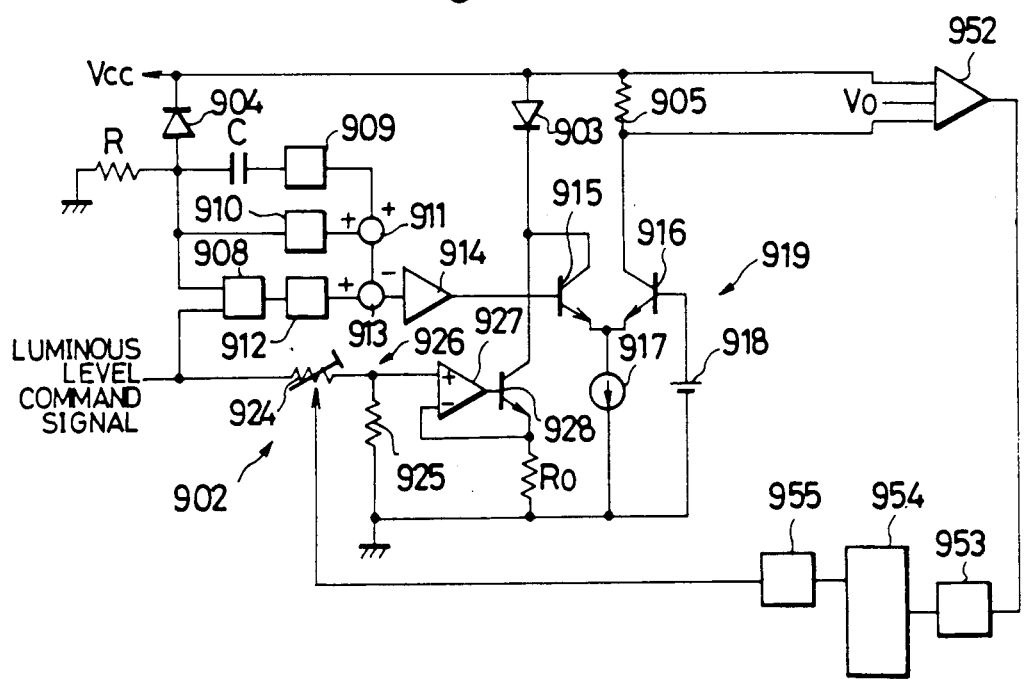

FIG. 77 shows the semiconductor laser controller in another embodiment of the present invention.

In this embodiment, instead of the comparing amplifier 901 in the embodiment of FIG. 76, a circuit composed of the capacitor C, the resistor R, the impedance converter 909, the voltage-current converters 910, 912, the comparing amplifier 908, the adder 911, the subtracter 913 and the electric current amplifier 914 as in the embodiment of FIG. 71 is used.

Figure 78:
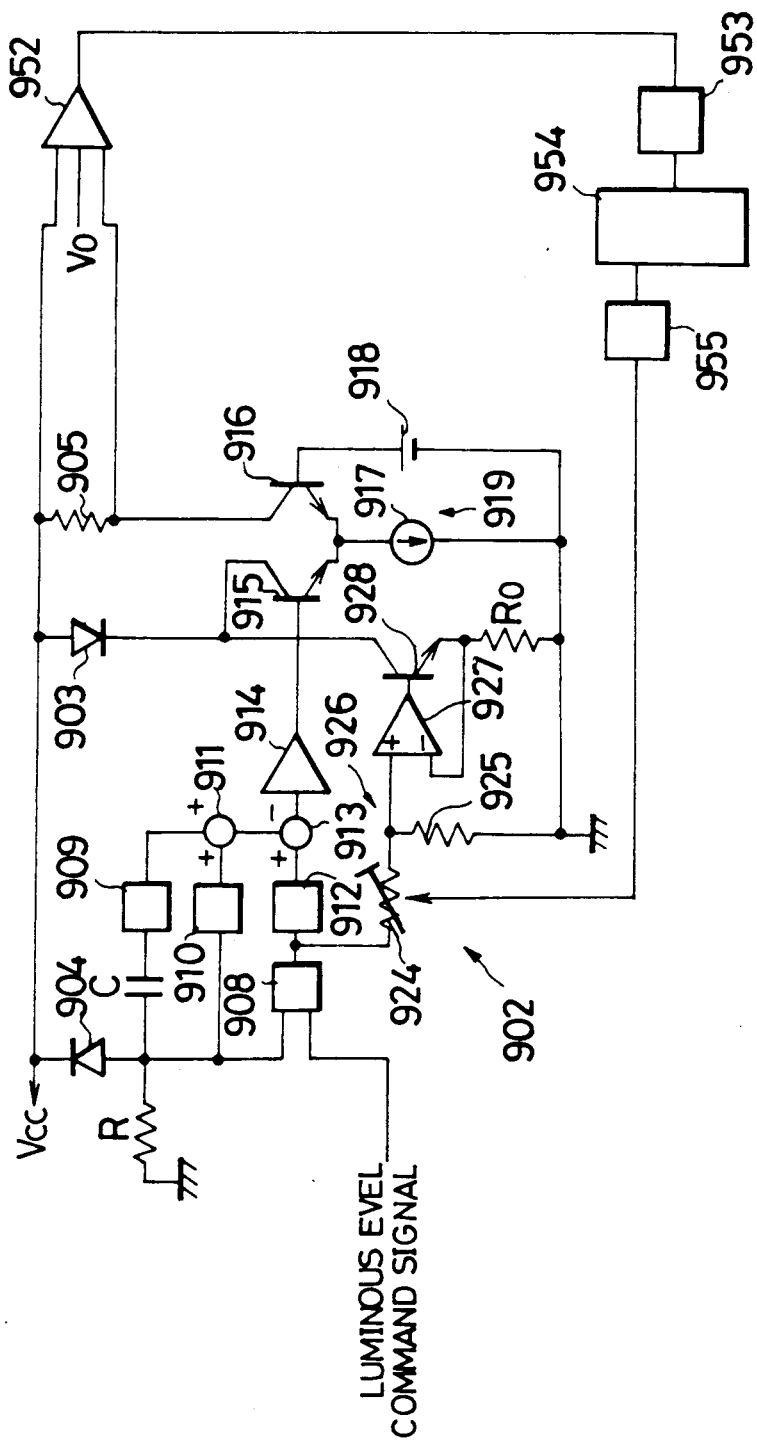

FIG. 78 shows the semiconductor laser controller in another embodiment of the present invention.

In this embodiment, instead of the luminous level command signal in the embodiment of FIG. 77, an output voltage of the comparing amplifier 908 is inputted to the electric current converter 902.

In these embodiments of FIGS. 77 and 78, the control value of the variable resistor 924 is calculated by the calculating circuit 954 from the output signal of the analog/digital converter 953 with respect to the two different values of the luminous level command signal. However, the control value of the variable resistor 924 may be calculated by performing a statistical processing of an average value, etc. by the calculating circuit from the output signal of the analog/digital converter 953 with respect to more than three different values of the luminous level command signal. Further, in this embodiment, a VCA, etc. may be used instead of the variable attenuator 926.

Figure 79:
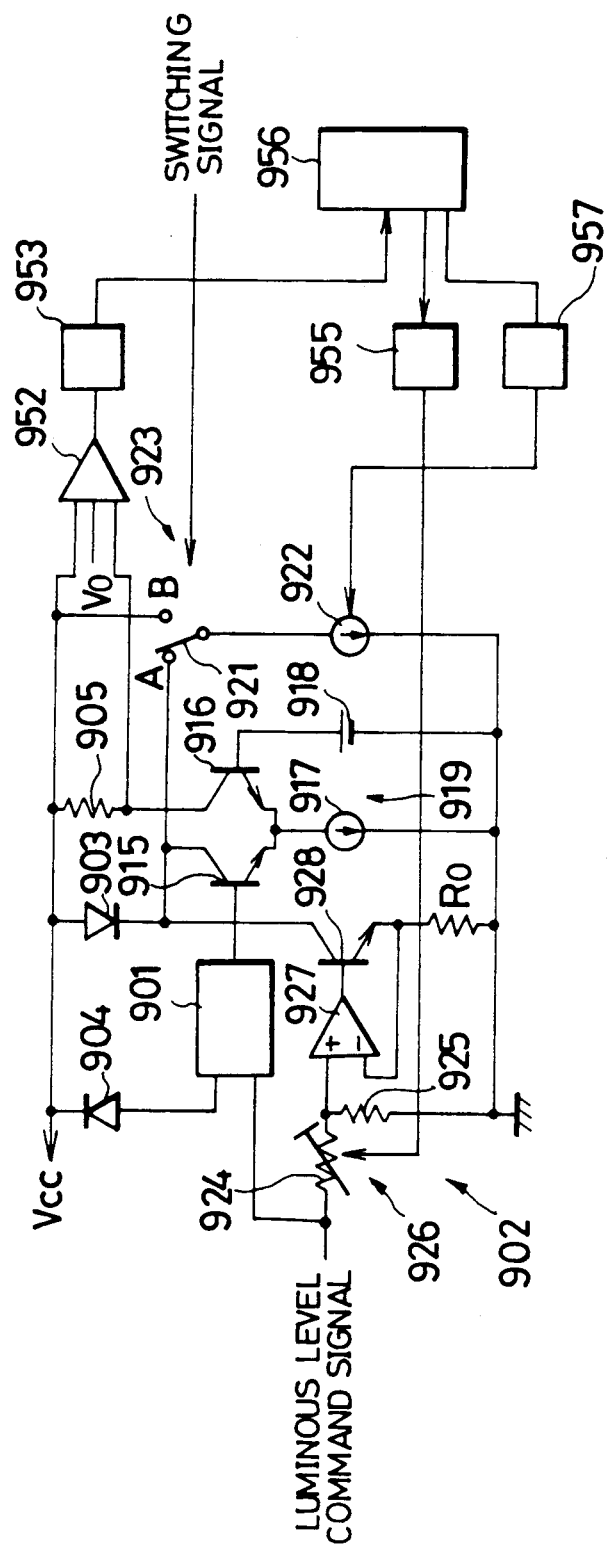

FIG. 79 shows the semiconductor laser controller in another embodiment of the present invention.

In this embodiment, a light-receiving element 904, a semiconductor laser 903, a comparing amplifier 901, an electric current converter 902, a differential amplifier 919 and a switching circuit 923 are similar to those in the embodiment of FIG. 73.

In a constant control period, the luminous level command signal is modulated by signals set to at least two different values by a modulating circuit. At this time, an adder-subtracter 952 detects a voltage provided by subtracting the voltage $V_0$ from the voltage between both terminals of the resistor 905 so that the control electric current of the photoelectric negative feedback loop is detected as a voltage. An output voltage of the adder-subtracter 952 is analog/digital-converted by an analog/digital converter 953 and is inputted to a calculating circuit 956. As mentioned above, the following formula is provided.

$$k = [k'(Vi1 - Vi2) + I11 - I21]/(Vi1 - Vi2)$$

Accordingly, an optimal conversion coefficient k can be provided if the conversion coefficient $k'$ of the electric current converter 902 is suitably set when the Vi1 and Vi2 are the luminous level command signals. Thus, the values $\eta$ and $I_{th}$ can be easily provided. Accordingly, the calculating circuit 956 calculates the values $\eta$ and $I_{th}$ from a set of the values P and $I_0$ composed of more than two measured values in which the light output and forward electric current characteristics of the semiconductor laser 903 are approximated by $P = \eta(I_0 - I_{th})$. This calculated value $\eta$ is digital/analog-converted by a digital/analog converter 955. The operation of the above variable resistor 924 is controlled by an output signal of this digital/analog converter 955. Thus, the attenuating amount of an attenuator 926 is determined and the above coefficient k of the electric current converter 902 is controlled. The calculated value $I_{th}$ is digital/analog-converted by a digital/analog converter 957. A set electric current value of an electric current source 922 is controlled by an output signal of this digital/analog converter 941.

In a period except for the control period, the resistance value of the variable resistor 924 and the set electric current value of the electric current source 922 are held by the counted value holding operation of the updown counters 937 and 940.

In this embodiment, the control values of the variable resistor 924 and the electric current source 922 are calculated by the calculating circuit 956 from the output signal of the analog/digital converter 953 with respect to the two different values of the luminous level command signal. However, the control values of the variable resistor 924 and the electric current source 922 may be calculated by performing a statistical processing of an average value, etc. by the calculating circuit from the output signal of the analog/digital converter 953 with respect to more than three different values of the luminous level command signal. Further, in this embodiment, a VCA, etc. may be used instead of the variable attenuator 926.

Figure 80:
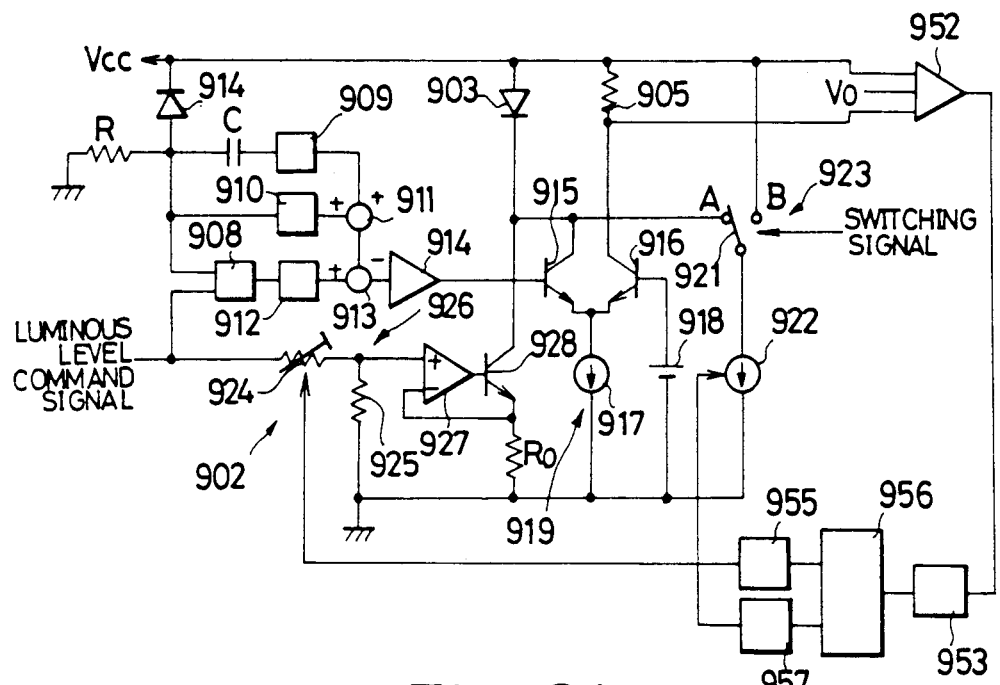

FIG. 80 shows the semiconductor laser controller in another embodiment of the present invention.

In this embodiment, instead of the comparing amplifier 901 in the embodiment of FIG. 79, a circuit composed of a capacitor C, a resistor R, an impedance converter 909, voltage-current converters 910, 912, a comparing amplifier 908, an adder 911, a subtracter 913 and an electric current amplifier 914 as in the embodiment of FIG. 71 is used.

Figure 81:
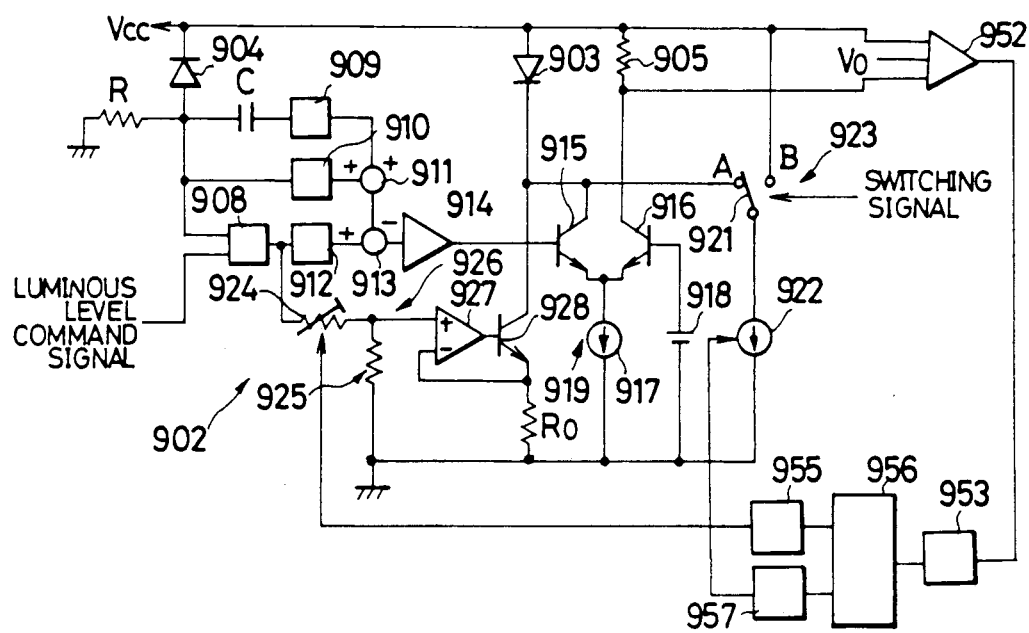

FIG. 81 shows the semiconductor laser controller in another embodiment of the present invention.

In this embodiment, instead of the luminous level command signal in the embodiment of FIG. 80, an output voltage of the comparing amplifier 908 is inputted to the electric current converter 902.

In these embodiments of FIGS. 80 and 81, the control value of the variable resistor 924 is also calculated by the calculating circuit 956 from the output signal of the analog/digital converter 953 with respect to the two different values of the luminous level command signal. However, the control value of the variable resistor 924 may be calculated by performing a statistical processing of an average value, etc. by the calculating circuit from the output signal of the analog/digital converter 953 with respect to more than three different values of the luminous level command signal. Further, in this embodiment, a VCA, etc. may be used instead of the variable attenuator 926.

Figure 82:
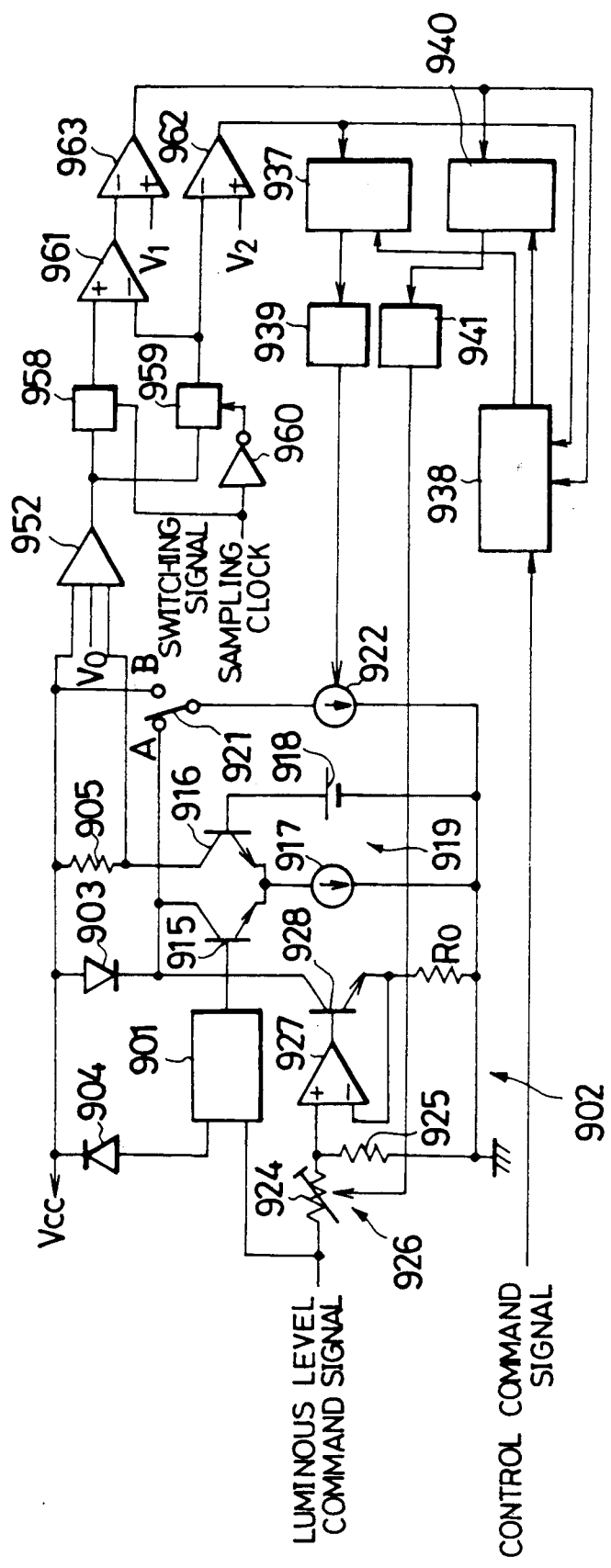

FIG. 82 shows the semiconductor laser controller in another embodiment of the present invention.

In this embodiment, instead of the emitter followers 929, 930, the capacitor 931, the resistor 932, the multiplier 933, the limit amplifier 934, the filter 935 and the comparator 936 in the embodiment of FIG. 73, an adder-subtracter 952, sampling circuits 958, 959, an inverter 960, a differential amplifier 961 and comparators 962, 963 are used.

A luminous level command signal is modulated by a modulating circuit at a constant amplitude level in a constant control period. At this time, the adder-subtracter 952 detects a voltage provided by subtracting a voltage $V_0$ from the voltage between both terminals of the resistor 905 so that a control electric current of a photoelectric negative feedback loop is detected as a voltage. An output voltage of the adder-subtracter 952 is sampled by a sampling clock signal by the sampling circuit 958 when the luminous level command signal is at a high peak level in voltage. The output voltage of the adder-subtracter 952 is sampled by the sampling circuit 959 when the sampling clock signal is inverted by the inverter 960 and is inputted to the sampling circuit 959 and the luminous level command signal is at a bottom (low) level in voltage. The differential amplifier 961 detects the difference in voltage between output signals of the sampling circuits 958 and 959 and this voltage difference is compared with a reference voltage $V_2$ by the comparator 962. An output voltage of this comparator 962 is inputted to an updown terminal of an updown counter 937 to control a counting-up mode and a counting-down mode of the updown counter 937. The counting operation of the updown counter 937 is controlled by clock and control signals from a timing generator 938 and the updown counter 937 holds a counted value. The timing generator 938 inputs a control command signal in the above control period and switches the operation of the updown counter 937 from the counted value holding operation to the counting operation. The timing generator 938 also switches the operation of the updown counter 937 from the counting operation to the counted value holding operation at a timing for changing the output voltage of the comparator 936 from a high level to a low level, or a timing for changing this output voltage from the low level to the high level. The counted value of the updown counter 937 is digital/analog-converted by a digital/analog converter 939. The operation of the above variable resistor 924 is controlled by an output signal of this digital/analog converter 939 and an attenuating amount of an attenuator 926 is determined so that the above coefficient k of the electric current converter 902 is controlled. Thus, the variable resistor 924 is set such that the changing amount of the control electric current of the photoelectric negative feedback loop is minimized. The output voltage of the sampling circuit 959 is compared with a reference voltage $V_1$ by the comparator 963. An output of this comparator 963 is inputted to an updown terminal of an updown counter 940 to control a counting-up mode and a counting-down mode of the updown counter 940. The counting operation and speed of the updown counter 940 are controlled by the clock and control signals from the timing generator 938 and the updown counter 940 holds a counted value. In the above control period, the timing generator 938 switches the operation of the updown counter 940 from the counted value holding operation to the counting operation. The timing generator 938 also switches the operation of the updown counter 940 from the counting operation to the counted value holding operation at a timing for changing the output voltage of the comparator 940 from a high level to a low level, or a timing for changing this output voltage from the low level to the high level. The counted value of the updown counter 940 is digital/analog-converted by a digital/analog converter 941. A set electric current value of an electric current source 922 is controlled by an output signal of this digital/analog converter 941.

In a period except for the control period, the resistance value of the variable resistor 924 and the set electric current value of the electric current source 922 are held by the counted value holding operation of the updown counters 937 and 940.

Figure 83:
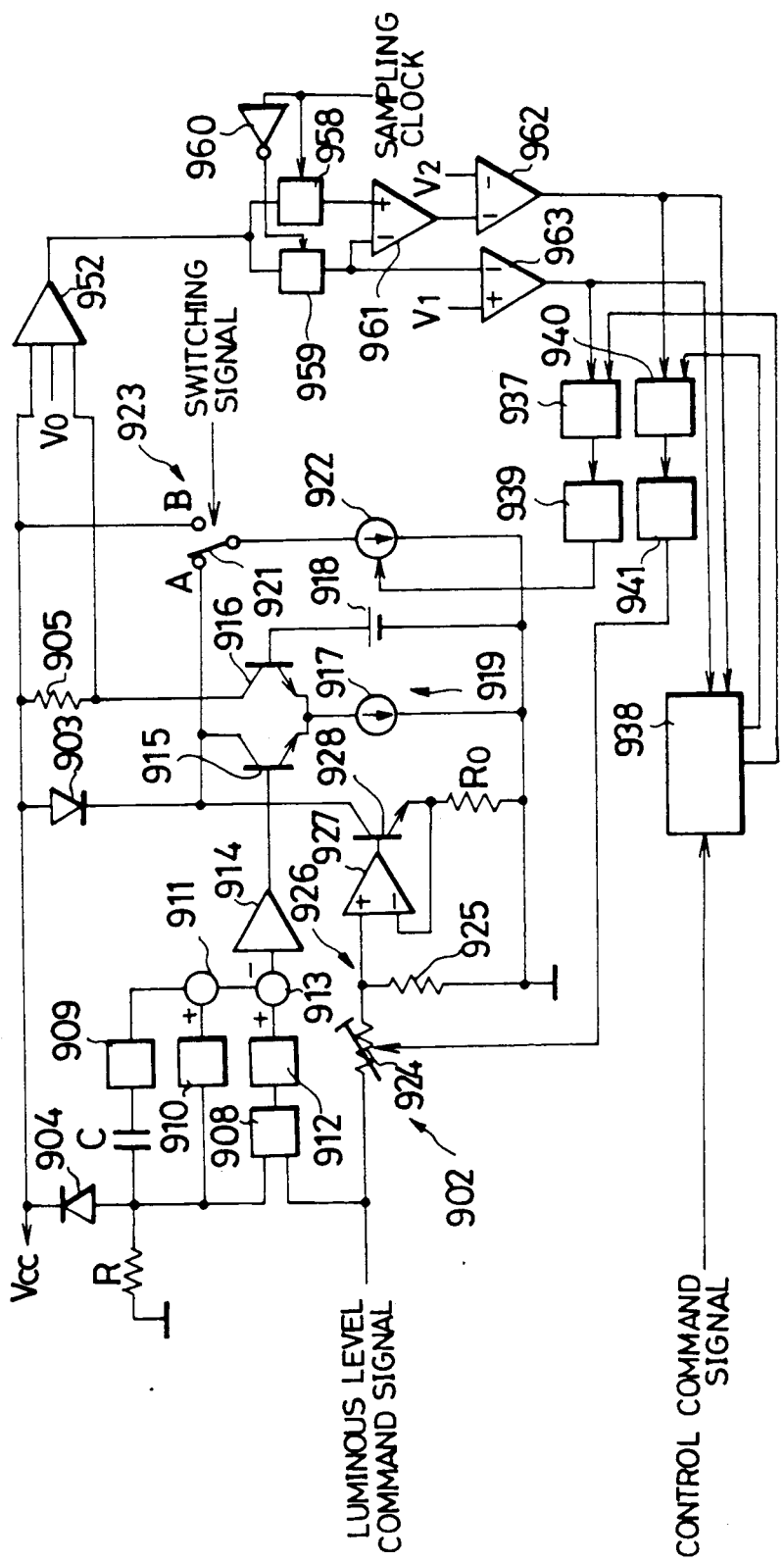

FIG. 83 shows the semiconductor laser controller in another embodiment of the present invention.

In this embodiment, instead of the comparing amplifier 901 in the embodiment of FIG. 82, a circuit composed of a capacitor C, a resistor R, an impedance converter 909, voltage-current converters 910, 912, a comparing amplifier 908, an adder 911, a subtracter 913 and an electric current amplifier 914 as in the embodiment of FIG. 71 is used.

In these embodiments of FIGS. 82 and 83, the operations of the variable resistor 926 and the electric current source 922 are simultaneously controlled. However, the operations of the variable resistor 926 and the electric current source 922 may be separately controlled and a VCA, etc. may be used instead of the variable attenuator 926.

As mentioned above, in the embodiments of the present invention shown in FIGS. 73 to 83, a semiconductor laser controller comprises a photoelectric negative feedback loop for detecting a light output of a driven semiconductor laser by a light-receiving portion and controlling a forward electric current of the semiconductor laser such that a light-receiving signal proportional to the light output of the semiconductor laser provided from the light-receiving portion is equal to a command signal indicative of a luminous level; converting means for converting the luminous level command signal to the forward electric current of the semiconductor laser in accordance with a conversion rule preset such that the light-receiving signal is equal to the luminous level command signal on the basis of light output and forward electric current characteristics of the semiconductor laser, a coupling coefficient between the light-receiving portion and the semiconductor laser, and light input and light-receiving signal characteristics of the light-receiving portion; detecting means for detecting a control electric current of the photoelectric negative feedback loop; correcting means for correcting the change in light output and forward electric current characteristics of the semiconductor laser by controlling the conversion rule such that the control electric current of the photoelectric negative feedback loop is not changed even when the luminous level command signal is changed by a detecting signal from the detecting means; and means for controlling the operation of the semiconductor laser by a sum or difference in electric current with respect to the control electric current of the photoelectric negative feedback loop and an electric current produced by the converting means. Accordingly, the semiconductor laser controller accurately operated at a high speed and having a high resolution can be realized.

Further, in the above semiconductor laser controller of the present invention, the photoelectric negative feedback loop is constructed by a first photoelectric negative feedback loop for detecting the light output of the semiconductor laser by the light-receiving portion and controlling the forward electric current of the semiconductor laser such that a light-receiving electric current proportional to the light output of the semiconductor laser obtained from the light-receiving portion is equal to the luminous level command signal in which a first luminous level command signal is converted to an electric current, and a second photoelectric negative feedback loop for controlling the first luminous level command signal such that a voltage proportional to the light-receiving electric current is equal to that of the luminous level command signal. Accordingly, the semiconductor laser controller accurately operated at a high speed and having a high resolution can be realized without setting an open loop gain of the first photoelectric negative feedback loop to a very large value.

Further, in the above semiconductor laser controller of the present invention, the converting means converts the luminous level command signal as an analog signal voltage to an electric current corresponding to the luminous level command signal by approximating the light output and forward electric current characteristics of the semiconductor laser to a straight line, and the detecting means detects the control electric current of the photoelectric negative feedback loop by emitting the light from the semiconductor laser in a constant period in which the luminous level command signal is set at least two different levels, and the correcting means controls the inclination in conversion characteristics of the converting means so as to correct the change in differential quantum efficiency of the semiconductor laser in the constant period by the detecting signal from the detecting means and holds the inclination in conversion characteristics of the converting means in the other period. Accordingly, effects similar to those obtained in the above-mentioned semiconductor laser controller can be obtained by a simple construction.

Further, in the above semiconductor laser controller of the present invention, the converting means converts the luminous level command signal as an analog signal voltage to an electric current corresponding to the luminous level command signal by approximating the light output and forward electric current characteristics of the semiconductor laser to a straight line, and the detecting means detects the control electric current of the first photoelectric negative feedback loop by emitting the light from the semiconductor laser in a constant period in which the luminous level command signal is set at least two different levels, and the correcting means controls the inclination in conversion characteristics of the converting means so as to correct the change in differential quantum efficiency of the semiconductor laser in the constant period by the detecting signal from the detecting means and holds the inclination in conversion characteristics of the converting means in the other period. Accordingly, effects similar to those obtained in the above-mentioned semiconductor laser controller can be obtained by a simple construction.

Further, in above the semiconductor laser controller of the present invention, the converting means has means for converting the luminous level command signal as an analog signal voltage to an electric current corresponding to the luminous level command signal by approximating the light output and forward electric current characteristics of the semiconductor laser to a straight line, and has switching means for turning on and off the forward electric current of the semiconductor laser by a set electric current value by a switching signal, and the detecting means detects the control electric current of the photoelectric negative feedback loop by emitting the light from the semiconductor laser in a constant period in which the luminous level command signal is set at least two different levels, and the correcting means controls the inclination in conversion characteristics of the converting means so as to correct the change in differential quantum efficiency of the semiconductor laser in the constant period by the detecting signal from the detecting means, and holds the inclination in conversion characteristics of the converting means in the other period. Accordingly, effects similar to those obtained in the above-mentioned semiconductor laser controller can be obtained by a simple construction.

Further, in the above semiconductor laser controller of the present invention, the converting means has means for converting the luminous level command signal as an analog signal voltage to an electric current corresponding to the luminous level command signal by approximating the light output and forward electric current characteristics of the semiconductor laser to a straight line, and has switching means for turning on and off the forward electric current of the semiconductor laser by a set electric current value by a switching signal, and the detecting means detects the phase and amplitude with respect to the luminous level command signal of the control electric current of the photoelectric negative feedback loop in a constant period in which the luminous level command signal is set at a constant amplitude level, and the correcting means controls the inclination in conversion characteristics of the converting means so as to minimize an absolute value of the control electric current of the photoelectric negative feedback loop in the constant period by the detecting signal from the detecting means, and holds the inclination in conversion characteristics of the converting means in the other period. Accordingly, effects similar to those obtained in the above-mentioned semiconductor laser controller can be obtained by a simple construction.

Further, in the above semiconductor laser controller of the present invention, the converting means has means for converting the luminous level command signal as an analog signal voltage to an electric current corresponding to the luminous level command signal by approximating the light output and forward electric current characteristics of the semiconductor laser to a straight line, and has switching means for turning on and off the forward electric current of the semiconductor laser by a set electric current value by a switching signal, and the detecting means and the correcting means sample a control electric current of the photoelectric negative feedback loop at timings of a peak and a bottom of the luminous level command signal in a constant period in which the luminous level command signal is pulse-modulated at a constant amplitude level having a constant offset level, and control a conversion coefficient of the converting means so as to minimize an absolute value of a differential voltage of sampling values corresponding to these peak and bottom, and control a set electric current value of the switching means so as to minimize the absolute value of the differential voltage between the sampling value corresponding to the timing of the bottom and a voltage corresponding to a bottom value of the luminous level command signal, and hold the inclination in conversion characteristics of the converting means and the set electric current value of the switching means in the other period. Accordingly, effects similar to those obtained in the above-mentioned semiconductor laser controller can be obtained by a simple construction.

Figure 86:
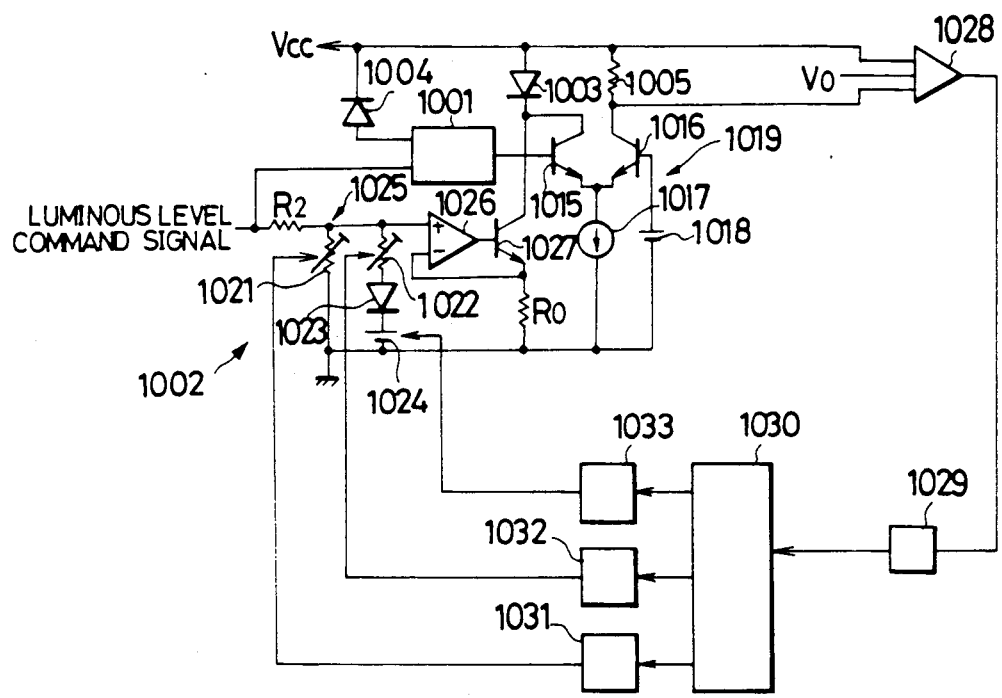
FIGS. 86 to 97 are block diagrams showing the semiconductor laser controller in another embodiments of the present invention.

FIG. 86 shows the semiconductor laser controller in another embodiment of the present invention.

A command signal indicative of a luminous level is inputted to a comparing amplifier 1001 and an electric current converter 1002 and a portion of a light output of a driven semiconductor laser 1003 is monitored by a light-receiving element 1004. A differential amplifier 1019 is composed of transistors 1015, 1016, an electric current source 1017 and a bias voltage source 1018. The differential amplifier 1019, the comparing amplifier 1001, the semiconductor laser 1003 and the light-receiving element 1004 form a photoelectric negative feedback loop. The comparing amplifier 1001 compares the luminous level command signal and a light-receiving signal proportional to a photovoltaic current (proportional to the light output of the semiconductor laser 1003) induced in the light-receiving element 1004. The comparing amplifier 1001 then controls a forward electric current of the semiconductor laser 1003 by this compared result through the differential amplifier 1019 such that the light-receiving signal is equal to the luminous level command signal.

The electric current converter 1002 is constructed by an attenuator 1025 composed of variable resistors 1021, 1022, a resistor $R_2$, a diode 1023 and a variable voltage source 1024, a differential amplifier 1026, a transistor 1027 and a resistor $R_0$. The electric current converter 1002 outputs an electric current preset in accordance with the luminous level command signal. This preset electric current is an electric current preset on the basis of light output and forward electric current characteristics of the semiconductor laser 1003, a coupling coefficient between the light-receiving element 1004 and the semiconductor laser 1003, and light input and light-receiving signal characteristics of the light-receiving element 1004. Namely, the luminous level command signal Vs is attenuated by the attenuator 1025 to Vso and is inputted to the differential amplifier 1026 and is then converted to an electric current $Vso/R_0$ by the transistor 1027 and the resistor $R_0$. A sum $Vso/R_0 + A\Delta V$ of this electric current $Vso/R_0$ and an output electric current $A\Delta V$ of the differential amplifier 1019 becomes the forward electric current of the semiconductor laser 1003. The semiconductor laser 1003 outputs a light output $P_0$ determined by this forward electric current $Vso/R_0 + A\Delta V$.

The responsive characteristics of the light output $P_0$ of the semiconductor laser and the control electric current of the photoelectric negative feedback loop are similar to those in the embodiment of FIGS. 57.

Figure 98:
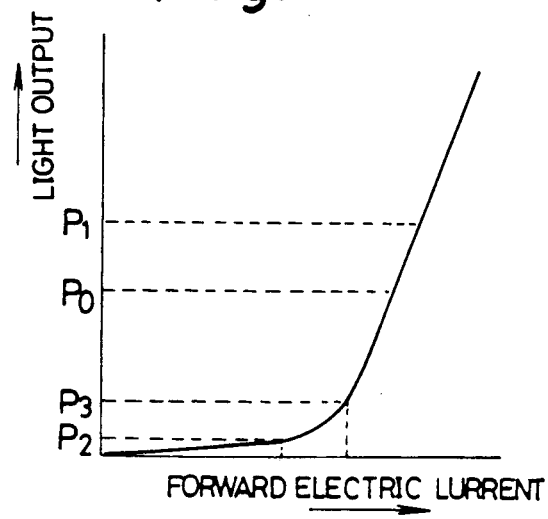
FIG. 98 is a characteristic graph for explaining the semiconductor laser controller of the present invention.

In a constant control period, the luminous level command signal is first set to P2 as shown in FIG. 98 for example and the resistance value of the variable resistor 1021 is set by a calculating circuit 1030 to an initially setting value R0 through a digital/analog converter 1031. Further, the voltage value of the variable voltage source 1024 is set by the calculating circuit 1030 to a voltage greater than that of the luminous level command signal through a digital/analog converter 1033 such that the diode 1023 is turned off at any time. An adder-subtracter 1028 detects a voltage provided by subtracting a voltage $V_0$ from the voltage between both terminals of the resistor 1005 so that a control electric current I2 of the photoelectric negative feedback loop is detected. The voltage $V_0$ is a voltage for removing an offset of an electric current of the electric current source 1017 from the control electric current of the photoelectric negative feedback loop. An output voltage of the adder-subtracter 1028 is analog/digital-converted by an analog/digital converter 1029 and is inputted to the calculating circuit 1030. The calculating circuit 1030 calculates a control value of the variable resistor 1021 by the output voltage of the analog/digital converter 1029. This control value is digital/analog-converted by the digital/analog converter 1031 and the resistance value of the variable resistor 1021 is controlled by the output signal of this digital/analog converter 1031. At this time, the calculating circuit 1030 calculates a value $\alpha$ by approximating the light output and forward electric current characteristics of the semiconductor laser 1003 as follows.

$$P2 = \alpha(I2 + k1 \times P2)$$

$$k1 = (\gamma/R_0)R0/(R2+R0)$$

The calculating circuit 1031 also sets the resistance value of the variable resistor 1021 such that I2=0. The value $\gamma$ is a known constant determined by the photoelectric negative feedback loop.

Next, the luminous level command signal is set to values P0 and P1 as shown in FIG. 98 for example. The calculating circuit 1030 calculates control values of the variable resistor 1022 and the variable voltage source 1024 by the output voltage of the analog/digital converter 1029. The respective control values are digital/analog-converted by digital/analog converters 1032, 1033. The resistance value of the variable resistor 1022 and the voltage value of the variable voltage source 1024 are controlled by respective output signals of the digital/analog converters 1032, 1033. At this time, the calculating circuit 1030 first sets the resistance value of the variable resistor 1021 to a value (which is set to Ri) set by the above-mentioned method and the resistance value of the variable resistor 1022 is set to an initially setting value R0. The calculating circuit 1030 further sets the voltage value of the variable voltage source 1024 to $-Vd$ (Vd is a threshold voltage of the diode 1023) such that the diode 1023 is turned on at any time. The values P0 and P1 are set to light amount values for sufficiently performing the laser oscillation of the semiconductor laser 1003 in advance. The corresponding luminous level command signal is set to have a voltage greater than the threshold voltage of the diode 1023. The calculating circuit 1030 calculates values $\beta$ and $I_{th}$ from data I1, I1 respectively corresponding to the set light amounts P0, P1 inputted from the analog/digital converter 1029 by approximating the light output and forward electric current characteristics of the semiconductor laser 1003 as follows.

$$P0 = \beta(I0 + ko \times P0 - I_{th})$$

$$P2 = \beta(I1 + ko \times P1 - I_{th})$$

$$ko = (\gamma/R_0)R0 \times Ri/[R2(R0+Ri)+R0 \times Ri]$$

The value R0 is calculated such that the values I0 and I1 become 0. The resistance value of the variable resistor 1022 is set to this calculated value. The voltage value of the variable voltage source 1024 is set to turn the diode 1023 on when the value P is provided such that two straight lines represented by $$P = \alpha I$$

$$P = \beta(I - I_{th})$$

cross each other.

In a period except for the control period, the resistance values of the variable resistors 1021, 1022 and the voltage value of the variable voltage source 1024 are held by the calculating circuit 1030.

In this embodiment, the resistance values of the variable resistors 1021, 1022 and the voltage value of the variable voltage source 1024 are controlled with respect to the two different luminous light amounts P1, P0. However, the resistance values of the variable resistors 1021, 1022 and the voltage value of the variable voltage source 1024 may be controlled by measuring the control electric current of the photoelectric negative feedback loop and performing a statistical processing of an average value, etc. with respect to more than three different luminous light amounts. Further, a conversion coefficient of the electric current converter 1002 is controlled by the attenuator 1025, but may be controlled by a combination of a plurality of VCA (voltage control amplifier) circuits for example.

Figure 87:
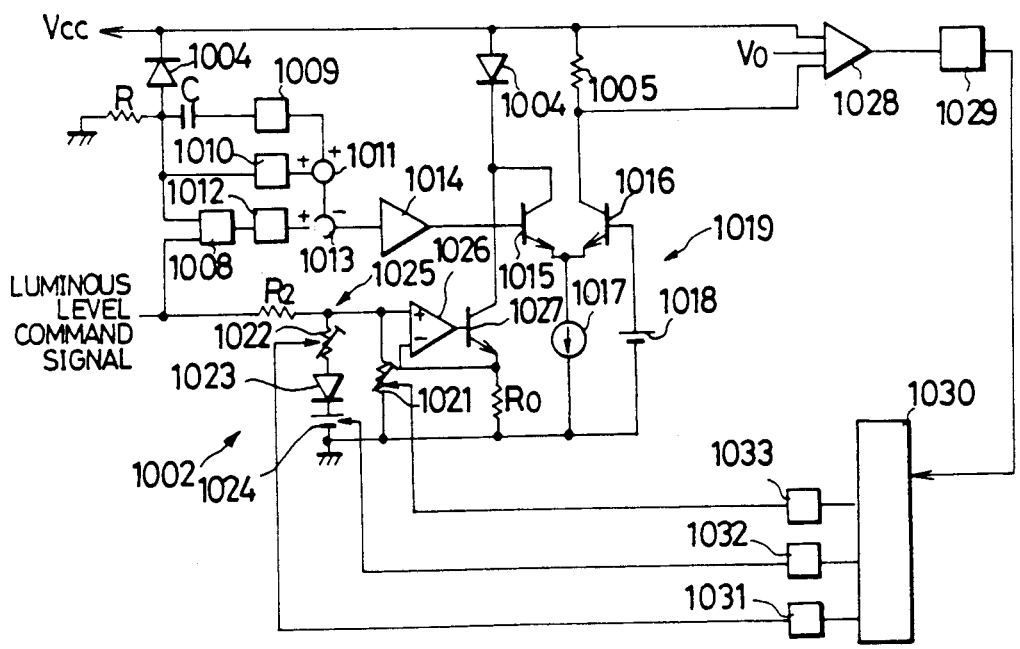

FIG. 87 shows the semiconductor laser controller in another embodiment of the present invention.

In this embodiment, instead of the comparing amplifier 1001 in the embodiment of FIG. 86, a circuit composed of a capacitor C, a resistor R, an impedance converter 1009, voltage-current converters 1010, 1012, a comparing amplifier 1008, an adder 1011, a subtracter 1013 and an electric current amplifier 1014 as in the embodiment of FIG. 71 is used.

Figure 88:
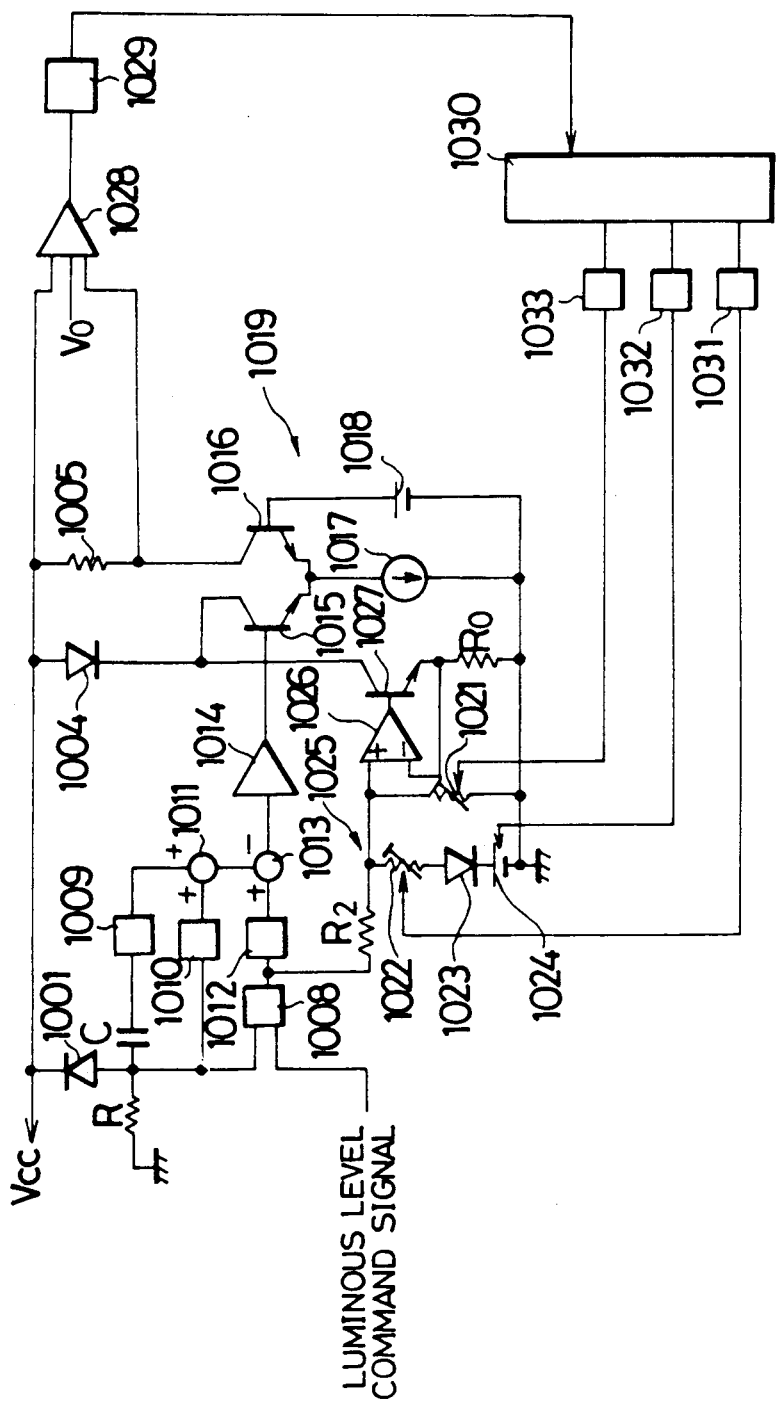

FIG. 88 shows the semiconductor laser controller in another embodiment of the present invention.

In this embodiment, instead of the luminous level command signal in the embodiment of FIG. 87, an output voltage of the comparing amplifier 1008 is inputted to the electric current converter 1002.

Figure 89:
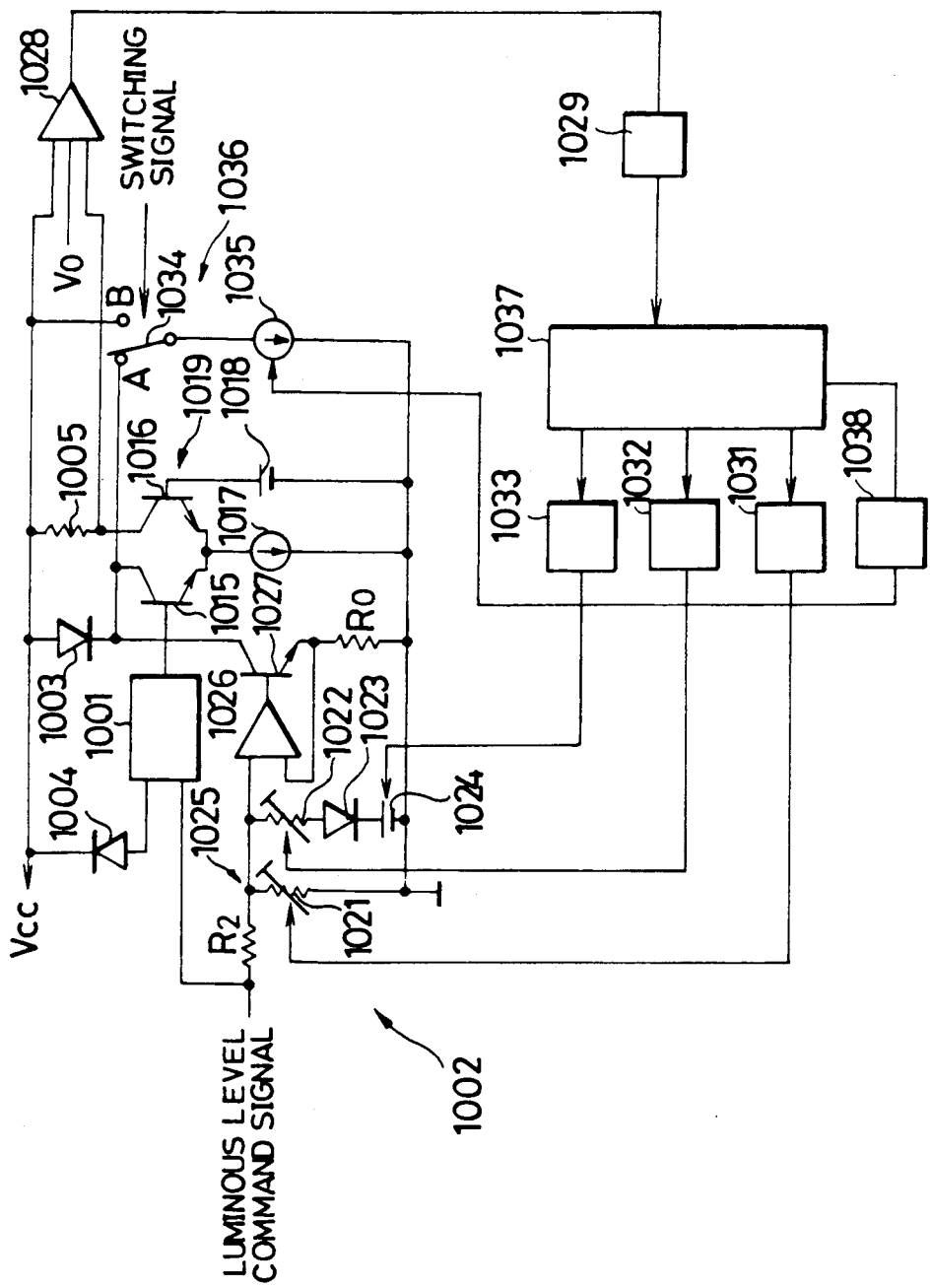

FIG. 89 shows the semiconductor laser controller in another embodiment of the present invention.

In this embodiment, a light-receiving element 1004, a semiconductor laser 1003, a comparing amplifier 1001, an electric current converter 1002 and a differential amplifier 1019 are similar to those in the embodiment of FIG. 86. A switch 1034 and a variable electric current source 1035 constructs a switching circuit 1036 and are included in the electric current converter 1002. Normally, the switch 1034 is switched onto the side of a fixed terminal B and no electric current from the variable electric current source 1035 is supplied to the semiconductor laser 1003 so that no light is emitted from the semiconductor laser 1003. When a switching signal is inputted at a timing for emitting the light from the semiconductor laser 1003, the switch 1034 is switched onto the side of a fixed terminal A and the electric current from the variable electric current source 1035 is supplied to the semiconductor laser 1003 so that the light is emitted from the semiconductor laser 1003. A sum of output electric currents of this switching circuit 1036, the differential amplifier 1019 and the electric current converter 1002 becomes the forward electric current of the semiconductor laser 1003. The semiconductor laser 1003 outputs the light output P0 determined by this forward electric current. The switching circuit 1036 is operated at a high speed until an electric current value at which the semiconductor laser 1003 is driven by the switching circuit 1036. Accordingly, this switching circuit rises at a high speed irrespective of a rising speed of the electric current converter 1002. Further, in general, as can be seen from the light output and electric current characteristics of the semiconductor laser 1003 shown in FIG. 98, there is no laser oscillation until a threshold electric current. Accordingly, no quenching ratio by an offset electric current is almost deteriorated. The responsive characteristics of the light output of the semiconductor laser 1003 and the control electric current of the photoelectric negative feedback loop are similar to those in the embodiment of FIG. 57.

In a constant control period, the luminous level command signal is set to P2 and P3 as shown in FIG. 98 for example and the resistance value of the variable resistor 1021 is set by a calculating circuit 1037 to an initially setting value R0 through a digital/analog converter 1031. Further, the voltage value of the variable voltage source 1024 is set by the calculating circuit 1037 to a voltage greater than that of the luminous level command signal through a digital/analog converter 1033 such that the diode 1023 is turned off at any time. An adder-subtracter 1028 detects a voltage provided by subtracting a voltage $V_0$ from the voltage between both terminals of the resistor 1005 so that a control electric current $I_2$ of the photoelectric negative feedback loop is detected. An output voltage of the adder-subtracter 1028 is analog/digital-converted by an analog/digital converter 1029 and is inputted to the calculating circuit 1037. The calculating circuit 1037 calculates a control value of the variable resistor 1021 by the output voltage of the analog/digital converter 1029. This control value is digital/analog-converted by the digital/analog converter 1031 and the resistance value of the variable resistor 1021 is controlled by the output signal of this digital/analog converter 1031. At this time, the calculating circuit 1037 calculates a value $\alpha$ by approximating the light output and forward electric current characteristics of the semiconductor laser 1003 as follows.

$$P2 = \alpha(I2 + k1 \times P2)$$
$$k1 = (\gamma/R_0)R0/(R2 + R0)$$

The calculating circuit 1037 also sets the resistance value of the variable resistor 1021 such that I2=0.

Next, the luminous level command signal is set to values P0 and P1 as shown in FIG. 98 for example. The calculating circuit 1037 calculates control values of the variable resistor 1022 and the variable voltage source 1024 by the output voltage of the analog/digital converter 1029. The respective control values are digital/analog-converted by digital/analog converters 1032, 1033. The resistance value of the variable resistor 1022 and the voltage value of the variable voltage source 1024 are controlled by respective output signals of the digital/analog converters 1032, 1033. At this time, the calculating circuit 1030 first sets the resistance value of the variable resistor 1021 to a value (which is set to Ri) set by the above-mentioned method and the resistance value of the variable resistor 1022 is set to an initially setting value R0. The calculating circuit 1030 further sets the voltage value of the variable voltage source 1024 to $-V_d$ such that the diode 1023 is turned on at any time. The calculating circuit 1037 calculates values $\beta$ and $I_{th}$ from data I1, I1 respectively corresponding to the set light amounts P0, P1 inputted from the digital/analog converter 1031 by approximating the light output and forward electric current characteristics of the semiconductor laser 1003 as follows.

$$P0 = \beta(I0 + k_o \times P0 - I_{th})$$

$$P1 = \beta(I1 + k_o \times P1 - I_{th})$$

$$k_o = (\gamma/R_0)R0 \times Ri/[R2(R0 + Ri) + R0 \times Ri]$$

The value R0 is calculated such that the values I0 and I1 become 0. The resistance value of the variable resistor 1022 is set to this calculated value. The voltage value of the variable voltage source 1024 is set to turn the diode 1023 on when the value P is provided such that two straight lines represented by $$P = \alpha I$$

$$P = \beta(I - I_{th})$$

cross each other.

Next, the luminous level command signal is set to P2 as shown in FIG. 98 for example. At this time, the calculating circuit 1037 calculates a control value of the variable electric current source 1035 by data from the analog/digital converter 1029. This control value is digital/analog-converted by a digital/analog converter 1038 and an electric current value of the variable electric current source 1035 is controlled by an output signal of this digital/analog converter 1038.

In a period except for the control period, the resistance values of the variable resistors 1021, 1022 and the voltage value of the variable voltage source 1024 are held by the calculating circuit 1030.

In this embodiment, the resistance values of the variable resistors 1021, 1022, the voltage value of the variable voltage source 1024 and the electric current value of the variable electric current source 1035 are controlled with respect to the three different luminous light amounts P3, P1 and P0. However, the resistance values of the variable resistors 1021, 1022, the voltage value of the variable voltage source 1024 and the electric current value of the variable electric current source 1035 may be controlled by measuring the control electric current of the photoelectric negative feedback loop and preforming a statistical processing of an average value, etc. with respect to more than four different luminous light amounts. Further, a conversion coefficient of the electric current converter 1002 is controlled by the attenuator 1025, but may be controlled by a combination of a plurality of VCA circuits for example.

Figure 90:
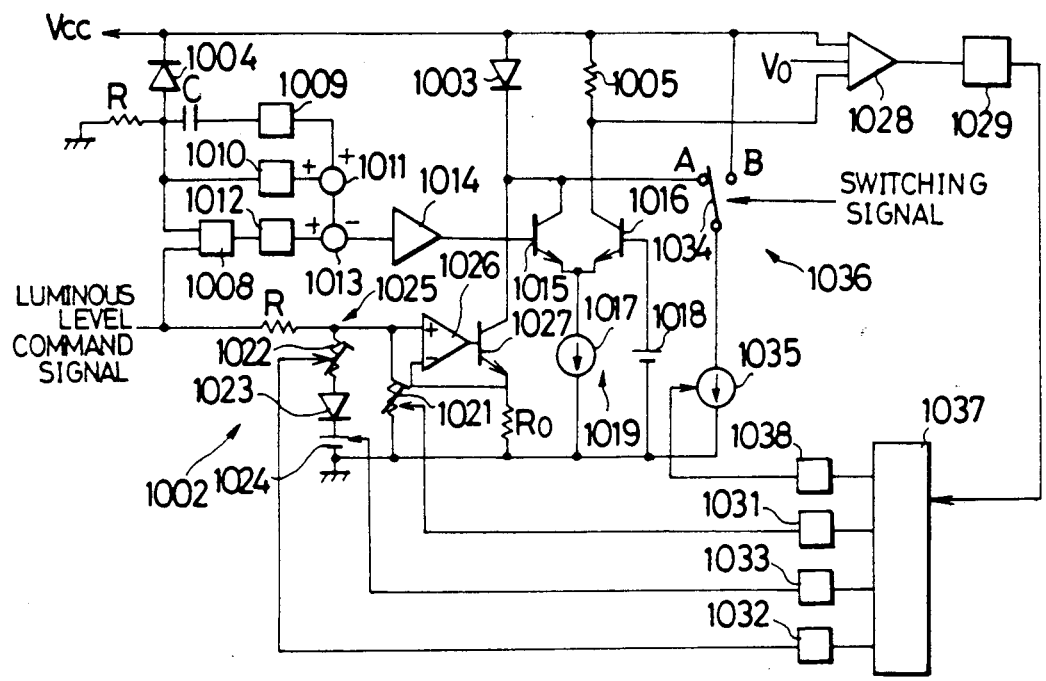

FIG. 90 shows the semiconductor laser controller in another embodiment of the present invention.

In this embodiment, instead of the comparing amplifier 1001 in the embodiment of FIG. 89, a circuit composed of a capacitor C, a resistor R, an impedance converter 1009, voltage-current converters 1010, 1012, a comparing amplifier 1008, an adder 1011, a subtracter 1013 and an electric current amplifier 1014 as in the embodiment of FIG. 71 is used.

Figure 91:
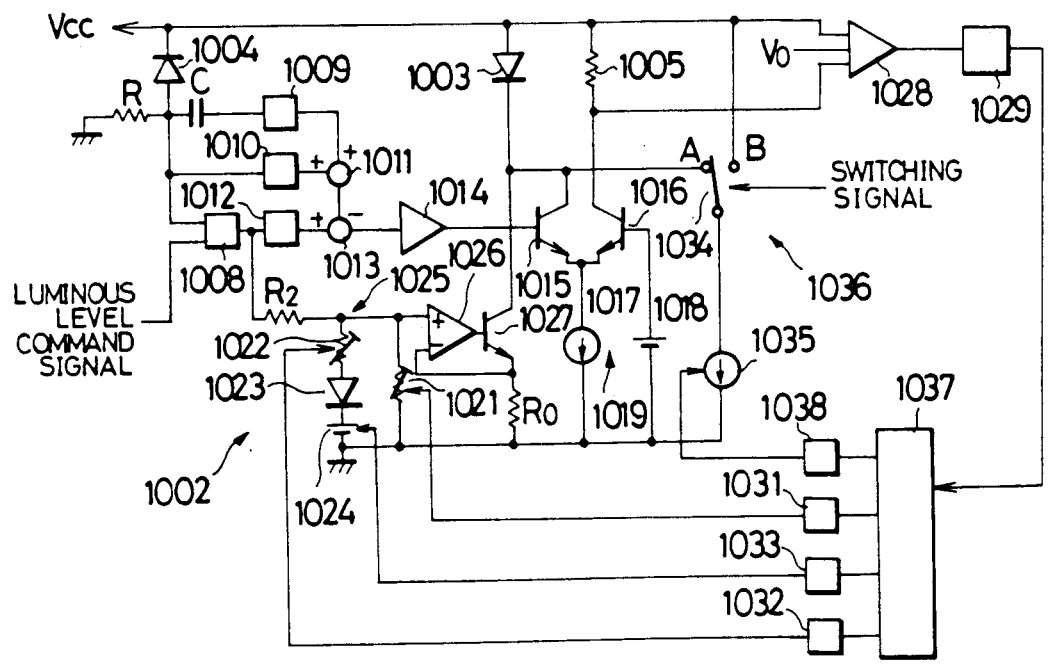

FIG. 91 shows the semiconductor laser controller in another embodiment of the present invention.

In this embodiment, instead of the luminous level command signal in the embodiment of FIG. 90, an output voltage of the comparing amplifier 1008 is inputted to the electric current converter 1002.

Figure 92:
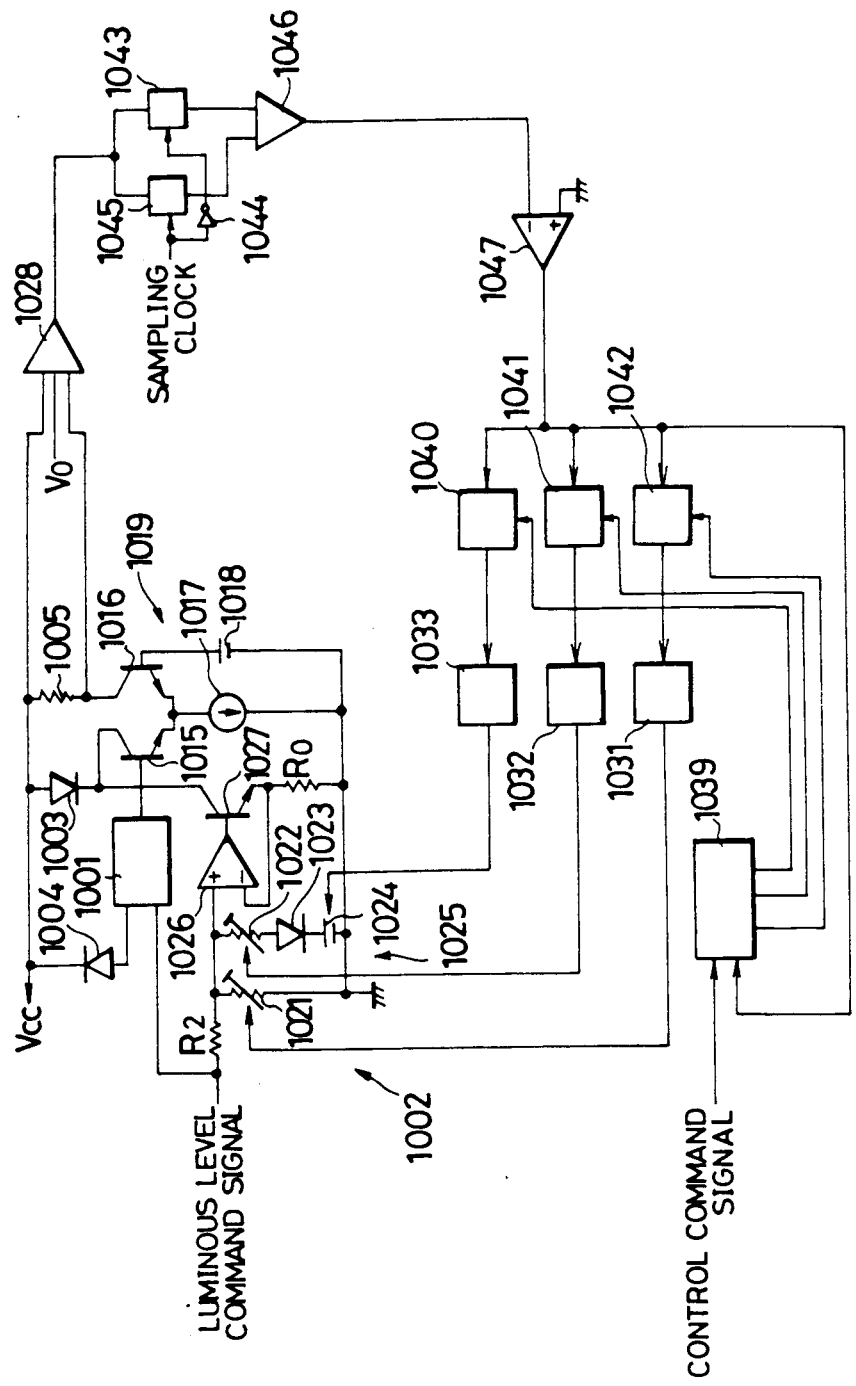

FIG. 92 shows the semiconductor laser controller in another embodiment of the present invention.

In this embodiment, a light-receiving element 1004, a semiconductor laser 1003, a comparing amplifier 1001, an electric current converter 1002, a differential amplifier 1019 and a switching circuit 1036 are similar to those in the above embodiment.

In a constant control period, the luminous level command signal is pulse-modulated at an amplitude 0 to P2 as shown in FIG. 98 for example. Further, a timing generator 1039 sets an updown counter 1040 to an initially setting value by a control command signal so that a voltage value of a variable voltage source 1024 is set through a digital/analog converter 1033 so as to turn a diode 1023 off at any time. At this time, an output voltage of an adder-subtracter 1028 is sampled by a sampling clock signal by a sampling circuit 1043 when the luminous level command signal is at a peak level in voltage. The output voltage of the adder-subtracter 1028 is sampled by a sampling circuit 1045 when the sampling clock signal is inputted to the sampling circuit 1045 through an inverter 1044 and the luminous level command signal is at a bottom level in voltage. A subtracter 1046 detects the difference between the output voltages of the sampling circuits 1043, 1045 and an output voltage of the subtracter 1046 is compared with a reference voltage by a comparator 1047. This reference voltage is basically set to 0 V, but it is necessary to slightly adjust this reference voltage so as to further restrain DO loop characteristics of the semiconductor laser 1003. The output voltage of the comparator 1047 is inputted to an updown terminal of an updown counter 1042 to control an counting-up mode and a counting-down mode of the updown counter 1042. The counting operation of the updown counter 1042 is controlled by clock and control signals from a timing generator 1039 and the updown counter 1042 holds a counted value. The timing generator 1039 inputs a control command signal in the above control period and switches the operation of the updown counter 1042 from the counted value holding operation to the counting operation. The timing generator 1039 also switches the operation of the updown counter 1042 from the counting operation to the counted value holding operation at a timing for changing the output voltage of the comparator 1047 from a high level to a low level, or a timing for changing this output voltage from the low level to the high level. The counted value of the updown counter 1042 is digital/analog-converted by a digital/analog converter 1031. The operation of the above variable resistor 1021 is controlled by an output signal of this digital/analog converter 1031. Thus, the variable resistor 1021 is set such that the control electric current of the photoelectric negative feedback loop is minimized.

Next, the luminous level command signal is pulse-modulated at an amplitude P0 to P1 as shown in FIG. 98 for example. At this time, the timing generator 1039 sets an updown counter 1041 to a second initially setting value and sets the updown counter 1040 to the initially setting value. Thus, the voltage value of the variable voltage source 1024 is set to $-V_d$ through the digital/analog converter 1033 so as to turn the diode 1023 off at any time. The output voltage of the comparator 1047 is inputted to an updown terminal of the updown counter 1041 to control an counting-up mode and a counting-down mode of the updown counter 1041. The counting operation of the updown counter 1041 is controlled by the clock and control signals from the timing generator 1039 and the updown counter 1041 holds a counted value. At this time, the timing generator 1039 switches the operation of the updown counter 1041 from the counted value holding operation to the counting operation. The timing generator 1039 also switches the operation of the updown counter 1041 from the counting operation to the counted value holding operation at the timing for changing the output voltage of the comparator 1047 from the high level to the low level, or the timing for changing this output voltage from the low level to the high level. The counted value of the updown counter 1041 is digital/analog-converted by a digital/analog converter 1032. The operation of the above variable resistor 1022 is controlled by an output signal of this digital/analog converter 1032. Thus, the variable resistor 1022 is set such that the control electric current of the photoelectric negative feedback loop is minimized.

Next, the luminous level command signal is pulse-modulated at the amplitude P0 to P1. Similarly, the voltage value of the variable voltage source 1024 is set by the updown counter 1040 and the digital/analog converter 1033.

In a period except for the control period, the resistance values of the variable resistors 1021, 1022 and the voltage value of the variable voltage source 1024 are held.

Figure 93:
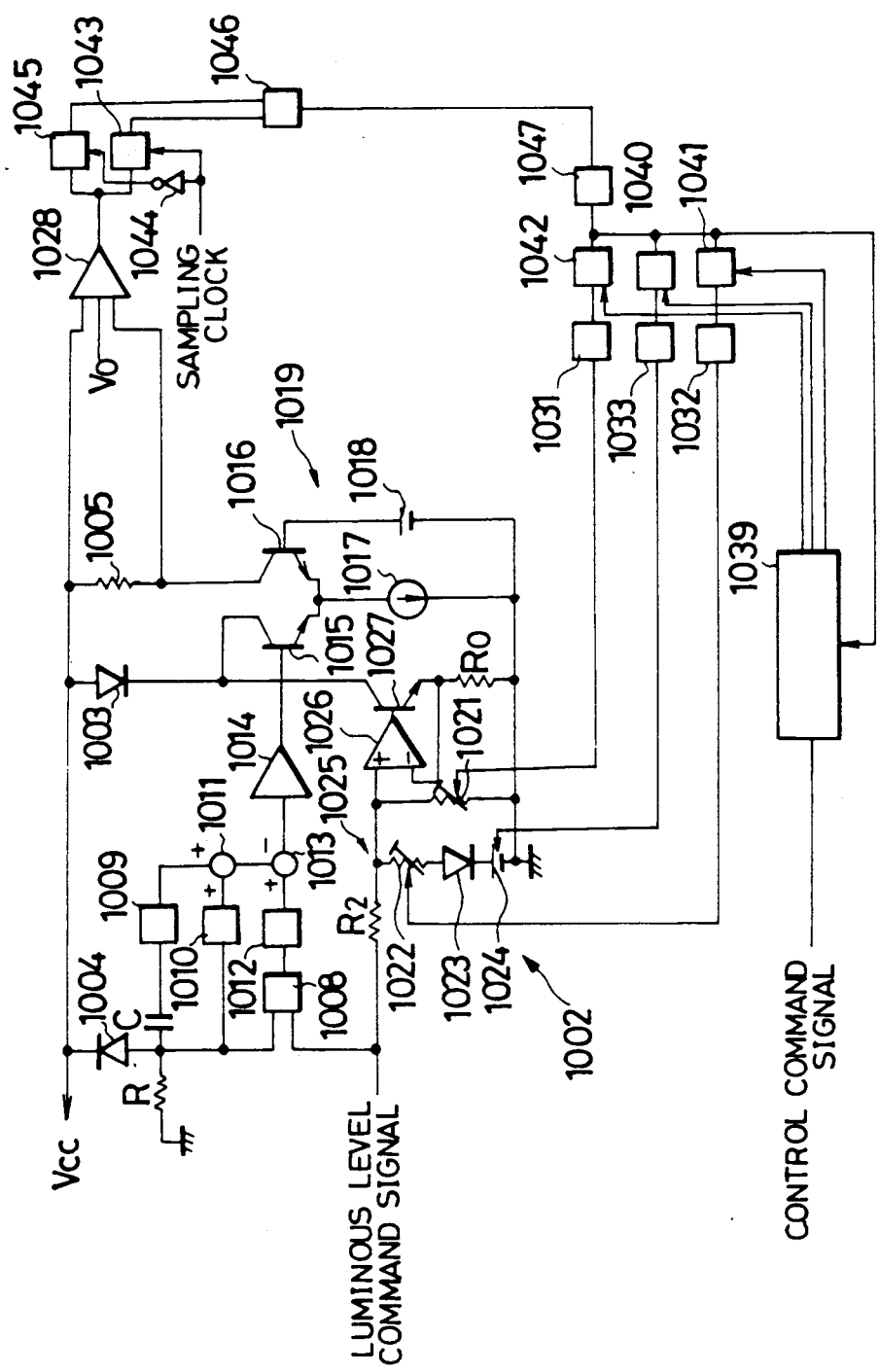

FIG. 93 shows the semiconductor laser controller in another embodiment of the present invention.

In this embodiment, instead of the comparing amplifier 1001 in the embodiment of FIG. 92, a circuit composed of a capacitor C, a resistor R, an impedance converter 1009, voltage-current converters 1010, 1012, a comparing amplifier 1008, an adder 1011, a subtracter 1013 and an electric current amplifier 1014 as in the embodiment of FIG. 71 is used.

Figure 94:
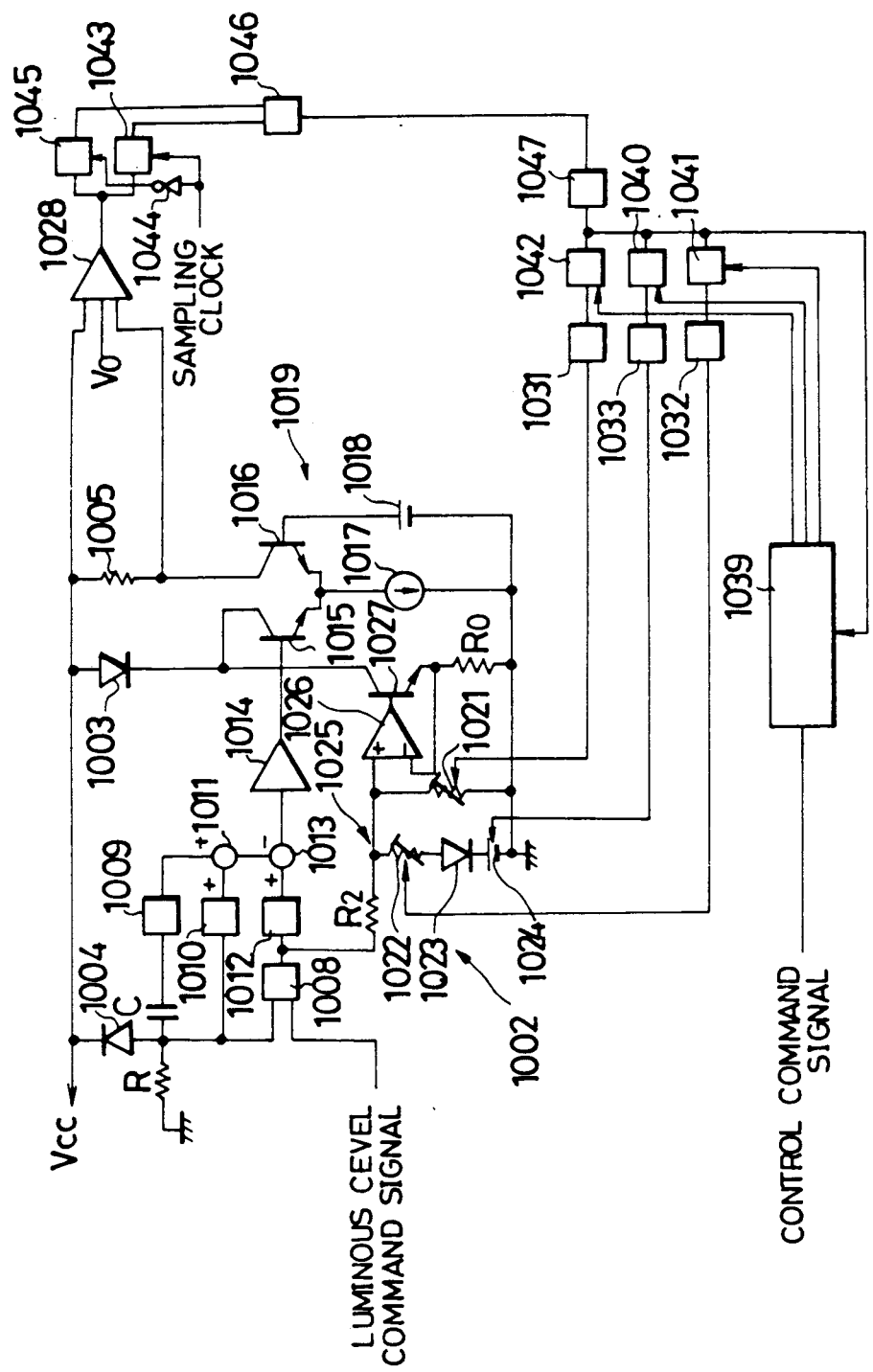

FIG. 94 shows the semiconductor laser controller in another embodiment of the present invention.

In this embodiment, instead of the luminous level command signal in the embodiment of FIG. 93, an output voltage of the comparing amplifier 1008 is inputted to the electric current converter 1002.

Figure 95:
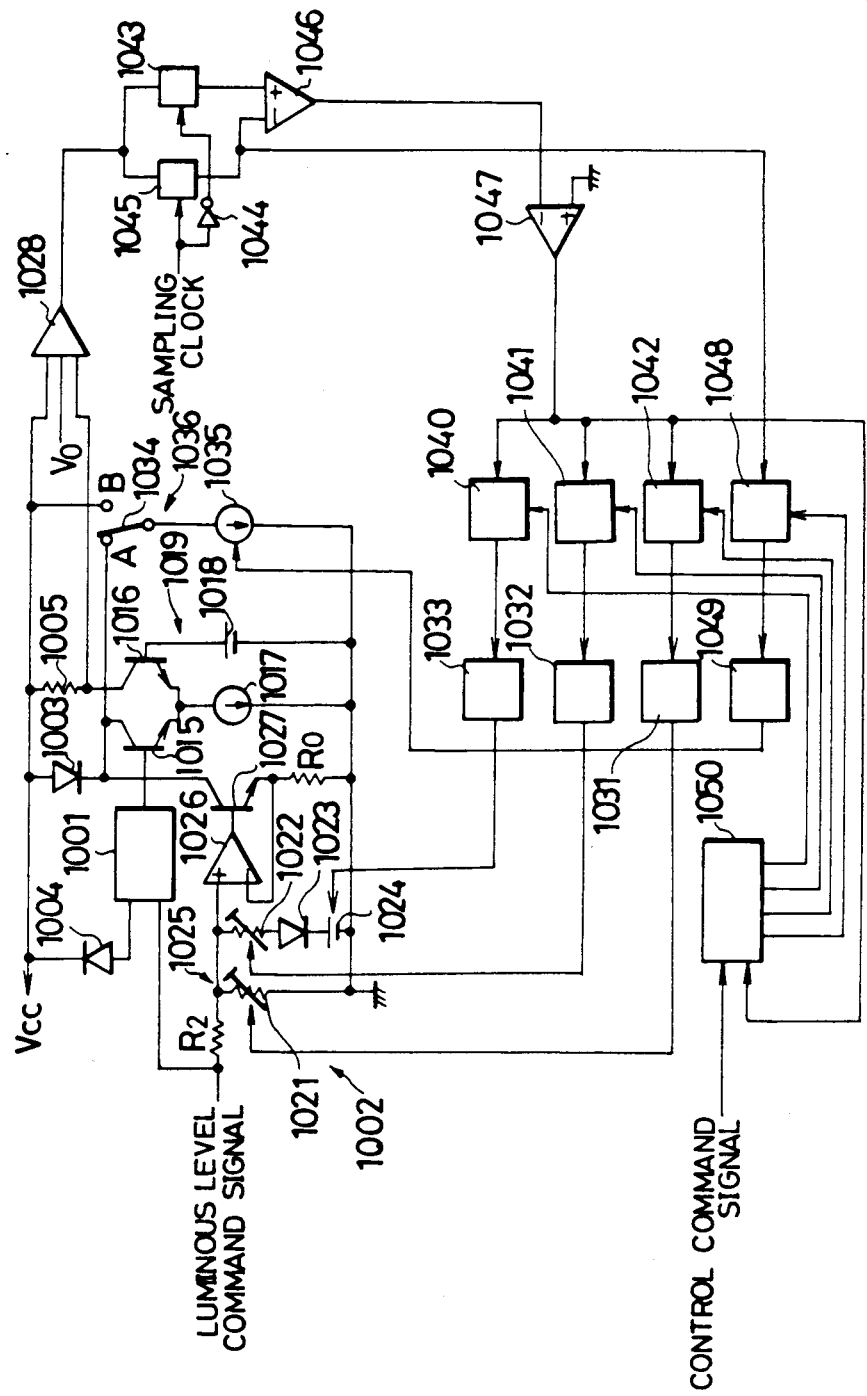

FIG. 95 shows the semiconductor laser controller in another embodiment of the present invention.

In this embodiment, a switching circuit 1036, an analog/digital converter 1048 and a digital/analog converter 1049 are added in the embodiment of FIG. 92.

In a constant control period, the luminous level command signal is pulse-modulated at an amplitude P3 to P2 as shown in FIG. 98 for example. Further, a timing generator 1050 sets an updown counter 1040 to an initially setting value by a control command signal so that a voltage value of a variable voltage source 1024 is set through a digital/analog converter 1033 so as to turn a diode 1023 off at any time. At this time, an output voltage of an adder-subtracter 1028 is sampled by a sampling clock signal by a sampling circuit 1043 when the luminous level command signal is at a peak level in voltage. The output voltage of the adder-subtracter 1028 is sampled by a sampling circuit 1045 when the sampling clock signal is inputted to the sampling circuit 1045 through an inverter 1044 and the luminous level command signal is at a bottom level in voltage. A subtracter 1046 detects the difference between the output voltages of the sampling circuits 1043, 1045 and an output voltage of the subtracter 1046 is compared with a reference voltage by a comparator 1047. This reference voltage is basically set to 0 V, but it is necessary to slightly adjust this reference voltage so as to further restrain DO loop characteristics of the semiconductor laser 1003. The output voltage of the comparator 1047 is inputted to an updown terminal of an updown counter 1042 to control a counting-up mode and a counting-down mode of the updown counter 1042. The counting operation of the updown counter 1042 is controlled by clock and control signals from the timing generator 1050 and the updown counter 1042 holds a counted value. The timing generator 1050 inputs a control command signal in the above control period and switches the operation of the updown counter 1042 from the counted value holding operation to the counting operation. The timing generator 1050 also switches the operation of the updown counter 1042 from the counting operation to the counted value holding operation at a timing for changing the output voltage of the comparator 1047 from a high level to a low level, or a timing for changing this output voltage from the low level to the high level. The counted value of the updown counter 1042 is digital/analog-converted by a digital/analog converter 1031. The operation of the above variable resistor 1021 is controlled by an output signal of this digital/analog converter 1031. Thus, the variable resistor 1021 is set such that the control electric current of the photoelectric negative feedback loop is minimized.

Next, the luminous level command signal is pulse-modulated at an amplitude P0 to P1 as shown in FIG. 98 for example. At this time, the timing generator 1050 sets an updown counter 1041 to a second initially setting value and sets the updown counter 1040 to the initially setting value. Thus, the voltage value of the variable voltage source 1024 is set to $-Vd$ through the digital/analog converter 1033 so as to turn the diode 1023 off at any time. The output voltage of the comparator 1047 is inputted to an updown terminal of the updown counter 1041 to control a counting-up mode and a counting-down mode of the updown counter 1041. The counting operation of the updown counter 1041 is controlled by the clock and control signals from the timing generator 1050 and the updown counter 1041 holds a counted value. At this time, the timing generator 1050 switches the operation of the updown counter 1041 from the counted value holding operation to the counting operation. The timing generator 1038 also switches the operation of the updown counter 1041 from the counting operation to the counted value holding operation at the timing for changing the output voltage of the comparator 1047 from the high level to the low level, or the timing for changing this output voltage from the low level to the high level. The counted value of the updown counter 1041 is digital/analog-converted by a digital/analog converter 1032. The operation of the above variable resistor 1022 is controlled by an output signal of this digital/analog converter 1032. Thus, the variable resistor 1022 is set such that the control electric current of the photoelectric negative feedback loop is minimized.

Next, the luminous level command signal is pulse-modulated at the amplitude P2 to P1. Similarly, the voltage value of the variable voltage source 1024 is set by the updown counter 1040 and the digital/analog converter 1033. A electric current value of a variable electric current source 1035 is set by an analog/digital converter 1048 and a digital/analog converter 1049. In this case, a sampling value of the sampling circuit 1043 is added to the variable electric current source 1035 through the analog/digital converter 1048 and the digital/analog converter 1049 at a timing at which an output polarity of the comparator 1047 is inverted and the operation of the updown converter 1048 is switched from the counting operation to the counted value holding operation.

In a period except for the control period, the resistance values of the variable resistors 1021, 1022, the voltage value of the voltage source 1024 and the electric current value of the variable electric current source 1035 are held.

Figure 96:
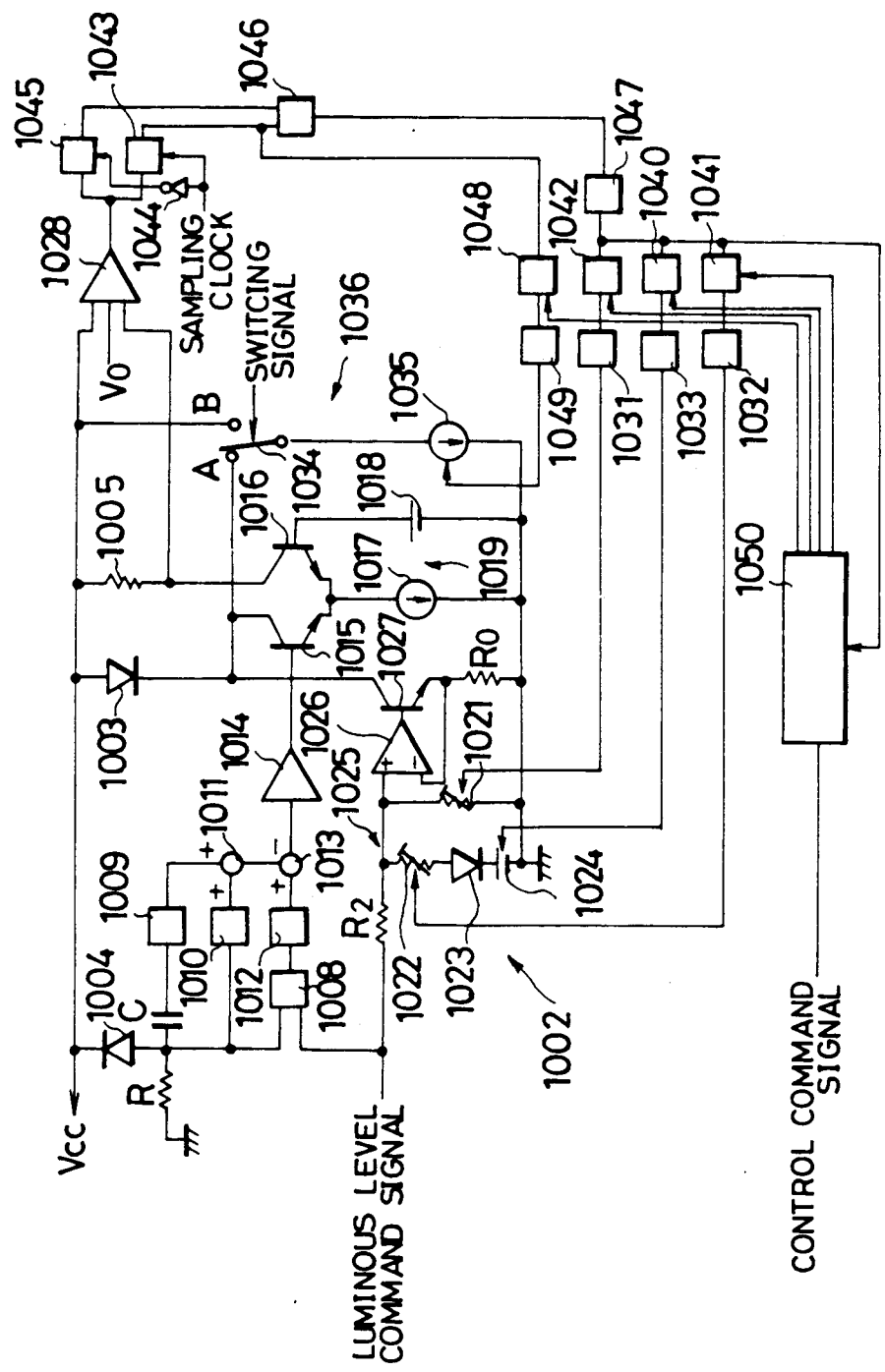

FIG. 96 shows the semiconductor laser controller in another embodiment of the present invention.

In this embodiment, instead of the comparing amplifier 1001 in the embodiment of FIG. 95, a circuit composed of a capacitor C, a resistor R, an impedance converter 1009, voltage-current converters 1010, 1012, a comparing amplifier 1008, an adder 1011, a subtracter 1013 and an electric current amplifier 1014 as in the embodiment of FIG. 71 is used.

Figure 97:
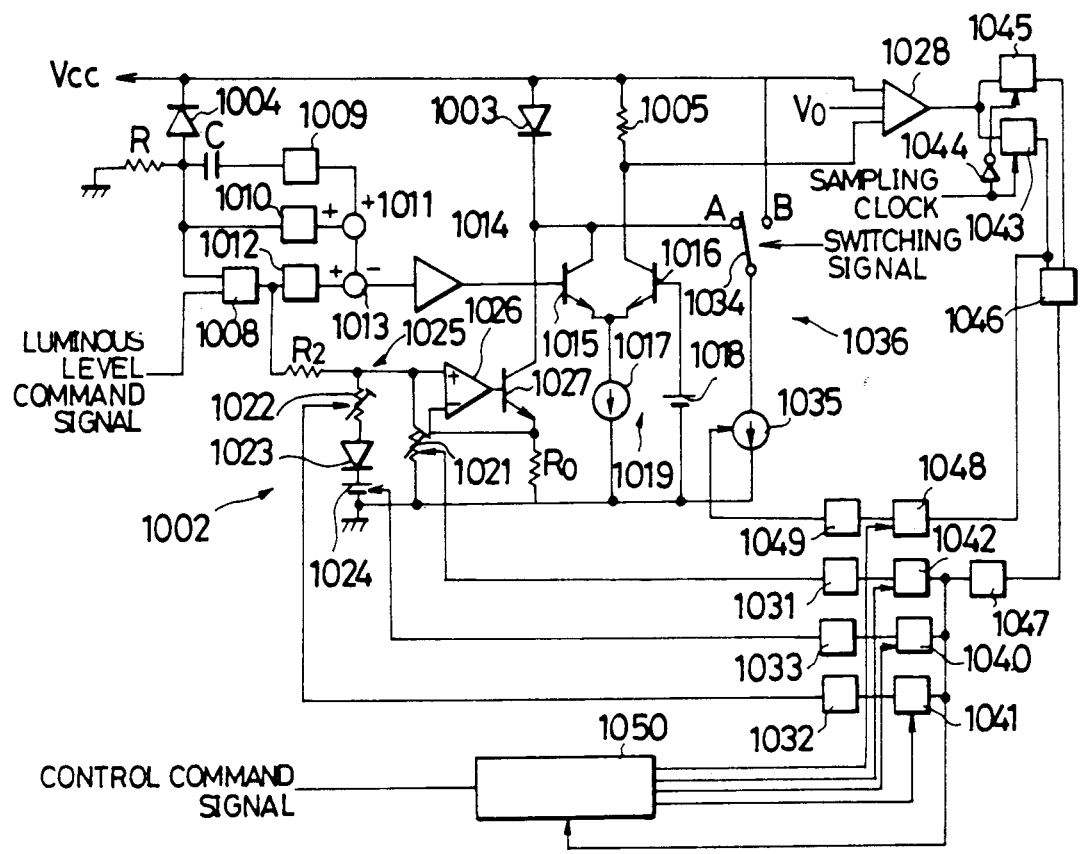

FIG. 97 shows the semiconductor laser controller in another embodiment of the present invention.

In this embodiment, instead of the luminous level command signal in the embodiment of FIG. 96, an output voltage of the comparing amplifier 1008 is inputted to the electric current converter 1002.

As mentioned above, in the embodiments of the present invention shown in FIGS. 86 to 97, a semiconductor laser controller comprises a photoelectric negative feedback loop for detecting a light output of a driven semiconductor laser by a light-receiving portion and controlling a forward electric current of the semiconductor laser such that a light-receiving signal proportional to the light output of the semiconductor laser provided from the light-receiving portion is equal to a command signal indicative of a luminous level; converting means for converting the luminous level command signal to the forward electric current of the semiconductor laser in accordance with a conversion rule preset such that the light-receiving signal is equal to the luminous level command signal on the basis of light output and forward electric current characteristics of the semiconductor laser, a coupling coefficient between the light-receiving portion and the semiconductor laser, and light input and light-receiving signal characteristics of the light-receiving portion; detecting means for detecting a control electric current of the photoelectric negative feedback loop; correcting means for correcting the change in light output and forward electric current characteristics of the semiconductor laser by controlling the conversion rule such that the control electric current of the photoelectric negative feedback loop is not changed even when the luminous level command signal is changed by a detecting signal from the detecting means; and means for controlling the operation of the semiconductor laser by a sum or difference in electric current with respect to the control electric current of the photoelectric negative feedback loop and an electric current produced by the converting means. Accordingly, the semiconductor laser controller stably operated irrespective of the change in temperature, etc. and accurately operated at a high speed and having a high resolution can be realized.

Further, in the above semiconductor laser controller of the present invention, the photoelectric negative feedback loop is constructed by a first photoelectric negative feedback loop for detecting the light output of the semiconductor laser by the light-receiving portion and controlling the forward electric current of the semiconductor laser such that a light-receiving electric current proportional to the light output of the semiconductor laser obtained from the light-receiving portion is equal to the luminous level command signal in which a first luminous level command signal is converted to an electric current, and a second photoelectric negative feedback loop for controlling the first luminous level command signal such that a voltage proportional to the light-receiving electric current is equal to that of the luminous level command signal. Accordingly, effects similar to those in the above semiconductor laser controller can be obtained without setting to a very large value a DC loop gain in an open loop of the photoelectric negative feedback loop requiring a control operation at a high speed.

Further, in the above semiconductor laser controller of the present invention, the converting means converts the luminous level command signal as an analog signal voltage to an electric current corresponding to the luminous level command signal by approximating the light output and forward electric current characteristics of the semiconductor laser to a polygonal line constructed by n straight lines where n designates a natural number, and the detecting means detects the control electric current of the photoelectric negative feedback loop by emitting the light from the semiconductor laser in a constant period in which the luminous level command signal is set at least 2n different levels, and the correcting means controls the inclination in conversion characteristics of the converting means approximated by the straight line so as to correct the change in differential quantum efficiency of the semiconductor laser in the constant period by the detecting signal from the detecting means, and holds the inclination in conversion characteristics of the converting means in the other period. Accordingly, effects similar to those obtained in the above-mentioned semiconductor laser controller can be obtained by a simple circuit construction.

Further, in the above semiconductor laser controller of the present invention, the converting means converts the luminous level command signal as an analog signal voltage to an electric current corresponding to the luminous level command signal by approximating the light output and forward electric current characteristics of the semiconductor laser to a polygonal line constructed by n straight lines where n designates a natural number, and the detecting means detects the control electric current of the first photoelectric negative feedback loop by emitting the light from the semiconductor laser in a constant period in which the luminous level command signal is set at least 2n different levels, and the correcting means controls the inclination in conversion characteristics of the converting means approximated by the straight line so as to correct the change in differential quantum efficiency of the semiconductor laser in the constant period by the detecting signal from the detecting means, and holds the inclination in conversion characteristics of the converting means in the other period. Accordingly, effects similar to those obtained in the above-mentioned semiconductor laser controller can be obtained by a simple circuit construction.

Further, in the above semiconductor laser controller of the present invention, the converting means has means for converting the luminous level command signal as an analog signal voltage to an electric current corresponding to the luminous level command signal by approximating the light output and forward electric current characteristics of the semiconductor laser to a polygonal line constructed by n straight lines where n designates a natural number, and has switching means for turning on and off the forward electric current of the semiconductor laser by a set electric current value by a switching signal, and the detecting means detects the control electric current of the photoelectric negative feedback loop by emitting the light from the semiconductor laser in a constant period in which the luminous level command signal is set at least 2n different levels, and the correcting means controls the inclination in conversion characteristics of the converting means approximated by the straight line so as to correct the change in differential quantum efficiency of the semiconductor laser in the constant period by the detecting signal from the detecting means, and holds the inclination in conversion characteristics of the converting means in the other period. Accordingly, effects similar to those obtained in the above-mentioned semiconductor laser controller can be obtained by a simple circuit construction.

Further, in the above semiconductor laser controller of the present invention, the converting means has means for converting the luminous level command signal as an analog signal voltage to an electric current corresponding to the luminous level command signal by approximating the light output and forward electric current characteristics of the semiconductor laser to a polygonal line constructed by n straight lines where n designates a natural number, and the detecting means and the correcting means sample the control electric current of the photoelectric negative feedback loop at timings of a peak and a bottom of the luminous level command signal in a constant period in which the luminous level command signal is pulse-modulated at least (2n−1) different constant amplitude levels having a constant offset level, and control the inclination and a polygonal point of each polygonal line of the converting means approximated by the polygonal line so as to minimize an absolute value of a differential voltage of sampling values corresponding to these peak and bottom, and holds the inclination and the polygonal point of each polygonal line of the converting means in the other period. Accordingly, effects similar to those obtained in the above-mentioned semiconductor laser controller can be obtained by a simple circuit construction.

Further, in the above semiconductor laser controller of the present invention, the converting means has means for converting the luminous level command signal as an analog signal voltage to an electric current corresponding to the luminous level command signal by approximating the light output and forward electric current characteristics of the semiconductor laser to a polygonal line constructed by n straight lines where n designates a natural number, and has switching means for turning on and off the forward electric current of the semiconductor laser by a set electric current value by a switching signal, and the detecting means and the correcting means sample the control electric current of the photoelectric negative feedback loop at timings of a peak and a bottom of the luminous level command signal in a constant period in which the luminous level command signal is pulse-modulated at least 2n different constant amplitude levels having a constant offset level, and control the inclination and a polygonal point of each polygonal line of the converting means approximated by the polygonal line and the set electric current value switched by the switching means so as to minimize an absolute value of a differential voltage of sampling values corresponding to these peak and bottom, and holds the inclination and the polygonal point of each polygonal line of the converting means and the set electric current value in the other period. Accordingly, effects similar to those obtained in the above-mentioned semiconductor laser controller can be obtained by a simple circuit construction.

Figure 100:
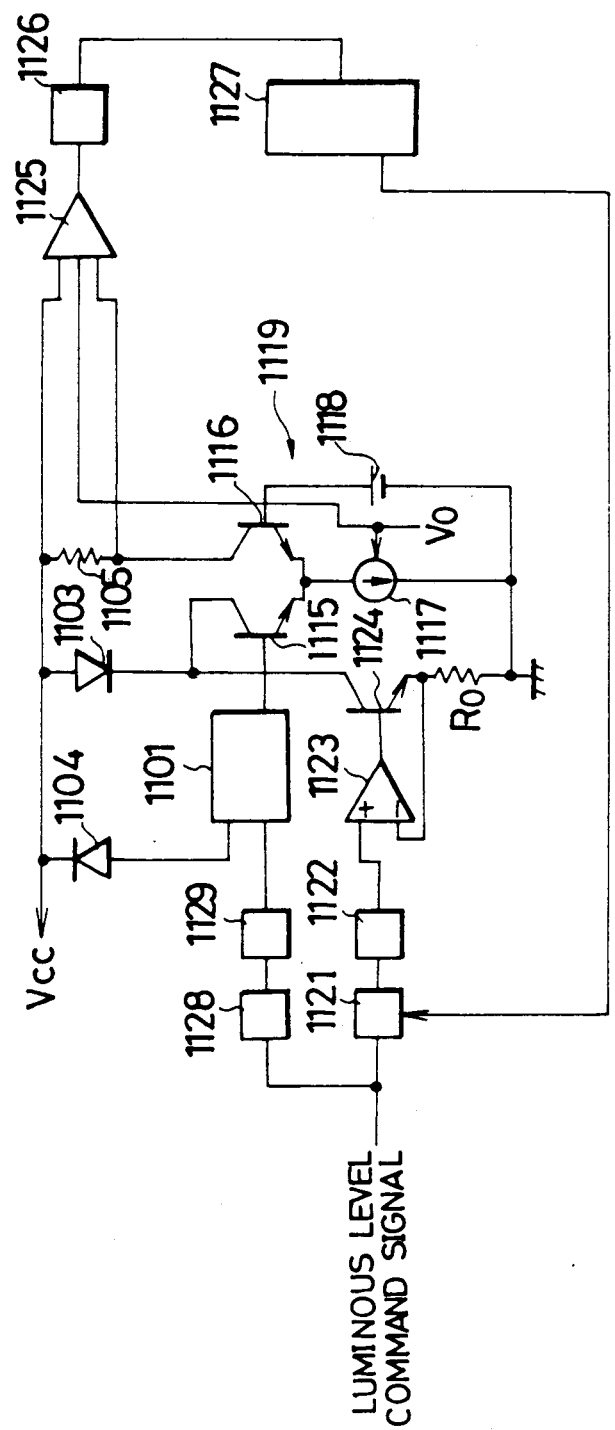

FIG. 100 shows the semiconductor laser controller in another embodiment of the present invention.

A command signal indicative of a luminous level is inputted to a comparing amplifier 1101 and an electric current converter 1102 and a portion of a light output of a driven semiconductor laser 1103 is monitored by a light-receiving element 1104. A differential amplifier 1119 is composed of transistors 1115, 1116, an electric current source 1117 and a bias voltage source 1118. The differential amplifier 1119, the comparing amplifier 1101, the semiconductor laser 1103 and the light-receiving element 1104 form a photoelectric negative feedback loop. The comparing amplifier 1101 compares the luminous level command signal and a light-receiving signal proportional to a photovoltaic current (proportional to the light output of the semiconductor laser 1103) induced in the light-receiving element 1104. The comparing amplifier 1101 then controls a forward electric current of the semiconductor laser 1103 by this compared result through the differential amplifier 1119 such that the light-receiving signal is equal to the luminous level command signal.

The electric current converter 1102 is constructed by a conversion table 1121, a digital/analog converter 1122, a differential amplifier 1123, a transistor 1124 and a resistor $R_0$. The electric current converter 1102 outputs an electric current preset in accordance with the luminous level command signal. This preset electric current is an electric current preset on the basis of light output and forward electric current characteristics of the semiconductor laser 1103, a coupling coefficient between the light-receiving element 1104 and the semiconductor laser 1103, and light input and light-receiving signal characteristics of the light-receiving element 1104. Namely, the luminous level command signal Vs is data-converted to correct the light output and forward electric current characteristics of the semiconductor laser 1103 and is digital/analog-converted by the digital/analog converter 1122. An output signal of this digital/analog converter 1122 is inputted to the differential amplifier 1123 and is converted to an electric current $1/R_0$ by the transistor 1124 and the resistor $R_0$. A sum of this electric current and an output electric current of the differential amplifier 1119 becomes the forward electric current of the semiconductor laser 1103 and the semiconductor laser 1103 outputs the light output $P_0$ determined by this forward electric current.

In a constant control period, the conversion table 1121 is reset to linearly perform the data-conversion and the luminous level command signal is sequentially increased from a minimum value for example. At this time, an adder-subtracter 1125 detects a voltage provided by subtracting a voltage $V_0$ from the voltage between both terminals of a resistor 1105 so that a control electric current of the photoelectric negative feedback loop is detected. The voltage $V_0$ is a voltage for removing an offset of an electric current of an electric current source 1117 from the control electric current of the photoelectric negative feedback loop. An output voltage of the adder-subtracter 1125 is analog/digital-converted by an analog/digital converter 1126 and is inputted to a calculating circuit 1127. The calculating circuit 1127 resets the conversion table 1121 such that a value provided by adding a value converted by the conversion table 1121 by data from the analog/digital converter 1126 to the control electric current of the semiconductor laser 1103 becomes a conversion value with respect to each setting value of the conversion table 1121. Namely, the calculating circuit 1127 resets the conversion table 1121 such that a sum of the data from the analog/digital converter 1126 and a conversion electric current of the conversion table 1121 becomes the conversion electric current of the conversion table 1121. Thus, the light output and forward electric current characteristics of the semiconductor laser 1103 are corrected with respect to the change in temperature, etc. Further, the luminous level command signal is delayed for synchronization by a predetermined time by a delay circuit 1128 and is digital/analog-converted by a digital/analog converter 1129 and is then inputted to the comparing amplifier 1101.

Figure 99:
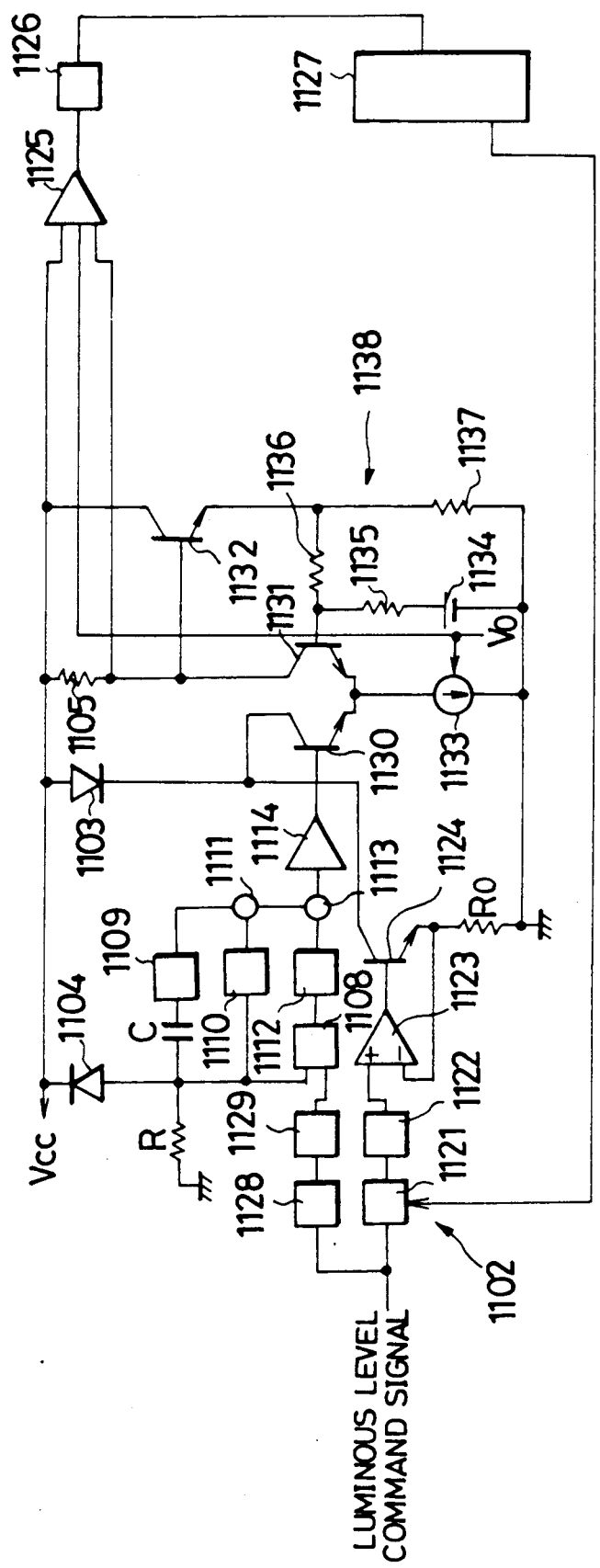
FIGS. 99 to 102 are block diagrams showing the semiconductor laser controller in another embodiments of the present invention.

FIG. 99 shows the semiconductor laser controller in another embodiment of the present invention.

In this embodiment, instead of the comparing amplifier 801 in the embodiment of FIG. 57, a circuit composed of a capacitor C, a resistor R, an impedance converter 1109, voltage-current converters 1110, 1112, a comparing amplifier 1108, an adder 1111, a subtracter 1113 and an electric current amplifier 1114 as in the embodiment of FIG. 71 is used. Further, instead of the differential amplifier 1119, a differential amplifier 1138 composed of transistors 1130, 1131, 1132, a variable electric current source 1133, a voltage source 1134 and resistors 1135 to 1137 is used. An electric current value of the variable electric current source 1133 is set by a voltage $V_0$.

Figure 102:
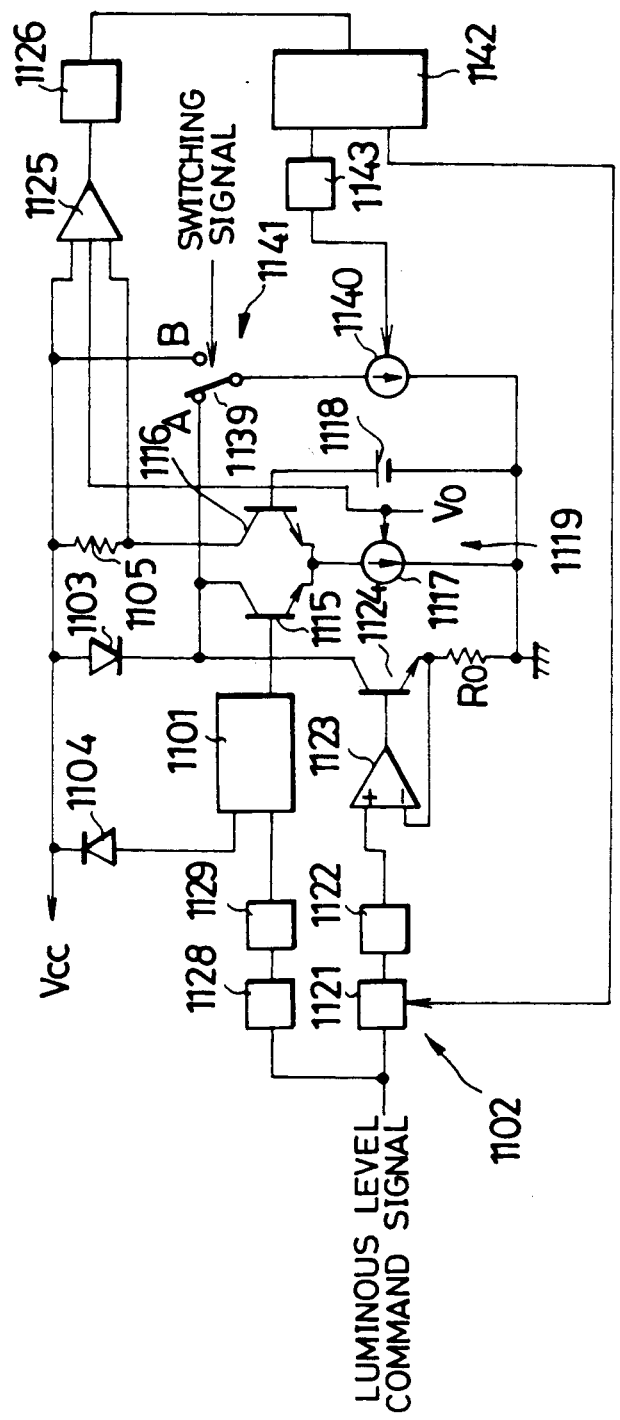

FIG. 102 shows the semiconductor laser controller in another embodiment of the present invention.

In this embodiment, a switching circuit 1141 composed of a switch 1139 and a variable electric current source 1140 is added in the embodiment of FIG. 100. Normally, the switch 1139 is switched onto the side of a fixed terminal B and no electric current from the variable electric current source 1140 is supplied to the semiconductor laser 1103 so that no light is emitted from the semiconductor laser 1103. When a switching signal is inputted at a timing for emitting the light from the semiconductor laser 1103, the switch 1139 is switched onto the side of a fixed terminal A and the electric current from the variable electric current source 1140 is supplied to the semiconductor laser 1103 so that the light is emitted from the semiconductor laser 1103. A sum of output electric currents of this switching circuit 1141, the differential amplifier 1119 and the electric current converter 1102 becomes the forward electric current of the semiconductor laser 1103 and the semiconductor laser 1103 outputs the light output $P_0$ determined by this forward electric current.

In a constant control period, similar to the above embodiment, the calculating circuit 1142 resets the conversion table 1121 and further sets the electric current value of the variable electric current source 1140 through a digital/analog converter 1143 such that a conversion electric current of the conversion table 1121 corresponding to a minimum luminous level of the luminous level command signal becomes 0. In this control period, the switch 1139 is switched onto the side of the fixed terminal A at any time.

The switching circuit 1141 is operated at a high speed until an electric current at which the semiconductor laser 1103 is driven by the switching circuit 1141. Accordingly, this switching circuit rises at a high speed irrespective of a rising speed of the electric current converter 1102. Further, in general, in the semiconductor laser 1103 has the light output and forward electric current characteristics in which there is no laser oscillation until a threshold electric current. Accordingly, no quenching ratio by an offset electric current is almost deteriorated.

Figure 101:
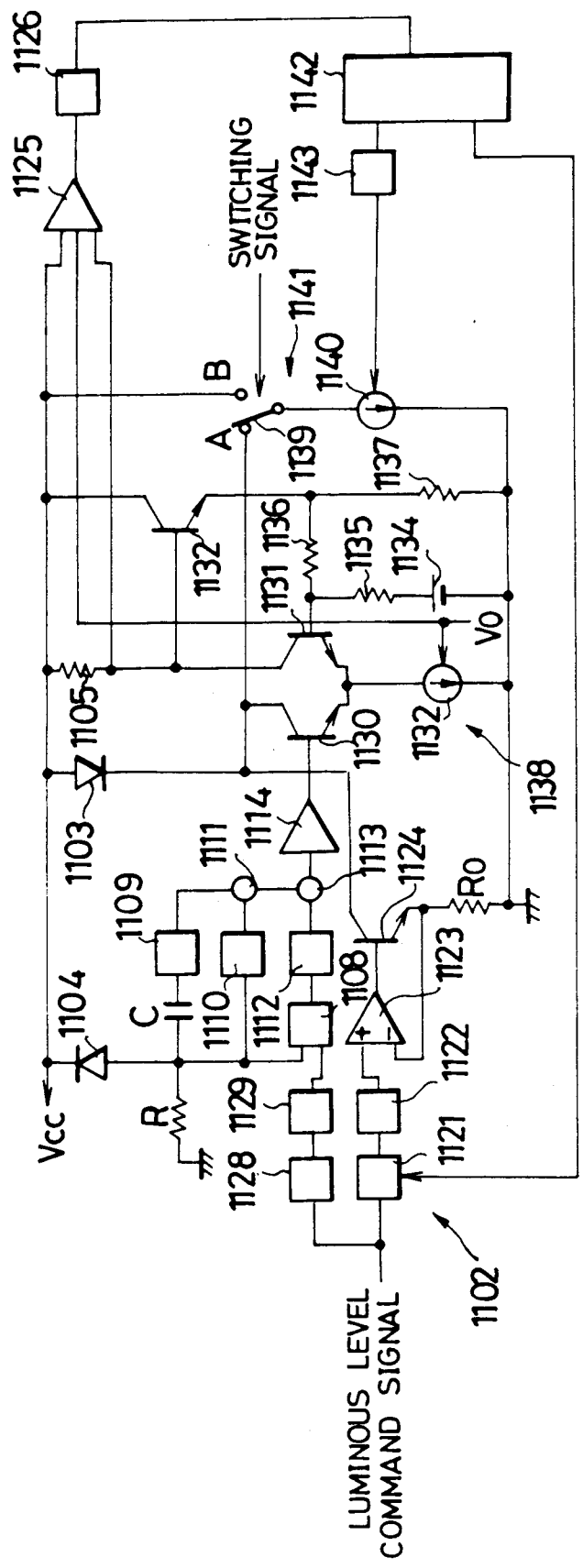

FIG. 101 shows the semiconductor laser controller in another embodiment of the present invention.

In this embodiment, instead of the comparing amplifier 1101 in the embodiment of FIG. 102, a circuit composed of a capacitor C, a resistor R, an impedance converter 1109, voltage-current converters 1110, 1112, a comparing amplifier 1108, an adder 1111, a subtracter 1113 and an electric current amplifier 1114 as in the embodiment of FIG. 71 is used. Further, instead of the differential amplifier 1119, a differential amplifier 1138 composed of transistors 1130, 1131, 1132, a variable electric current source 1133, a voltage source 1134 and resistors 1135 to 1137 is used. As mentioned above, in the embodiments of the present invention shown in FIGS. 99 to 102, a semiconductor laser controller comprises a photoelectric negative feedback loop for detecting a light output of a driven semiconductor laser by a light-receiving portion and controlling a forward electric current of the semiconductor laser such that a light-receiving signal proportional to the light output of the semiconductor laser provided from the light-receiving portion is equal to a command signal indicative of a luminous level; converting means for converting the luminous level command signal to the forward electric current of the semiconductor laser in accordance with a conversion rule preset such that the light-receiving signal is equal to the luminous level command signal on the basis of light output and forward electric current characteristics of the semiconductor laser, a coupling coefficient between the light-receiving portion and the semiconductor laser, and light input and light-receiving signal characteristics of the light-receiving portion; detecting means for detecting a control electric current of the photoelectric negative feedback loop; correcting means for correcting the change in light output and forward electric current characteristics of the semiconductor laser by controlling the conversion rule such that the control electric current of the photoelectric negative feedback loop is not changed even when the luminous level command signal is changed by a detecting signal from the detecting means; and means for controlling the operation of the semiconductor laser by a sum or difference in electric current with respect to the control electric current of the photoelectric negative feedback loop and an electric current produced by the converting means. Accordingly, the semiconductor laser controller for restraining the change in operation by the change in temperature, etc. and accurately operated at a high speed and having a high resolution can be realized.

Further, in the above semiconductor laser controller of the present invention, the photoelectric negative feedback loop is constructed by a first photoelectric negative feedback loop for detecting the light output of the semiconductor laser by the light-receiving portion and controlling the forward electric current of the semiconductor laser such that a light-receiving electric current proportional to the light output of the semiconductor laser obtained from the light-receiving portion is equal to the luminous level command signal in which a first luminous level command signal is converted to an electric current, and a second photoelectric negative feedback loop for controlling the first luminous level command signal such that a voltage proportional to the light-receiving electric current is equal to that of the luminous level command signal. Accordingly, effects similar to those in the above semiconductor laser controller can be obtained without setting an open loop gain of the photoelectric negative feedback loop requiring a high speed operation to a very large value.

Further, in the above semiconductor laser controller of the present invention, the converting means, the detecting means and the correcting means have means for converting the luminous level command signal as a digital signal by a conversion table so as to correct the light output and forward electric current characteristics of the semiconductor laser and further converting the converted signal to an electric current corresponding to the luminous level command signal by a digital/analog converter, and have means for linearly setting the conversion characteristics of the conversion table in a constant period in which the luminous level command signal is increased from a minimum setting level to a maximum setting level, is decreased from the maximum setting level to the minimum setting level, or is arbitrarily changed in accordance with a dynamic range, and the linearly setting means sets a value of the conversion table such that a sum of the control electric current of the photoelectric negative feedback loop and a conversion electric current of the conversion table becomes the conversion electric current of the conversion table. Accordingly, effects similar to those obtained in the above-mentioned semiconductor laser controller can be obtained by a simple construction.

Further, in the above semiconductor laser controller of the present invention, the converting means, the detecting means and the correcting means have means for converting the luminous level command signal as a digital signal by a conversion table so as to correct the light output and forward electric current characteristics of the semiconductor laser and further converting the converted signal to an electric current corresponding to the luminous level command signal by a digital/analog converter, and have means for linearly setting the conversion characteristics of the conversion table in a constant period in which the luminous level command signal is increased from a minimum setting level to a maximum setting level, is decreased from the maximum setting level to the minimum setting level, or is arbitrarily changed in accordance with a dynamic range, and the linearly setting means sets a value of the conversion table such that a sum of the control electric current of the first photoelectric negative feedback loop and a conversion electric current of the conversion table becomes the conversion electric current of the conversion table. Accordingly, effects similar to those obtained in the above-mentioned semiconductor laser controller can be obtained by a simple construction.

Further, in the above semiconductor laser controller of the present invention, the controller further comprises switching means for turning on and off the forward electric current of the semiconductor laser by a set electric current value by a switching signal, and the operation of the semiconductor laser is controlled by an electric current provided by adding an electric current produced by the switching means to the control electric current of the semiconductor laser, and an electric current provided by subtracting the electric current produced by the switching means from each setting value of the conversion table is set to the value of the conversion table, and the value of the electric current produced by the switching means is set to the forward electric current of the semiconductor laser corresponding to the minimum setting value of the luminous level command signal. Accordingly, the rising speed of the conversion means can be further increased in the above-mentioned semiconductor laser controller.

Many widely different embodiments of the present invention may be constructed without departing from the spirit and scope of the present invention. It should be understood that the present invention is not limited to the specific embodiments described in the specification, except as defined in the appended claims.

What is claimed is:

1. A semiconductor laser controller comprising:
   photoelectric converting means for converting a light output of a driven semiconductor laser to a photovoltaic current proportional to the light output of the driven semiconductor laser and separating the photovoltaic current into high and low frequency components;
   a photoelectric negative feedback loop for controlling a forward electric current of the semiconductor laser such that a sum of the high and low frequency components of the photovoltaic current converted by the photoelectric converting means is equal to a reference signal electric current defining the light output of the semiconductor laser; and
   control means for controlling said reference signal electric current such that a voltage proportional to the low frequency component of the photovoltaic current converted by said photoelectric converting means is equal to a reference signal voltage corresponding to the reference signal electric current.

2. A semiconductor laser controller comprising:
   a photoelectric negative feedback looop for detecting a light output of the driven semiconductor laser by a light-receiving portion and for controlling the forward electric current of said semiconductor laser such that a light-receiving signal corresponding to the photovoltaic current proportional to the light output of said semiconductor laser provided from said light-receiving portion is equal to a command signal indicative of a luminous level corresponding to the reference signal electric current;
   converting means for converting said luminous level command signal to the forward electric current of said semiconductor laser such that said light-receiving signal is equal to said luminous level command signal on the basis of light output and forward electric current characteristics of said semiconductor laser, a coupling coefficient between said light-receiving portion and said semiconductor laser, and light input and light-receiving signal characteristics of said light-receiving portion; and
   means for controlling an operation of said semiconductor laser by a sum or difference in electric current with respect to a control electric current of said photoelectric negative feedback loop and an electric current converted by said converting means.

3. A semiconductor laser controller as claimed in claim 2, wherein said controller further comprises a circuit for turning on and off an offset electric current by a switching signal, and the operation of said semiconductor laser is controlled by an electric current provided by adding said offset electric current to said sum or difference in electric current.

4. A semiconductor laser controller as claimed in claim 2, wherein said controller further comprises detecting means for detecting an error in conversion of said converting means by detecting the control electric current of said photoelectric negative feedback loop.

5. A semiconductor laser controller as claimed in claim 4, wherein said controller further comprises a circuit for turning on and off an offset electric current by a switching signal, and the operation of said semiconductor laser is controlled by an electric current provided by adding said offset electric current to said sum or difference in electric current.

6. A semiconductor laser controller as claimed in claim 2, wherein said photoelectric negative feedback loop is constructed by a first photoelectric negative feedback loop for detecting the light output of said semiconductor laser by the light-receiving portion and controlling the forward electric current of said semiconductor laser such that a light-receiving electric current proportional to the light output of said semiconductor laser obtained from said light-receiving portion is equal to a first luminous level command signal in which the luminous level command signal is converted to an electric current, and a second photoelectric negative feedback loop for controlling said first luminous level command signal such that a voltage proportional to said light-receiving electric current is equal to that of the luminous level command signal.

7. A semiconductor laser controller as claimed in claim 2, wherein said converting means converts said luminous level command signal as an analog signal voltage to an electric current proportional to said luminous level command signal such that the light output in the light output and forward electric current characteristics of said semiconductor laser is represented by a straight line.

8. A semiconductor laser controller as claimed in claim 6, wherein said converting means converts said luminous level command signal as an analog signal voltage to an electric current proportional to said luminous level command signal such that the light output in the light output and forward electric current characteristics of said semiconductor laser is represented by a straight line.

9. A semiconductor laser controller as claimed in claim 2, wherein said converting means converts said luminous level command signal as an analog signal voltage to an electric current corresponding to said luminous level command signal such that the light output in the light output and forward electric current characteristics of said semiconductor laser is represented by a polygonal line.

10. A semiconductor laser controller as claimed in claim 6, wherein said converting means converts said luminous level command signal as an analog signal voltage to an electric current corresponding to said luminous level command signal such that the light output in the light output and forward electric current characteristics of said semiconductor laser is represented by a polygonal line.

11. A semiconductor laser controller as claimed in claim 2, wherein said luminous level command signal is set to a digital signal and said converting means has a conversion table for converting said luminous level command signal to a signal for correcting the light output and forward electric current characteristics of said semiconductor laser, and a digital/analog converter for converting the signal converted by said conversion table to the forward electric current of said semiconductor laser.

12. A semiconductor laser controller as claimed in claim 6, wherein said luminous level command signal is set to a digital signal and said converting means has a conversion table for converting said luminous level command signal to a signal for correcting the light output and forward electric current characteristics of said semiconductor laser, and a digital/analog converter for converting the signal converted by said conversion table to the forward electric current of said semiconductor laser.

13. A semiconductor laser controller as claimed in claim 3, wherein said photoelectric negative feedback loop is constructed by a first photoelectric negative feedback loop for detecting the light output of said semiconductor laser by the light-receiving portion and controlling the forward electric current of said semiconductor laser such that a light-receiving electric current proportional to the light output of said semiconductor laser obtained from said light-receiving portion is equal to a first luminous level command signal in which the luminous level command signal is converted to an electric current, and a second photoelectric negative feedback loop for controlling said first luminous level command signal such that a voltage proportional to said light-receiving electric current is equal to that of the luminous level command signal.

14. A semiconductor laser controller as claimed in claim 3, wherein said converting means converts said luminous level command signal as an analog signal voltage to an electric current proportional to said luminous level command signal such that the light output in the light output and forward electric current characteristics of said semiconductor laser is represented by a straight line.

15. A semiconductor laser controller as claimed in claim 13, wherein said converting means converts said luminous level command signal as an analog signal voltage to an electric current proportional to said luminous level command signal such that the light output in the light output and forward electric current characteristics of said semiconductor laser is represented by a straight line.

16. A semiconductor laser controller as claimed in claim 3, wherein said converting means converts said luminous level command signal as an analog signal voltage to an electric current corresponding to said luminous level command signal such that the light output in the light output and forward electric current characteristics of said semiconductor laser is represented by a polygonal line.

17. A semiconductor laser controller as claimed in claim 13, wherein said converting means converts said luminous level command signal as an analog signal voltage to an electric current corresponding to said luminous level command signal such that the light output in the light output and forward electric current characteristics of said semiconductor laser is represented by a polygonal line.

18. A semiconductor laser controller as claimed in claim 3, wherein said luminous level command signal is set to a digital signal and said converting means has a conversion table for converting said luminous level command signal to a correcting signal corrected on the basis of the light output and forward electric current characteristics of said semiconductor laser, and digital-/analog converting means for converting the signal converted by said conversion table to the forward electric current of said semiconductor laser.

19. A semiconductor laser controller as claimed in claim 13, wherein said luminous level command signal is set to a digital signal and said converting means has a conversion table for converting said luminous level command signal to a correcting signal corrected on the basis of the light output and forward electric current characteristics of said semiconductor laser, and digital-/analog converting means for converting the signal converted by said conversion table to the forward electric current of said semiconductor laser.

20. A semiconductor laser controller as claimed in claim 4, wherein said photoelectric negative feedback loop is constructed by a first photoelectric negative feedback loop for detecting the light output of said semiconductor laser by the light-receiving portion and controlling the forward electric current of said semiconductor laser such that a light-receiving electric current proportional to the light output of said semiconductor laser obtained from said light-receiving portion is equal to a first luminous level command signal in which the luminous level command signal is converted to an electric current, and a second photoelectric negative feedback loop for controlling said first luminous level command signal such that a voltage proportional to said light-receiving electric current is equal to that of the luminous level command signal.

21. A semiconductor laser controller as claimed in claim 4, wherein said converting means converts said luminous level command signal as an analog signal voltage to an electric current proportional to said luminous level command signal such that the light output in the light output and forward electric current characteristics of said semiconductor laser is represented by a straight line.

22. A semiconductor laser controller as claimed in claim 20, wherein said converting means converts said luminous level command signal as an analog signal voltage to an electric current proportional to said luminous level command signal such that the light output in the light output and forward electric current characteristics of said semiconductor laser is represented by a straight line.

23. A semiconductor laser controller as claimed in claim 4, wherein said converting means converts said luminous level command signal as an analog signal voltage to an electric current corresponding to said luminous level command signal such that the light output in the light output and forward electric current characteristics of said semiconductor laser is represented by a polygonal line.

24. A semiconductor laser controller as claimed in claim 20, wherein said converting means converts said luminous level command signal as an analog signal voltage to an electric current corresponding to said luminous level command signal such that the light output in the light output and forward electric current characteristics of said semiconductor laser is represented by a polygonal line.

25. A semiconductor laser controller as claimed in claim 4, wherein said luminous level command signal is set to a digital signal and said converting means has a conversion table for converting said luminous level command signal to a correcting signal corrected on the basis of the light output and forward electric current characteristics of said semiconductor laser, and digital-/analog converting means for converting the signal converted by said conversion table to the forward electric current of said semiconductor laser.

26. A semiconductor laser controller as claimed in claim 20, wherein said luminous level command signal is set to a digital signal and said converting means has a conversion table for converting said luminous level command signal to a correcting signal corrected on the basis of the light output and forward electric current characteristics of said semiconductor laser, and digital-/analog converting means for converting the signal converted by said conversion table to the forward electric current of said semiconductor laser.

27. A semiconductor laser controller as claimed in claim 5, wherein said photoelectric negative feedback loop is constructed by a first photoelectric negative feedback loop for detecting the light output of said semiconductor laser by the light-receiving portion and controlling the forward electric current of said semiconductor laser such that a light-receiving electric current proportional to the light output of said semiconductor laser obtained from said light-receiving portion is equal to a first luminous level command signal in which the luminous level command signal is converted to an electric current, and a second photoelectric negative feedback loop for controlling said first luminous level command signal such that a voltage proportional to said light-receiving electric current is equal to that of the luminous level command signal.

28. A semiconductor laser controller as claimed in claim 5, wherein said converting means converts said luminous level command signal as an analog signal voltage to an electric current corresponding to said luminous level command signal such that the light output in the light output and forward electric current characteristics of said semiconductor laser is represented by a straight line.

29. A semiconductor laser controller as claimed in claim 27, wherein said converting means converts said luminous level command signal as an analog signal voltage to an electric current corresponding to said luminous level command signal such that the light output in the light output and forward electric current characteristics of said semiconductor laser is represented by a straight line.

30. A semiconductor laser controller as claimed in claim 5, wherein said converting means converts said luminous level command signal as an analog signal voltage to an electric current corresponding to said luminous level command signal such that the light output in the light output and forward electric current characteristics of said semiconductor laser is represented by a polygonal line.

31. A semiconductor laser controller as claimed in claim 27, wherein said converting means converts said luminous level command signal as an analog signal voltage to an electric current corresponding to said luminous level command signal such that the light output in the light output and forward electric current characteristics of said semiconductor laser is represented by a polygonal line.

32. A semiconductor laser controller as claimed in claim 5, wherein said luminous level command signal is set to a digital signal and said converting means has a conversion table for converting said luminous level command signal to a correcting signal corrected on the basis of the light output and forward electric current characteristics of said semiconductor laser, and digital-/analog converting means for converting the signal converted by said conversion table to the forward electric current of said semiconductor laser.

33. A semiconductor laser controller as claimed in claim 27, wherein said luminous level command signal is set to a digital signal and said converting means has a conversion table for converting said luminous level command signal to a correcting signal corrected on the basis of the light output and forward electric current characteristics of said semiconductor laser, and digital-/analog converting means for converting the signal converted by said conversion table to the forward electric current of said semiconductor laser.

34. A semiconductor laser controller as claimed in claim 4, wherein said controller further comprises correcting means for correcting the change in light output and forward electric current characteristics of said semiconductor laser by controlling said conversion rule such that the control electric current of said photoelectric negative feedback loop is not changed even when the luminous level command signal is changed by a detecting signal from said detecting means.

35. A semiconductor laser controller as claimed in claim 34, wherein said photoelectric negative feedback loop is constructed by a first photoelectric negative feedback loop for detecting the light output of said semiconductor laser by the light-receiving portion and controlling the forward electric current of said semiconductor laser such that a light-receiving electric current proportional to the light output of said semiconductor laser obtained from said light-receiving portion is equal to a first luminous level command signal in which the luminous level command signal is converted to an electric current, and a second photoelectric negative feedback loop for controlling said first luminous level command signal such that a voltage proportional to said light-receiving electric current is equal to that of the luminous level command signal.

36. A semiconductor laser controller as claimed in claim 34, wherein said converting means converts the luminous level command signal as an analog signal voltage to an electric current corresponding to said luminous level command signal such that the light output in the light output and forward electric current characteristics of said semiconductor laser is represented by a straight line, and said detecting means detects the phase and amplitude with respect to said luminous level command signal of the control electric current of said photoelectric negative feedback loop by said luminous level command signal modulated at a constant amplitude level in a constant period, and said correcting means controls the inclination in conversion characteristics of said converting means so as to minimize an absolute value of the control electric current of said photoelectric negative feedback loop in said constant period by the detecting signal from said detecting means and holds the inclination in conversion characteristics of said converting means in the other period.

37. A semiconductor laser controller as claimed in claim 35, wherein said converting means converts the luminous level command signal as an analog signal voltage to an electric current corresponding to said luminous level command signal such that the light output in the light output and forward electric current characteristics of said semiconductor laser is represented by a straight line, and said detecting means detects the phase and amplitude with respect to said luminous level command signal of the control electric current of said first photoelectric negative feedback loop by said luminous level command signal modulated at a constant amplitude level in a constant period, and said correcting means controls the inclination in conversion characteristics of said converting means so as to minimize an absolute value of the control electric current of said first photoelectric negative feedback loop in said constant period by the detecting signal from said detecting means and holds the inclination in conversion characteristics of said converting means in the other period.

38. A semiconductor laser controller as claimed in claim 34, wherein said converting means converts the luminous level command signal as an analog signal voltage to an electric current determined by said luminous level command signal such that the light output in the light output and forward electric current characteristics of said semiconductor laser is represent by a polygonal line constructed by n straight lines where n designates a natural number, and said detecting means detects the phase and amplitude with respect to said luminous level command signal of the control electric current of said photoelectric negative feedback loop by said luminous level command signal modulated at more than (2n−1) different amplitudes and an offset value signal in a constant period, and said correcting means controls the inclination and a polygonal point of each straight line constructing said polygonal line of said converting means so as to minimize an absolute value of the control electric current of said photoelectric negative feedback loop in said constant period by the detecting signal from said detecting means, and holds the inclination and the polygonal point of each straight line constructing said polygonal line of said converting means in the other period.

39. A semiconductor laser controller as claimed in claim 35, wherein said converting means converts the luminous level command signal as an analog signal voltage to an electric current determined by said luminous level command signal such that the light output in the light output and forward electric current characteristics of said semiconductor laser is represent by a polygonal line constructed by n straight lines where n designates a natural number, and said detecting means detects the phase and amplitude with respect to said luminous level command signal of the control electric current of said first photoelectric negative feedback loop by said luminous level command signal modulated at more than (2n−1) different amplitudes and an offset value signal in a constant period, and said correcting means controls the inclination and a polygonal point of each straight line constructing said polygonal line of said converting means so as to minimize an absolute value of the control electric current of said first photoelectric negative feedback loop in said constant period by the detecting signal from said detecting means, and holds the inclination and the polygonal point of each straight line constructing said polygonal line of said converting means in the other period.

40. A semiconductor laser controller as claimed in claim 34, wherein said converting means has a conversion table for converting said luminous level command signal as a digital signal to a signal corrected on the basis of the light output and forward electric current characteristics of said semiconductor laser and has digital-/analog converting means for converting the signal converted by said conversion table to the forward electric current of said semiconductor laser, and said detecting means detects the phase and amplitude with respect to said luminous level command signal of the control electric current of said photoelectric negative feedback loop by said luminous level command signal modulated at a plurality of amplitude values according to a dynamic range in a constant period, and said correcting means controls a value of said conversion table so as to minimize an absolute value of the control electric current of said photoelectric negative feedback loop in said constant period by the detecting signal from said detecting means, and holds the value of said conversion table in the other period.

41. A semiconductor laser controller as claimed in claim 35, wherein said converting means has a conversion table for converting said luminous level command signal as a digital signal to a signal corrected on the basis of the light output and forward electric current characteristics of said semiconductor laser and has digital/analog converting means for converting the signal converted by said conversion table to the forward electric current of said semiconductor laser, and said detecting means detects the phase and amplitude with respect to said luminous level command signal of the control electric current of said first photoelectric negative feedback loop by said luminous level command signal modulated at a plurality of amplitude values according to a dynamic range in a constant period, and said correcting means controls a value of said conversion table so as to minimize an absolute value of the control electric current of said first photoelectric negative feedback loop in said constant period by the detecting signal from said detecting means, and holds the value of said conversion table in the other period.

42. A semiconductor laser controller as claimed in claim 34, wherein said converting means converts the luminous level command signal as an analog signal voltage to an electric current corresponding to said luminous level command signal such that the light output in the light output and forward electric current characteristics of said semiconductor laser is represented by a straight line, and said detecting means detects the control electric current of said photoelectric negative feedback loop by emitting the light from said semiconductor laser in a constant period in which said luminous level command signal is set at least two different levels, and said correcting means controls the inclination in conversion characteristics of said converting means so as to correct the change in differential quantum efficiency of said semiconductor laser in said constant period by the detecting signal from said detecting means and holds the inclination in conversion characteristics of said converting means in the other period.

43. A semiconductor laser controller as claimed in claim 35, wherein said converting means converts the luminous level command signal as an analog signal voltage to an electric current corresponding to said luminous level command signal such that the light output in the light output and forward electric current characteristics of said semiconductor laser is represented by a straight line, and said detecting means detects the control electric current of said first photoelectric negative feedback loop by emitting the light from said semiconductor laser in a constant period in which said luminous level command signal is set at least two different levels, and said correcting means controls the inclination in conversion characteristics of said converting means so as to correct the change in differential quantum efficiency of said semiconductor laser in said constant period by the detecting signal from said detecting means and holds the inclination in conversion characteristics of said converting means in the other period.

44. A semiconductor laser controller as claimed in claim 34, wherein said converting means has means for converting the luminous level command signal as an analog signal voltage to an electric current corresponding to said luminous level command signal such that the light output in the light output and forward electric current characteristics of said semiconductor laser is represented by a straight line, and has switching means for turning on and off the forward electric current of said semiconductor laser by a set electric current value by a switching signal, and said detecting means detects the control electric current of said photoelectric negative feedback loop by emitting the light from said semiconductor laser in a constant period in which said luminous level command signal is set at least two different levels, and said correcting means controls the inclination in conversion characteristics of said converting means so as to correct the change in differential quantum efficiency of said semiconductor laser in said constant period by the detecting signal from said detecting means, and holds the inclination in conversion characteristics of said converting means in the other period.

45. A semiconductor laser controller as claimed in claim 35, wherein said converting means has means for converting the luminous level command signal as an analog signal voltage to an electric current corresponding to said luminous level command signal such that the light output in the light output and forward electric current characteristics of said semiconductor laser is represented by a straight line, and has switching means for turning on and off the forward electric current of said semiconductor laser by a set electric current value by a switching signal, and said detecting means detects the control electric current of said photoelectric negative feedback loop by emitting the light from said semiconductor laser in a constant period in which said luminous level command signal is set at least two different levels, and said correcting means controls the inclination in conversion characteristics of said converting means so as to correct the change in differential quantum efficiency of said semiconductor laser in said constant period by the detecting signal from said detecting means, and holds the inclination in conversion characteristics of said converting means in the other period.

46. A semiconductor laser controller as claimed in claim 34, wherein said converting means has means for converting the luminous level command signal as an analog signal voltage to an electric current corresponding to said luminous level command signal such that the light output in the light output and forward electric current characteristics of said semiconductor laser is represented by a straight line, and has switching means for turning on and off the forward electric current of said semiconductor laser by a set electric current value by a switching signal, and said detecting means detects the phase and amplitude with respect to said luminous level command signal of the control electric current of said photoelectric negative feedback loop in a constant period in which said luminous level command signal is set at a constant amplitude level, and said correcting means controls the inclination in conversion characteristics of said converting means so as to minimize an absolute value of the control electric current of said photoelectric negative feedback loop in said constant period by the detecting signal from said detecting means, and holds the inclination in conversion characteristics of said converting means in the other period.

47. A semiconductor laser controller as claimed in claim 35, wherein said converting means has means for converting the luminous level command signal as an analog signal voltage to an electric current corresponding to said luminous level command signal such that the light output in the light output and forward electric current characteristics of said semiconductor laser is represented by a straight line, and has switching means for turning on and off the forward electric current of said semiconductor laser by a set electric current value by a switching signal, and said detecting means detects the phase and amplitude with respect to said luminous level command signal of the control electric current of said photoelectric negative feedback loop in a constant period in which said luminous level command signal is set at a constant amplitude level, and said correcting means controls the inclination in conversion characteristics of said converting means so as to minimize an absolute value of the control electric current of said photoelectric negative feedback loop in said constant period by the detecting signal from said detecting means, and holds the inclination in conversion characteristics of said converting means in the other period.

48. A semiconductor laser controller as claimed in claim 34, wherein said converting means has means for converting the luminous level command signal as an analog signal voltage to an electric current corresponding to said luminous level command signal such that the light output in the light output and forward electric current characteristics of said semiconductor laser is represented by a straight line, and has switching means for turning on and off the forward electric current of said semiconductor laser by a set electric current value by a switching signal, and said detecting means and said correcting means sample a control electric current of said photoelectric negative feedback loop at timings of a peak and a bottom of said luminous level command signal in a constant period in which said luminous level command signal is pulse-modulated at a constant amplitude level having a constant offset level, and control a conversion coefficient of said converting means so as to minimize an absolute value of a differential voltage of sampling values corresponding to these peak and bottom, and control a set electric current value of said switching means so as to minimize the absolute value of the differential voltage between the sampling value corresponding to the timing of said bottom and a voltage corresponding to a bottom value of said luminous level command signal, and hold the inclination in conversion characteristics of said converting means and the set electric current value of said switching means in the other period.

49. A semiconductor laser controller as claimed in claim 35, wherein said converting means has means for converting the luminous level command signal as an analog signal voltage to an electric current corresponding to said luminous level command signal such that the light output in the light output and forward electric current characteristics of said semiconductor laser is represented by a straight line, and has switching means for turning on and off the forward electric current of said semiconductor laser by a set electric current value by a switching signal, and said detecting means and said correcting means sample a control electric current of said photoelectric negative feedback loop at timings of a peak and a bottom of said luminous level command signal in a constant period in which said luminous level command signal is pulse-modulated at a constant amplitude level having a constant offset level, and control a conversion coefficient of said converting means so as to minimize an absolute value of a differential voltage of sampling values corresponding to these peak and bottom, and control a set electric current value of said switching means so as to minimize the absolute value of the differential voltage between the sampling value corresponding to the timing of said bottom and a voltage corresponding to a bottom value of said luminous level command signal, and hold the inclination in conversion characteristics of said converting means and the set electric current value of said switching means in the other period.

50. A semiconductor laser controller as claimed in claim 34, wherein said converting means converts the luminous level command signal as an analog signal voltage to an electric current corresponding to said luminous level command signal such that the light output in the light output and forward electric current characteristics of said semiconductor laser is represented by a polygonal line constructed by n straight lines where n designates a natural number, and said detecting means detects the control electric current of said photoelectric negative feedback loop by emitting the light from said semiconductor laser in a constant period in which said luminous level command signal is set at least 2n different levels, and said correcting means controls the inclination in conversion characteristics of said converting means approximated by said straight line so as to correct the change in differential quantum efficiency of said semiconductor laser in said constant period by the detecting signal from said detecting means, and holds the inclination in conversion characteristics of said converting means in the other period.

51. A semiconductor laser controller as claimed in claim 35, wherein said converting means converts the luminous level command signal as an analog signal voltage to an electric current corresponding to said luminous level command signal such that the light output in the light output and forward electric current characteristics of said semiconductor laser is represented by a polygonal line constructed by n straight lines where n designates a natural number, and said detecting means detects the control electric current of said first photoelectric negative feedback loop by emitting the light from said semiconductor laser in a constant period in which said luminous level command signal is set at least 2n different levels, and said correcting means controls the inclination in conversion characteristics of said converting means approximated by said straight line so as to correct the change in differential quantum efficiency of said semiconductor laser in said constant period by the detecting signal from said detecting means, and holds the inclination in conversion characteristics of said converting means in the other period.

52. A semiconductor laser controller as claimed in claim 34, wherein said converting means has means for converting the luminous level command signal as an analog signal voltage to an electric current corresponding to said luminous level command signal such that the light output in the light output and forward electric current characteristics of said semiconductor laser is represented by a polygonal line constructed by n straight lines where n designates a natural number, and has switching means for turning on and off the forward electric current of said semiconductor laser by a set electric current value by a switching signal, and said detecting means detects the control electric current of said photoelectric negative feedback loop by emitting the light from said semiconductor laser in a constant period in which said luminous level command signal is set at least 2n different levels, and said correcting means controls the inclination in conversion characteristics of said converting means approximated by said straight line so as to correct the change in differential quantum efficiency of said semiconductor laser in said constant period by the detecting signal from said detecting means, and holds the inclination in conversion characteristics of said converting means in the other period.

53. A semiconductor laser controller as claimed in claim 35, wherein said converting means has means for converting the luminous level command signal as an analog signal voltage to an electric current corresponding to said luminous level command signal such that the light output in the light output and forward electric current characteristics of said semiconductor laser is represented by a polygonal line constructed by n straight lines where n designates a natural number, and has switching means for turning on and off the forward electric current of said semiconductor laser by a set electric current value by a switching signal, and said detecting means detects the control electric current of said photoelectric negative feedback loop by emitting the light from said semiconductor laser in a constant period in which said luminous level command signal is set at least 2n different levels, and said correcting means controls the inclination in conversion characteristics of said converting means approximated by said straight line so as to correct the change in differential quantum efficiency of said semiconductor laser in said constant period by the detecting signal from said detecting means, and holds the inclination in conversion characteristics of said converting means in the other period.

54. A semiconductor laser controller as claimed in claim 34, wherein said converting means has means for converting the luminous level command signal as an analog signal voltage to an electric current corresponding to said luminous level command signal such that the light output in the light output and forward electric current characteristics of said semiconductor laser is represented by a polygonal line constructed by n straight lines where n designates a natural number, and said detecting means and said correcting means sample the control electric current of said photoelectric negative feedback loop at timings of a peak and a bottom of said luminous level command signal in a constant period in which said luminous level command signal is pulse-modulated at least (2n−1) different constant amplitude levels having a constant offset level, and control the inclination and a polygonal point of each polygonal line of said converting means approximated by said polygonal line so as to minimize an absolute value of a differential voltage of sampling values corresponding to these peak and bottom, and holds the inclination and the polygonal point of each polygonal line of said converting means in the other period.

55. A semiconductor laser controller as claimed in claim 35, wherein said converting means has means for converting the luminous level command signal as an analog signal voltage to an electric current corresponding to said luminous level command signal such that the light output in the light output and forward electric current characteristics of said semiconductor laser is represented by a polygonal line constructed by n straight lines where n designates a natural number, and said detecting means and said correcting means sample the control electric current of said photoelectric negative feedback loop at timings of a peak and a bottom of said luminous level command signal in a constant period in which said luminous level command signal is pulse-modulated at least (2n−1) different constant amplitude levels having a constant offset level, and control the inclination and a polygonal point of each polygonal line of said converting means approximated by said polygonal line so as to minimize an absolute value of a differential voltage of sampling values corresponding to these peak and bottom, and holds the inclination and the polygonal point of each polygonal line of said converting means in the other period.

56. A semiconductor laser controller as claimed in claim 34, wherein said converting means has means for converting the luminous level command signal as an analog signal voltage to an electric current corresponding to said luminous level command signal such that the light output in the light output and forward electric current characteristics of said semiconductor laser is represented by a polygonal line constructed by n straight lines where n designates a natural number, and has switching means for turning on and off the forward electric current of said semiconductor laser by a set electric current value by a switching signal, and said detecting means and said correcting means sample the control electric current of said photoelectric negative feedback loop at timings of a peak and a bottom of said luminous level command signal in a constant period in which said luminous level command signal is pulse-modulated at least 2n different constant amplitude levels having a constant offset level, and control the inclination and a polygonal point of each polygonal line of said converting means approximated by said polygonal line and the set electric current value switched by said switching means so as to minimize an absolute value of a differential voltage of sampling values corresponding to these peak and bottom, and holds the inclination and the polygonal point of each polygonal line of said converting means and said set electric current value in the other period.

57. A semiconductor laser controller as claimed in claim 35, wherein said converting means has means for converting the luminous level command signal as an analog signal voltage to an electric current corresponding to said luminous level command signal such that the light output in the light output and forward electric current characteristics of said semiconductor laser is represented by a polygonal line constructed by n straight lines where n designates a natural number, and has switching means for turning on and off the forward electric current of said semiconductor laser by a set electric current value by a switching signal, and said detecting means and said correcting means sample the control electric current of said photoelectric negative feedback loop at timings of a peak and a bottom of said luminous level command signal in a constant period in which said luminous level command signal is pulse-modulated at least 2n different constant amplitude levels having a constant offset level, and control the inclination and a polygonal point of each polygonal line of said converting means approximated by said polygonal line and the set electric current value switched by said switching means so as to minimize an absolute value of a differential voltage of sampling values corresponding to these peak and bottom, and holds the inclination and the polygonal point of each polygonal line of said converting means and said set electric current value in the other period.

58. A semiconductor laser controller as claimed in claim 34, wherein said converting means, said detecting means and said correcting means have means for converting said luminous level command signal as a digital signal by a conversion table so as to correct the light output and forward electric current characteristics of said semiconductor laser and further converting the converted signal to an electric current corresponding to said luminous level command signal by a digital/analog converter, and have means for linearly setting the conversion characteristics of said conversion table in a constant period in which said luminous level command signal is increased from a minimum setting level to a maximum setting level, is decreased from the maximum setting level to the minimum setting level, or is arbitrarily changed in accordance with a dynamic range, and said linearly setting means sets a value of said conversion table such that a sum of the control electric current of said photoelectric negative feedback loop and a conversion electric current of said conversion table becomes the conversion electric current of said conversion table.

59. A semiconductor laser controller as claimed in claim 35, wherein said converting means, said detecting means and said correcting means have means for converting said luminous level command signal as a digital signal by a conversion table so as to correct the light output and forward electric current characteristics of said semiconductor laser and further converting the converted signal to an electric current corresponding to said luminous level command signal by a digital/analog converter, and have means for linearly setting the conversion characteristics of said conversion table in a constant period in which said luminous level command signal is increased from a minimum setting level to a maximum setting level, is decreased from the maximum setting level to the minimum setting level, or is arbitrarily changed in accordance with a dynamic range, and said linearly setting means sets a value of said conversion table such that a sum of the control electric current of said first photoelectric negative feedback loop and a conversion electric current of said conversion table becomes the conversion electric current of said conversion table.

60. A semiconductor laser controller as claimed in claim 58, wherein the controller further comprises switching means for turning on and off the forward electric current of said semiconductor laser by a set electric current value by a switching signal, and the operation of said semiconductor laser is controlled by an electric current provided by adding an electric current produced by said switching means to the control electric current of said semiconductor laser, and an electric current provided by subtracting the electric current produced by said switching means from each setting value of said conversion table is set to the value of said conversion table, and the value of the electric current produced by said switching means is set to the forward electric current of said semiconductor laser corresponding to the minimum setting value of said luminous level command signal.

61. A semiconductor laser controller as claimed in claim 59, wherein the controller further comprises switching means for turning on and off the forward electric current of said semiconductor laser by a set electric current value by a switching signal, and the operation of said semiconductor laser is controlled by an electric current provided by adding an electric current produced by said switching means to the control electric current of said semiconductor laser, and an electric current provided by subtracting the electric current produced by said switching means from each setting value of said conversion table is set to the value of said conversion table, and the value of the electric current produced by said switching means is set to the forward electric current of said semiconductor laser corresponding to the minimum setting value of said luminous level command signal.

62. A semiconductor laser controller comprising:
photoelectric converting means for detecting a photovoltaic current proportional to a light output of a driven laser diode by and separating the photovoltaic current into high and low frequency components;
a photoelectric negative feedback loop for controlling a forward electric current of said laser diode such that a sum of the high and low frequency components of the photovoltaic current generated by the photoelectric converting means is equal to a reference signal electric current; and
phase compensating means for compensating a phase of the forward electric current of said laser diode.

63. An optical disk apparatus for causing a laser beam from a semiconductor laser to irradiate an optical disk to record, reproduce or erase information, said apparatus comprising:
a light-receiving element for receiving a portion of the laser beam from the semiconductor laser;
a wide band electric current amplifier connected to said semiconductor laser and inputting a command signal indicative of a luminous level to control a laser beam emitted by said semiconductor laser and irradiating said optical disk;
a wide band photoelectric negative feedback loop comprising an impedance converter and a first voltage-current converter connected in parallel to each other between said wide band electric current amplifier and said light-receiving element,
said wide band photoelectric negative feedback loop feeding a detecting signal provided by said light-receiving element at a reproducing or erasing time back to said wide band electric current amplifier; and
a low region photoelectric negative feedback loop comprising a differential amplifier and a second voltage-current converter connected between said light-receiving element and said wide band electric current amplifier,
said low region photoelectric negative feedback loop comparing the detecting signal provided by said light-receiving element at the reproducing or erasing time with a reference value by the differential amplifier and converting the compared signal to an electric signal by the second voltage-current converter, and feeding the converted signal back to said wide band electric current amplifier.

64. An optical disk apparatus as claimed in claim 63, comprising a circuit causing a luminous command signal in accordance with a series of data pulses at the recording time and the light intensity of the laser beam for record to be inputted as the luminous level command signal to the photoelectric negative feedback loop through a circuit for correcting high frequency region characteristics.

* * * * *

UNITED STATES PATENT AND TRADEMARK OFFICE
CERTIFICATE OF CORRECTION

PATENT NO. : 5,036,519
DATED : July 30, 1991
INVENTOR(S) : Hidetoshi EMA, et al.

It is certified that error appears in the above-identified patent and that said Letters Patent is hereby corrected as shown below:

Title page, left-hand column, at item "[75]", "Kawasaka" should read --Kawasaki--.

Signed and Sealed this

Twentieth Day of July, 1993

Attest:

MICHAEL K. KIRK

*Attesting Officer*   *Acting Commissioner of Patents and Trademarks*